US010304810B2

(12) United States Patent
Gardner et al.

(10) Patent No.: US 10,304,810 B2
(45) Date of Patent: *May 28, 2019

(54) METHOD OF MAKING A LIGHT EMITTING DIODE ARRAY ON A BACKPLANE

(71) Applicant: GLO AB, Lund (SE)

(72) Inventors: Nathan Gardner, Sunnyvale, CA (US); Fredrick A. Kish, Jr., Sunnyvale, CA (US); Miljenko Modric, Santa Clara, CA (US); Anusha Pokhriyal, Sunnyvale, CA (US); Daniel Thompson, Palo Alto, CA (US); Fariba Danesh, Pleasanton, CA (US)

(73) Assignee: GLO AB, Lund (SE)

(*) Notice: Subject to any disclaimer, the term of this patent is extended or adjusted under 35 U.S.C. 154(b) by 92 days.

This patent is subject to a terminal disclaimer.

(21) Appl. No.: 15/533,866

(22) PCT Filed: Dec. 17, 2015

(86) PCT No.: PCT/US2015/066362
§ 371 (c)(1),
(2) Date: Jun. 7, 2017

(87) PCT Pub. No.: WO2016/100657
PCT Pub. Date: Jun. 23, 2016

(65) Prior Publication Data
US 2018/0366450 A1 Dec. 20, 2018

Related U.S. Application Data

(60) Provisional application No. 62/094,525, filed on Dec. 19, 2014, provisional application No. 62/094,539, (Continued)

(51) Int. Cl.
*H01L 25/075* (2006.01)
*H01L 25/16* (2006.01)
(Continued)

(52) U.S. Cl.
CPC ...... *H01L 25/0753* (2013.01); *H01L 21/6835* (2013.01); *H01L 24/97* (2013.01);
(Continued)

(58) Field of Classification Search
None
See application file for complete search history.

(56) References Cited

U.S. PATENT DOCUMENTS

| 5,477,082 A | 12/1995 | Buckley, III et al. |
| 9,893,041 B2 | 2/2018 | Pokhriyal et al. |

(Continued)

FOREIGN PATENT DOCUMENTS

| CN | 101076900 A | 11/2007 |
| CN | 102543987 A | 7/2012 |

(Continued)

OTHER PUBLICATIONS

International Preliminary Report on Patentability from the International Bureau for International Patent Application No. PCT/US2015/066362, dated Jun. 29, 2017, 7 pages.

(Continued)

*Primary Examiner* — Alexander G Ghyka
(74) *Attorney, Agent, or Firm* — The Marbury Law Group PLLC

(57) ABSTRACT

A backplane optionally having stepped horizontal surfaces and optionally embedding metal interconnect structures is provided. First conductive bonding structures are formed on first stepped horizontal surfaces. First light emitting devices on a first transfer substrate are disposed on the first conductive bonding structures, and a first subset of the first light emitting devices is bonded to the first conductive bonding structures. Laser irradiation can be employed to selectively disconnect the first subset of the first light emitting devices from the first transfer substrate while a second subset of the (Continued)

first light emitting devices remains attached to the first transfer substrate. Additional devices on each additional transfer substrate can be bonded to additional conductive bonding structures on the backplane employing the same method provided that the additional devices are not present in positions that would overlap with pre-existing first light emitting devices or devices on the backplane at a bonding position.

57 Claims, 87 Drawing Sheets

Related U.S. Application Data filed on Dec. 19, 2014, provisional application No. 62/107,606, filed on Jan. 26, 2015, provisional application No. 62/153,291, filed on Apr. 27, 2015, provisional application No. 62/153,298, filed on Apr. 27, 2015, provisional application No. 62/161,067, filed on May 13, 2015.

(51) Int. Cl.
| | | |
|---|---|---|
| *H01L 27/15* | (2006.01) | |
| *H01L 33/62* | (2010.01) | |
| *H01L 23/00* | (2006.01) | |
| *H01L 21/683* | (2006.01) | |
| *H01L 33/00* | (2010.01) | |
| *H01L 25/00* | (2006.01) | |

(52) U.S. Cl.
CPC .......... *H01L 25/167* (2013.01); *H01L 27/156* (2013.01); *H01L 33/0079* (2013.01); *H01L 33/62* (2013.01); *H01L 25/50* (2013.01); *H01L 33/0095* (2013.01); *H01L 2221/68322* (2013.01); *H01L 2221/68381* (2013.01); *H01L 2224/131* (2013.01); *H01L 2224/13109* (2013.01); *H01L 2224/13111* (2013.01); *H01L 2224/81* (2013.01); *H01L 2224/81001* (2013.01); *H01L 2224/95* (2013.01); *H01L 2933/0066* (2013.01)

(56) References Cited

U.S. PATENT DOCUMENTS

| | | | |
|---|---|---|---|
| 2002/0064032 | A1 | 5/2002 | Oohata |
| 2003/0024635 | A1 | 2/2003 | Utsunomiya |
| 2008/0299746 | A1 | 12/2008 | Yao et al. |
| 2009/0029527 | A1 | 1/2009 | Amundson et al. |
| 2009/0278142 | A1 | 11/2009 | Watanabe et al. |
| 2009/0315061 | A1 | 12/2009 | Andrews |
| 2010/0258543 | A1 | 10/2010 | Mizuno et al. |
| 2011/0151602 | A1 | 6/2011 | Speier |
| 2011/0200791 | A1 | 8/2011 | Kugelmann et al. |
| 2012/0091478 | A1 | 4/2012 | Lee et al. |
| 2013/0200408 | A1 | 8/2013 | Wang |
| 2013/0214302 | A1 | 8/2013 | Yeh et al. |
| 2014/0048822 | A1 | 2/2014 | Slater, Jr. et al. |
| 2014/0209930 | A1 | 7/2014 | Weng et al. |
| 2014/0290867 | A1 | 10/2014 | Bibl et al. |
| 2014/0346664 | A1 | 11/2014 | Eppes |
| 2014/0374779 | A1 | 12/2014 | Chung et al. |
| 2015/0318210 | A1 | 11/2015 | Budd et al. |
| 2015/0340346 | A1 | 11/2015 | Chu et al. |
| 2016/0111605 | A1 | 4/2016 | Li et al. |
| 2017/0288102 | A1* | 10/2017 | Farrens ................. H01L 27/156 |

FOREIGN PATENT DOCUMENTS

| | | |
|---|---|---|
| EP | 2555265 A2 | 2/2013 |
| JP | S5617385 A | 2/1981 |
| JP | H10229221 A | 8/1998 |
| JP | 2006520518 A | 9/2006 |
| JP | 2010519757 A | 6/2010 |
| JP | 2013211443 A | 10/2013 |
| JP | 2014220312 A | 11/2014 |
| KR | 1020130097948 A | 9/2013 |
| WO | WO2013074370 A1 | 5/2013 |
| WO | 2016100662 A1 | 6/2016 |

OTHER PUBLICATIONS

European Office Communication, Extended Supplementary European Search Report for European Patent Application No. EP 15871062, completed Mar. 6, 2018, 10 pages.
Office Communication from China National Intellectual Property Administration for Chinese Patent Application No. 201580074898.X, dated Oct. 19, 2018, 12 pages.
European Office Communication pursuant to Rules 70(2) and 70a(2) for European Patent Application No. EP 15871062, completed Apr. 3, 2018, 1 page.
European Office Communication Pursuant to Rule 164(1) EPC, Supplementary Partial European Search Report, for EP Application No. 15871065, dated Jun. 11, 2018, 17 pages.
Liu, M. et al: "On-demand multi-batch self-assembly of hybrid MEMS by patterning solders of different melting points," Journal of MicroMechanics and MicroEngineering, vol. 17, pp. 2163-2168, (2007).
International Search Report and Written Opinion for PCT/US15/66362, dated Jun. 13, 2016.
International Search Report and Written Opinion for PCT/US2015/66372, dated Mar. 31, 2016.
Gardner, Nathan et al. "Light Emitting Diode Array on a Backplane and Method of Making Thereof"; U.S. Appl. No. 15/533,907, filed Jun. 7, 2017.
European Patent Application No. 15871065, European Office Communication, Supplementary European Search Report and European Search Opinion, dated Oct. 1, 2018, 17 pgs.
Office Action from U.S. Appl. No. 15/463,042, dated Jan. 25, 2018, 23 pages.
USPTO Notice of Allowance and Fee(s) Due for U.S. Appl. No. 15/533,907, dated Jul. 16, 2018, 36 pages.
EP Application No. 15871062.4-1211, Office Action dated Mar. 5, 2019, 6pgs.

* cited by examiner

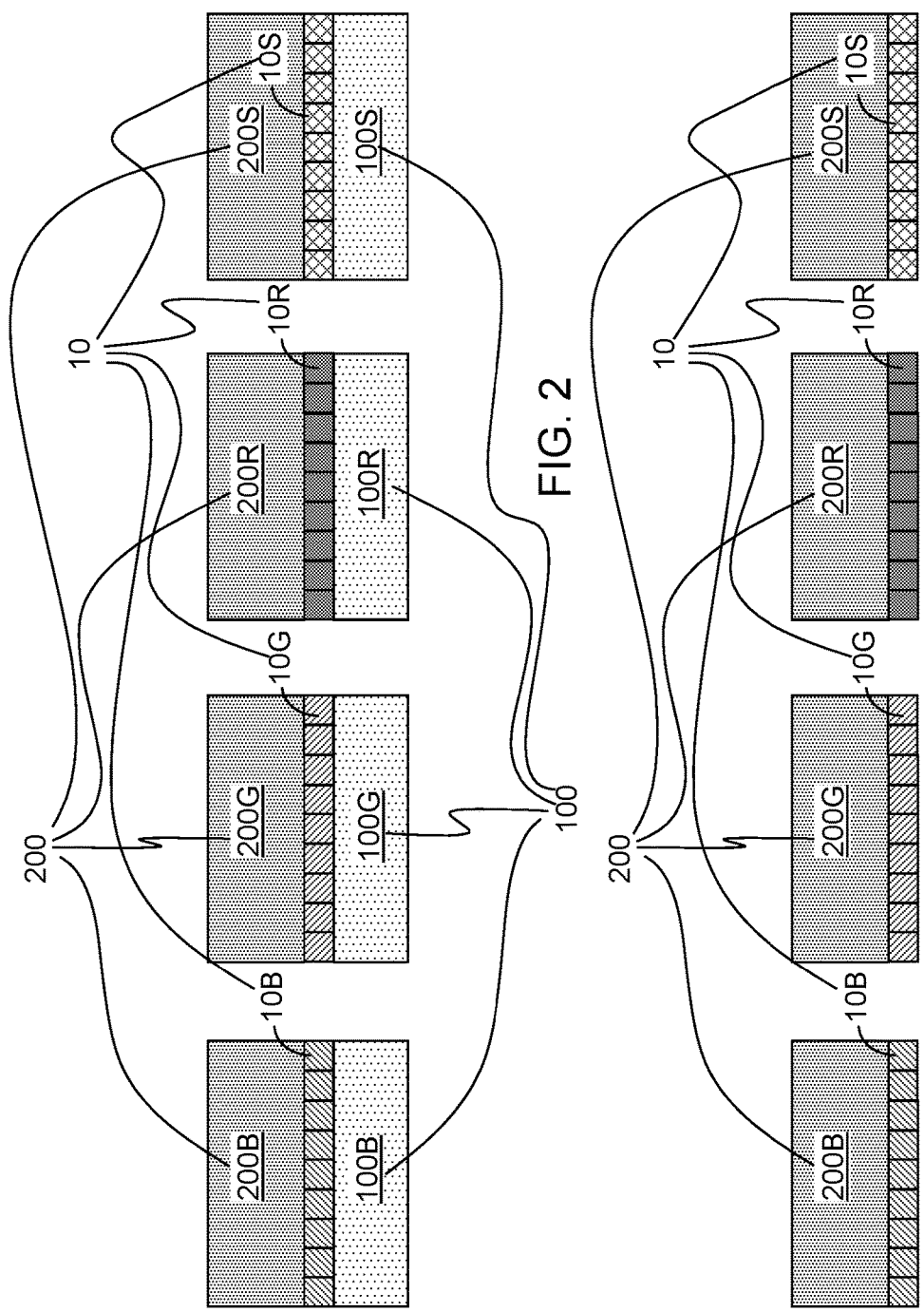

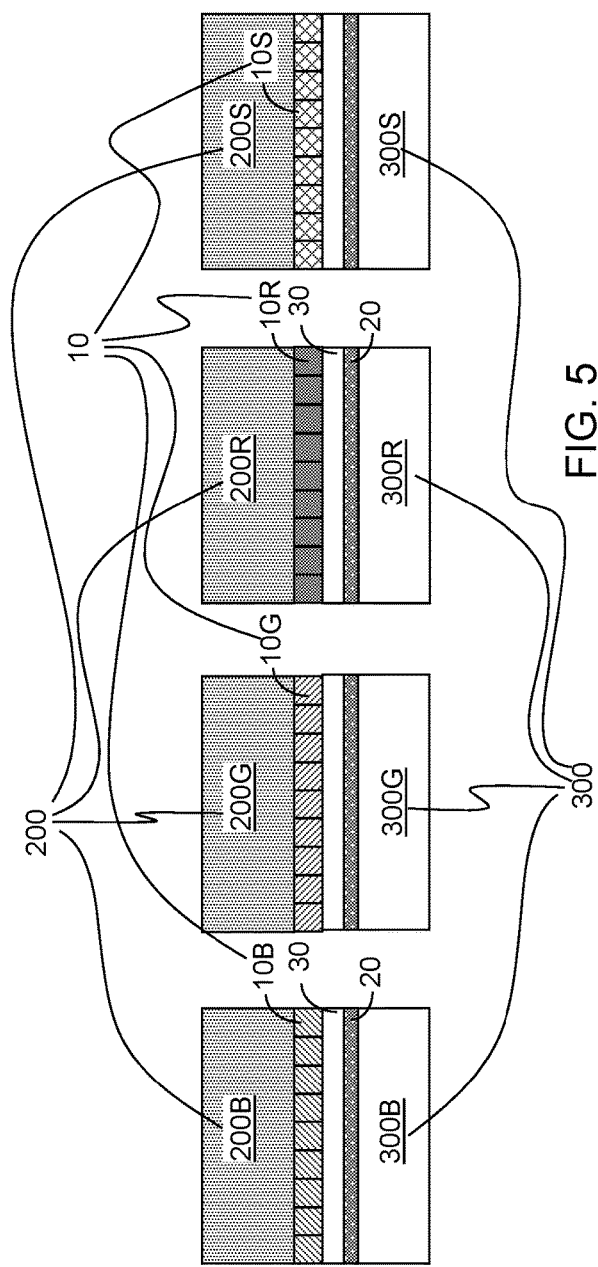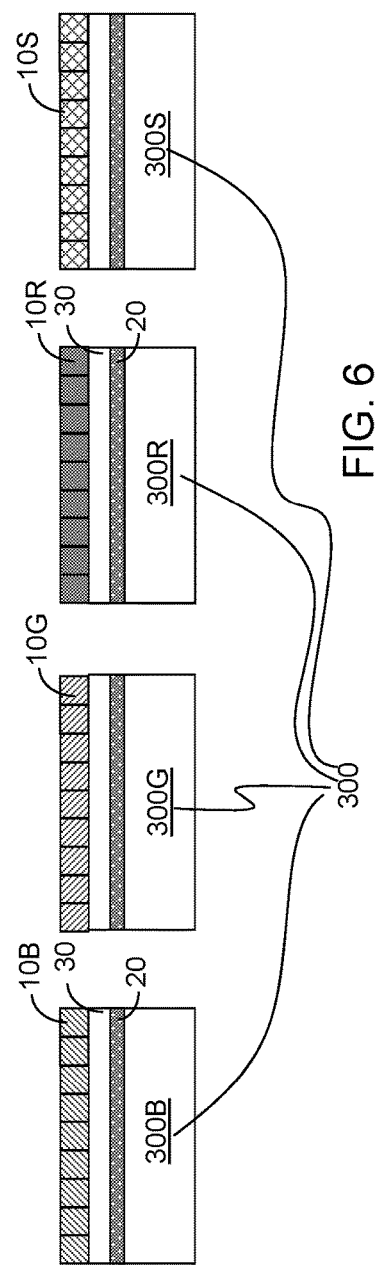

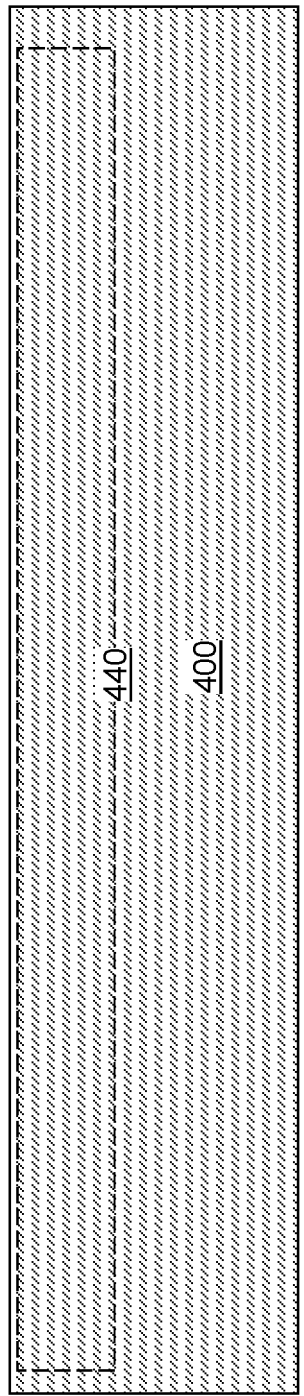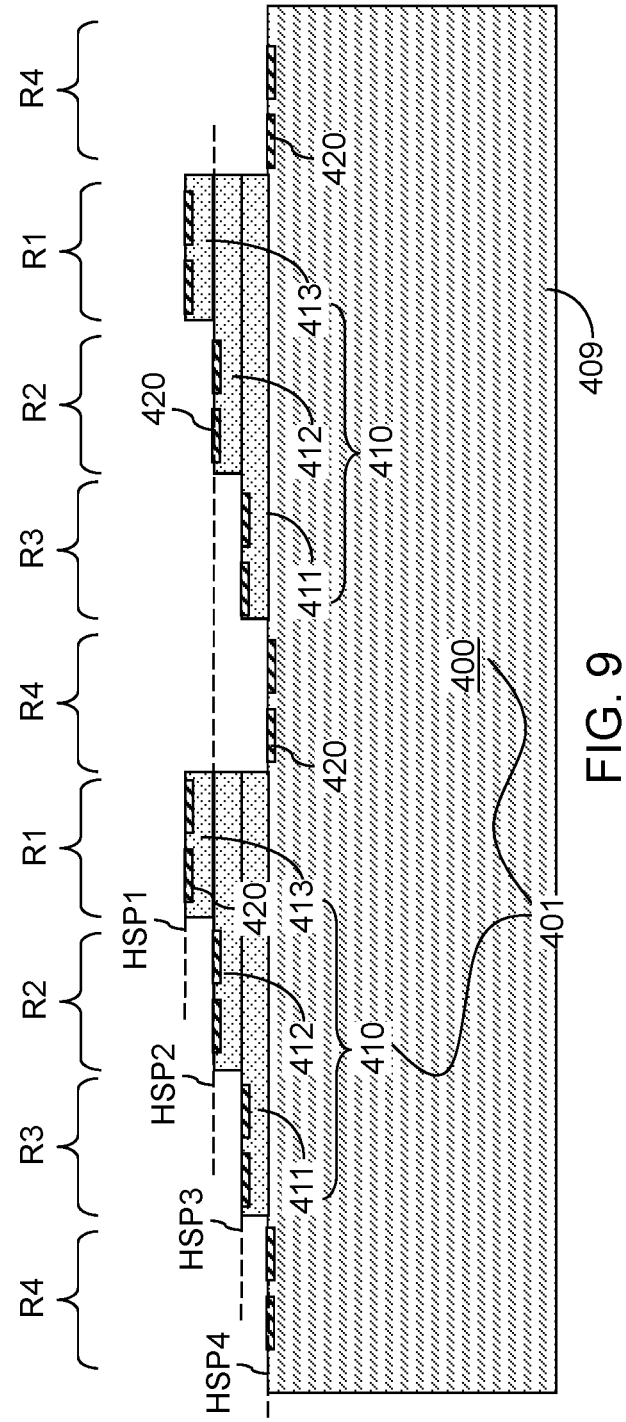

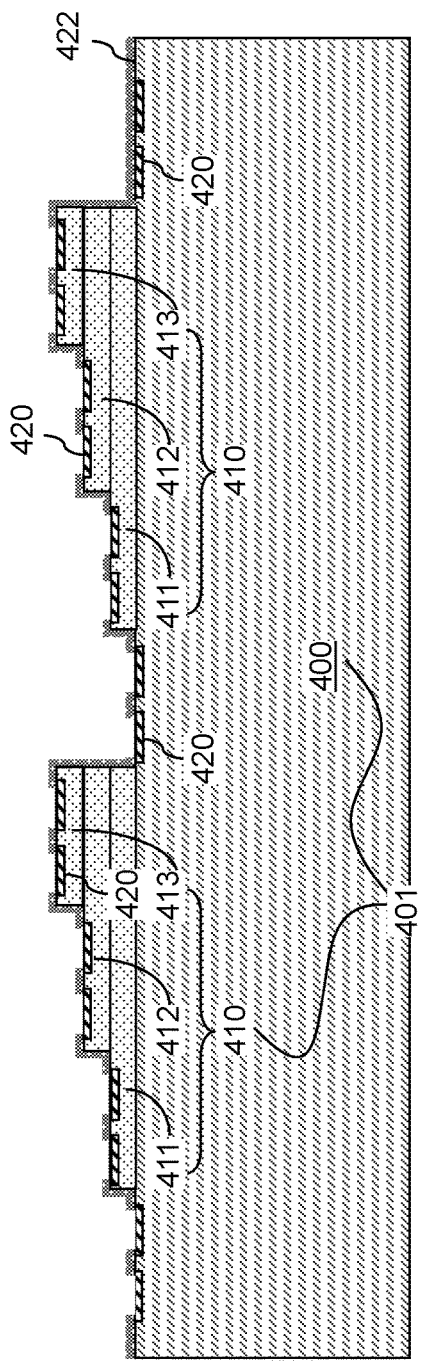
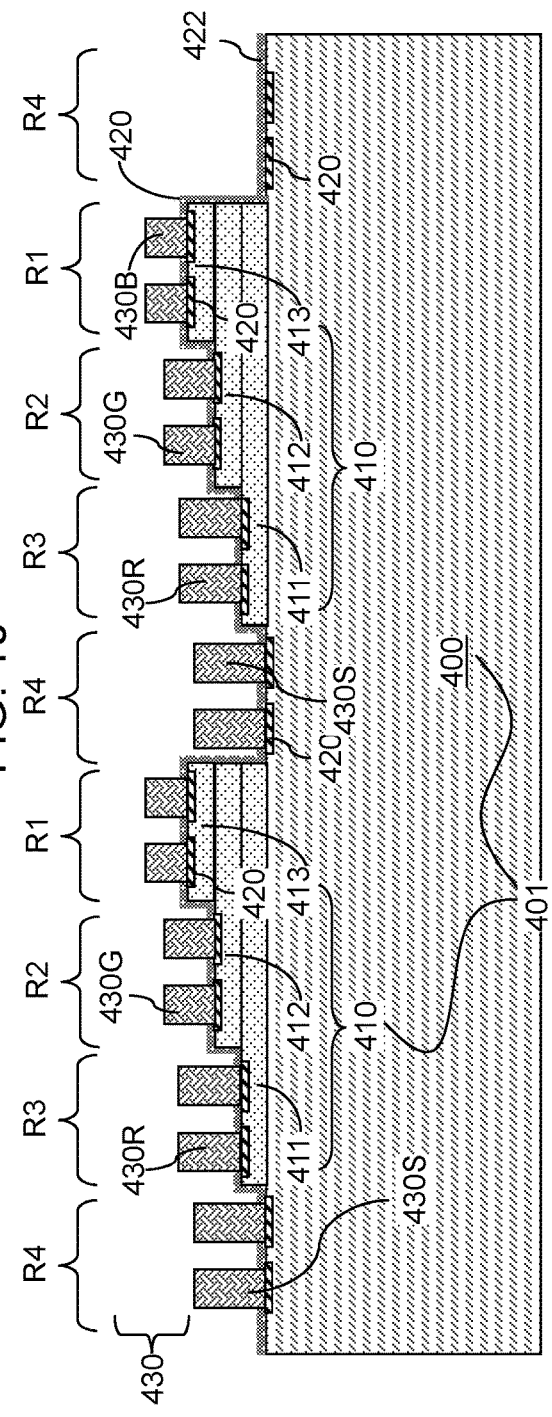
FIG. 10
FIG. 11

FIG. 30

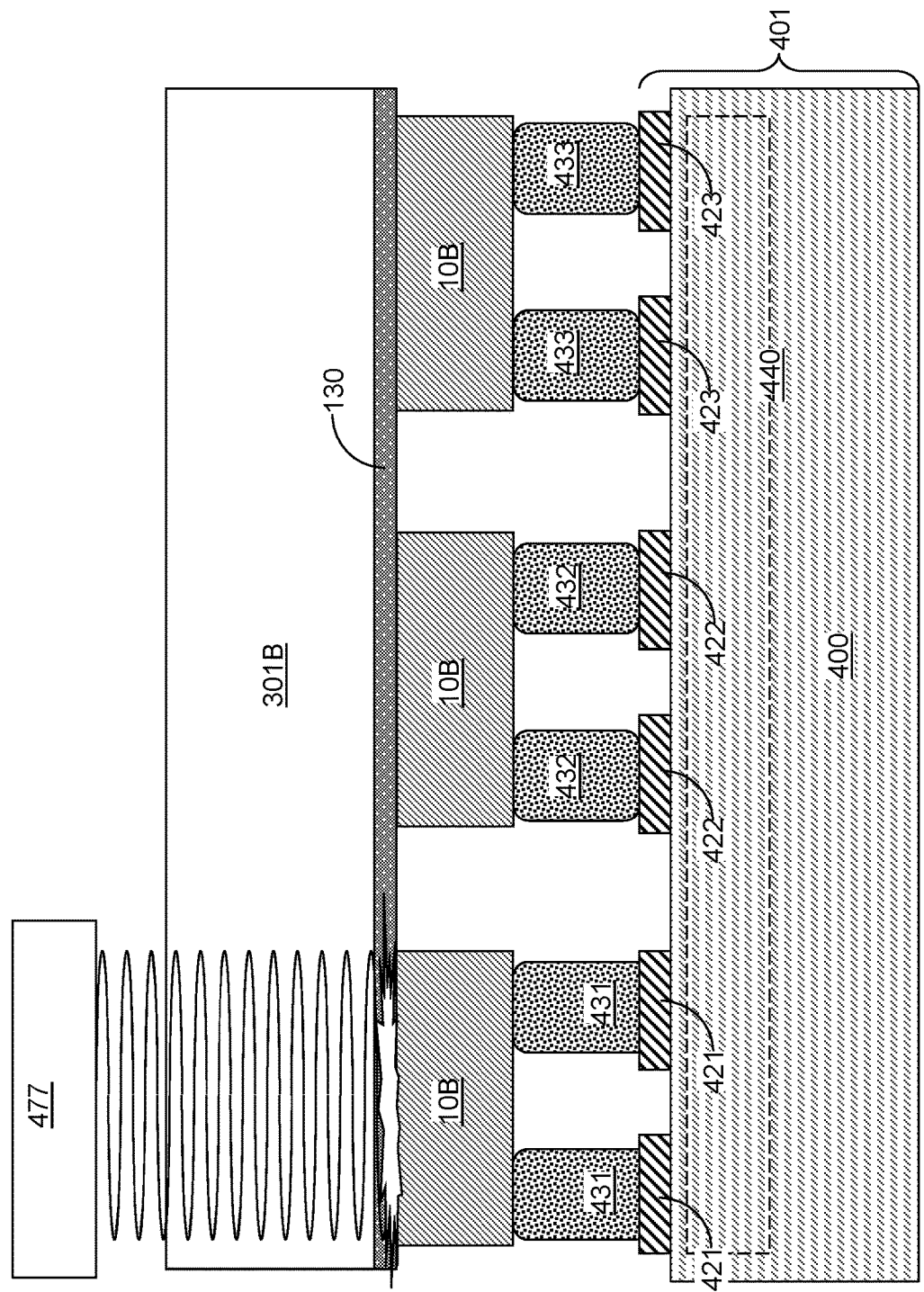

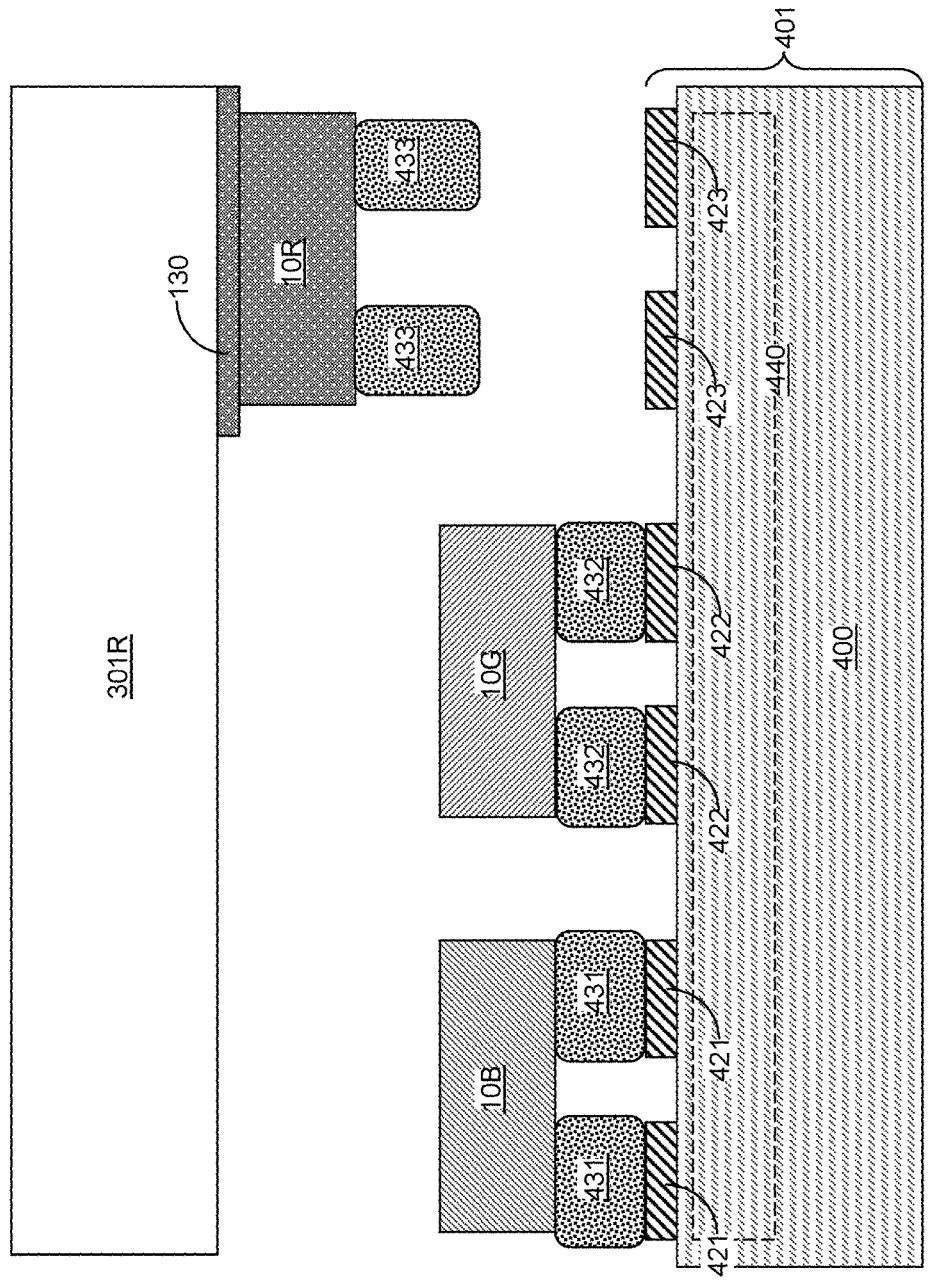

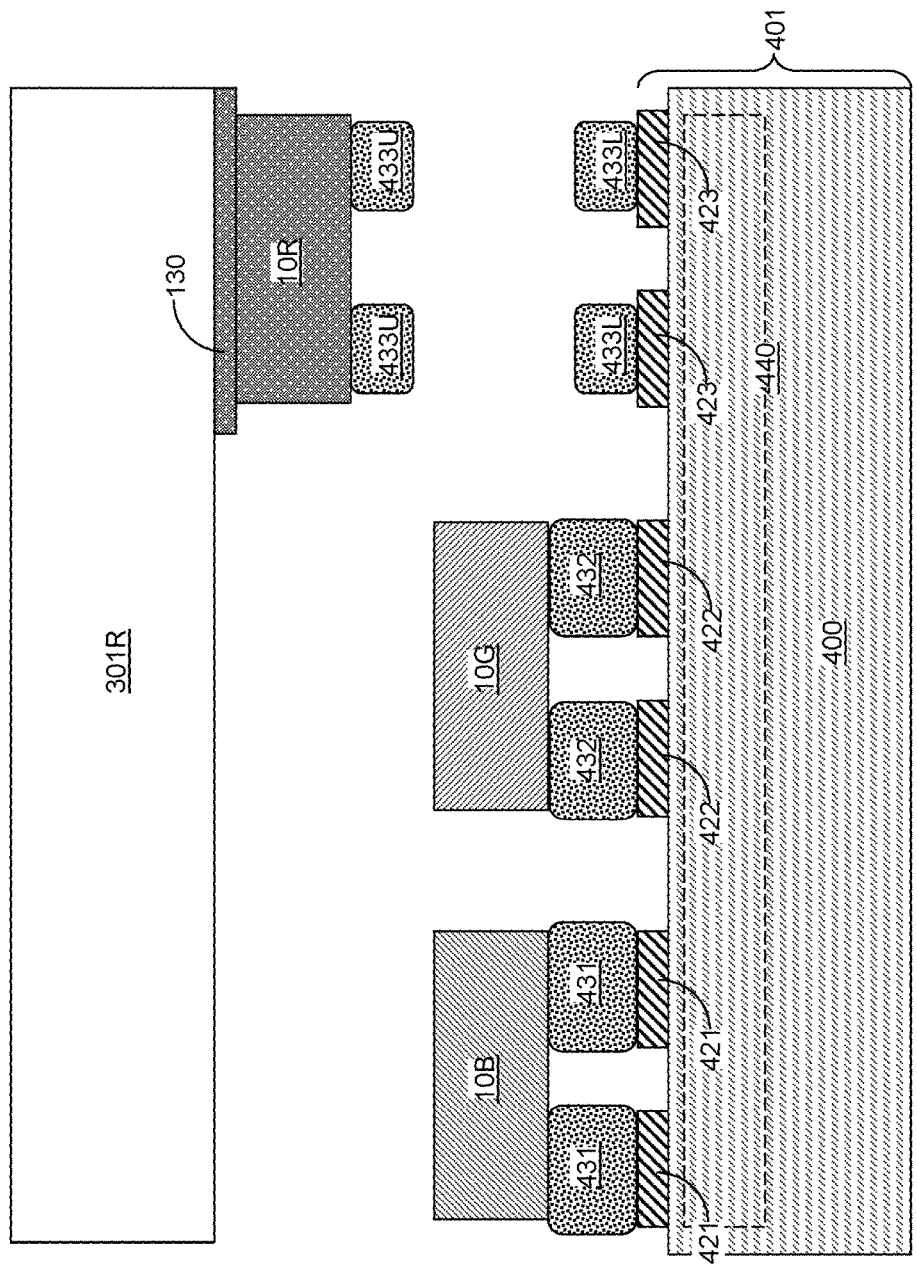

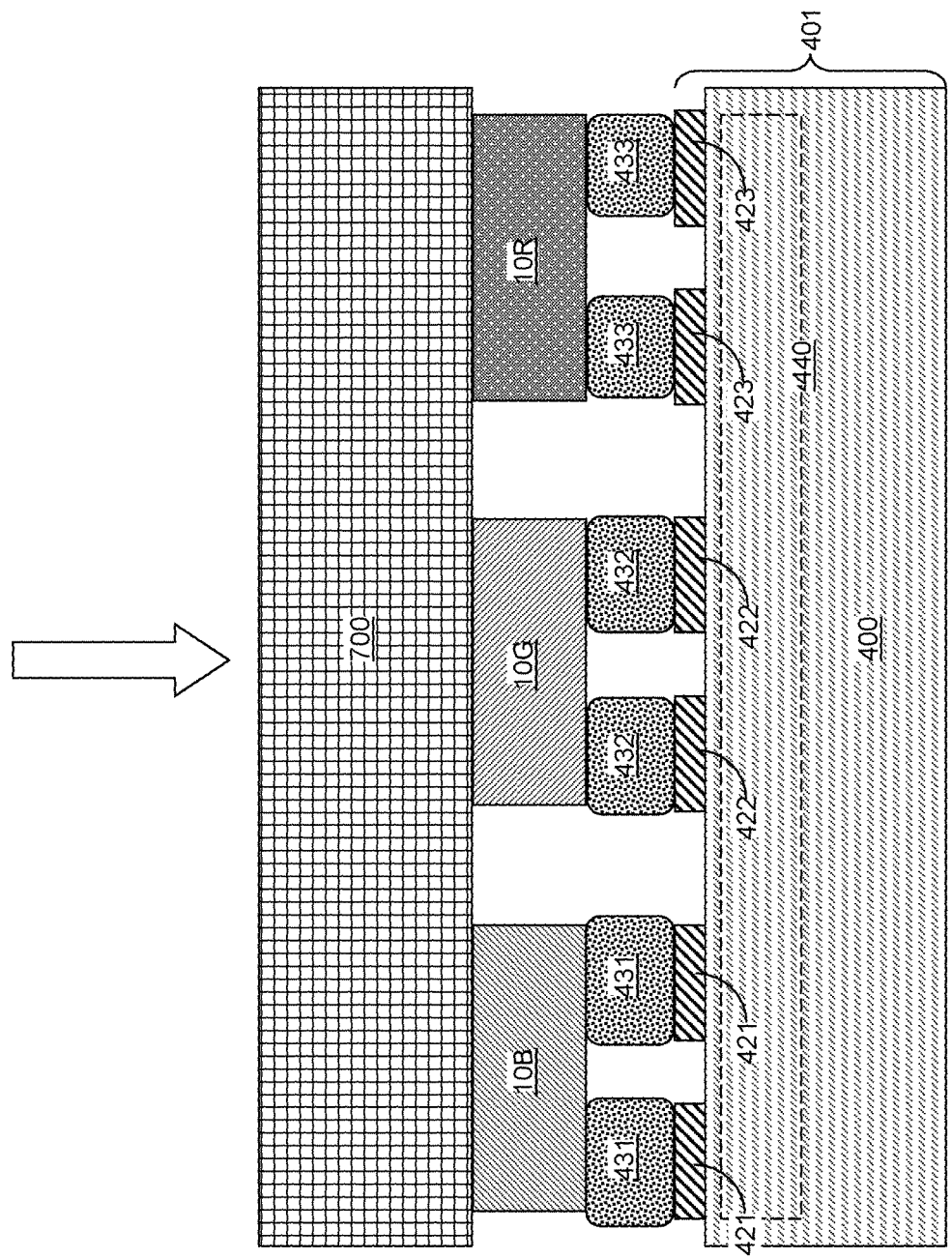

METHOD OF MAKING A LIGHT EMITTING DIODE ARRAY ON A BACKPLANE

CROSS-REFERENCE TO OTHER APPLICATIONS

This application is a national phase application under 35 U.S.C. § 371 of international application PCT/US2015/66362, filed Dec. 17, 2015 which claims the benefit of priority to U.S. Provisional Application No. 62/094,525 filed on Dec. 19, 2014, 62/094,539 filed Dec. 19, 2014; 62/107,606 filed on Jan. 26, 2015; 62/153,291 filed on Apr. 27, 2015; 62/153,298 filed on Apr. 27, 2015; 62/161,067 filed May 13, 2015, the entire teachings of which are incorporated herein by reference.

FIELD

The embodiments of the invention are directed generally to semiconductor light emitting devices, and specifically to an emissive display panel employing a light emitting device array on a backplane, and a method of manufacturing the same.

BACKGROUND

Light emitting devices such as light emitting devices are used in electronic displays, such as liquid crystal displays in laptops or LED televisions. Light emitting devices include light emitting diodes (LEDs) and various other types of electronic devices configured to emit light.

SUMMARY

According to an aspect of the present disclosure, a method of forming a device assembly is provided. Multiple types of solder material portions are formed on a substrate. The multiple types of solder material portions comprises at least one first solder material portion including a first solder material and at least one second solder material portion including a second solder material. Multiple types of devices are provided. The multiple types of devices comprises a first type device including at least one first bonding pad and a second type device including at least one second bonding pad. The first and second bonding pads comprise a common bonding material. The first solder material and the common bonding material form a first eutectic system having a first eutectic temperature. The second solder material and the common bonding material form a second eutectic system having a second eutectic temperature that is greater than the first eutectic temperature. The first type device is bonded to the substrate by disposing each first bonding pad on a respective first solder material portion and heating each first bonding pad to a temperature above the first eutectic temperature and below the second eutectic temperature. The second type device is bonded to the substrate by disposing each second bonding pad on a respective second solder material portion and heating each second bonding pad to a temperature above the second eutectic temperature.

According to an aspect of the present disclosure, a method of forming at least one integrated light emitting device assembly is provided. A first assembly comprising a first source substrate and first light emitting devices that emit light of a first wavelength is disposed over a backplane. First conductive bonding structures are disposed between the backplane and the first assembly. A first subset of the first light emitting devices is bonded to the backplane through the first conductive bonding structures. The first subset of the first light emitting devices is detached from the first source substrate by laser ablation of material portions overlying the first subset of the first light emitting devices. An assembly comprising the first source substrate and a second subset of the first light emitting devices is separated from the backplane while the first subset of the first light emitting devices remains bonded to the backplane.

According to another aspect of the present disclosure, an integrated light emitting device assembly is provided, which comprises a backplane having stepped horizontal surfaces at a top side. The stepped horizontal surfaces comprise a first subset of the stepped horizontal surfaces located within a first horizontal surface plane, and a second subset of the stepped horizontal surfaces located within a second horizontal surface plane that is more proximal to a backside surface of the backplane than the first subset of stepped horizontal surfaces is to the backside surface of the backplane. The integrated light emitting device assembly comprises conductive bonding structures located on the stepped horizontal surfaces of the backplane. The conductive bonding structures comprise first conductive bonding structures overlying the first subset of the stepped horizontal surfaces and second conductive bonding structures overlying the second subset of the stepped horizontal surfaces. Further, the integrated light emitting device assembly comprises light emitting devices bonded to the conductive bonding structures. The light emitting devices comprise first light emitting devices that emit light of a first wavelength and overlie the first subset of the stepped horizontal surfaces and second light emitting devices that emit light of a second wavelength and overlie the second subset of stepped horizontal surfaces.

According to yet another aspect of the present disclosure, an integrated light emitting device assembly comprising first light emitting devices and second light emitting devices bonded to a backplane is provided. Each first light emitting device emits light at a first wavelength. Each second light emitting device emits light at a second wavelength that is different from the first wavelength. Each first light emitting device is bonded to the backplane through a first stack including a first bonding pad and a first conductive bonding structure. Each second light emitting device is bonded to the backplane through a second stack including a second bonding pad and a second conductive bonding structure. A first plane including first interfaces between the first bonding pads and the first conductive bonding structures is vertically offset from a second plane including second interfaces between the second bonding pads and the second conductive bonding structures.

According to still another aspect of the present disclosure, an integrated light emitting device assembly comprising first light emitting devices and second light emitting devices bonded to a backplane is provided. Each first light emitting device emits light at a first wavelength. Each second light emitting device emits light at a second wavelength that is different from the first wavelength. Each first light emitting device is bonded to the backplane through a first stack including a first bonding pad and a first conductive bonding structure. Each second light emitting device is bonded to the backplane through a second stack including a second bonding pad and a second conductive bonding structure. The first conductive bonding structures and the second conductive bonding structures have a same height. Each of the first conductive bonding structures has a first volume. Each of the second conductive bonding structures has a second volume that is less than the first volume.

BRIEF DESCRIPTION OF THE DRAWINGS

FIG. 2 is a schematic illustration of the step of bonding of the growth substrates to respective first carrier substrates through the respective devices according to an embodiment of the present disclosure.

FIG. 3 is a schematic illustration of the step of removing the growth substrates according to an embodiment of the present disclosure.

FIG. 5 is a schematic illustration of the step of bonding each pair of a first carrier substrate and a second carrier substrate according to an embodiment of the present disclosure.

FIG. 6 is a schematic illustration of the step in which each first carrier substrate is removed from a bonded structure according to an embodiment of the present disclosure.

FIG. 8 is a vertical cross-sectional view of a backplane substrate according to an embodiment of the present disclosure.

FIG. 9 is a vertical cross-sectional view of a backplane that is formed by forming various dielectric material layers on the backplane according to an embodiment of the present disclosure.

FIG. 10 is a vertical cross-sectional view of the backplane after formation and patterning of an optional protective layer including an optical protection material according to an embodiment of the present disclosure.

FIG. 11 is a vertical cross-sectional view of the backplane after formation of first conductive bonding structures on a first subset of horizontal stepped surfaces according to an embodiment of the present disclosure.

FIG. 30 illustrates an exemplary transfer pattern and an exemplary transfer sequence for transferring four different types of devices from four transfer substrates to four backplanes.

DETAILED DESCRIPTION

Figure 1:
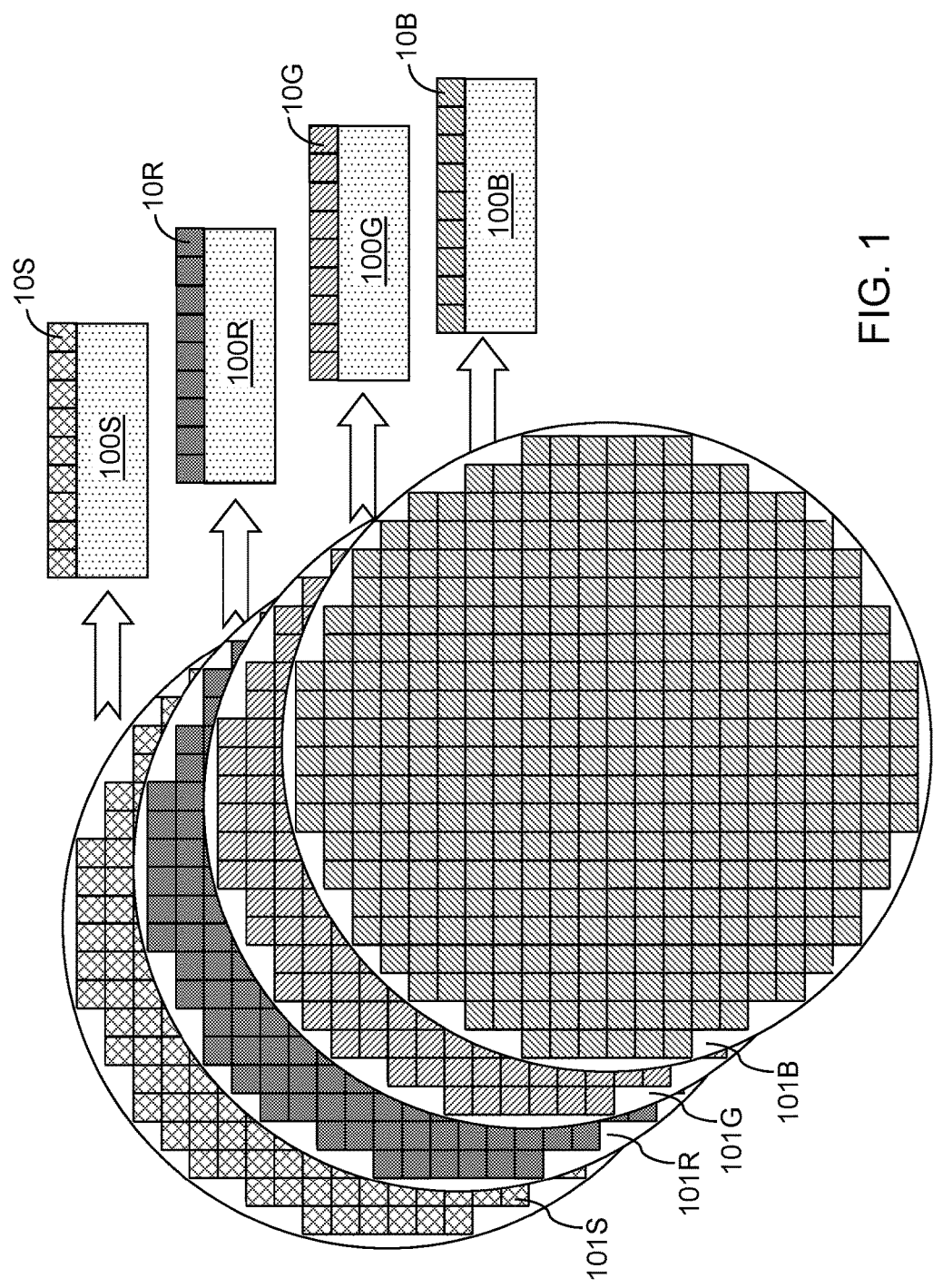
FIG. 1 is a schematic illustration of the step of generation of assemblies of growth substrates with respective devices thereupon from initial growth substrates according to an embodiment of the present disclosure.

As stated above, the present disclosure is directed to an assembly of integrated back light units, and a method of manufacturing the same, the various aspects of which are described below. Throughout the drawings, like elements are described by the same reference numeral. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "light emitting device" refers to any device that is configured to emit light and includes, but is not limited to, a light emitting diode (LED), a laser, such as a vertical-cavity surface-emitting laser (VCSEL), and any other electronic device that is configured to emit light upon application of a suitable electrical bias. A light emitting device may be a vertical structure (e.g., a vertical LED) in which the p-side and n-side contacts are located on opposite sides of the structure or a lateral structure in which the p-side and n-side contacts are located on the same side of the structure. As used herein, a "light emitting device assembly" refers to an assembly in which at least one light emitting device is structurally fixed with respect to a support structure, which can include, for example, a substrate, a matrix, or any other structure configured to provide stable mechanical support to the at least one light emitting device.

In the present disclosure, a method is provided for transferring an array of devices (such as an array of light emitting devices or an array of sensor devices) from a growth substrate to a target substrate. The target substrate can be any substrate on which formation of multiple types of devices in any configuration is desired. In an illustrative example, the target substrate can be a backplane substrate such as an active or passive matrix backplane substrate for driving light emitting devices. As used herein, a "backplane substrate" refers to any substrate configured to affix multiple devices thereupon. In one embodiment, the center-to-center spacing of neighboring light emitting devices on the backplane substrate can be is an integer multiple of the center-to-center spacing of neighboring light emitting devices on the growth substrate. The light emitting devices may include a plurality of light emitting devices, such as a group of two light emitting devices, one configured to emit blue light and one configured to emit green light. The light emitting devices may include a group of three light emitting devices, one configured to emit blue light, one configured to emit green light, and one configured to emit red light. As used herein, "neighboring light emitting devices" refer to a plurality of two or more light emitting devices located in closer proximity than at least another light emitting device. The method of the present disclosure can provide selective transfer of a subset of light emitting devices from a light emitting device array on a growth substrate to the backplane substrate.

Referring to FIG. 1, devices (10B, 10G, 10R, 10S) can be fabricated on respective initial growth substrates (101B, 101G, 101R, 101S) employing methods known in the art. As used herein, an "initial growth substrate" refers to a substrate that is processed to form devices thereupon or therein. The devices (10B, 10G, 10R, 10S) can include light emitting devices (10B, 10G, 10R) and/or sensor devices 10S (e.g., photodetectors) and/or any other electronic devices. The light emitting devices (10B, 10G, 10R) can be any type of light emitting devices, i.e., vertical light emitting devices, lateral light emitting devices, or any combination thereof. Devices of the same type can be formed on each initial growth substrate (101B, 101G, 101R, 101S). The devices (10B, 10G, 10R, 10S) can be formed as an array on the respective initial growth substrates (101B, 101G, 101R, 101S).

In one embodiment, the initial growth substrates (101B, 101G, 101R, 101S) can include an absorbing substrate such as a silicon substrate. As used herein, an "absorbing substrate" refers to a substrate that absorbs more than 50% of light energy within the spectrum range including ultraviolet range, visible range, and infrared range. As used herein, "ultraviolet range" refers to the wavelength range from 10 nm to 400 nm; "visible range" refers to the wavelength range from 400 nm to 800 nm, and "infrared range" refers to the wavelength range from 800 nm to 1 mm.

If the initial growth substrates (101B, 101G, 101R, 101S) are absorbing substrates, each array of devices (10B, 10G, 10R, 10S) can be transferred to a respective transparent carrier substrates, or a "transparent substrate," by full wafer transfer processes in which each array of devices (10B, 10G, 10R, 10S) is transferred to the respective transparent substrate in its entirety. As used herein, a "transparent substrate" refers to a substrate that transmits more than 50% of light energy at a wavelength within the spectrum range including ultraviolet range, visible range, and infrared range.

In one embodiment, devices (10B, 10G, 10R, 10S) can include light emitting devices (10B, 10G, 10R). In one embodiment, each light emitting device (10B, 10G, 10R) can be configured to emit light of a single peak wavelength. It is understood that light emitting devices typically emit light of a narrow wavelength band centered around the single wavelength at which the intensity of light is at a maximum, and the wavelength of a light emitting device refers to the peak wavelength. For example, an array of first light emitting devices 10B can be formed on a first-type growth substrate 100B, an array of second light emitting devices 10G can be formed on a second-type growth substrate 100G, and an array of third light emitting devices 10R can be formed on a third-type growth substrate 100R. In addition, an array of sensor devices 10S can be formed on a fourth-type growth substrate 100S. Alternatively, one or more types of light emitting devices (10B, 10G, 10R) can be integrated light emitting devices that are configured to emit light of at least two different wavelengths. In one embodiment, the light emitting devices (10B, 10G, 10R) may comprise arrays of nanowires or other nanostructures.

Contact structures (not explicitly shown) such as contact pads are provided on each light emitting device (10B, 10G, 10R). The contact structures for each light emitting device (10B, 10G, 10R) can include an anode contact structure and a cathode contact structure. In case one or more of the light emitting devices (10B, 10G, 10R) is an integrated light emitting device configured to emit light of at least two different wavelengths, a common contact structure (such as a common cathode contact structure) can be employed. For example, a triplet of blue, green, and red light emitting devices embodied as a single integrated light emitting device may have a single cathode contact.

The array of light emitting devices (10B, 10G, 10R) on each initial growth substrate (101B, 101G, 101R) is configured such that the center-to-center spacing of light emitting devices on a backplane substrate to which the light emitting devices are subsequently transferred is an integer multiple of the center-to-center spacing of light emitting devices (10B, 10G, 10R) on the initial growth substrate (101B, 101G, 101R).

Each initial growth substrate (101B, 101G, 101R, 101S) and devices (10B, 10G, 10R, 10S) thereupon can be diced into suitable sizes. Each diced portion of the initial growth substrate (101B, 101G, 101R, 101S) is herein referred to as a growth substrate (100B, 100G, 100R, 100S). Assemblies of growth substrates (100B, 100G, 100R, 100S) with respective devices (10B, 10G, 10R, 10S) thereupon are thus generated. In other words, the growth substrates (100B, 100G, 100R, 100S) are either the entirety or the diced portions of the initial growth substrates (101B, 101G, 101R, 101S), and an array of devices (10B, 10G, 10R, 10S) is present on each growth substrate (100B, 100G, 100R, 100S). The array of devices (10B, 10G, 10R, 10S) on each growth substrate (100B, 100G, 100R, 100S) can be an array of devices of the same type.

Prior to, or after, each initial growth substrate (101B, 101G, 101R, 101S) is singulated to corresponding growth substrates (100B, 100G, 100R, 100S), each device (10B, 10G, 10R, 10S), e.g., a light emitting device, a group of light emitting devices, or a sensor device, can be mechanically isolated from one another by forming trenches between each neighboring pair of the devices. In an illustrative example, if a light emitting device array or a sensor array is disposed on an initial growth substrate (101B, 101G, 101R, 101S), the trenches can extend from the final growth surface of the light emitting device array or the sensor array to the top surface of the initial growth substrate (101B, 101G, 101R, 101S).

Various schemes may be employed to transfer each array of devices (10B, 10G, 10R, 10S) to a respective transparent substrate, which is herein referred to as a transfer substrate. FIGS. 2-6 illustrate an exemplary scheme that can be employed to transfer each array of devices (10B, 10G, 10R, 10S) to a respective transparent substrate.

Referring to FIG. 2, first carrier substrates 200 can be optionally employed in case the contact structures on each device (10B, 10G, 10R, 10S) are formed on the top side of each device (10B, 10G, 10R, 10S) during fabrication of the devices (10B, 10G, 10R, 10S) on the growth substrates (101B, 101G, 101R, 101S). The first carrier substrates 200 can be any suitable substrate that can be bonded to the devices (10B, 10G, 10R, 10S) and can provide structural support to the (10B, 10G, 10R, 10S). Each as-grown array of devices (10B, 10G, 10R, 10S) and a respective growth substrate 100 is bonded to a first carrier substrate 200. Thus, each growth substrate 100 can be bonded to a respective first carrier substrate 200 through the respective devices 10. In other words, the devices 10 are present between a growth substrate 100 and a first carrier substrate within each bonded structure (100, 10, 200). In an illustrative example, a first-type growth substrate 100B can be bonded to a first-type first carrier substrate 200B through first light emitting devices 10B, a second-type growth substrate 100G can be bonded to a second-type first carrier substrate 200G through second light emitting devices 10G, a third-type growth substrate 100R can be bonded to a third-type first carrier substrate 200R through third light emitting devices 10R, and a fourth-type growth substrate 100S can be bonded to a fourth-type first carrier substrate 200S through the sensor devices 10S.

Referring to FIG. 3, each growth substrate 100 can be removed from the transient bonded structure including the stack of the growth substrate 100, an array of devices 10, and the first carrier substrate 200. For example, if the growth substrate 100 is a silicon substrate, the growth substrate 100 can be removed by a wet chemical etch process, grinding, polishing, splitting (for example, at a hydrogen implanted layer), or a combination thereof. For example, splitting of a substrate can be performed by implanting atoms that form a weak region (such as hydrogen atoms implanted into a semiconductor material) and by applying a suitable processing conditions (for example, an anneal at an elevated temperature and/or mechanical force) to cause the substrate to split into two parts.

Figure 4:
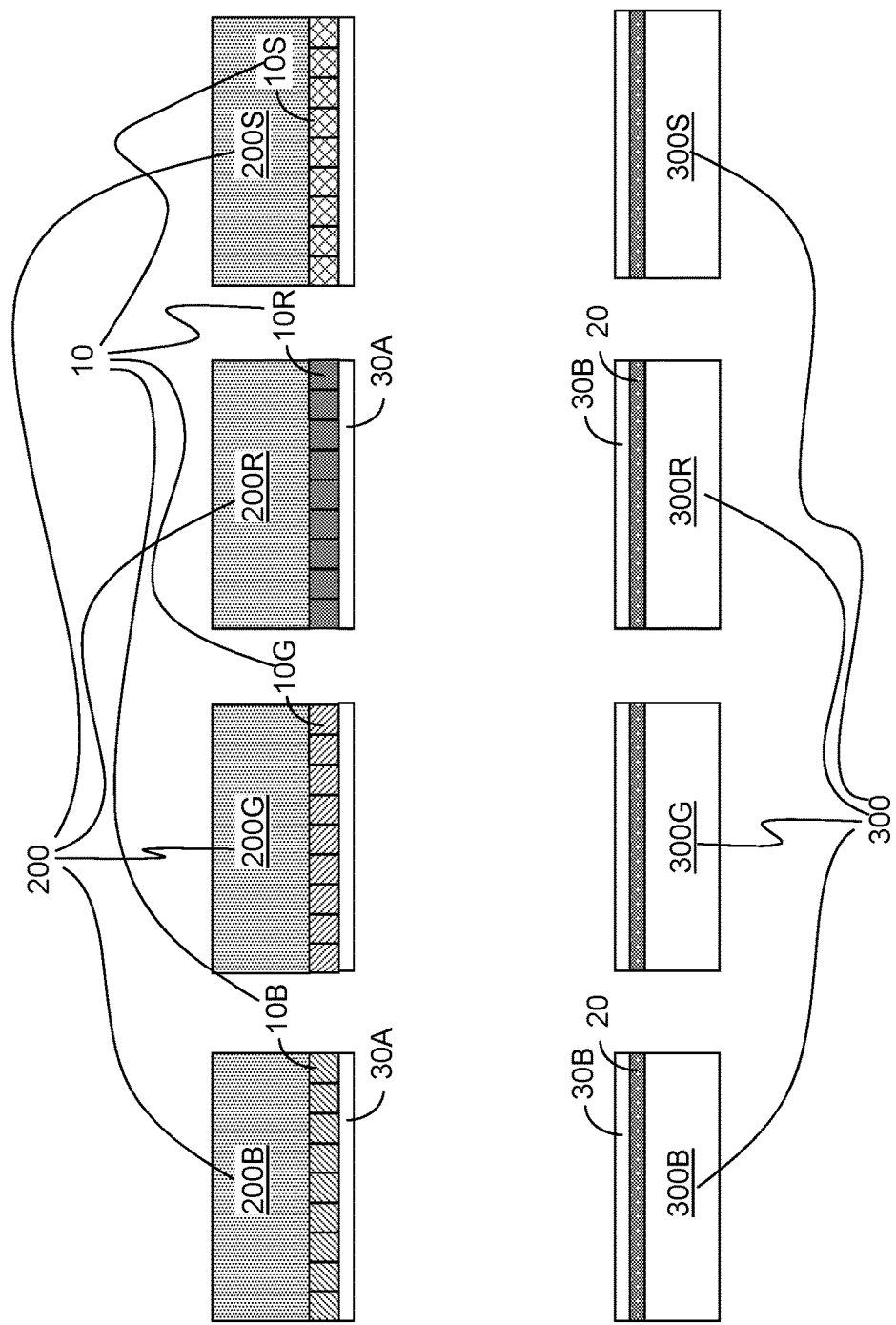
FIG. 4 is a schematic illustration of the step of forming a first bonding material layer on the first carrier substrates, providing second carrier substrate, and forming a release layer and a second bonding material layer according to an embodiment of the present disclosure.

Referring to FIG. 4, a first bonding material layer 30A can be formed on each first carrier substrate 200. The first bonding material layer 30A includes any bonding material that can be bonded to another bonding material upon suitable treatment (such as application of heat and/or pressure). In one embodiment, the first bonding material layer 30A can comprise a dielectric material such as silicon oxide, borophosphosilicate glass (BPSG), a spin-on glass (SOG) material, and/or an adhesive bonding material such as SU-8 or benzocyclobutene (BCB). The thickness of the first bonding material layer 30A can be in a range from 50 nm to 5 micron, although lesser and greater thicknesses can also be employed. In one embodiment, the first bonding material layer 30A can be a silicon oxide layer having a thickness of about 1 micron. The first bonding material layer 30A can be formed by a suitable deposition method such as chemical vapor deposition or spin coating.

Transfer substrates 300 are provided. As used herein, a "transfer substrate" refers to a substrate from which at least one device is transferred to a target substrate, which can comprise a backplane substrate. In one embodiment, each transfer substrate 300 can be a second carrier substrate, which can be employed to receive an array of devices from a respective first carrier substrate 200 and to carry the array of devices until a subset of the devices are transferred to the target substrate in a subsequent process.

In some embodiments, the transfer substrates 300 can be optically transparent at a laser wavelength. The laser wavelength is the wavelength of the laser beam to be subsequently employed to transfer devices individually and selectively from a respective transfer substrate 300 to the target substrate, and can be an ultraviolet wavelength, a visible wavelength, or an infrared wavelength. In one embodiment, the transparent substrates 300 can include sapphire, glass (silicon oxide), or other optically transparent material known in the art. In an alternative embodiment, the transfer substrates 300 can be transparent growth substrates or diced portions thereof. In some other embodiments in which initial growth substrates are cleaved (for example, at a layer implanted with hydrogen or noble gas) to provide a thin substrate from which light emitting diodes are transferred to a backplane without use of transfer substrates, the initial growth substrates may absorb laser at the laser wavelength.

A release layer 20 and a second bonding material layer 30B can be sequentially deposited on each transfer substrate 300. The release layer 20 includes a material that can provide sufficient adhesion to the transfer substrate 300 and is absorptive at the laser wavelength of the laser beam to be subsequently employed during a subsequent selective transfer process. For example, the release layer 20 can include silicon-rich silicon nitride or a semiconductor layer, such as a GaN layer that can be heated by laser irradiation. The thickness of the release layer 20 can be in a range from 100 nm to 1 micron, although lesser and greater thicknesses can also be employed.

The second bonding material layer 30B can comprise a dielectric material such as silicon oxide. The thickness of the second bonding material layer 30B can be in a range from 50 nm to 5 micron, although lesser and greater thicknesses can also be employed. In one embodiment, the second bonding material layer 30B can be a silicon oxide layer having a thickness of about 1 micron. The second bonding material layer 30B can be formed by a suitable deposition method such as chemical vapor deposition or spin coating.

A transfer substrate 300 can be provided for each first carrier substrate 200. For example, a first transfer substrate 300B can be provided for the first-type first carrier substrate 200B; a second transfer substrate 300G can be provided for the second-type first carrier substrate 200G; a third transfer substrate 300R can be provided for the third-type first carrier substrate 300R; and an additional transfer substrate 300S can be provided for the additional type first carrier substrate 300S. Multiple stacked structures can be formed, which include a first stacked structure (300B, 20, 30B) including a stack of the first transfer substrate 300B, a release layer 20, and a second bonding material layer 30B; a second stacked structure (300G, 20, 30B) including a stack of the second transfer substrate 300G, a release layer 20, and a second bonding material layer 30B; a third stacked structure (300R, 20, 30B) including a stack of the third transfer substrate 300R, a release layer 20, and a second bonding material layer 30B; and an additional stacked structure (300S, 20, 30B) including a stack of the additional transfer substrate 300S, a release layer 20, and a second bonding material layer 30B.

The combination of the array of first light emitting devices 10B and the first transfer substrate 300B is herein referred to as a first transfer assembly (300B, 10B), the combination of the second light emitting devices 10G and the second transfer substrate 300G is herein referred to as a second transfer assembly (300G, 10G), and the combination of the third light emitting devices 10R and the third transfer substrate 300R is herein referred to as a third transfer assembly (300R, 10R). In addition, the combination of the sensor devices 10S and the fourth transfer substrate 300S is herein referred to as fourth transfer assembly (300S, 10S).

Referring to FIG. 5, each pair of a first carrier substrate 200 and a transfer substrate 300 (which can be a second carrier substrate) can be bonded. For example, the second bonding material layer 30B can be bonded with the respective first bonding material layer 30A on the corresponding first carrier substrate 200 to form a bonding material layer 30. Each bonded assembly comprises a first transfer substrate 300, a release layer 20, a bonding material layer 30, and an array of devices 10.

Referring to FIG. 6, a first carrier substrate 200 is removed from each bonded assembly (300, 20, 30, 200), for example, by polishing, grinding, cleaving, and/or chemical etching. Each array of devices 20 can be disposed on a transfer substrate 300, which is a transparent carrier substrate with a release layer 20 thereupon, i.e., between the transparent carrier substrate and the array of devices 20.

Figure 7:
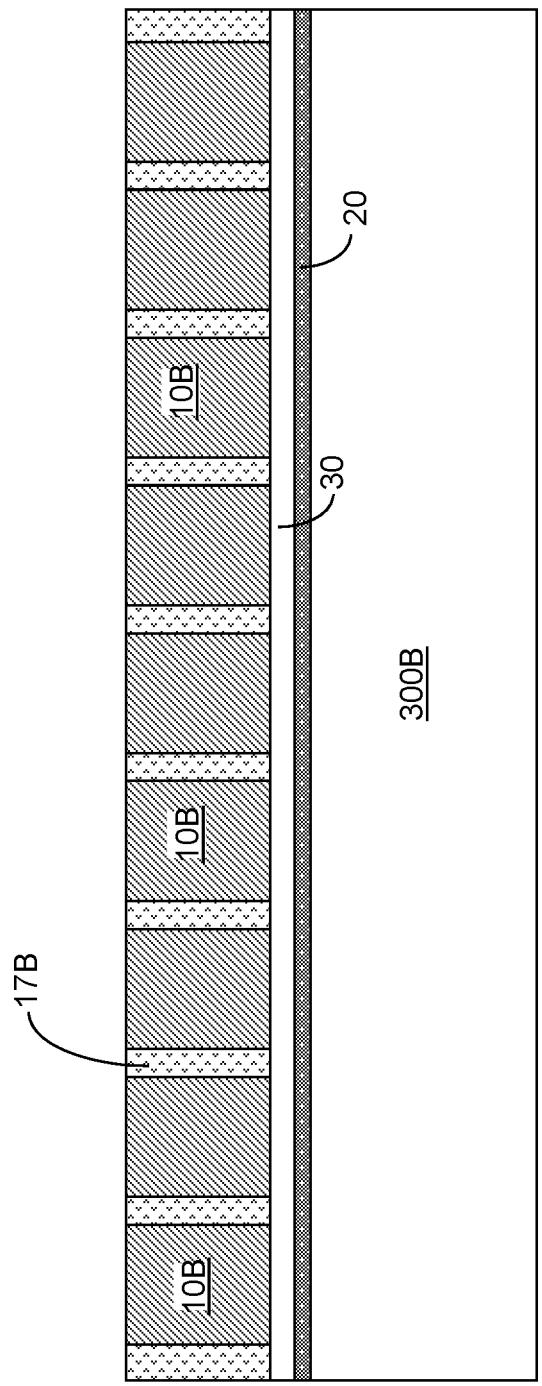
FIG. 7 is a vertical cross-sectional view of a second carrier substrate, an array of first light emitting devices thereupon, and an optional optical protection material layer that fills gaps among the first light emitting devices according to an embodiment of the present disclosure.

Referring to FIG. 7, each array of devices 10 on a respective transfer substrate 300 can be arranged such that each device 10 is laterally spaced from neighboring devices 10 by trenches. For example, the array of first light emitting devices 10B on the first transfer substrate 300B can be laterally spaced from one another by trenches. Optionally, a first optical protection material layer 17B can be applied to fill the gaps among the first light emitting devices 10B. Similarly, an optical protection material layer can be applied to fill the gaps among each array of devices 10 on other transfer substrates (300G, 300R, 300S). Each optical protection material layer comprises a material that absorbs or scatters light at the laser wavelength of the laser beam to be subsequently employed. Each optical protection material layer can include, for example, silicon-rich silicon nitride, an organic or inorganic antireflective coating (ARC) material, or a photoresist material. Each optical protection material layer can be formed such that the outside surfaces of the devices 10 are not covered by the optical protection material layer. The optical protection material layers can be formed, for example, by spin coating or by a combination of deposition and a recess etch.

Each assembly (300, 20, 30, 10) comprising a transfer substrate 300 and an array of devices 10 can further comprise a release layer 20 contacting the respective transfer substrate 300 and comprising a material that absorbs light at a wavelength selected from ultraviolet range, visible range, and infrared range, and a bonding material layer 30 contacting the release layer 20 and the respective array of devices 10.

Referring to FIG. 8, a backplane substrate 400 is provided. The backplane substrate 400 is a substrate onto which various devices can be subsequently transferred. In one embodiment, the backplane substrate 400 can be a substrate of silicon, glass, plastic, and/or at least other material that can provide structural support to the devices to be subsequently transferred thereupon. In one embodiment, the backplane substrate 400 may be a passive backplane substrate, in which metal interconnect structures 440 comprising metallization lines are present, for example, in a criss-cross grid and active device circuits are not present. In another embodiment, the backplane substrate 400 may be an active backplane substrate, which includes metal interconnect structures 440 as a criss-cross grid of conductive lines and further includes a device circuitry at one or more intersections of the criss-cross grid of conductive lines. The device circuitry can comprises one or more transistors.

Referring to FIG. 9, a backplane 401 including stepped horizontal surfaces is formed. As used herein, "stepped horizontal surfaces" refer to a set of horizontal surfaces that are vertically spaced apart and connected by steps. In one embodiment, the stepped horizontal surfaces can be formed by adding various dielectric material layers 410 and additional metal interconnect structures embedded in the additional dielectric material layers 410 to the backplane substrate 400. In one embodiment, the various dielectric material layers 410 can comprise a plurality of portions of an upper dielectric material layer 413 overlying the dielectric material matrix, a plurality of portions of an intermediate dielectric material layer 412 interposed between the upper dielectric material layer 413 and the dielectric material matrix, and a plurality of portions of a lower dielectric material layer 411 interposed between the intermediate dielectric material layer 412 and the dielectric matrix. Alternatively, surface portions of the backplane substrate 401 as provided at the processing step of FIG. 8 can be recessed to different depths to form the backplane 401 including stepped horizontal surfaces. The stepped horizontal surfaces can be provided at a top side of the backplane 401.

A first subset of the stepped horizontal surfaces can be located within a first horizontal surface plane HSP1, which is the horizontal plane containing the topmost horizontal surfaces of the backplane 401. A second subset of the stepped horizontal surfaces can be located within a second horizontal surface plane HSP2, which may be more proximal to a backside surface 409 of the backplane 401 than the first subset of stepped horizontal surfaces is to the backside surface 409 of the backplane 401. A third subset of the stepped horizontal surfaces can be located within a third horizontal surface plane HSP3, which may be more proximal to the backside surface 409 of the backplane 401 than the second subset of stepped horizontal surfaces is to the backside surface 409 of the backplane 401. An additional subset of the stepped horizontal surfaces can be located within an additional horizontal surface plane HSP4, which may be more proximal to the backside surface 409 of the backplane 401 than the third subset of stepped horizontal surfaces is to the backside surface 409 of the backplane 401. The first subset of the stepped horizontal surfaces can be formed in a first region R1, the second subset of the stepped horizontal surfaces can be formed in a second region R2, the third subset of the stepped horizontal surfaces can be formed in a third region R3, and the additional subset of the stepped horizontal surfaces can be formed in a fourth region R4. The first region R1 includes locations at which first type devices, such as first light emitting devices 10B, are to be subsequently attached. The second region R2 includes locations at which second type devices, such as second light emitting devices 10G, are to be subsequently attached. The third region R3 includes locations at which third type devices, such as third light emitting devices 10R, are to be subsequently attached. The fourth region R4 includes locations at which fourth type devices, such as sensor devices 10S, are to be subsequently attached.

In one embodiment, horizontal top surfaces of the upper dielectric material layer 413 can constitute the first subset of the stepped horizontal surfaces, horizontal top surfaces of the intermediate dielectric material layer 412 can constitute the second subset of the stepped horizontal surfaces, horizontal top surfaces of the lower dielectric material layer 411 can constitute the third subset of the stepped horizontal surfaces, and physically exposed surfaces of the backplane substrate 400 can constitute the fourth subset of the stepped horizontal surfaces.

A bond pad 420 can be provided d at each location at which a device is to be subsequently bonded. For example, the bond pads 420 can be formed at each intersection of the criss-cross lines of the metal interconnect structures 440 in the backplane 401. The bond pads 420 cam comprise metallic pads including a metallic material such as Sn, AuSn, SAC, or other solderable metal. Additionally or alternatively, the bond pads 420 can comprise Cu or Au or other metal that can, through a thermocompression process, form a contact with another metal. The bond pads 420 can be embedded within the backplane 401 as components of the metal interconnect structures 440, or can be formed on top of dielectric surfaces of the backplane 401.

In one embodiment, the center-to-center spacing of bond pads 420 on the backplane 401 can be an integer multiple of the center-to-center spacing of the devices 10 on a respective growth substrate 100, on a respective first carrier substrate 200, or on a respective transfer substrate 300.

In one embodiment, the backplane 401 can comprise metal interconnect structures 440 embedded within a dielectric material matrix. The bond pads 420 are electrically connected to a respective metal interconnect structure 440 within the backplane 440. As used herein, a first element is "electrically connected to" a second element if the first element is electrically shorted to the second element.

In one embodiment, the bond pads 420 on the backplane 401 can be configured to align with contact pads on the devices 10 (such as light emitting devices). One or more bond pads 401 may be provided in a group. For example, if a device 10 to be transferred to the backplane 401 comprises a plurality of red, green, and blue light emitting diodes (LEDs), there may be a group of four bond pads 420 arranged in alignment with contact pads on the LED. For example, the group of bond pads 410 can include an anode contact for the red LED, an anode contact for the blue LED, an anode contact for the green LED, and a cathode contact. For example, if a device 10 to be transferred to the backplane 401 comprises a single LED, there may be a group of two bond pads 420 arranged in alignment with contact pads on the LED.

Referring to FIG. 10, a protective layer 422 including an optical protection material can be optionally formed on the side of the backplane 401. The protective layer 422 includes a material that absorbs or scatters light at the laser wavelength of the laser beam to be subsequently employed. In one embodiment, the protective layer 422 can include a dielectric material such as silicon-rich silicon nitride or an antireflective coating material. The thickness of the protective layer 422 can be in a range from 200 nm to 2 microns, although lesser and greater thicknesses can also be employed. The protective layer 422 can be formed such that conductive bonding structures (i.e., contact structures) to be subsequently formed can contact the bond pads 420. Suitable openings can be formed in the protective layer 422. In one embodiment, all openings in the protective layer 422 can be formed in the same patterning step. In another embodiment, the opening in the protective layer 422 can be sequentially formed, for example, immediately before formation of each set of conductive bonding structures.

Referring to FIG. 11, conductive bonding structures (430B, 430G, 430R, 430S) can be formed on the horizontal stepped surfaces located on the top side of the backplane 401. The conductive bonding structures 430 can include first conductive bonding structures 430B that are formed on the first subset of horizontal stepped surfaces in the first region R1, second conductive bonding structures 430G that are formed on the second subset of horizontal stepped surfaces in the second region R2, third conductive bonding structures 430R that are formed on the third subset of horizontal stepped surfaces in the third region R3, and additional conductive bonding structures 430S that are formed on the fourth subset of horizontal stepped surfaces in the fourth region R1.

The first conductive bonding structures 430B are formed at locations at which transfer of first light emitting devices 10B is desired. The second conductive bonding structures 430G are formed at locations at which transfer of second light emitting devices 10G is desired. The third conductive bonding structures 430R are present at locations at which transfer of third light emitting devices 10R is desired. The additional conductive bonding structures 430S are present at locations at which transfer of sensor devices 10S is desired.

In one embodiment, each of the conductive bonding structures 430 can comprise a metal stack that can bond with the bond pads 420 provided on the backplane 401. In one embodiment, the conductive bonding structures 430 can comprise copper and/or gold, and the bonding pads can be formed of Sn. In one embodiment, the conductive bonding structures 430 can comprise a layer of Au, and the bond pads 420 can be formed of AuSn or an Sn—Ag—Cu alloy. In another embodiment, the conductive bonding structures 430 can be formed of copper, and the bond pads can be formed of copper. The conductive bonding structures 430 are electrically connected to a respective the metal interconnect structure 440 within the backplane 401. In general, various conductive bonding structures that can be employed for the purposes of the present disclosure can include (1) a lower conductive material (such as copper or aluminum that is electrically attached to the circuitry of the backplane), (2) one or more thin layers for adhesion, which covers the lower conductive material and provides a diffusion barrier (such as a TiPt layer), and (3) a solderable material (such as pure tin or indium, or alloys such as AuSn or SAC).

In one embodiment, the conductive bonding structures 430 can be employed to electrically and mechanically join various devices to be transferred to the backplane 401. The various devices can include light emitting diode (LED) subpixels, sensor pixels, and other electronic elements. Additional contacts can be formed on other horizontal surfaces of the set of stepped horizontal surfaces at this step, or can be formed at subsequent processing steps.

The various conductive bonding structures (which include the conductive bonding structures 430) may be formed on multiple horizontal planes that are vertically offset. For example, for a three-color RGB display panel comprising sensors, the various conductive bonding structures can be arranged in four different horizontal planes. In an illustrative example, the conductive bonding structures of the blue subpixels in the display panel can be located on a first plane such as the first horizontal surface plane HSP1 containing the first subset of the stepped horizontal surfaces. The various conductive bonding structures for all of the green subpixels can be located on a second plane such as the second horizontal surface plane HSP2 containing the second subset of the stepped horizontal surfaces. The second plane can be a certain distance, for example, 2 micron, lower than the first plane. The various conductive bonding structures for all of the red subpixels can be located on a third plane such as the third horizontal surface plane HSP3 containing the third subset of the stepped horizontal surfaces. The third plane can be, for example, 4 micron lower than the first contact plane. The conductive bonding structures for all of the sensor subpixels can be formed on a fourth plane such as the additional horizontal surface plane HSP1 containing the additional subset of the stepped horizontal surfaces. The fourth plane can be, for example, 6 microns lower than the first contact plane. A display panel with a greater number of colors than three colors, such as a four-color display panel or a five-color display panel, can be formed in the same manner. One of the advantage a display panel with more than three colors is that such a display panel can be less sensitive to non-uniform or dead pixels.

Each of the second conductive bonding structures 430G can have the same material stack (or the same material composition) as any embodiment of the first conductive bonding structures 430B. The second conductive bonding structures 430G are electrically connected to a respective the metal interconnect structure 440 within the backplane 401. In one embodiment, the second conductive bonding structures 430G can be employed to electrically and mechanically join various devices to be transferred to the backplane 401. In one embodiment, the second conductive bonding structures 430G can have a greater height than the first conductive bonding structures 430B. In other words, the first conductive bonding structures 430B can have a lesser height than the second conductive bonding structures 430G.

Each of the third conductive bonding structures 430R can have the same material stack (or the same material composition) as any embodiment of the first conductive bonding structures 430B or the second conductive bonding structures 430G. The third conductive bonding structures 430R are electrically connected to a respective the metal interconnect structure 440 within the backplane 401. In one embodiment, the third conductive bonding structures 430R can be employed to electrically and mechanically join various devices to be transferred to the backplane 401. In one embodiment, the third conductive bonding structures 430R can have a greater height than the second conductive bonding structures 430G. In other words, the second conductive bonding structures 430G can have a lesser height than the third conductive bonding structures 430R.

Each of the additional conductive bonding structures 430S can have the same material stack (or the same material composition) as any embodiment of the first conductive bonding structures 430B or the second conductive bonding structures 430G or the third conductive bonding structures 430R. The additional conductive bonding structures 430S are electrically connected to a respective the metal interconnect structure 440 within the backplane 401. In one embodiment, the additional conductive bonding structures 430S can be employed to electrically and mechanically join various devices to be transferred to the backplane 401. In one embodiment, the additional conductive bonding structures 430S can have a greater height than the third conductive bonding structures 430R. In other words, the third conductive bonding structures 430R can have a lesser height than the additional conductive bonding structures 430S.

Figure 12:
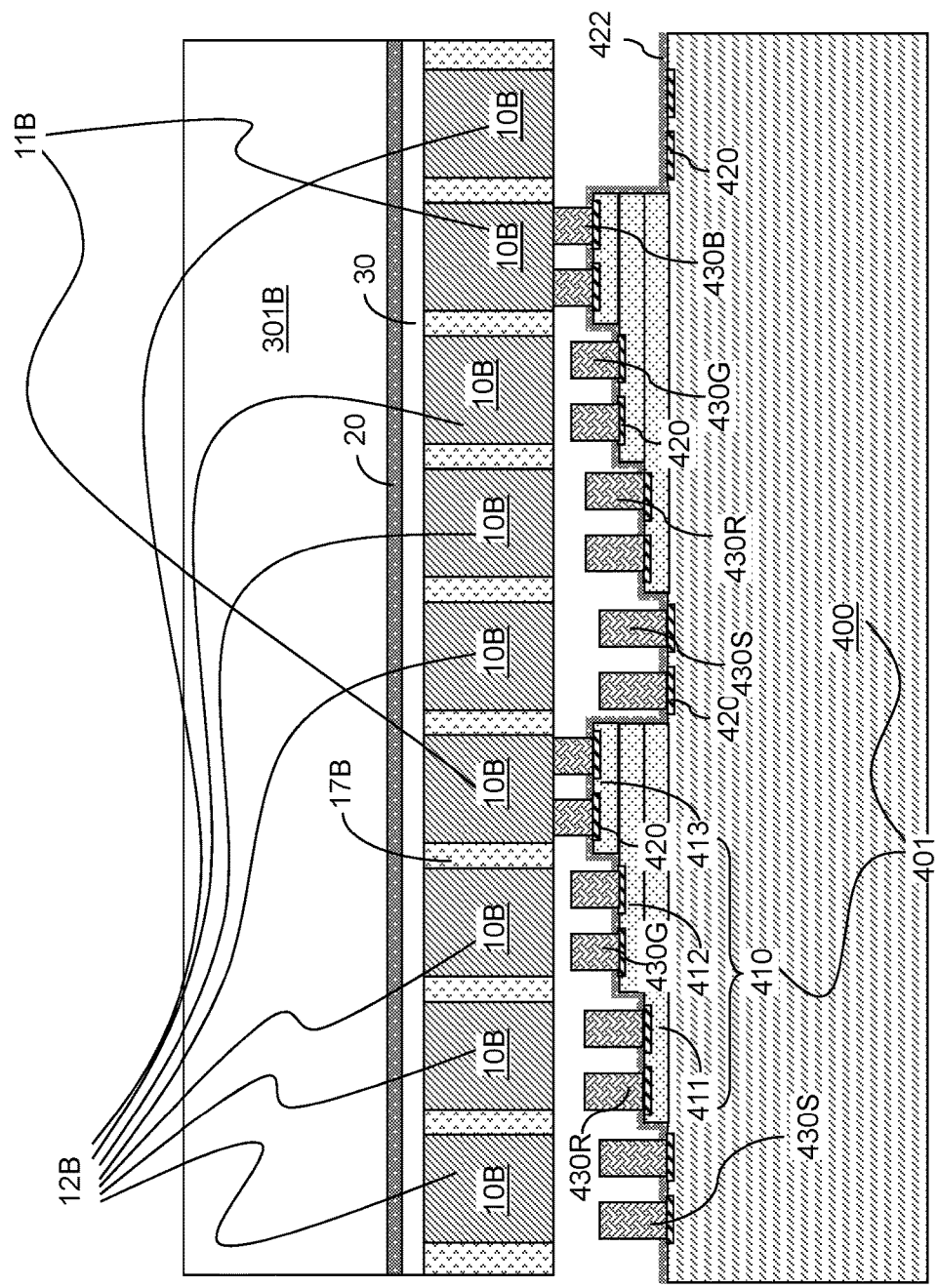
FIG. 12 is a vertical cross-sectional view of the backplane while bonding a first subset of the first light emitting devices on a first transfer substrate to the first conductive bonding structures on a first subset of horizontal stepped surfaces of the backplane according to an embodiment of the present disclosure.

Referring to FIG. 12, an assembly comprising a first transfer substrate 301B and first light emitting devices 10B that emits light of a first wavelength is disposed on the backplane 401 so that a first subset 11B of the first light emitting devices 10B contacts the first conductive bonding structures 430B and a second subset 12B of the first light emitting devices 10B does not contact any conductive bonding structure. The assembly comprising the first transfer substrate 301B and the first light emitting devices 10B is aligned to the backplane 401 so that the contact pads (not shown) of the first subset 11B of the first light emitting devices 10B contact respective first conductive bonding structures 430B. Specifically, the array of the first light emitting devices 10B can be aligned over the backplane 401 such that each bond pad 420 and a corresponding contact pad of an overlying first light emitting device 10B contact the first conductive bonding structure 430B located therebetween.

The first subset 11B of the first light emitting devices 10B on the first transfer substrate 301B is bonded to the first conductive bonding structures 430B, which are located on the first subset of horizontal stepped surfaces of the backplane 401. In one embodiment, the bond pads 420 can be solderable bond pad, and a heat cycle can be applied to the backplane 401 and the first transfer substrate 301B such that a solder material reflows and the bond pads 420 are attached to the first conductive bonding structures 430B. In one embodiment, the bond pads 420 can be cold bonding bond pad, and the first conductive bonding structures 430B can be metal stud bumps such as Cu stud bumps. In this case, a mechanical force is applied such that each bond pad 420 and a corresponding first conductive bonding structure 430B mate with each other. Optionally, the first transfer substrate 301B can be thinned to a thickness less than 100 microns prior to alignment with the backplane 401.

Figure 13:
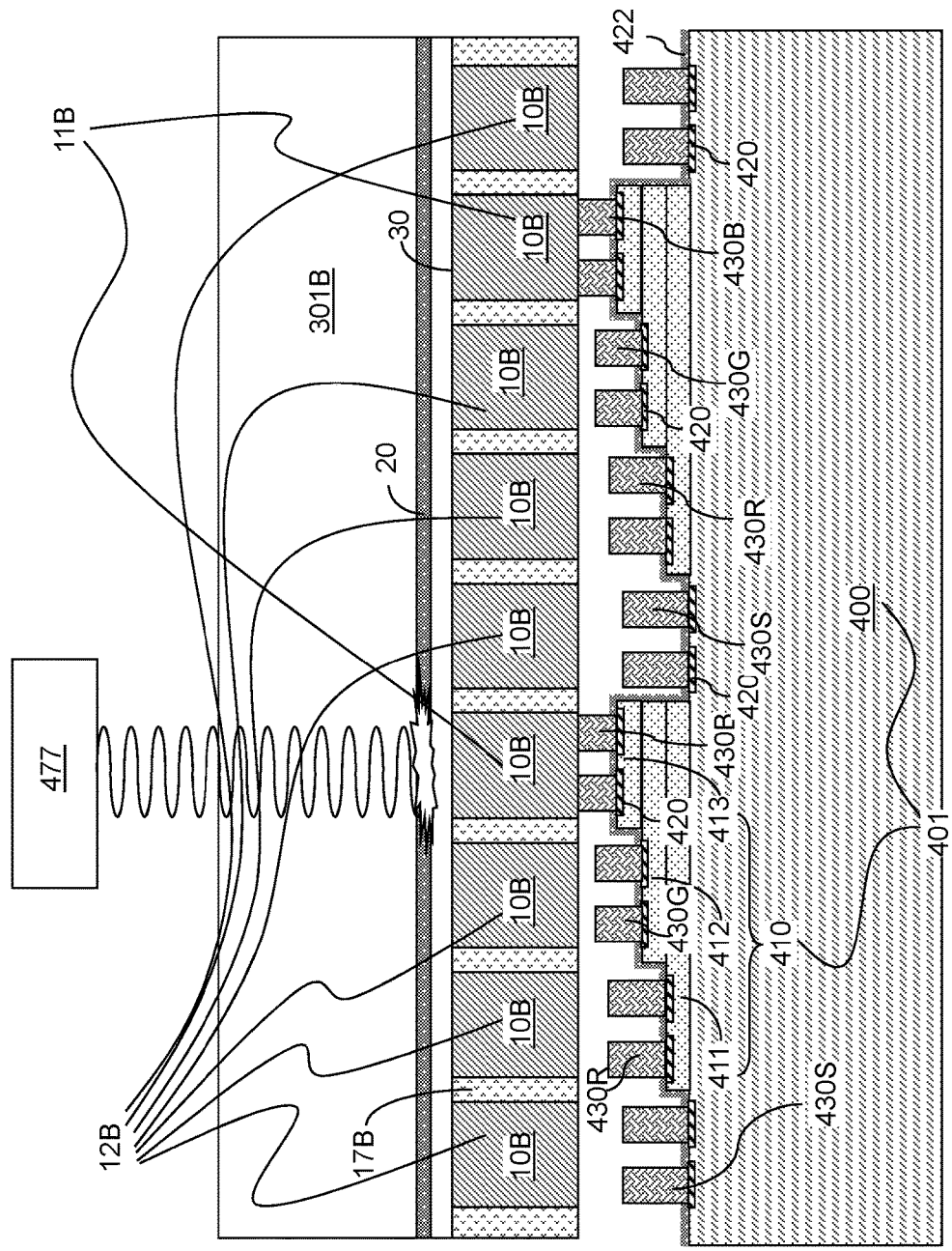
FIG. 13 is a vertical cross-sectional view of the backplane and the first transfer substrate while detaching a light emitting device among the first subset of the first light emitting devices employing laser irradiation and ablation of a portion of the release layer in the first transfer substrate according to an embodiment of the present disclosure.

Referring to FIG. 13, each first light emitting device 10B that is bonded to the first conductive bonding structures 430B can be dissociated from the first transfer substrate 301B individually, while first light emitting devices 10B that are not bonded to the first conductive bonding structures 430B remain intact, i.e., are not detached. The set of the first light emitting devices 10B that are bonded to the first conductive bonding structures 430B is the first subset 11B of the first light emitting devices 10B, and the set of first light emitting devices 10B that are not bonded to the first conductive bonding structures 430B is the second subset 12B of the first light emitting devices 10B. Each first light emitting device 10B among the first subset 11B of the first light emitting devices 10B can be detached employing targeted laser irradiation emitted by a laser 477. The material of the release layer 20 is selected such that the laser beam is absorbed by the release layer 20. The size of the laser beam, or the size of the raster area of the laser beam if the laser beam is rastered, can be selected to substantially match the area of a single first light emitting device 10B. The first optical protection material layer 17B, if present, can absorb or reflect the portion of the laser beam that collaterally impinges thereupon. In one embodiment, the irradiated portion of the release layer 20 can be ablated. Further, a portion of the bonding material layer 30 that underlies the ablated portion of the release layer 20 can be collaterally ablated or structurally damaged during the laser irradiation.

Each portion of the release layer 20 that overlies the first subset 11B of the first light emitting devices 10B is irradiated by the laser beam sequentially, i.e., one at a time. The portions of the release layer 20 that are irradiated by the laser beam are collectively referred to as first portions of the release layer 20, while the portions of the release layer 20 that are not irradiated by the laser beam are collectively referred to as second portions of the release layer 20. The first portions of the release layer 20 that overlies the first subset 11B of the first light emitting devices 10B are selectively and sequentially removed, while the second portions of the release layer 20 that overlie the second subset 12B of the first light emitting devices 10B are not removed. The first transfer substrate 301B comprises a material that is optically transparent at the laser wavelength.

In one embodiment, the release layer 20 can comprise silicon nitride, the laser wavelength can be an ultraviolet wavelength (such as 248 nm or 193 nm), and irradiating the first portions of the release layer 20 with the laser beam ablates the first portions of the release layer 20. The process of selectively removing the first portions of the release layer 20 while not removing the second portions of the release layer 20 is herein referred to as an area-selective laser lift-off process or a die-selective laser lift-off process. The size of the area of laser irradiation (i.e., the shot size) of the laser beam can be selected such that the area of the laser irradiation is slightly greater than the area of each first light emitting device 10B (or a plurality of first light emitting devices in case multiple first light emitting devices 10B are transferred at the same time). Only the first subset 11B of first light emitting devices 10B, i.e., the subset of the first light emitting devices 10B (or groups of first light emitting devices 10B) which have their respective conductive contact structures 430B bonded to the underlying bond pads 420, is processed by the selective laser lift-off process. The laser beam is steered away from the second subset 12B of the first light emitting devices 10B that are not bonded to the backplane 401.

Figure 14:
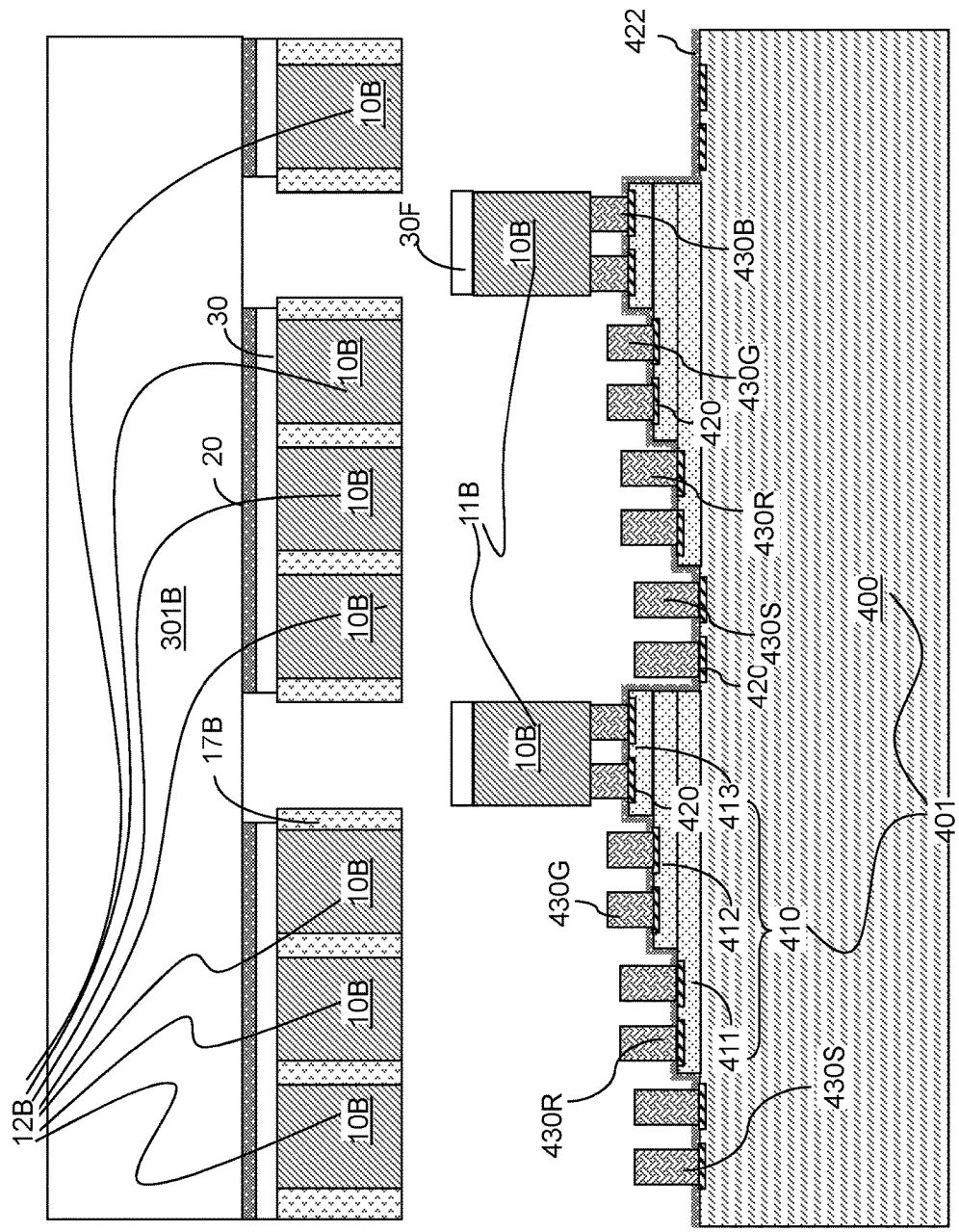
FIG. 14 is a vertical cross-sectional view of the backplane after separating the first transfer substrate according to an embodiment of the present disclosure.

Referring to FIG. 14, after all first portions of the release layer 20 overlying the first subset 11B of first light emitting devices 10B are removed, the first transfer substrate 301B can be separated from the backplane 401 by pulling the first transfer substrate 301B and/or the backplane 401 from each other. In one embodiment, a remnant portion 30F of the bonding material layer 30 can be formed on at least one of the first subset 11B of the first light emitting devices 10B after the first portions of the release layer 20 are irradiated with the laser beam. In another embodiment, the portions of the bonding material layer 30 underneath the irradiated portions of the release layer 20 can be ablated or liquefied and flow out, for example, along sidewalls of an underlying first light emitting device 10B. If any portion of the bonding material layer 30 remains underneath the irradiated portions of the release layer 20, the periphery of such a portion can be fractured while the assembly comprising the first transfer substrate 301B and the second subset 12B of the first light emitting devices 10B is separated from the backplane 401. The separation of the assembly comprising the first transfer substrate 301B and the second subset 12B of the first light emitting devices 10B from the backplane 401 can be performed while the first subset 11B of the first light emitting devices 10B remains bonded to the first conductive bonding structures 430B.

The second subset 12B of the first light emitting devices 10B can be employed to subsequently transfer another subset of the first light emitting devices 10B to another backplane (not shown). The second light emitting devices 10G on the second transfer substrate 300G (See FIG. 6) can be similarly employed to transfer a subset of the second light emitting devices 10G to yet another backplane (not shown). The third light emitting devices 10R on the third transfer substrate 300R (See FIG. 6) can be similarly employed to transfer a subset of the third light emitting devices 10R to still another backplane (not shown). The sensor devices 10S on the additional transfer substrate 300S (See FIG. 6) can be similarly employed to transfer a subset of the sensor devices 10S to even another backplane (not shown).

Optionally, a wet chemical clean process can be performed to remove residual material from the backplane 401 and the first subset 11B of first light emitting devices 10B thereupon. For example, dilute hydrofluoric acid can be employed to remove residual material from the surfaces of the backplane 401 and the first subset 11B of first light emitting devices 10B.

Figure 15:
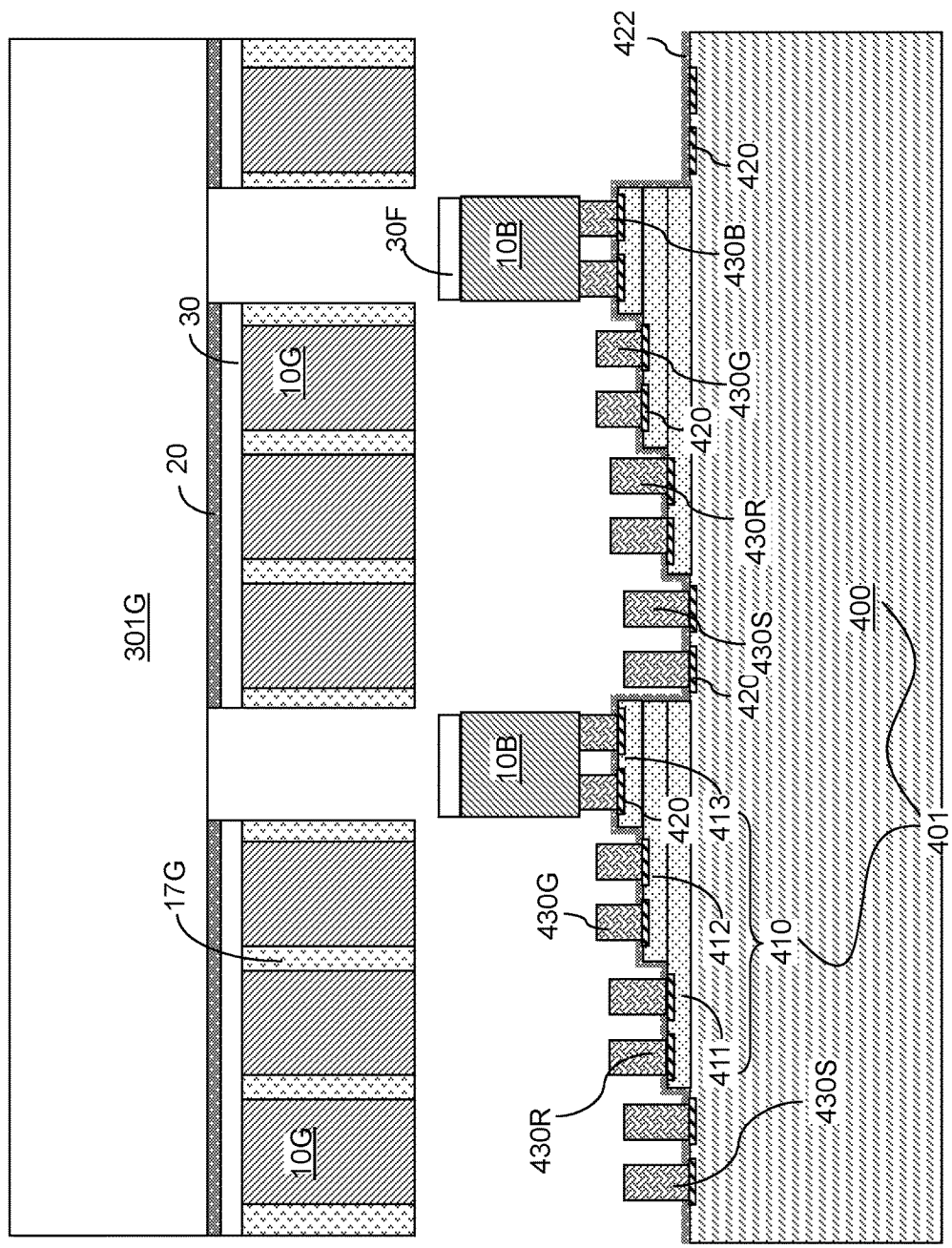
FIG. 15 is a vertical cross-sectional view of the backplane after aligning a second transfer substrate with second light emitting devices thereupon according to an embodiment of the present disclosure.
Figure 16:
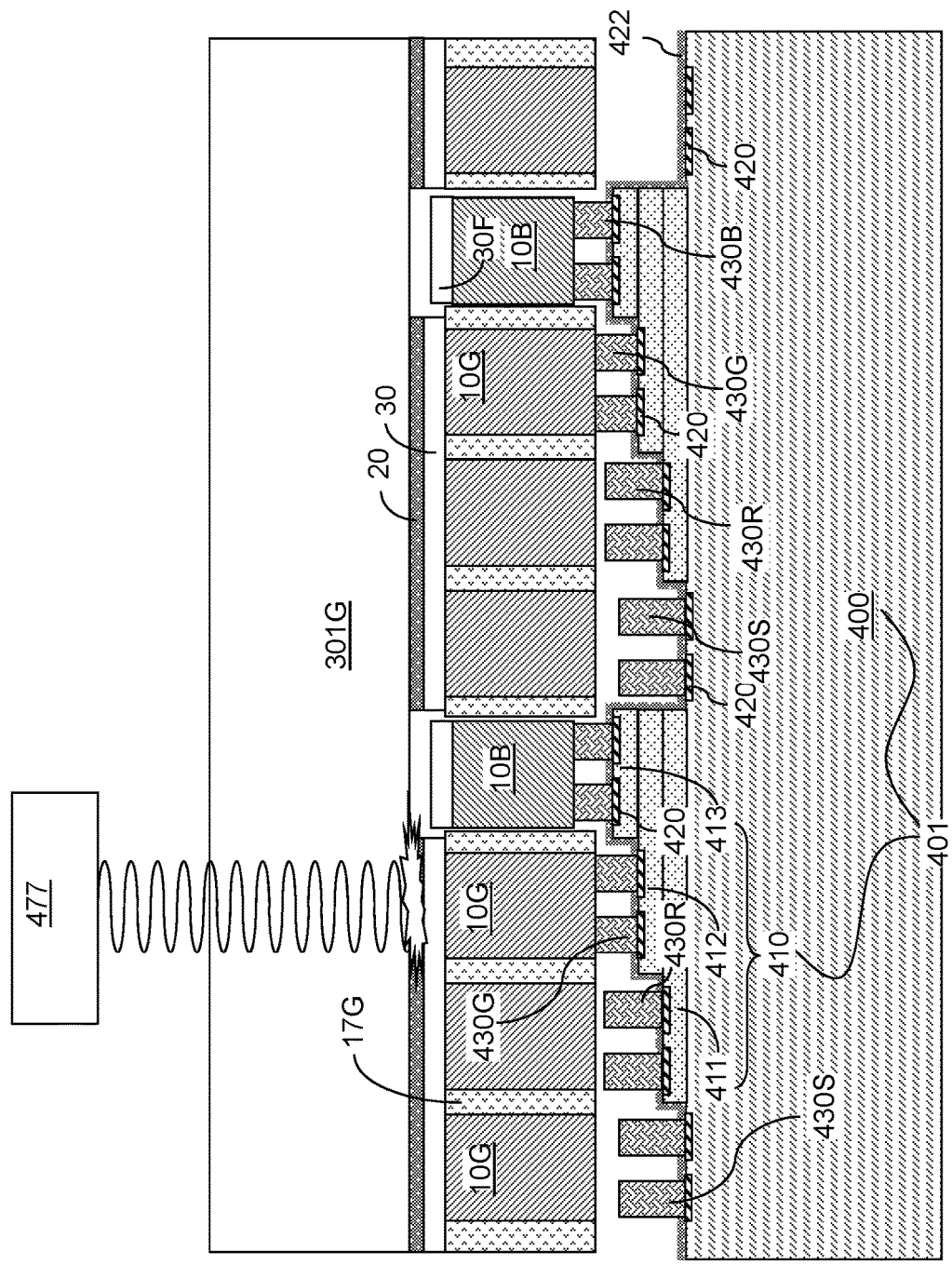
FIG. 16 is a vertical cross-sectional view of the backplane and the second transfer substrate while detaching a light emitting device among a first subset of the second light emitting devices employing laser irradiation and ablation of a portion of the release layer in the second transfer substrate according to an embodiment of the present disclosure.

Referring to FIG. 15, an assembly comprising a second transfer substrate 301G and second light emitting devices 10G that emits light of a second wavelength is provided. The second wavelength is different from the first wavelength. For example, the first wavelength can be a wavelength of blue light, and the second wavelength can be a wavelength of green light. The second light emitting devices 10G are not present in positions that correspond to positions over the backplane 401 at which the first subset of the first light emitting devices 10B is present in a configuration in which the second light emitting devices 10G face the top side of the backplane 401. In other words, the second light emitting devices 10G are not present in areas that overlap with the areas of the first subset of the first light emitting devices 10B in a configuration in which the second light emitting devices 10G face downward and the first subset of the first light emitting devices 10B on the backplane 401 face upward. In one embodiment, any second light emitting device 10G located in positions that would overlap with preexisting first devices 10B on the backplane 401 can be removed from the second transfer substrate 301G before the second transfer substrate 301G is aligned with the backplane 401 for transfer of a subset of the second light emitting devices 10G. Optionally, a second optical protection material layer 17G can be applied to fill the gaps among the second light emitting devices 10G prior to removal of a subset of the second light emitting devices 10G from overlapping locations. The second optical protection material layer 17G can have the same composition as the first optical protection material layer 17B. By ensuring that the second light emitting devices 10G are not present in positions that correspond to positions over the backplane 401 at which the first subset of the first light emitting devices 10B is present, potential collision between second light emitting devices 10G and the first subset of the first light emitting devices 10B can be avoided when the second transfer substrate 301G is subsequently disposed on the backplane 401 to bond a subset of the second light emitting devices 10G.

After aligning the assembly of the second transfer substrate 301G and the second light emitting devices 10G to the backplane 401, the assembly of the second transfer substrate 301G and the second light emitting devices 10G is disposed on the backplane 401 so that a first subset of the second light emitting devices 10G contacts the second conductive bonding structures 430G and a second subset of the second light emitting devices 10G does not contact any conductive bonding structure. The contact pads (not shown) of the first subset of the second light emitting devices 10G contact respective second conductive bonding structures 430G. Specifically, the array of the second light emitting devices 10G can be aligned over the backplane 401 such that each bond pad 420 and a corresponding contact pad of an overlying second light emitting device 10G contact the second conductive bonding structure 430G located therebetween.

The second conductive bonding structures 430G are present at locations at which transfer of second light emitting devices 10G is desired. The first subset of the second light emitting devices 10G on the second transfer substrate 301G is bonded to the second conductive bonding structures 430G, which are located on the second subset of horizontal stepped surfaces of the backplane 401. Each pair of a bond pad 420 and an overlying contact pads on the first subset of the second light emitting devices 10G can be bonded through a respective second conductive bonding structures 430G employing any of the bonding methods described above, i.e., the bonding methods that can be employed to bond pairs of a bond pad 420 and an overlying contact pads on the first subset of the first light emitting devices 10B through a respective first conductive bonding structures 430B.

Subsequently, each second light emitting device 10G that is bonded to the second conductive bonding structures 430G can be dissociated from the second transfer substrate 301G individually, while second light emitting devices 10G that are not bonded to the second conductive bonding structures 430G remain intact, i.e., are not detached. The set of the second light emitting devices 10G that are bonded to the second conductive bonding structures 430G is the first subset of the second light emitting devices 10G, and the set of second light emitting devices 10G that are not bonded to the second conductive bonding structures 430G is the second subset of the second light emitting devices 10G. Each second light emitting device 10G among the first subset of the second light emitting devices 10G can be detached employing targeted laser irradiation emitted by a laser 477 in the same manner employed to detach the first subset of the first light emitting devices 10B in a prior processing step. Thus, the first portions of the release layer 20 that overlies the first subset of the second light emitting devices 10G are selectively and sequentially removed, while the second portions of the release layer 20 that overlie the second subset of the second light emitting devices 10G are not removed. The second transfer substrate 301G comprises a material that is optically transparent at the laser wavelength. In one embodiment, the release layer 20 can comprise silicon nitride, the laser wavelength can be an ultraviolet wavelength (such as 248 nm or 193 nm), and irradiating the first portions of the release layer 20 with the laser beam ablates the first portions of the release layer 20.

Figure 17:
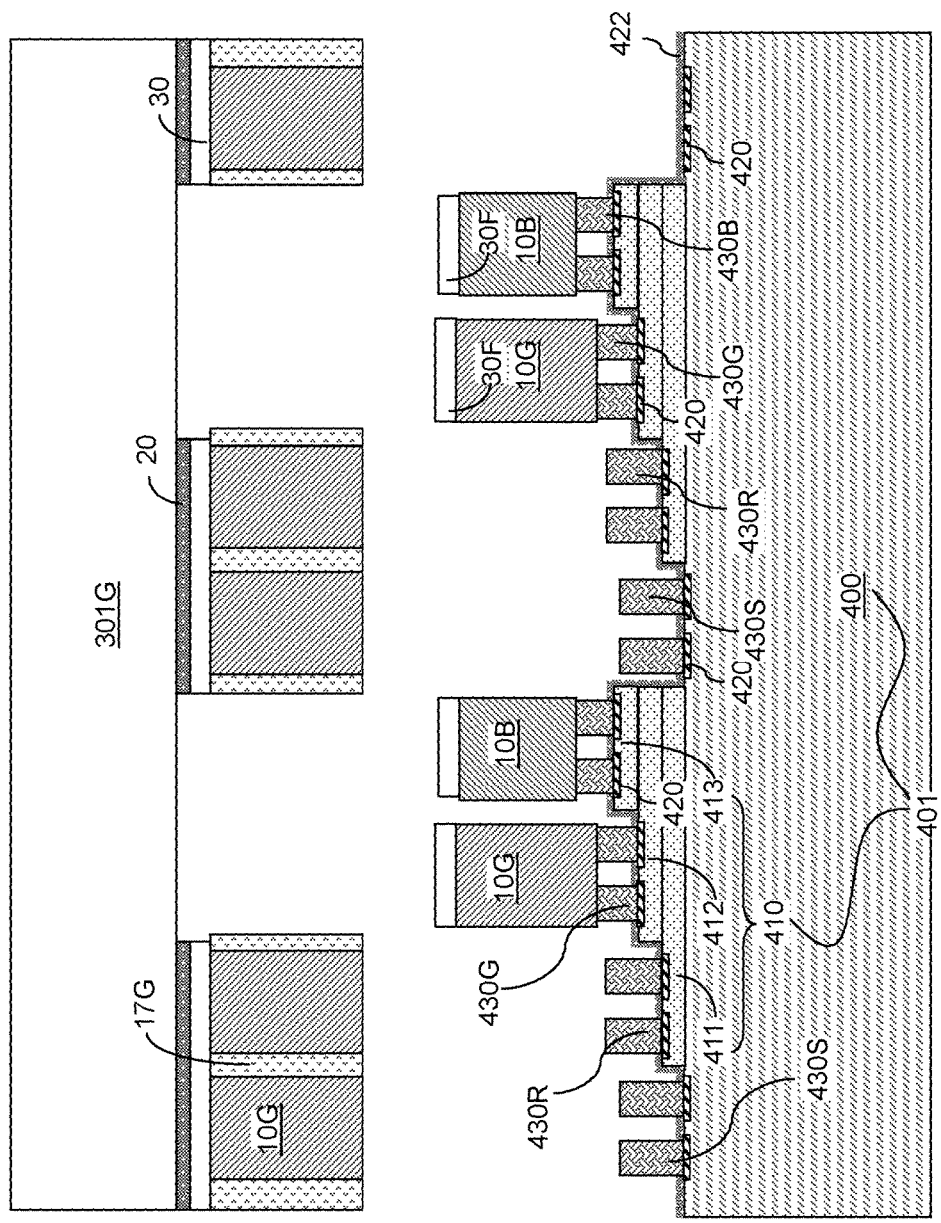
FIG. 17 is a vertical cross-sectional view of the backplane after separating the second transfer substrate according to an embodiment of the present disclosure.

Referring to FIG. 17, after all first portions of the release layer 20 overlying the first subset of the second light emitting devices 10G are removed, the second transfer substrate 301G can be separated from the backplane 401 by pulling the second transfer substrate 301G and/or the backplane 401 from each other. In one embodiment, a remnant portion 30F of the bonding material layer 30 can be formed on at least one of the first subset of the second light emitting devices 10G after the first portions of the release layer 20 are irradiated with the laser beam. In another embodiment, the portions of the bonding material layer 30 underneath the irradiated portions of the release layer 20 can be ablated or liquefied and flow out, for example, along sidewalls of an underlying second light emitting device 10G. If any portion of the bonding material layer 30 remains underneath the irradiated portions of the release layer 20, the periphery of such a portion can be fractured while the assembly comprising the second transfer substrate 301G and the second subset of the second light emitting devices 10G is separated from the backplane 401. The separation of the assembly comprising the second transfer substrate 301G and the second subset of the second light emitting devices 10G from the backplane 401 can be performed while the first subset of the second light emitting devices 10G remains bonded to the second conductive bonding structures 430G.

The second subset of the second light emitting devices 10G can be employed to subsequently transfer another subset of the second light emitting devices 10G to another backplane (not shown). Optionally, a wet chemical clean process can be performed to remove residual material from the backplane 401 and the first subset of the first light emitting devices 10B and the first subset of the second light emitting devices 10G. For example, dilute hydrofluoric acid can be employed to remove residual material from the surfaces of the backplane 401, the first subset of the first light emitting devices 10B, and the first subset of the second light emitting devices 10G.

Figure 18:
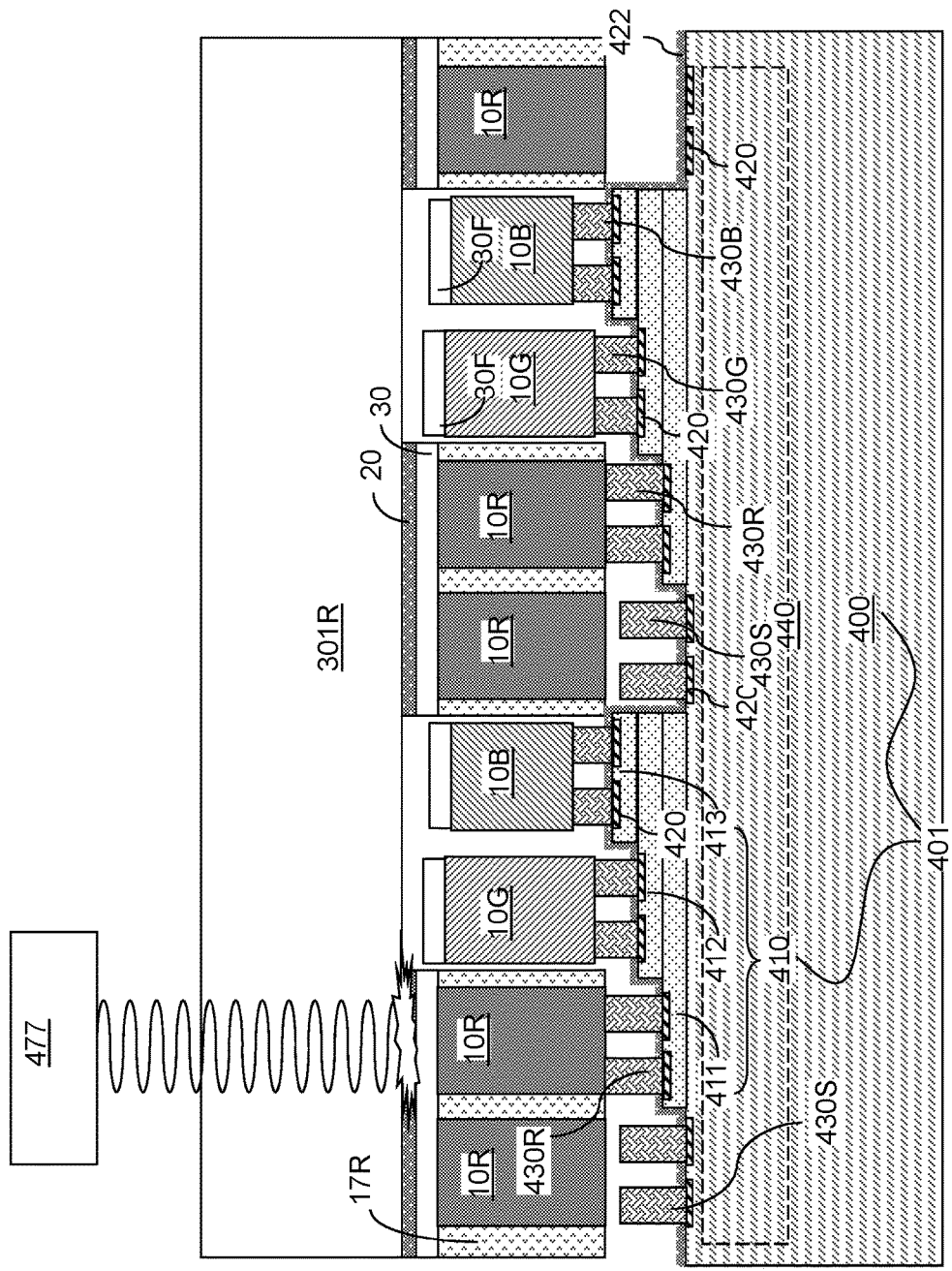
FIG. 18 is a vertical cross-sectional view of the backplane and a third transfer substrate while detaching a light emitting device among a first subset of third light emitting devices employing laser irradiation and ablation of a portion of the release layer in the third transfer substrate according to an embodiment of the present disclosure.

Referring to FIG. 18, an assembly comprising a third transfer substrate 301R and third light emitting devices 10R that emits light of a third wavelength is provided. The third wavelength is different from the first wavelength and the second wavelength. For example, the first wavelength can be a wavelength of blue light, the second wavelength can be a wavelength of green light, and the third wavelength can be a wavelength of red light. The third light emitting devices 10R are not present in positions that correspond to positions over the backplane 401 at which the first subset of the first light emitting devices 10B or the first subset of the second light emitting devices 10G is present in a configuration in which the third light emitting devices 10R face the top side of the backplane 401. In other words, the third light emitting devices 10R are not present in areas that overlap with the areas of the first subset of the first light emitting devices 10B or the first subset of the second light emitting devices 10G in a configuration in which the third light emitting devices 10R face downward and the first subset of the first light emitting devices 10B and the first subset of the second light emitting devices 10G on the backplane 401 face upward.

In one embodiment, any third light emitting device 10R located in positions that would overlap with preexisting devices (10B, 10G) on the backplane 401 can be removed from the third transfer substrate 301R before the third transfer substrate 301R is aligned with the backplane 401 for transfer of a subset of the third light emitting devices 10R. Optionally, a third optical protection material layer 17R can be applied to fill the gaps among the third light emitting devices 10R prior to removal of a subset of the third light emitting devices 10R from overlapping locations. The third optical protection material layer 17R can have the same composition as the first optical protection material layer 17B. By ensuring that the third light emitting devices 10R are not present in positions that correspond to positions over the backplane 401 at which the first subset of the first light emitting devices 10B and the first subset of the second light emitting devices 10G are present, potential collision between the third light emitting devices 10R and the first subset of the first light emitting devices 10B or between the third light emitting devices 10R and the first subset of the second light emitting devices 10G can be avoided when the third transfer substrate 301R is subsequently disposed on the backplane 401 to bond a subset of the third light emitting devices 10R.

After aligning the assembly of the third transfer substrate 301R and the third light emitting devices 10R to the backplane 401, the assembly of the third transfer substrate 301R and the third light emitting devices 10R is disposed on the backplane 401 so that a first subset of the third light emitting devices 10R contacts the third conductive bonding structures 430R and a second subset of the third light emitting devices 10R does not contact any conductive bonding structure. The contact pads (not shown) of the first subset of the third light emitting devices 10R contact respective third conductive bonding structures 430R. Specifically, the array of the third light emitting devices 10R can be aligned over the backplane 401 such that each bond pad 420 and a corresponding contact pad of an overlying third light emitting device 10R contact the third conductive bonding structure 430R located therebetween.

The third conductive bonding structures 430R are present only at locations at which transfer of third light emitting devices 10R is desired. The first subset of the third light emitting devices 10R on the third transfer substrate 301R is bonded to the third conductive bonding structures 430R, which are located on the third subset of horizontal stepped surfaces of the backplane 401. Each pair of a bond pad 420 and an overlying contact pads on the first subset of the third light emitting devices 10R can be bonded through a respective third conductive bonding structures 430R employing any of the bonding methods described above, i.e., the bonding methods that can be employed to bond pairs of a bond pad 420 and an overlying contact pads on the first subset of the first light emitting devices 10B through a respective first conductive bonding structures 430B.

Subsequently, each third light emitting device 10R that is bonded to the third conductive bonding structures 430R can be dissociated from the third transfer substrate 301R individually, while third light emitting devices 10R that are not bonded to the third conductive bonding structures 430R remain intact, i.e., are not detached. The set of the third light emitting devices 10R that are bonded to the third conductive bonding structures 430R is the first subset of the third light emitting devices 10R, and the set of third light emitting devices 10R that are not bonded to the second conductive bonding structures 430R is the second subset of the third light emitting devices 10R. Each third light emitting device 10R among the first subset of the third light emitting devices 10R can be detached employing targeted laser irradiation emitted by a laser 477 in the same manner employed to detach the first subset of the first light emitting devices 10B in a prior processing step. Thus, the first portions of the release layer 20 that overlies the first subset of the third light emitting devices 10R are selectively and sequentially removed, while the second portions of the release layer 20 that overlie the second subset of the third light emitting devices 10R are not removed. The third transfer substrate 301R comprises a material that is optically transparent at the laser wavelength. In one embodiment, the release layer 20 can comprise silicon nitride, the laser wavelength can be an ultraviolet wavelength (such as 248 nm or 193 nm), and irradiating the first portions of the release layer 20 with the laser beam ablates the first portions of the release layer 20.

Figure 19:
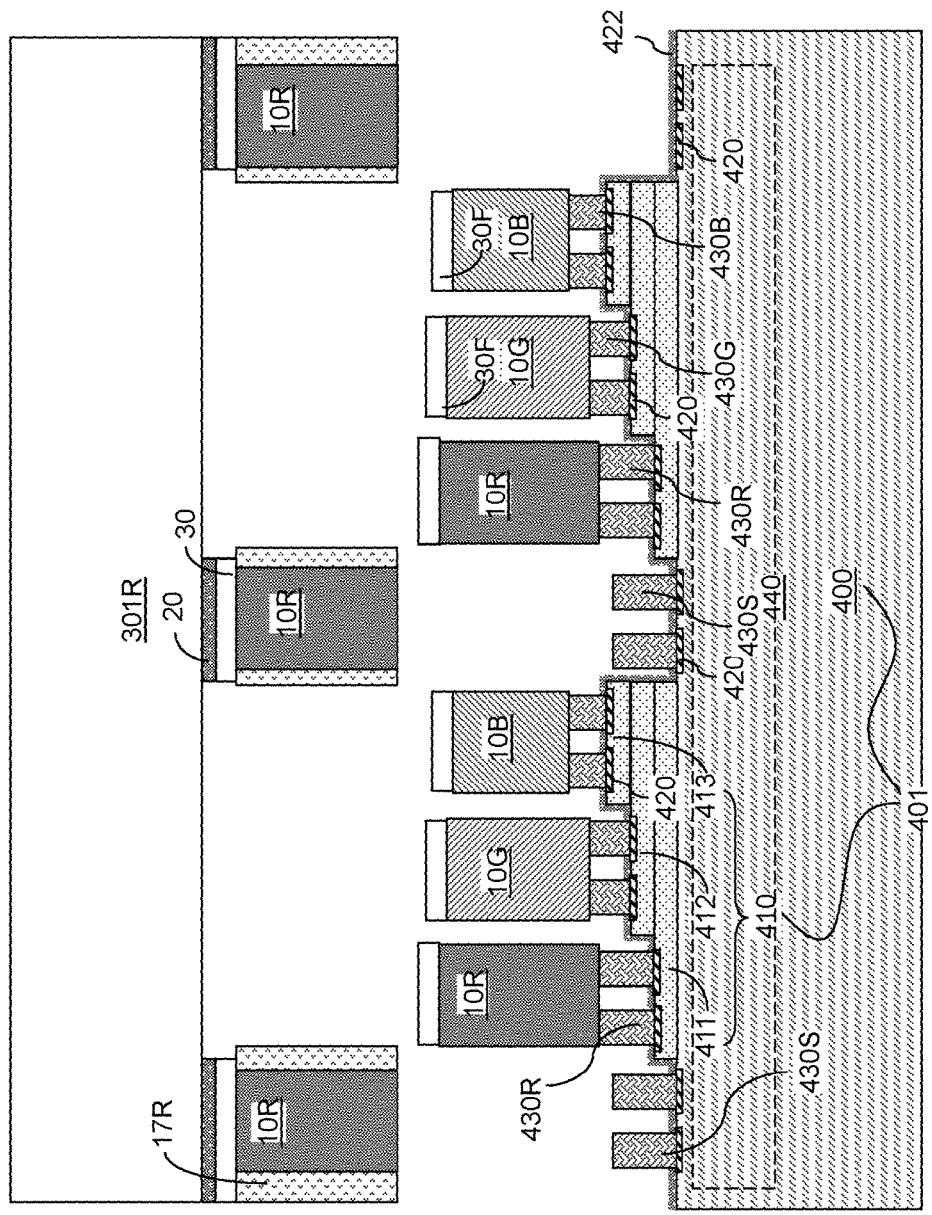
FIG. 19 is a vertical cross-sectional view of the backplane after separating the third transfer substrate according to an embodiment of the present disclosure.

Referring to FIG. 19, after all first portions of the release layer 20 overlying the first subset of the third light emitting devices 10R are removed, the third transfer substrate 301R can be separated from the backplane 401 by pulling the third transfer substrate 301R and/or the backplane 401 from each other. In one embodiment, a remnant portion 30F of the bonding material layer 30 can be formed on at least one of the first subset of the third light emitting devices 10R after the first portions of the release layer 20 are irradiated with the laser beam. In another embodiment, the portions of the bonding material layer 30 underneath the irradiated portions of the release layer 20 can be ablated or liquefied and flow out, for example, along sidewalls of an underlying third light emitting device 10R. If any portion of the bonding material layer 30 remains underneath the irradiated portions of the release layer 20, the periphery of such a portion can be fractured while the assembly comprising the third transfer substrate 301R and the second subset of the third light emitting devices 10R is separated from the backplane 401. The separation of the assembly comprising the third transfer substrate 301R and the second subset of the third light emitting devices 10R from the backplane 401 can be performed while the first subset of the third light emitting devices 10R remains bonded to the third conductive bonding structures 430R.

The second subset of the third light emitting devices 10R can be employed to subsequently transfer another subset of the third light emitting devices 10R to another backplane (not shown). Optionally, a wet chemical clean process can be performed to remove residual material from the backplane 401, the first subset of the first light emitting devices 10B, the first subset of the second light emitting devices 10G, and the first subset of the third light emitting devices 10R. For example, dilute hydrofluoric acid can be employed to remove residual material from the surfaces of the backplane 401, the first subset of the first light emitting devices 10B, the first subset of the second light emitting devices 10G, and the first subset of the third light emitting devices 10R.

It is understood that the order of bonding various devices can be permutated to enable bonding of multiple types of devices having different heights and the same horizontal pitch, i.e., the same periodicity along the two horizontal directions. In general, the sequence of bonding different devices 10 and the height of the respective conductive bonding structures can be selected to avoid collision between pre-existing bonded devices on the backplane 401 and the new devices to be bonded. The horizontal plane including the interface between the devices and the bonding material layer of the transfer substrate that is disposed over the backplane 410 is located above the topmost surfaces of the preexisting devices on the backplane 401.

Figure 20:
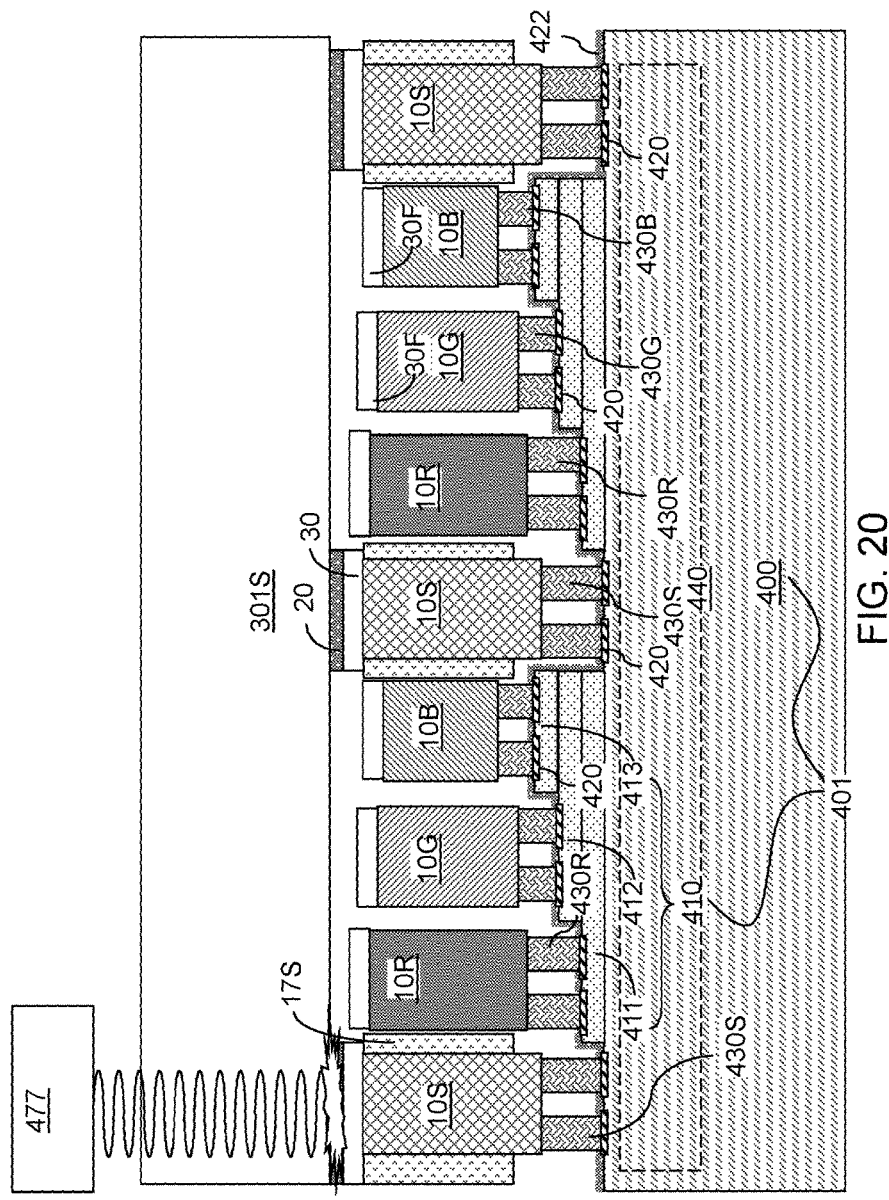
FIG. 20 is a vertical cross-sectional view of the backplane and a fourth transfer substrate while detaching a sensor device among a first subset of sensor devices employing laser irradiation and ablation of a portion of the release layer in the fourth transfer substrate according to an embodiment of the present disclosure.

Referring to FIG. 20, an assembly comprising the additional transfer substrate 301S and the sensor devices that sense at least one parameter is provided. The at least one parameter can be luminosity, pressure, temperature, and/or another physical parameter. The sensor devices 10S are not present in positions that correspond to positions over the backplane 401 at which the first subset of the first light emitting devices 10B, the first subset of the second light emitting devices 10G, or the first subset of the third light emitting devices 10R is present in a configuration in which the sensor devices 10S face the top side of the backplane 401. In other words, the sensor devices 10S are not present in areas that overlap with the areas of the first subset of the first light emitting devices 10B, the first subset of the second light emitting devices 10G, or the first subset of the third light emitting devices 10R in a configuration in which the sensor devices 10S face downward and the first subset of the first light emitting devices 10B, the first subset of the second light emitting devices 10G, and the first subset of the third light emitting devices 10R on the backplane 401 face upward. In one embodiment, any sensor device 10S located in positions that would overlap with preexisting devices (10B, 10G, 10R) on the backplane 401 can be removed from the additional transfer 301S substrate before the additional transfer substrate 301S is aligned with the backplane 401 for transfer of a subset of the sensor devices 10S. Optionally, a fourth optical protection material layer 17S can be applied to fill the gaps among the sensor devices 10S prior to removal of a subset of the sensor devices 10S from overlapping locations. The fourth optical protection material layer 17S can have the same composition as the first optical protection material layer 17B. By ensuring that the sensor devices 10S are not present in positions that correspond to positions over the backplane 401 at which the first subset of the first light emitting devices 10B, the first subset of the second light emitting devices 10G, and the first subset of the third light emitting devices 10R are present, potential collision between the sensor devices 10S and the light emitting devices (10B, 10G, 10R) can be avoided when the additional transfer substrate 301S is subsequently disposed on the backplane 401 to bond a subset of the sensor devices 10S.

After aligning the assembly of the additional transfer substrate 301R and the sensor devices 10S to the backplane 401, the assembly of the additional transfer substrate 301S and the sensor devices 10S is disposed on the backplane 401 so that a first subset of the sensor devices 10S contacts the additional conductive bonding structures 430S and a second subset of the sensor devices 10S does not contact any conductive bonding structure. The contact pads (not shown) of the first subset of the sensor devices 10S contact respective additional conductive bonding structures 430S. Specifically, the array of the sensor devices 10S can be aligned over the backplane 401 such that each bond pad 420 and a corresponding contact pad of an overlying sensor device 10S contact the additional conductive bonding structure 430S located therebetween.

The additional conductive bonding structures 430S are present only at locations at which transfer of sensor devices 10S is desired. The first subset of the sensor devices 10S on the additional transfer substrate 301S is bonded to the additional conductive bonding structures 430S, which are located on the fourth subset of horizontal stepped surfaces of the backplane 401. Each pair of a bond pad 420 and an overlying contact pads on the first subset of the sensor devices 10S can be bonded through a respective additional conductive bonding structures 430S employing any of the bonding methods described above, i.e., the bonding methods that can be employed to bond pairs of a bond pad 420 and an overlying contact pads on the first subset of the first light emitting devices 10B through a respective first conductive bonding structures 430B.

Subsequently, each sensor device 10S that is bonded to the additional conductive bonding structures 430S can be dissociated from the additional transfer substrate 301G individually, while sensor devices 10S that are not bonded to the additional conductive bonding structures 430S remain intact, i.e., are not detached. The set of the sensor devices 10S that are bonded to the additional conductive bonding structures 430G is the first subset of the sensor devices 10S, and the set of sensor devices 10S that are not bonded to the second conductive bonding structures 430G is the second subset of the sensor devices 10S. Each sensor device 10S among the first subset of the sensor devices 10S can be detached employing targeted laser irradiation emitted by a laser 477 in the same manner employed to detach the first subset of the first light emitting devices 10B in a prior processing step. Thus, the first portions of the release layer 20 that overlie the first subset of the sensor devices 10S are selectively and sequentially removed, while the second portions of the release layer 20 that overlie the second subset of the sensor devices 10S are not removed. The additional transfer substrate 301S comprises a material that is optically transparent at the laser wavelength. In one embodiment, the release layer 20 can comprise silicon nitride, the laser wavelength can be an ultraviolet wavelength (such as 248 nm or 193 nm), and irradiating the first portions of the release layer 20 with the laser beam ablates the first portions of the release layer 20.

Figure 21:
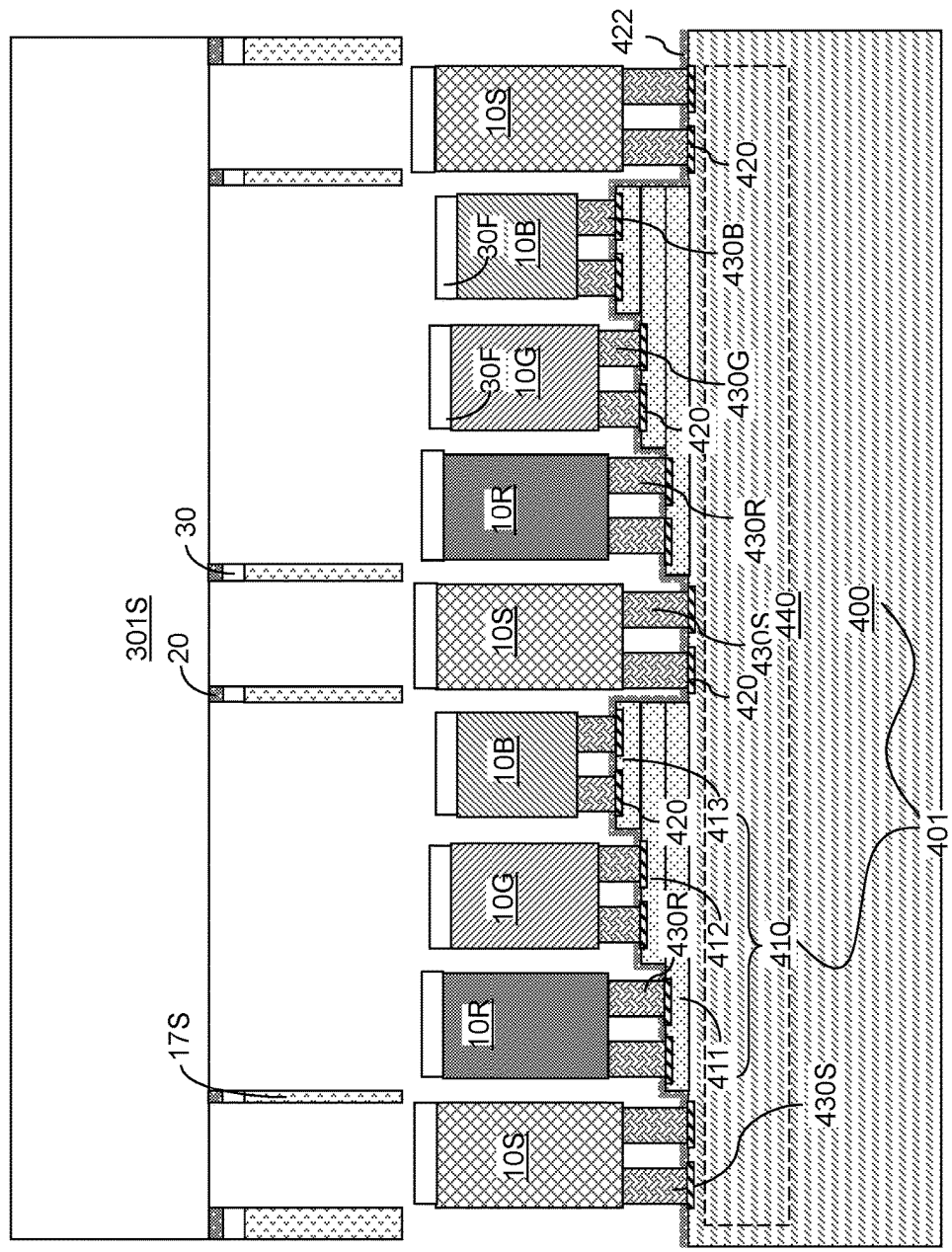
FIG. 21 is a vertical cross-sectional view of the backplane after separating the fourth transfer substrate according to an embodiment of the present disclosure.

Referring to FIG. 21, after all first portions of the release layer 20 overlying the first subset of the sensor devices 10S are removed, the additional transfer substrate 301S can be separated from the backplane 401 by pulling the additional transfer substrate 301S and/or the backplane 401 from each other. In one embodiment, a remnant portion 30F of the bonding material layer 30 can be formed on at least one of the first subset of the sensor devices 10S after the first portions of the release layer 20 are irradiated with the laser beam. In another embodiment, the portions of the bonding material layer 30 underneath the irradiated portions of the release layer 20 can be ablated or liquefied and flow out, for example, along sidewalls of an underlying sensor device 10S. If any portion of the bonding material layer 30 remains underneath the irradiated portions of the release layer 20, the periphery of such a portion can be fractured while the assembly comprising the additional transfer substrate 301S and the second subset of the sensor devices 10S is separated from the backplane 401. The separation of the assembly comprising the additional transfer substrate 301S and the second subset of the sensor devices 10S from the backplane 401 can be performed while the first subset of the sensor devices 10S remains bonded to the additional conductive bonding structures 430S.

The second subset of the sensor devices 10S can be employed to subsequently transfer another subset of the sensor devices 10S to another backplane (not shown). Optionally, a wet chemical clean process can be performed to remove residual material from the backplane 401, the first subset of the first light emitting devices 10B, the first subset of the second light emitting devices 10G, the first subset of the third light emitting devices 10R, and the first subset of the sensor devices 10S. For example, dilute hydrofluoric acid can be employed to remove residual material from the surfaces of the backplane 401, the first subset of the first light emitting devices 10B, the first subset of the second light emitting devices 10G, the first subset of the third light emitting devices 10R, and the first subset of the sensor devices 10S.

Figure 22:
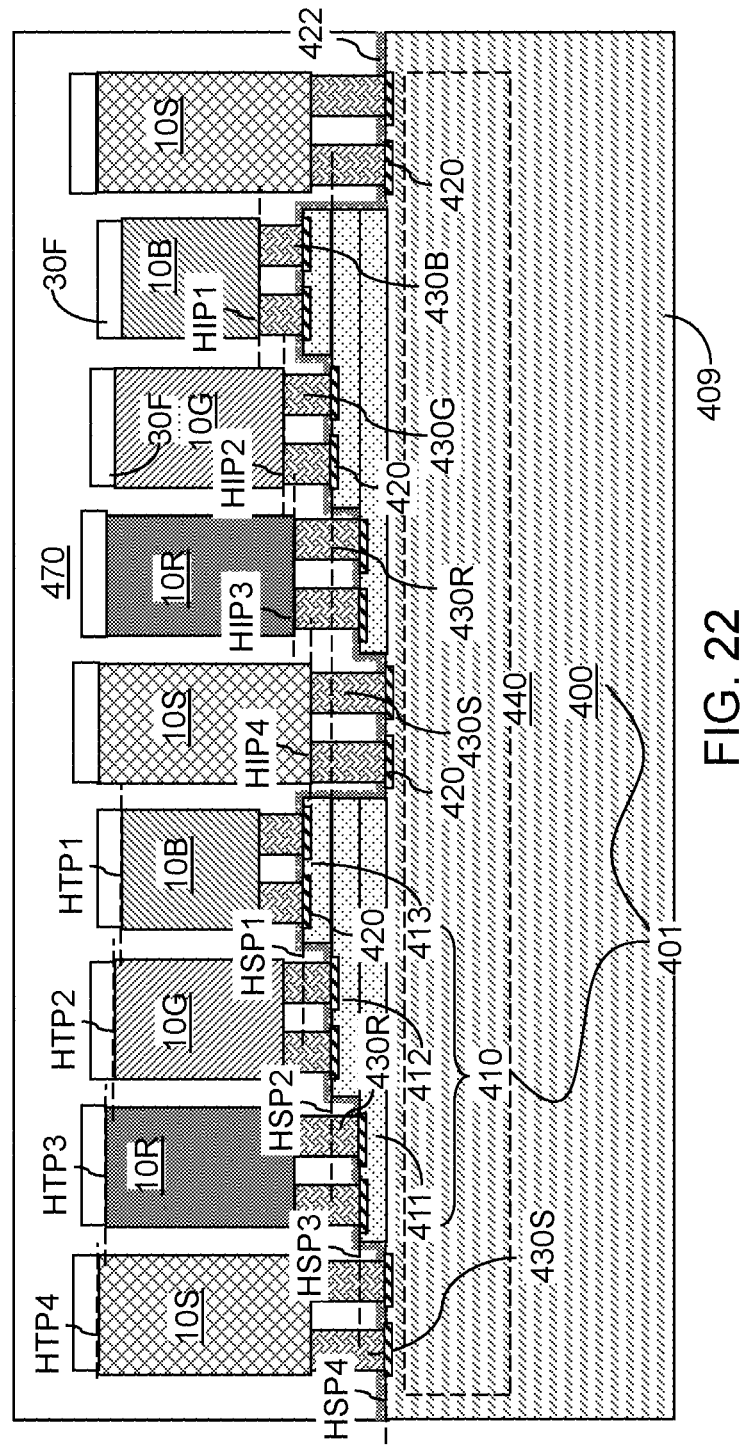
FIG. 22 is a vertical cross-sectional view of a first exemplary light emitting device assembly after formation of a transparent encapsulation dielectric layer according to an embodiment of the present disclosure.

Referring to FIG. 22, the electronic components (light emitting device subpixels, sensors, or other components) may be encapsulated by a transparent encapsulation material. The transparent encapsulation material increases the extraction of light from the light emitting device subpixels, increasing the amount of light emitted by the display panel. The transparent encapsulation material may provide a top surface of the display panel that has less peak-to-valley height variations. A transparent material can be deposited over the backplane 401 to form a transparent encapsulation dielectric layer 470. The encapsulant may be any of a range of materials such as dielectric resins (such as benzocyclobutene, polymethylmethacrylate, polybenzoxazole, or polyimide), silicones, dielectrics (such as $TiO_2$ or $SiO_2$), or low-melting temperature glasses or spin-on glasses.

The thicknesses of the conductive bonding structures and/or the thicknesses of the electronic component (light emitting device, sensor, or other electronic element) may be different for each of the groupings of components. In an illustrative example of a three-color RGB display panel comprising sensors, the first light emitting devices 10B can be blue light emitting devices, the second light emitting devices can be green light emitting devices, and the third light emitting devices can be red light emitting devices. The blue light emitting device may have a thickness of 6 microns and the first conductive bonding structure 430B between the backplane substrate and the blue light emitting device may be about 2 microns thick. The green light emitting device may have a thickness of 7 microns and the second conductive bonding structure 430G between the backplane substrate and the green light emitting device may be 4 microns thick. The red light emitting device may have a thickness of 8 microns and the third conductive bonding structure 430R between the backplane substrate and the red light emitting device may be 5 microns thick. The sensor device 10S may have a thickness of 8 microns and the additional conductive bonding structure 430S between the backplane substrate and the sensor may be 7 microns thick. In this example, the height of the distal face of the electronic component (face of the light emitting device or sensor farthest from the backplane 430) above the face of the backplane substrate may be 8 microns, 11 microns, 13 microns, and 15 microns, for the blue light emitting device, green light emitting device, red light emitting device, and sensor, respectively.

In a display panel, the thicknesses of the conductive bonding structures for the electronic components (light emitting devices, sensors, etc) may be different, or the thicknesses of the electronic components (light emitting devices, sensors, etc) may be different, or a combination thereof, as described in the example above.

The conductive bonding structures (430B, 430G, 430R, 430S) may be configured to make one or more electrical contacts to each element affixed to the backplane 401. In one embodiment, a green light emitting device subpixel may be affixed to the backplane substrate by two conductive bonding structures. A first conductive bonding structure connects the cathode of the green light emitting device to the electronic circuitry in the backplane 430, and a second conductive bonding structures connects the anode of the light emitting device to the electronic circuitry in the backplane 401. In one embodiment, the first and second conductive bonding structures may be located on different horizontal planes. For example, the anode contact plane may be 0.5 micron higher than the cathode contact plane. In one embodiment, the first and second conductive bonding structures may be different thicknesses. For example, the anode bonding structure thickness may be 0.5 um thicker than the cathode bonding structure.

In another embodiment, a blue light emitting device subpixel may be affixed to the backplane 430 by one conductive bonding structure, which may be either an anode bonding structure or a cathode bonding structure. In another embodiment, a silicon photodetector device may be affixed to the backplane 401 by two conductive bonding structures. In another embodiment, an array of three silicon photodetectors may be affixed to the backplane 401 by six conductive bonding structures. In another embodiment, a silicon photodetector device may be affixed to the backplane 430 by one conductive bonding structure, which may be either an anode or cathode bonding structure or a cathode bonding structure.

In one embodiment, a light emitting device configured to emit blue light may be formed adjacent to a light emitting device configured to emit green light and adjacent to a light emitting device configured to emit red light. In one embodiment, all contacts to the electronic devices affixed to the backplane 401 can be provided between the backplane 401 and the electronic components, and the transparent encapsulation dielectric layer 470 can have a single top surface (i.e., be planarized). In another embodiment, the transparent encapsulation dielectric layer 470 can be formed into a microlens array, for example with a domed surface over each electronic component.

The conductive bonding structures between electrical components (light emitting device subpixels, sensors, or other components) and the backplane 401 may comprise Ag, Al, Au, In, Sn, Cu, Ni, Bi, Sb. The conductive bonding structures may comprise multiple layers comprising multiple metals or metal alloys. The conductive bonding structures for different groupings of devices may comprise different metals or metal alloys. For example, the conductive bonding structures affixing the blue light emitting devices to the backplane 401 may comprise AuSn, the conductive bonding structures affixing the green light emitting devices to the backplane 401 may comprise NiSn, and the conductive bonding structures affixing the red light emitting devices to the backplane substrate may comprise InSn.

The exemplary structure of FIG. 22 is a first exemplary light emitting device assembly that comprises a backplane 401 having stepped horizontal surfaces at a top side. The stepped horizontal surfaces comprise a first subset of the stepped horizontal surfaces located within a first horizontal surface plane HSP1, a second subset of the stepped horizontal surfaces located within a second horizontal surface plane HSP2 that is more proximal to a backside surface 409 of the backplane 401 than the first subset of stepped horizontal surfaces is to the backside surface 409 of the backplane 401, a third subset of the stepped horizontal surfaces located within a third horizontal surface plane HSP3 that is more proximal to the backside surface 409 of the backplane 401 than the second subset of stepped horizontal surfaces is to the backside surface 409 of the backplane 401, and a fourth subset of the stepped horizontal surfaces located within a fourth horizontal surface plane HSP4 that is more proximal to the backside surface 409 of the backplane 401 than the third subset of stepped horizontal surfaces is to the backside surface 409 of the backplane 401. The height of each step between each consecutive plane can be in a range from 0 micron to 3 microns (for example, in a range from 0.2 micron to 2 microns). The presence or absence of finite step heights is dependent on methods employed for selectively attaching light emitting devices (or sensor devices), which depend on embodiments employed to implement the methods of the present disclosure. In other words, the steps may not be present in some embodiments, and all of the horizontal surface planes (HSP1, HSP2, HSP3, HSP4) can be located within the same horizontal plane in such cases. The presence of the steps facilitates formation of the topmost surfaces of the various electronic components (such as the light emitting devices (10B, 10G, 10R) and the sensor devices 10S) to be formed with less height differential than would be otherwise possible.

The integrated light emitting device assembly further comprises conductive bonding structures (430B, 430G, 430R, 430S) located on the stepped horizontal surfaces of the backplane 401. The conductive bonding structures (430B, 430G, 430R, 430S) can comprise first conductive bonding structures 430B contacting the first subset of the stepped horizontal surfaces, second conductive bonding structures 430G contacting the second subset of the stepped horizontal surfaces, third conductive bonding structures 430R contacting the third subset of the stepped horizontal surfaces, and additional conductive bonding structures 430S contacting the fourth subset of the stepped horizontal surfaces.

The integrated light emitting device assembly can further comprise light emitting devices (10B, 10G, 10R) bonded to the respective conductive bonding structures (430B, 430G, 430R, 430S). The light emitting devices (10B, 10G, 10R) comprise first light emitting devices 10B that emit light of a first wavelength and overlie the first subset of the stepped horizontal surfaces, second light emitting devices 10G that emit light of a second wavelength and overlie the second subset of stepped horizontal surfaces, and third light emitting devices 10R that emit light of a third wavelength and overlie the third subset of stepped horizontal surfaces.

The integrated light emitting device assembly can further comprise sensor devices 10S bonded to the backplane 410 through fourth conductive bonding structures 430S. The sensor devices 10S can overlie the fourth subset of stepped horizontal surfaces.

The locations of the various bonded components (10B, 10G, 10R, 10S), the heights of the various conductive bonding structures (430B, 430G, 430R, 430S), and the heights of the various stepped horizontal surfaces can be combined so that the height differential among the topmost surface of the bonded components (10B, 10G, 10R, 10S) as bonded to the backplane 401 can be less than the height differential among the various bonded components (10B, 10G, 10R, 10S). In one embodiment, a first horizontal interfacial plane HIP1 including interfaces between the first light emitting devices 10B and the first conductive bonding structures 403B can be more distal from the second horizontal surface plane HSP2 (or from any other horizontal reference plane such as the fourth horizontal surface plane HSP4 or the backside surface 409) than a second horizontal interface plane HIP2 between the second light emitting devices 10G and the second conductive bonding structures 430G is to the second horizontal surface plane HSP2 (or from any other horizontal reference plane such as the fourth horizontal surface plane HSP4 or the backside surface 409).

In one embodiment, the various conductive bonding structures (430B, 430G, 430R, 430S) can have different heights to reduce the height differential among the topmost surface of the bonded components (10B, 10G, 10R, 10S). In one embodiment, the second conductive bonding structures 430G can have a greater height than the first conductive bonding structures 430B. The third conductive bonding structures 430R can have a greater height than the second conductive bonding structures 430G. The additional conductive bonding structures 430S can have a greater height than the third conductive bonding structures 430R. The height differential among the various conductive bonding structures (430B, 430G, 430R, 430S) can be optional provided that the inherent height differential among the various bonded components (10B, 10G, 10R, 10S), the step height differential among the stepped horizontal surfaces of the backplane 401, and the locations of the various bonded components (10B, 10G, 10R, 10S) can be combined to prevent collision among sequential bonding of various transfer substrates (300B, 300G, 300R, 300S).

In one embodiment, a first horizontal top plane HTP1 including top surfaces of the first light emitting devices 10B can be more proximal to the second horizontal surface plane HSP2 (or from any other horizontal reference plane such as the fourth horizontal surface plane HSP4 or the backside surface 409) than a second horizontal top plane HTP2 including top surfaces of the second light emitting devices 10G is to the second horizontal surfaces plane HSP2 (or from any other horizontal reference plane such as the fourth horizontal surface plane HSP4 or the backside surface 409). The second horizontal top plane HTP2 including top surfaces of the second light emitting devices 10G can be more proximal to the second horizontal surface plane HSP2 (or from any other horizontal reference plane such as the fourth horizontal surface plane HSP4 or the backside surface 409) than a third horizontal top plane HTP3 including top surfaces of the third light emitting devices 10R is to the second horizontal surfaces plane HSP2 (or from any other horizontal reference plane such as the fourth horizontal surface plane HSP4 or the backside surface 409). The third horizontal top plane HTP3 including top surfaces of the third light emitting devices 10R can be more proximal to the second horizontal surface plane HSP2 (or from any other horizontal reference plane such as the fourth horizontal surface plane HSP4 or the backside surface 409) than a fourth horizontal top plane HTP4 including top surfaces of the sensor devices 10S is to the second horizontal surfaces plane HSP2 (or from any other horizontal reference plane such as the fourth horizontal surface plane HSP4 or the backside surface 409).

In one embodiment, the second light emitting devices 10G can have a greater height than the first light emitting devices 10B, the third light emitting devices 10R can have a greater height than the second light emitting devices 10G, and the sensor devices 10S can have a greater height than the third light emitting devices 10R.

In one embodiment, the backplane 401 comprises metal interconnect structures 440 embedded within a dielectric material matrix. The conductive bonding structures (430B, 430G, 430R, 430S) are electrically connected to a respective metal interconnect structure 440 within the backplane 401. The metal interconnect structures 440 can comprise bond pads 420 that are located on, or embedded within, the backplane 410. The bond pads 420 contact a respective bottom surface of the conductive bonding structures (430B, 430G, 430R, 430S). In one embodiment, the conductive bonding structures (430B, 430G, 430R, 430S) can comprise solder balls bonded to a respective bond pad 420 and to a respective light emitting device (10B, 10G, 10R) or to a respective sensor device 10S.

In one embodiment, a remnant portion 30F of the bonding material layer can be present over one or more of the bonded components (10B, 10G, 10R, 10S). For example, silicon oxide material portions can contact a respective top surface of the light emitting devices (10B, 10G, 10S), and can be laterally spaced from one another. In one embodiment, the transparent encapsulation dielectric layer 470 can overlie the backplane 401 and can embed the light emitting devices (10B, 10G, 10R) and the sensor devices 10S.

Optionally, a protective material layer 422 may be located on the stepped horizontal surfaces and sidewalls of the backplane 401. The protective material layer 422 can comprise a material that absorbs light within a wavelength range that includes ultraviolet light, visible light, and infrared light. In one embodiment, the light emitting devices (10B, 10G, 10R) and/or the sensor devices 10S can be arranged in a periodic array in which center-to-center distances of neighboring light emitting devices (10B, 10G, 10R) along a horizontal direction are integer multiples of a unit distance. In one embodiment, the periodic array can be a rectangular array in which the light emitting devices (10B, 10G, 10R) and/or the sensor devices 10S are arranged at lattice sites of a rectangular lattice.

Figure 23:
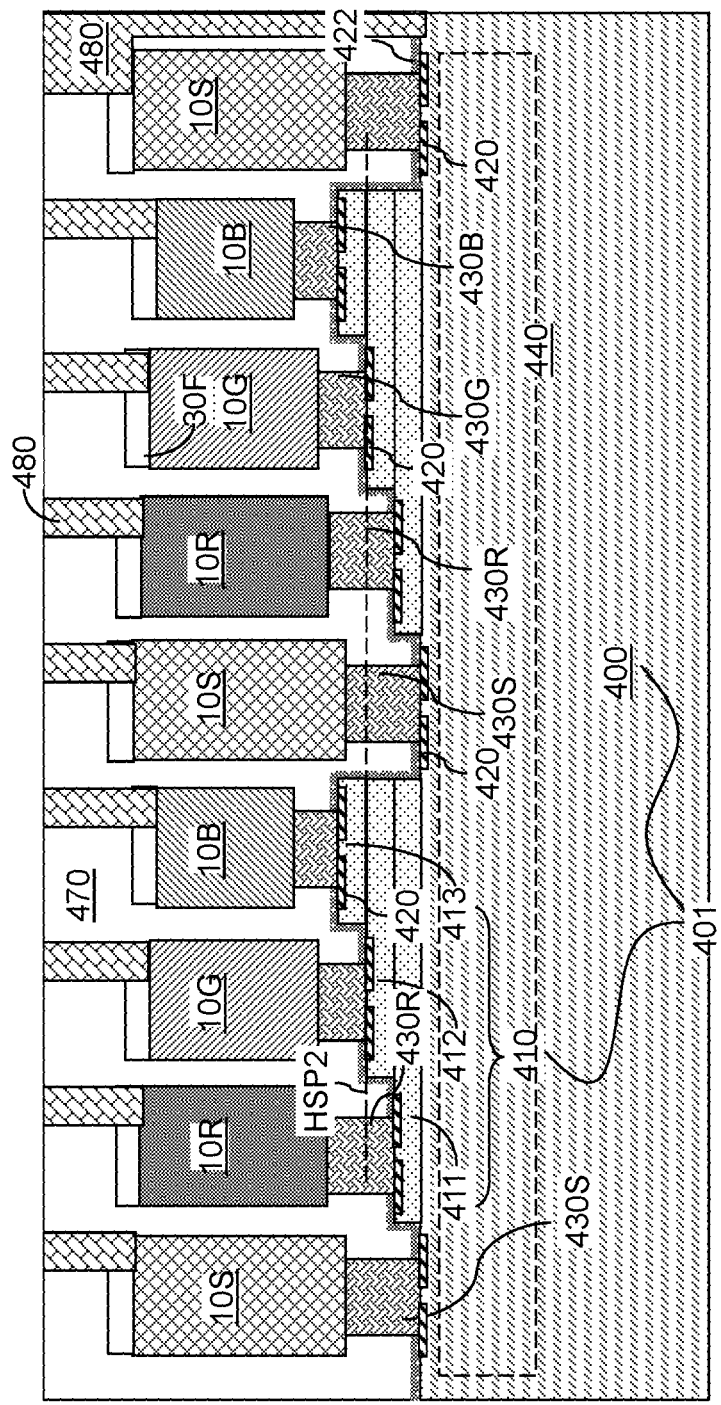
FIG. 23 is a vertical cross-sectional view of an alternate embodiment of the first exemplary light emitting device assembly after formation of conductive interconnect structures according to an embodiment of the present disclosure.

Referring to FIG. 23, an alternative embodiment of the integrated light emitting device assembly is shown. Conductive interconnect structures 480 can be formed within the transparent encapsulation dielectric layer 470, for example, by formation of line cavities and via cavities by a combination of lithographic patterning and at least one etch process, and by filling the line cavities and the via cavities with at least one conductive material. Alternatively or additionally, conductive interconnect structures 480 can be formed over the transparent encapsulation dielectric layer 470, for example, by deposition of a conductive material layer and patterning of the conductive material layer by a combination of lithographic patterning and at least one etch process. The conductive interconnect structures 480 can electrically contact one or more of the bonded components (10B, 10G, 10R, 10S). For example, the conductive interconnect structures 480 can be embedded within the transparent encapsulation dielectric layer 470 and can electrically contact a respective light emitting device (10B, 10G, 10R) and/or a respective sensor device 10S. In one embodiment, at least one of the conductive interconnect structures 480 can be electrically connected to a metal interconnect structure 440 embedded within the backplane 401.

In one embodiment, only a first part of the electrical contacts to the electronic components (10B, 10G, 10R, 10S) can be provided by the conductive bonding structures (430B, 430G, 430R, 430S) formed between the components (10B, 10G, 10R, 10S) and the backplane 401. A second part of the electrical contacts to the electrical components (10B, 10G, 10R, 10S) can be provided by a top contact layer as embodied by the conductive interconnect structures 480. The conductive interconnect structures 480 are formed over the electronic components (10B, 10G, 10R, 10S), and can be embedded within the transparent encapsulation dielectric layer 470, and/or can be formed over the transparent encapsulation dielectric layer 470.

In one embodiment, the transparent encapsulation dielectric layer 470 may partially planarize the top surface of a display panel that incorporates the integrated light emitting device assembly of the present disclosure. Via cavities can be provided in the transparent encapsulation dielectric layer 470 directly over the top surface of each electronic component (10B, 10G, 10S), and a transparent conductive oxide such as ITO or AZO, silver nanowire mesh, silver mesh electrode, or other transparent or semitransparent contact structures can be provided over the encapsulant and electronic components, forming op contact structures as embodied as the conductive interconnect structures 480. The top contact structures may be electrically joined to the backplane 401 at some specific site on the backplane 401, for example, by wirebonding or by contact via structures that extend through transparent encapsulation dielectric layer 470. The top contact structures may be a full sheet contact which covers every electronic component (10B, 10G, 10R, 10S) on the backplane 401, or may be patterned to provide multiple top contact structures to specific components or groups of components, in which case the top contact structures may be electrically joined to the backplane 401 at several specific sites, e.g. by wirebonding or by contact with a metal electrode formed on the backplane 401.

Figure 24:
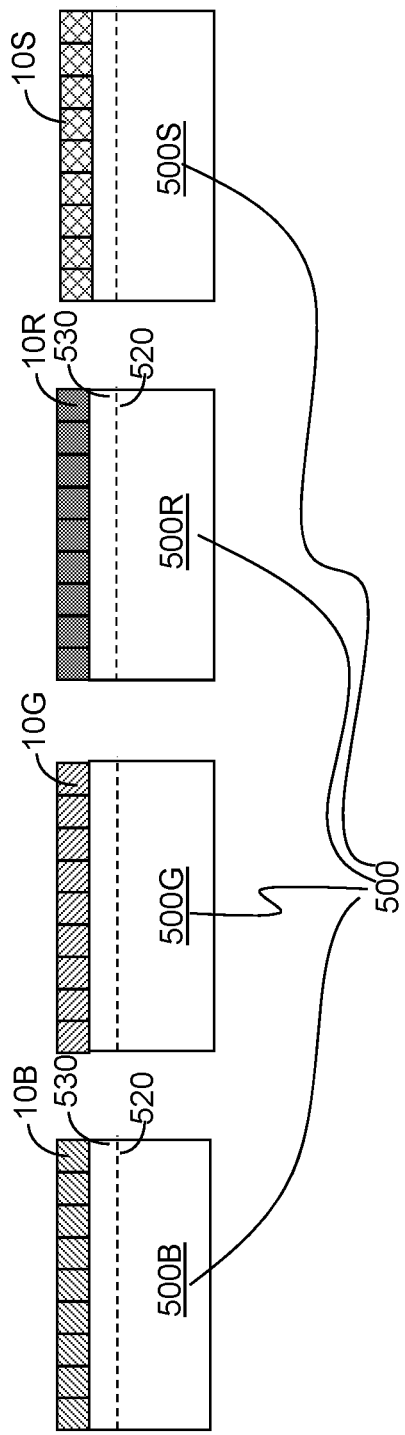
FIG. 24 is an alternative embodiment of the devices on initial growth substrates according to an embodiment of the present disclosure.

Referring to FIG. 24, an alternative embodiment of the devices (10B, 10G, 10R, 10S) on growth substrates 500 is illustrated. In this case, the devices (10B, 10G, 10R, 10S) can be grown or fabricated from the growth substrates 500 employing device fabrication techniques known in the art. For example, the growth substrates 500 can be a semiconductor substrate including a semiconductor material, which can be a compound semiconductor substrate (e.g., a GaAs or a GaN substrate), or an insulating substrate, such as sapphire. Each growth substrate 500 can be provided with an internal release layer 520, which can be, for example, an implanted material layer such as an implanted hydrogen layer, an implanted oxygen layer, an implanted nitrogen layer, or a layer formed by implantation of any other atomic species that facilitates cleaving upon irradiation by laser or local heating by other methods. The internal release layer 520 performs the function of the release layer 20 discussed above.

Each growth substrate 500 can be provided with a source substrate 530, which can be a thin layer of the material of the growth substrate 500, and is thin enough to be fractured, ablated, or otherwise removed upon laser irradiation of an adjoining portion of the internal release layer 520. The thickness of the source substrate 530 can be in a range from 50 nm to 3 microns, although lesser and greater thicknesses can also be employed. In one embodiment, first light emitting devices 10B can be manufactured over a first growth substrate 500B, second light emitting devices 10G can be manufactured over a second growth substrate 500G, third light emitting devices 10R can be manufactured over a third growth substrate 500R, and sensor devices 10S can be manufactured over a fourth growth substrate 500S.

Figure 25:
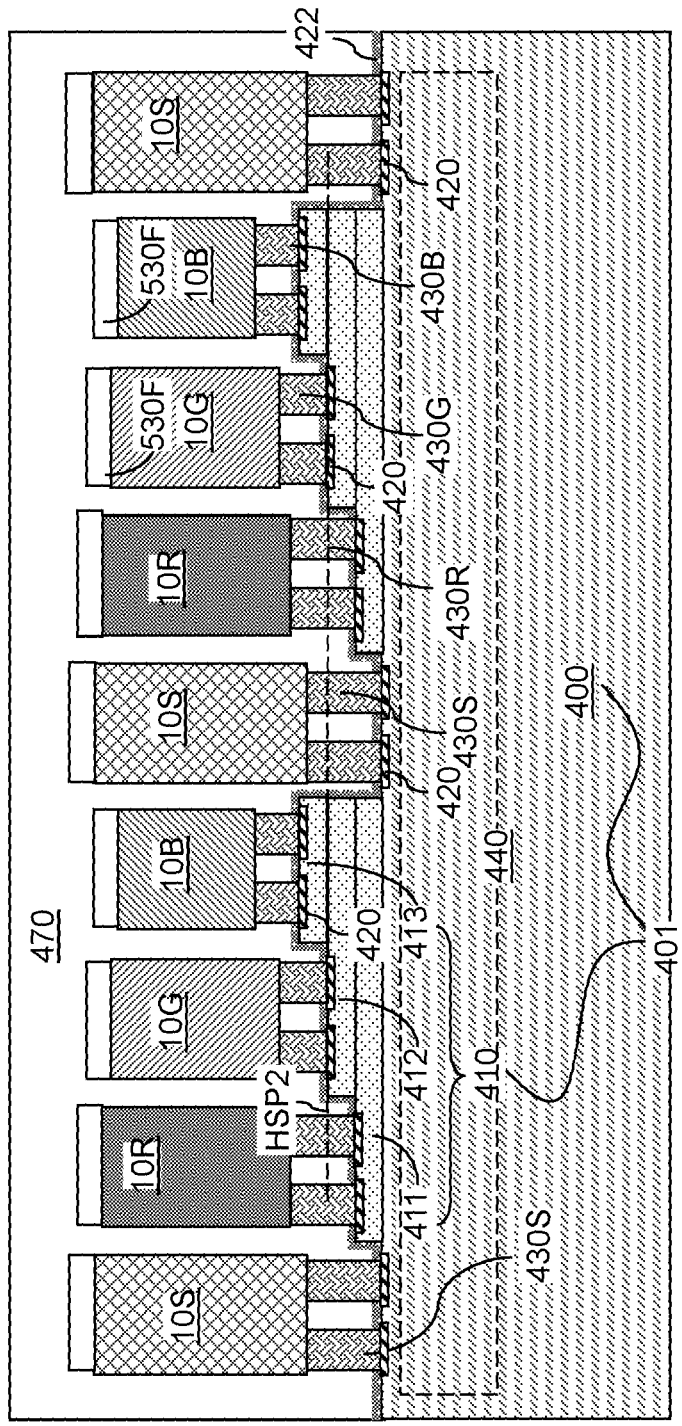
FIG. 25 is a vertical cross-sectional view of another alternate embodiment of the first exemplary light emitting device assembly according to an embodiment of the present disclosure.

Referring to FIG. 25, the same processing sequences described above can be employed to form an integrated light emitting device assembly. A portion of the source substrate 530 is ablated during each laser irradiation process. Because a source substrate 530 is present on each growth substrate 500, a remnant portion 530F of the source substrate 530 can be present over the bonded components (10B, 10G, 10R, 10S) and within the transparent encapsulation dielectric layer 470.

The methods of the present disclosure can be employed to form an emissive display panel. An emissive display panel is a direct view display where the viewer directly views an image made by different color light emission from different color light emitting subpixels. The subpixels can be inorganic light emitting devices, such as light emitting diodes. Thus, the direct view display differs from a backlight of a liquid crystal display (LCD), where different color light from the backlight is combined to form which light which is used to illuminate the liquid crystal material and color filters of the LCD, and the viewer views different color light transmitted through the color filters and the liquid crystal material. Elements on the backplane 401 and the light emitting devices can facilitate the assembly of the display panel. The emissive display panel may include sensors or other electronic elements assembled onto the display panel in a similar method. Elements of the sensors and/or electronic elements facilitate assembly of the display panel.

In order to fabricate an emissive display panel with inorganic light emitting diodes (LEDs) as the emissive element, millions of LEDs must be affixed to a backplane substrate. The backplane 401 contains the electronics which drive current through the individual LED subpixels such that light is emitted and an image is formed on the display.

In one embodiment, the display is a three color display panel, wherein within each pixel of the display there are three subpixels which emit red, green, and blue light. Each subpixel can be an inorganic LED. The blue and green subpixels may be made of InGaN LEDs. The red subpixels may be made of InGaN or AlInGaP or AlGaAs LEDs. The display panel may have more colors. For example, a four-color display can include four subpixels per pixel. The subpixels may emit blue light at about 470 nm wavelength, emerald green light at about 505 nm wavelength, yellowish-green light at about 570 nm wavelength, and red light at about 610 nm wavelength. In one embodiment, the subpixels may all be formed of InGaN.

The light emitting devices forming the subpixels may comprise an array of nanowires such that each nanowire is a light emitting device. Nanowire light emitting diodes (LEDs) are advantageous for forming the subpixels for several reasons. First, the nanowire LEDs may be as small as 1 micron in lateral dimension. This minimizes the amount of LED material that must be used to form each subpixel. This also allows the subpixels to be placed at small pitches, forming a high resolution display. Second, the nanowire LEDs have excellent efficacy (lumens per watt of electrical input power) when driven with small powers.

Figure 26:
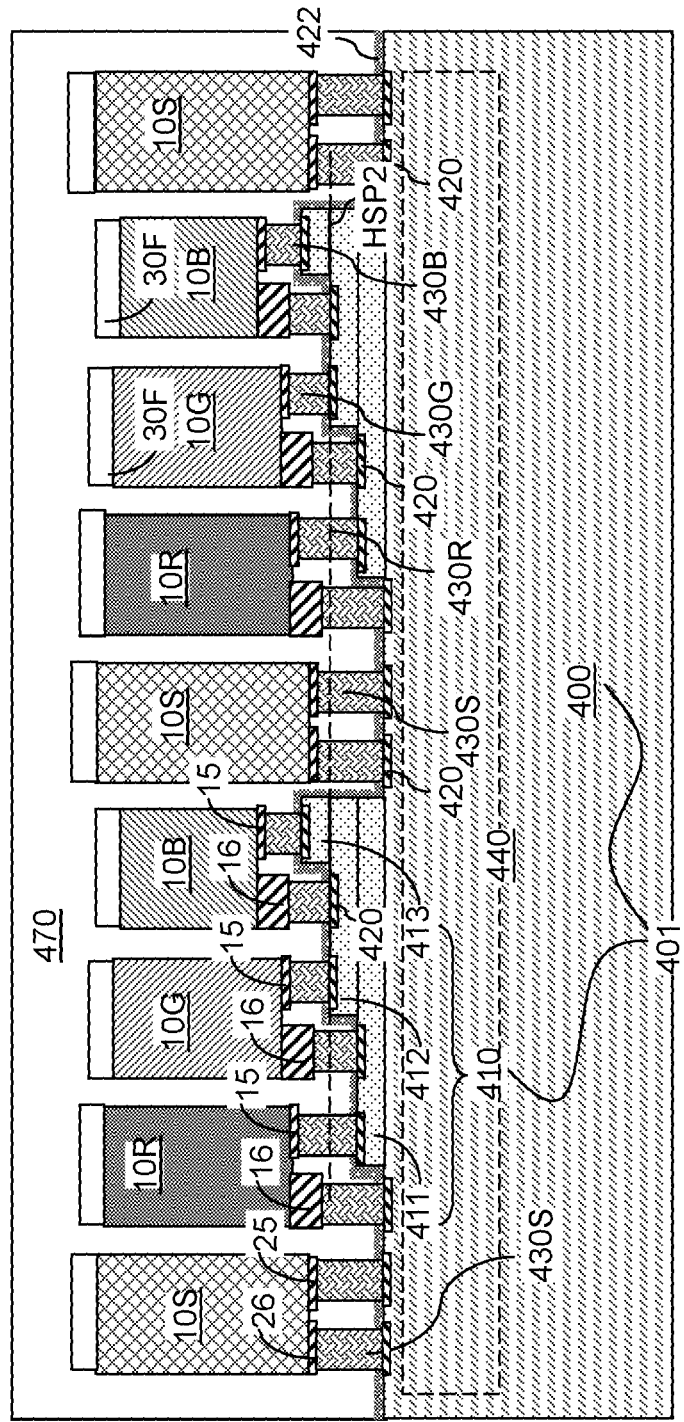
FIG. 26 is a vertical cross-sectional view of yet another alternate embodiment of the first exemplary light emitting device assembly according to an embodiment of the present disclosure.

Referring to FIG. 26, another alternate embodiment of the structure of the present disclosure is shown. In addition to have a stepped backplane 401 having stepped horizontal surfaces, stepped light emitting device surfaces can be employed to form a light emitting device assembly. In one embodiment, stepped light emitting device surfaces can be provided through use of different thicknesses of, or partial absence of, solderable metallization structures on the side of each light emitting device (10B, 10G, 10R) or each sensor structure 10S that is bonded to the backplane 401. In one embodiment, the solderable metallization structures can be a set of differential thickness contact pads (15, 16), which includes at least a first contact pad 15 having a first thickness and a second contact pad 16 having a second thickness that is different from the first thickness. Each combination of the first thickness and the second thickness can be selected to enable use of conductive bonding structures (430B, 430G, 430R, 430S) of the same thickness for each type of bonded components (10B, 10G, 10R, 10S). The solderable metallization structures such as the set of differential thickness contact pads (15, 16) can be formed, for example, by electroplating prior to dicing the initial growth substrates (100B, 100G, 100R, 100S). One or more than one type of bonded components (10B, 10G, 10R, 10S) can have differential thickness contact pads (15, 16). Alternately, one or more than one type of bonded components (10B, 10G, 10R, 10S) can have uniform thickness contact pads (15, 16) that have the same thickness.

Various types of devices can be bonded to the backplane 401. For example, in addition to, or in lieu of, bonding a set of sensor devices 10S, a probe or other electronic processor integrated chips (ICs) may be bonded to the backplane 401. A non-limiting illustrative example of a probe is a high-power infrared light emitting diode (IR LED) or a vertical-cavity surface-emitting laser (VCSEL) that is used in combination with a detector to provide the functionality of gesture recognition. A non-limiting illustrative example of an electronic IC is a low-density high cost processor chip for which direct fabrication on an active backplane is not economical, and transfer from a growth substrate to a backplane is more economical.

Multiple sensors, probes, and/or electronic ICs can be integrated onto the backplane 401 employing multiple bonding steps. In one embodiment, a plurality of vertical-cavity surface-emitting lasers (VCSELs) can be employed to form a projection display.

Tests and rework processes can be performed as needed at any stage of the assembly process of the present disclosure prior to formation of the transparent encapsulation dielectric layer 470. A rework process can comprise high-speed pick and place operations, in which a known defective electronic component (10G, 10G, 10R, 10S) that is bonded to the backplane 401 can be selectively picked (for example, employing local heating of the respective conductive bonding structures) and a functional replacement electronic component (10G, 10G, 10R, 10S) is placed in its stead. A suitable clean and placement of a new set of conductive bonding structures can be performed prior to bonding the functional replacement electronic component. If the rework process is performed at a later stage, the replacement electronic components can have a greater height than existing electronic components on the backplane 401 (for example, by adding a thicker bonding material layer or manufacturing the electronic component with a greater height), or a placement method that does not interfere with neighboring electronic components can be employed.

Figure 27:
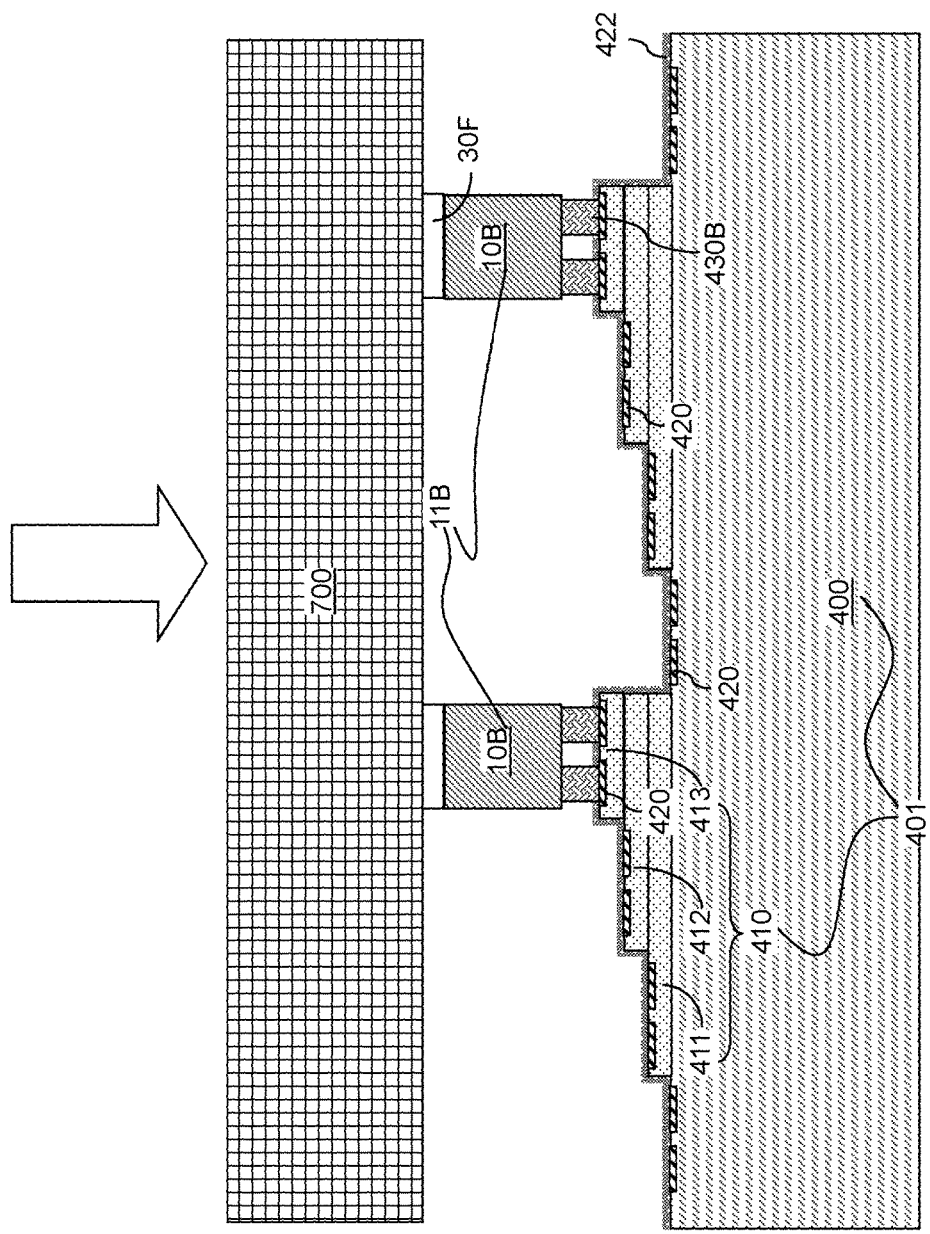
FIG. 27 illustrates a processing step in an alternate embodiment of the present disclosure in which a dummy substrate is disposed above top surfaces of bonded light emitting devices.

In one embodiment, the conductive bonding structures (430B, 430G, 430R, 430S) of the present disclosure can be solder material portions, i.e., solder "balls." It is understood that a solder "ball" may, or may not, have a spherical shape, and other shapes, such as a cylindrical shape, can also be employed as a solder "ball." Referring to FIG. 27, the processing sequences of the present disclosure may be modified to enhance to coplanarity of the top surfaces of bonded devices from a backplane 401. After each round of bonding devices (10B, 10G, 10R, or 10S) to a backplane 401 and removing a remainder of a transfer assembly, for example, after the processing steps of FIG. 14, after the processing steps of FIG. 17, after the processing steps of FIG. 19, and/or after the processing steps of FIG. 21, a dummy substrate 700 having a planar bottom surface can be disposed on the top surfaces of the newly bonded devices (10B, 10G, 10R, or 10S) and over the backplane 401.

FIG. 27 illustrates an exemplary structure after a dummy substrate 701 having a planar bottom surface is disposed on top surfaces of the first light emitting devices 10B after separating the assembly comprising the first transfer substrate 301B and the second subset of the first light emitting devices 10B from the backplane 401. The same method may be applied after separating any of the transfer substrates (301B, 301G, 301R, 301S). The dummy substrate 701 may be repeatedly used, or may be replaced with a new one for each usage. The dummy substrate 701 can comprise an insulator material, a conductive material, a semiconductor material, or a combination thereof provided that the bottom surface of the dummy substrate 701 includes a flat rigid surface, i.e., a surface that substantially coincides with a horizontal Euclidean two-dimensional plane.

Figure 28:
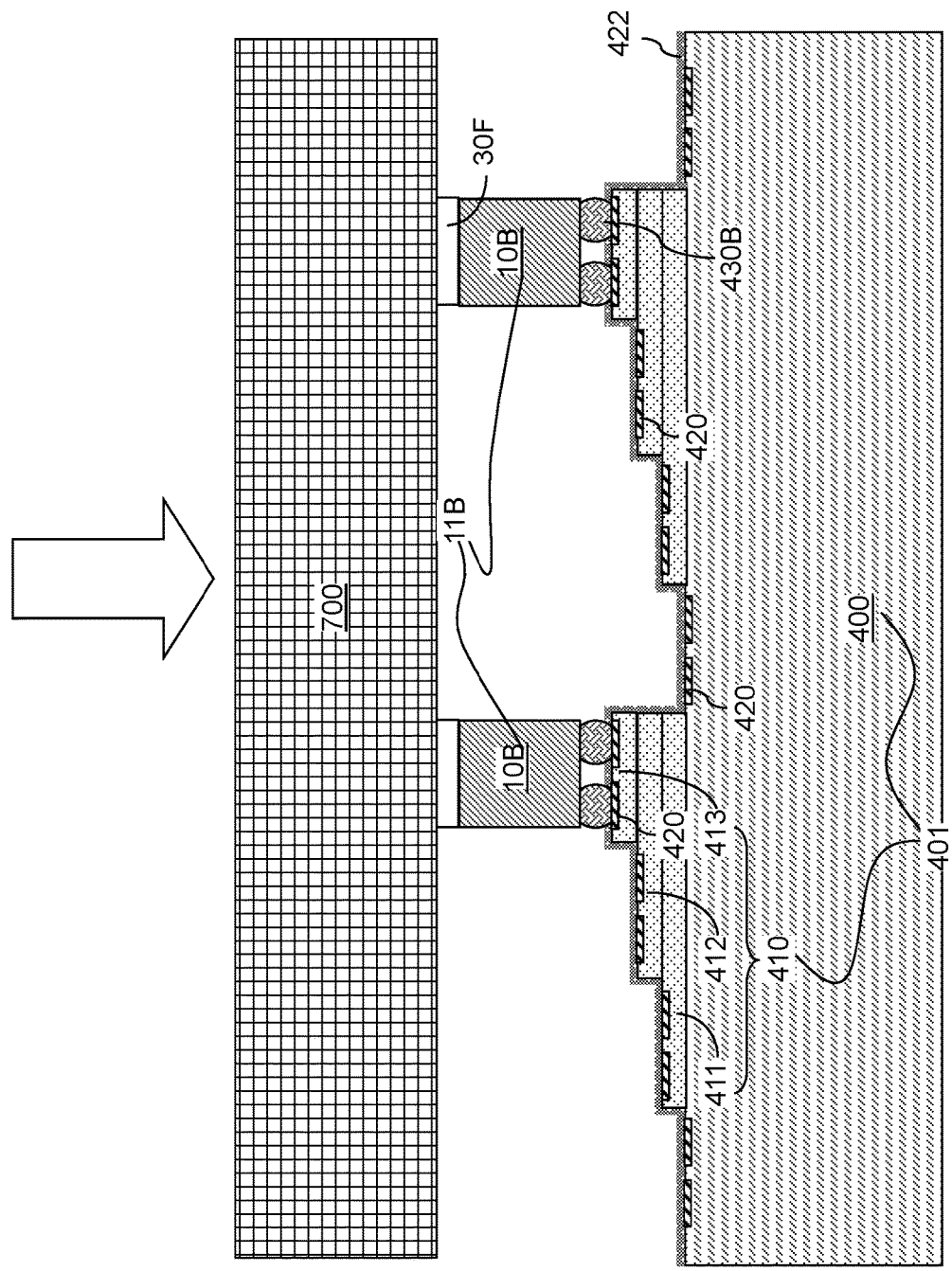
FIG. 28 illustrates a processing step in an alternate embodiment of the present disclosure in which the dummy substrate presses against bonded light emitting diodes while solder balls are heated to a reflow temperature.

Referring to FIG. 28, a downward pressure can be applied to the dummy substrate 700 while the conductive bonding structures (430B, 430G, 430R, 430S), i.e., the solder balls, are heated to a reflow temperature. During this processing step, the dummy substrate 700 presses the newly bonded devices (10B, 10G, 10R, or 10S) toward the backplane 401. In some embodiment, the dummy substrate 700 can be used during a last reflow step to press down on the top surfaces of the transferred devices (10B, 10G, 10R, and 10S) to ensure that the top surfaces of all the transferred dies are positioned in the same horizontal plane. In some other embodiments, previously bonded devices may not affect subsequent transfers by careful selection of the heights of top surfaces of the previously bonded devices (e.g., by selecting the heights of the stepped surfaces of the bond pads 420 and the heights of the conductive bonding structures 430 for multiple backplanes 401 such that top surfaces of later bonded devices are farther away from each backplane 401 than previously bonded devices). FIG. 28 illustrates the step of reflowing the first conductive bonding structures 430B while the dummy substrate 700 presses the transferred first light emitting devices 10B toward the backplane 410.

Figure 29:
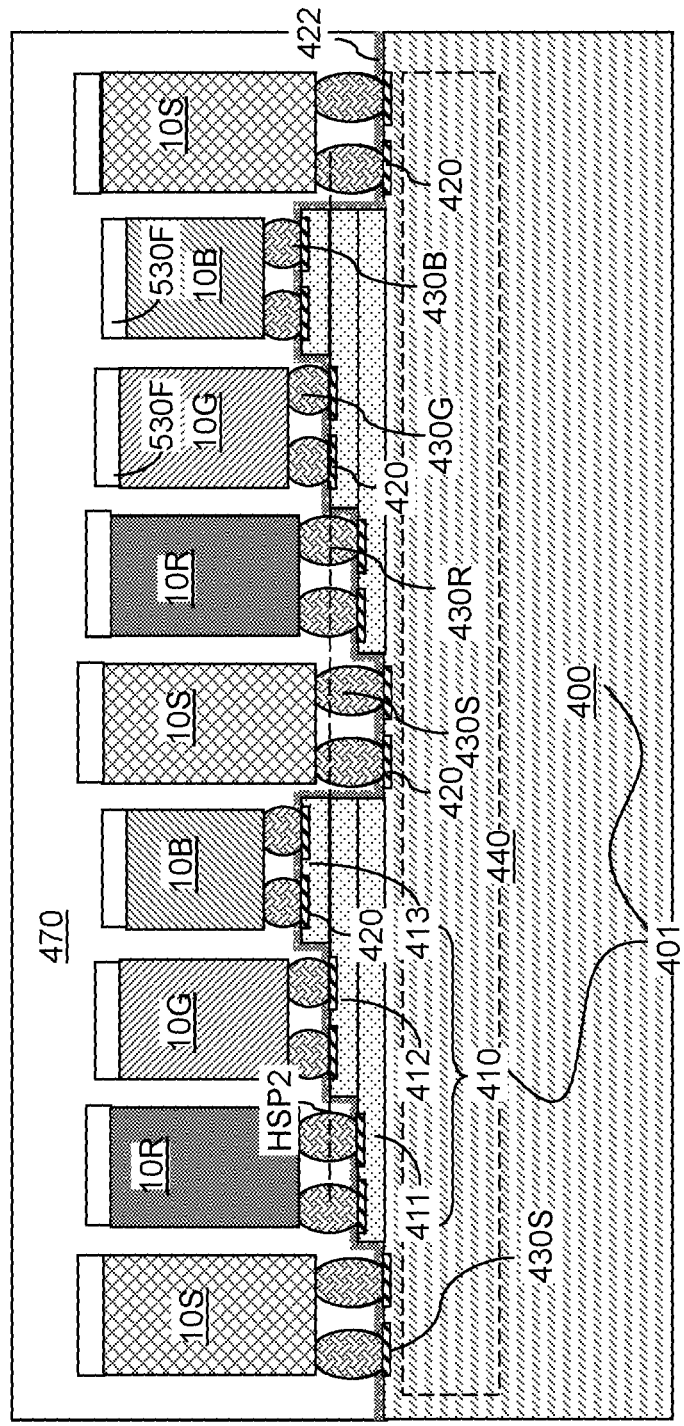
FIG. 29 illustrates still another alternate embodiment of the first exemplary light emitting device assembly according to an embodiment of the present disclosure.

Referring to FIG. 29, subsequent processing steps can be performed to encapsulate the bonded devices (10B, 10G, 10R, 10S) employing any of the embodiments described above. The conductive bonding structures (430B, 430G, 430R, 430S) can include features that are characteristic of reflowed solder material portions such as convex reflowed surfaces.

Multiple transfer assemblies and multiple backplanes can be employed to transfer devices of different types to each backplane, and to form a periodic array of a device set on each backplane. The devices in each transfer assembly can have the same two-dimensional periodicity prior to a series of device transfers. The periodic array of a device set can be the same across the backplanes, and can have a two-dimensional periodicity that is multiples of the two-dimensional periodicity of the devices on the transfer assemblies.

Figure 30:
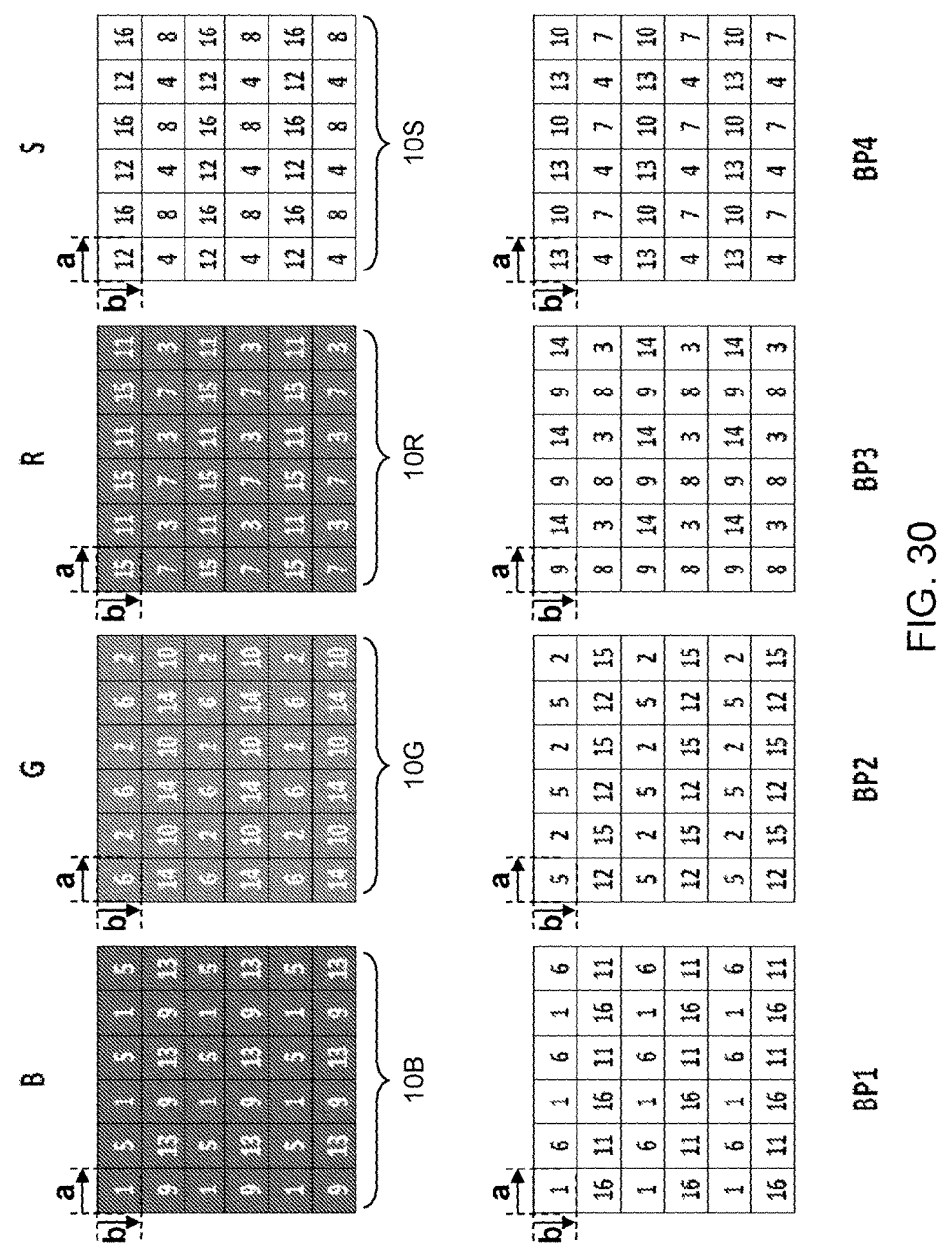

Referring to FIG. 30, an exemplary transfer pattern and an exemplary transfer sequence are illustrated for transferring four different types of devices (10B, 10G, 10R, 10S) (e.g., blue, green and red emitting LEDs and sensors, respectively) to four backplanes (BP1, BP2, BP3, BP4). The four different types of devices (10B, 10G, 10R, 10S) can be provided on four source substrates (B, G, R, S), which can comprise four transfer substrates (301B, 301G, 301R, 301S), or four growth substrates (100/500A, 100/500B, 100/500C, 100/500D), or combinations thereof. The first light emitting diodes 10B can be provided on the first source substrate B, the second light emitting diodes 10G can be provided on the second source substrate G, the third light emitting diodes 10R can be provided on the third source substrate R, and the sensor devices 10S can be provided on the fourth source substrate S.

A subset of first devices 10B labeled "1" can be transferred from the first source substrate B to locations on the first backplane BP1 that are marked with "1." Subsequently, a subset of second devices 10G labeled "2" can be transferred from the second source substrate G to a second substrate BP2 to locations on the second backplane BP2 that are marked with "2." The sequential transfer continues with each set of devices labeled with gradually increasing numerical indices up to the set of devices labeled with the numerical index "16."

Figure 31A:
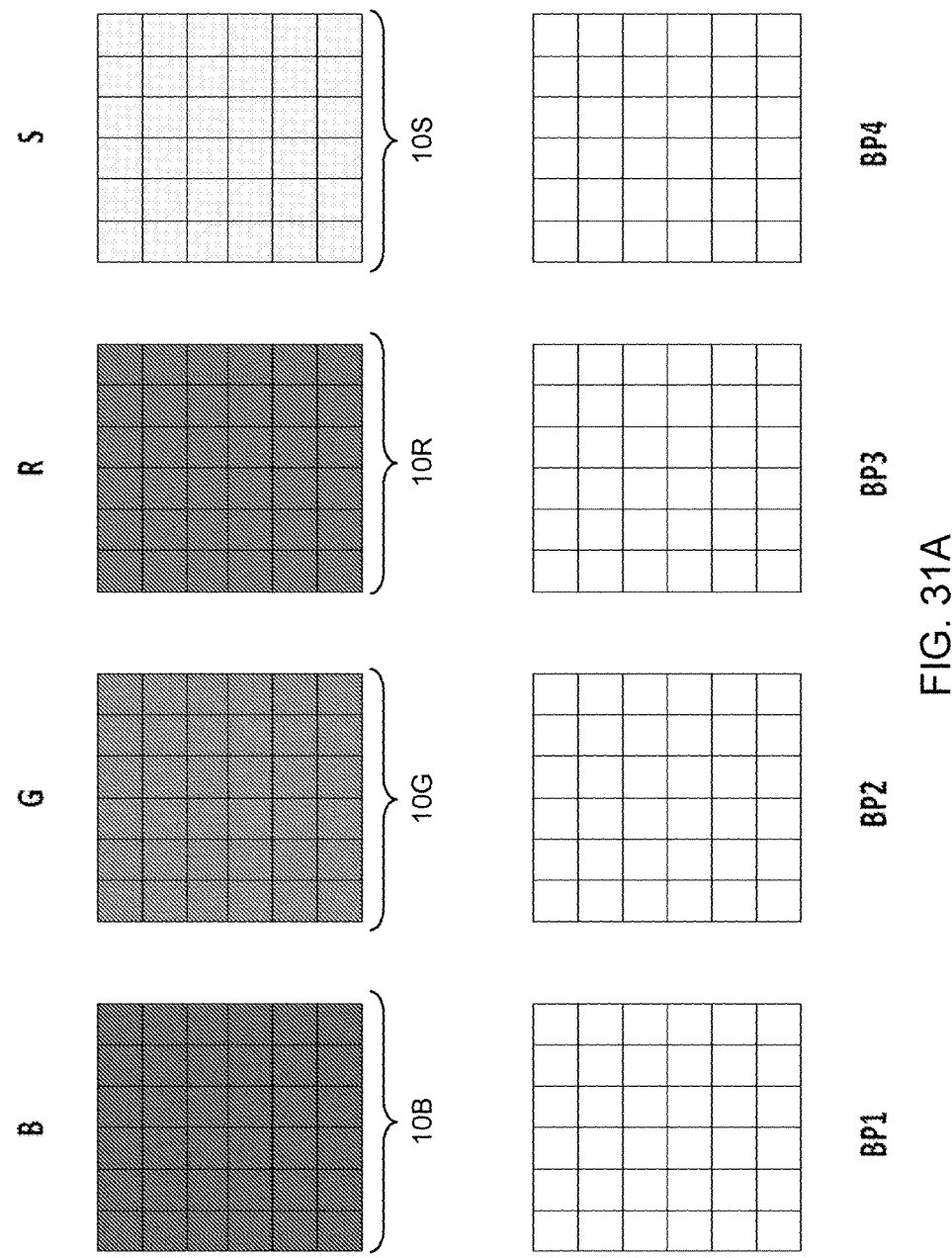
FIGS. 31A-31E are a schematic sequence for transfer of light emitting diodes according to the exemplary transfer pattern illustrated in FIG. 30.
Figure 31B:
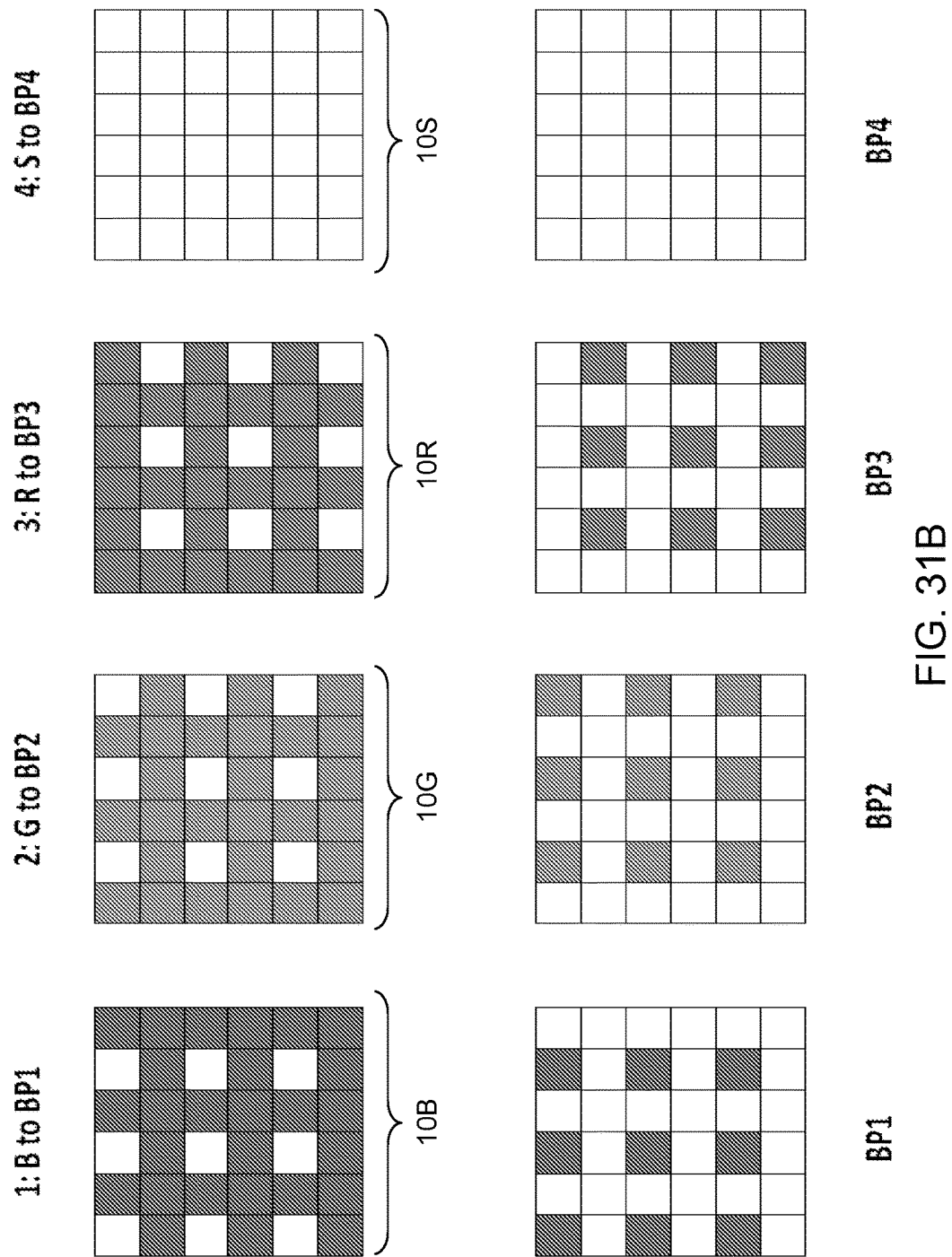
Figure 31C:
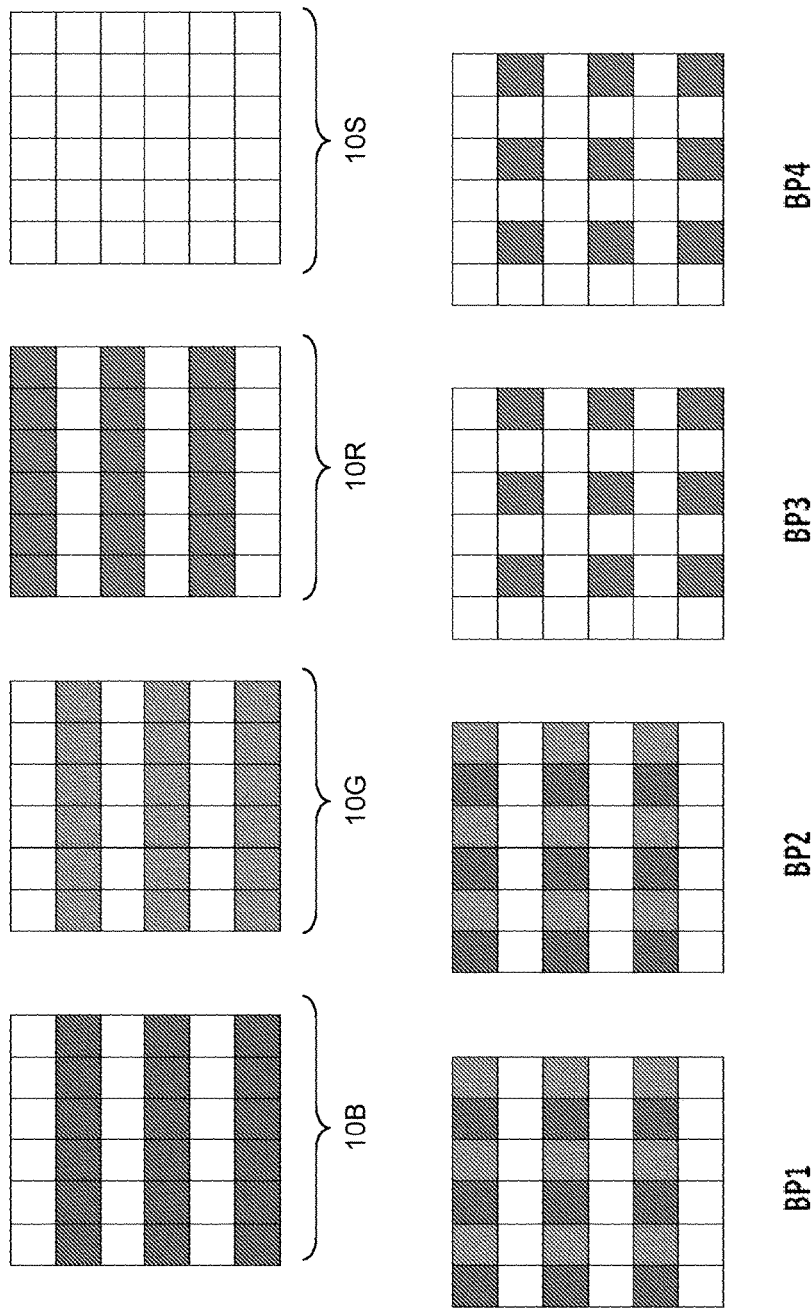
Figure 31D:
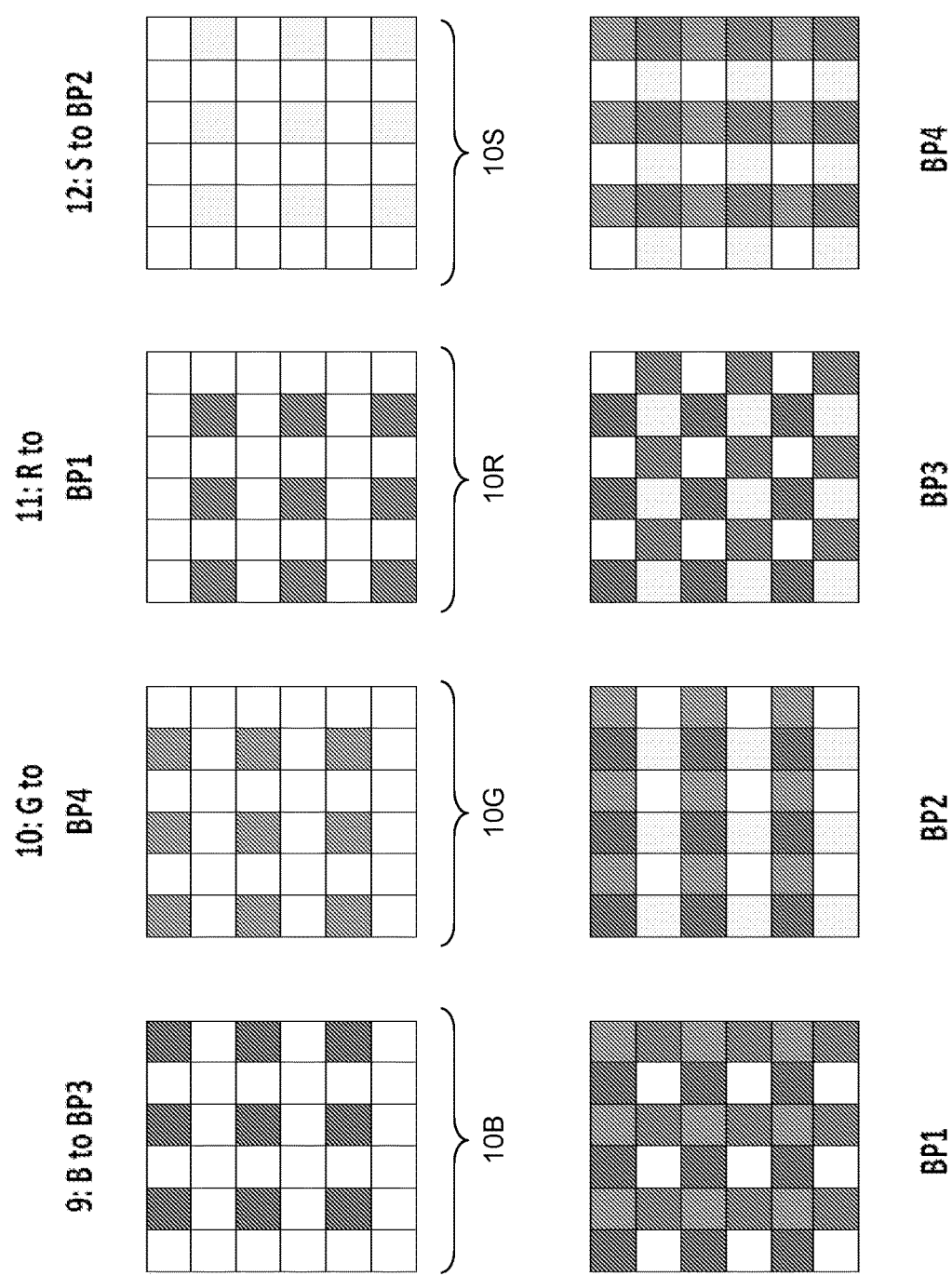
Figure 31E:
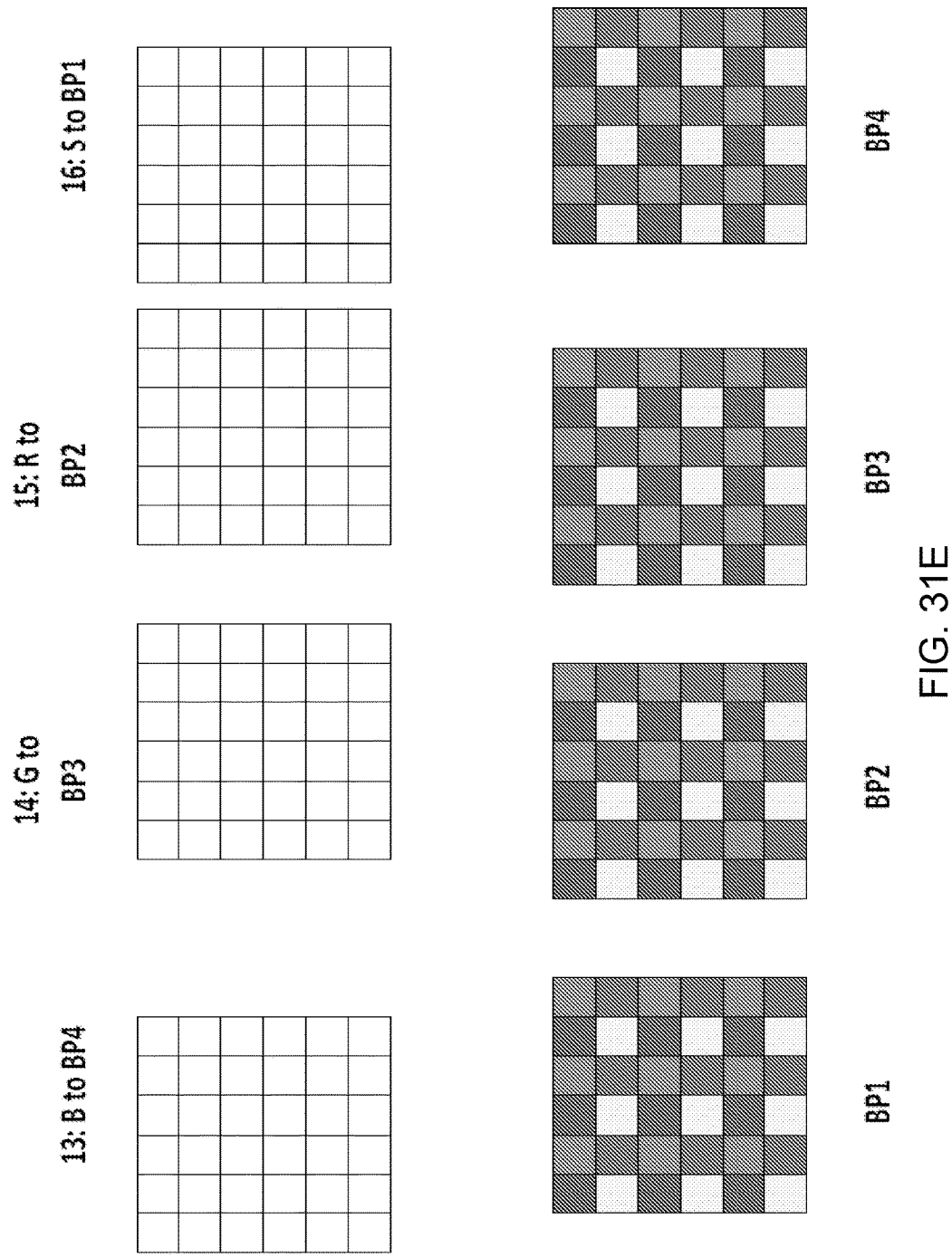

Changes in the presence or absence of the various devices (10B, 10G, 10R, 10S) on the source substrates (B, G, R, S) and the backplanes (BP1, BP2, BP3, BP4) at each step of the transfer sequence are illustrated in FIGS. 31A-31E. FIG. 31A corresponds to a configuration prior to any transfer of the devices (10B, 10G, 10R, 10S), FIG. 31B corresponds to the configuration after performing transfer steps 1-4, FIG. 31C corresponds to the configuration after performing steps 5-8, FIG. 31D corresponds to the configuration after performing steps 9-12, and FIG. 31E corresponds to the configuration after performing steps 13-16. It should be noted that steps 1-4 as illustrated in FIG. 31B may be shuffled in any order because steps 1-4 are independent of one another, steps 5-8 as illustrated in FIG. 31C may be shuffled in any order because steps 5-8 are independent of one another, steps 9-12 as illustrated in FIG. 31D may be shuffled in any order because steps 9-12 are independent of one another, and steps 13-16 as illustrated in FIG. 31E may be shuffled in any order because steps 13-16 are independent of one another.

While the exemplary transfer pattern and the exemplary transfer sequence is illustrated for cases in which four source substrates (B, G, R, S) and four backplanes (BP1, BP2, BP3, BP4) are employed, the method of the present disclosure can be applied to any case in which m transfer assemblies and n backplanes are employed, in which m is an integer greater than 1, n is an integer greater than 1, and n is not less than m. The n backplanes bond with devices from the m transfer assemblies to form n integrated light emitting device assemblies. In one embodiment, n can be the same as, or greater than, m.

A plurality of transfer assemblies, e.g., m transfer assemblies, is provided. Each of the m transfer assemblies comprises a respective source substrate (B, G, R, S) and respective devices (10B, 10G, 10R, 10S) within a two-dimensional array having a same two-dimensional periodicity. As used herein, a same two-dimensional periodicity for multiple structures refers to a configuration in which each of the multiple structures has a respective unit structure and instances of the respective unit structure are repeated along two independent directions of periodicity (e.g., a first periodicity direction and a second periodicity direction), and the unit structures are repeated along the respective first periodicity direction with a same first pitch and are repeated along the respective second periodicity direction with a same second pitch for all of the multiple structures, and the angle between the first periodicity direction and the second periodicity direction is the same for all of the multiple structures. Each of the n backplanes has a periodic repetition of respective unit conductive bonding structures pattern configured to mount m types of devices.

Each of the m types of devices can be one of the devices within a respective transfer assembly among the m transfer assemblies. The pitches of each unit conductive bonding structures pattern along two independent directions within each of the n backplanes can be multiples of a respective pitch of the two-dimensional periodicity of the devices within each of the m transfer assemblies. In an illustrative example, each of the devices (10B, 10G, 10R, 10S) can be periodic within a respective transfer assembly with the first periodicity of a along a first direction, and with the second periodicity of b along a second direction (which may be perpendicular to the first direction). The unit conductive bond pad pattern within each of the backplanes can have the first periodicity of $2a$ (which is an integer multiple of a) along a first direction, and with the second periodicity of $2b$ (which is an integer multiple of b) along a second direction (which may be perpendicular to the first direction).

Subsets of devices (10B, 10G, 10R, 10S) from each of them transfer assemblies can be sequentially transferred to a respective backplane (BP1, BP2, BP3, BP4) among the n backplanes by disposing each respective transfer assembly over the respective backplane (BP1, BP2, BP3, BP4) at locations that preclude collision of existing devices on the respective transfer assembly with any devices (10B, 10G, 10R, 10S), if any, that are previously bonded to the respective backplane (BP1, BP2, BP3, BP4).

Figure 32A:
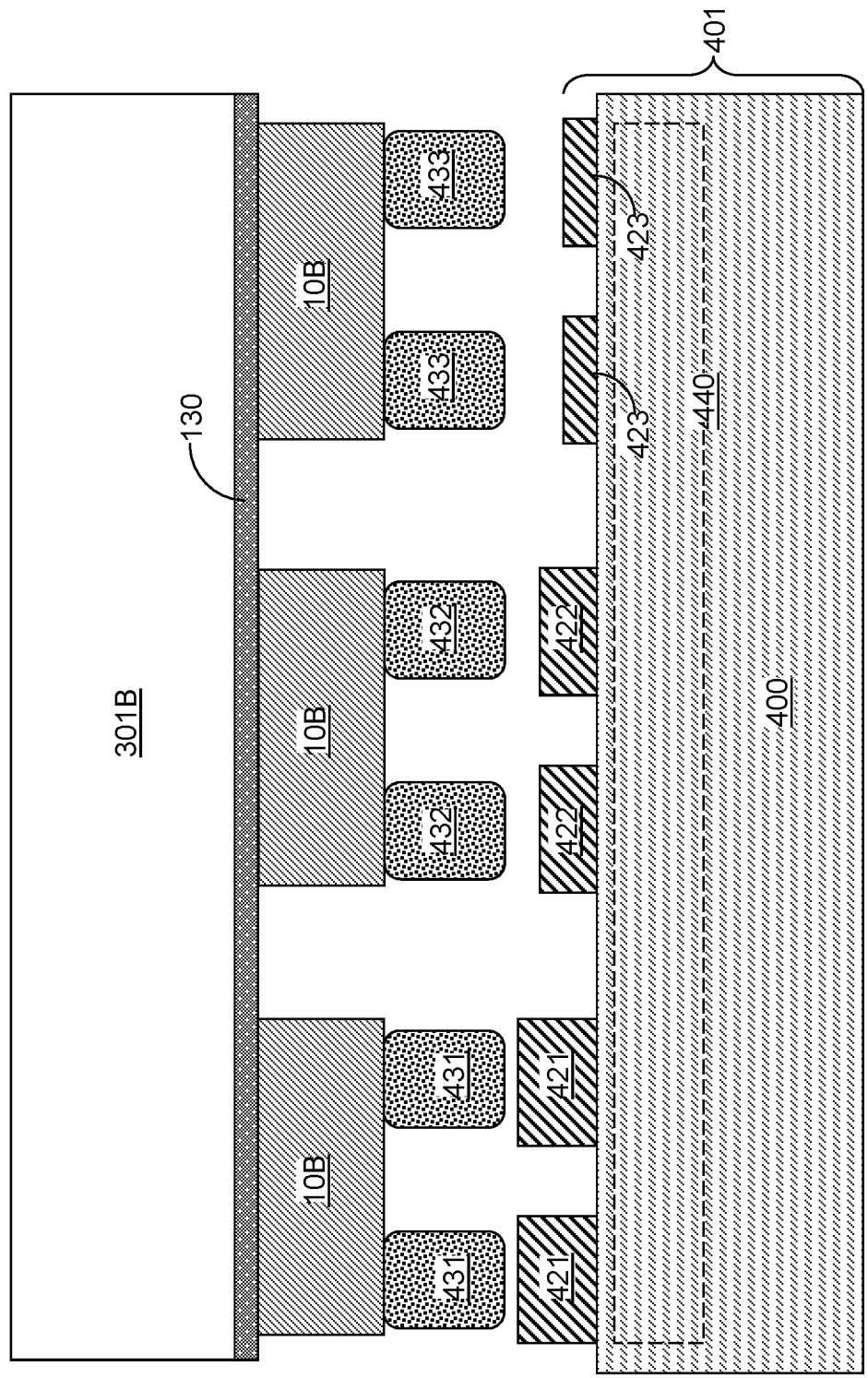
FIGS. 32A-32N are sequential vertical cross-sectional views illustrating a process for formation of a second exemplary light emitting device assembly according to an embodiment of the present disclosure.

Referring to FIG. 32A, an in-process structure is illustrated, which can be employed to form a second exemplary light emitting device assembly according to an embodiment of the present disclosure in which different height bond pads are used. As used herein, a "prototype" structure or an "in-process" structure refers to a transient structure that is subsequently modified in the shape or composition of at least one component therein. The in-process structure for the second exemplary light emitting device assembly can include a backplane substrate 400 including metal interconnect structures 440 therein. The first light emitting diodes 10B can be attached to the source substrate 301B via an ablation material layer 130, which can be a release layer 20 described above or a portion of a source substrate 530 described above. In this embodiment, the backplane substrate 400 may have a substantially planar (i.e., not stepped) upper surface or a stepped upper surface as illustrated in FIG. 9.

Bond pads (421, 422, 423) can be formed at locations at which various devices are to be subsequently bonded. The various devices can include first light emitting devices 10B, second light emitting devices 10G, third light emitting devices 10R, and/or sensor devices 10S described above. The various devices (10B, 10G, 10R, 10S) can be provided on source substrates (B, G, R, S; Refer to FIG. 30), which can be transfer substrates (301B, 301G, 301R, 301S), growth substrates (100/500B, 100/500G, 100/500R, 100/500S), or combinations thereof. The backplane 401 includes the backplane substrate 400 and the bond pads (421, 422, 423).

The bond pads (421, 422, 423) can have the same composition as the bond pads 420 described above. The bond pads (421, 422, 423) can include multiple types having different thicknesses. For example, the bond pads (421, 422, 423) can include first bond pads 421 having a first thickness, second bond pads 422 having a second thickness, and third bond pads 423 having a third thickness. Additional bond pads (not shown) having different thicknesses can also be employed. In one embodiment, the first thickness can be greater than the second thickness, and the second thickness can be greater than the third thickness. The difference between the first thickness and the second thickness can be in a range from 0.3 micron to 10 microns (for example, from 1 micron to 5 microns), and the difference between the second thickness and the third thickness can be in a range from 0.3 micron to 10 microns (for example, from 1 micron to 5 microns). The thickness of the thinnest bond pads can be in a range from 1 micron to 20 microns (for example, from 2 microns to 10 microns), although lesser and greater thicknesses can also be employed.

In one embodiment, conductive bonding structures (431, 432, 433) can be formed on the devices to be transferred to the backplane 401. For example, first light emitting diodes 10B can be the first devices to be transferred to the backplane substrate 400. The first light emitting diodes 10B can be located on first source substrate 301B, which can be a first transfer substrate 300B or a first-type growth substrate 100B or 500B. The conductive bonding structures (431, 432, 433) can be any of the conductive bonding structures 430 discussed above. The conductive bonding structures (431, 432, 432) can include first conductive bonding structures 431 formed on a first subset of the first light emitting diodes 10B to be subsequently transferred to the backplane substrate 400, second conductive bonding structures 432 formed on a second subset of the first light emitting diodes 10B to be subsequently transferred to another backplane substrate (not shown), third conductive bonding structures 433 formed on a third subset of the first light emitting diodes 10B to be subsequently transferred to yet another backplane substrate, and optional additional conductive bonding structures formed on another subset of the first light emitting diodes 10B to be subsequently transferred to still another backplane substrate. The conductive bonding structures (431, 432, 433) can be formed simultaneously on the first light emitting diodes 10B.

Alternatively, conductive bonding structures (431, 432, 433) can be formed on the bond pads (421, 422, 423) of the backplane 401. In this case, the conductive bonding structures (431, 432, 433) can be formed simultaneously on all the bond pads (421, 422, 423).

Yet alternatively, each conductive bonding structure (431, 432, 433) can be formed as two physically disjoined portions such that one portion of each conductive bonding structure (431, 432, or 433) is formed on a first light emitting diode 10B and another portion of the corresponding conductive bonding structure (431, 432, or 433) is formed on a surface of a matching bond pad (421, 422, or 423). In one embodiment, each conductive bonding structure (431, 432, 433) can be formed as two disjoined portions that are divided approximately evenly between an upper portion formed on a first light emitting diode 10B and a lower portion formed on a bond pad (421, 422, or 423).

In one embodiment, each of the conductive bonding structures (431, 432, 432) can have the same height (or total height if formed in two portions). In one embodiment, each of the conductive bonding structures (431, 432, 432) can have the same height and the same volume (or total volume if formed in two portions). In one embodiment, each of the conductive bonding structures (431, 432, 432) can have the same height, the same volume, and the same shape (or same sets of two shapes if formed in two portions). The height of the conductive bonding structures (431, 432, 432) can be in a range from 15 microns to 100 microns (such as from 20 microns to 60 microns), although lesser and greater heights can also be employed. In one embodiment, the conductive bonding structures (431, 432, 432) can be substantially spherical, substantially ellipsoidal, or substantially cylindrical. The maximum horizontal dimension (such as the diameter of a spherical shape or a cylindrical shape) of each conductive bonding structures (431, 432, 433) can be in a range from 15 microns to 100 microns (such as from 20 microns to 60 microns), although lesser and greater maximum horizontal dimensions can also be employed.

Figure 32B:
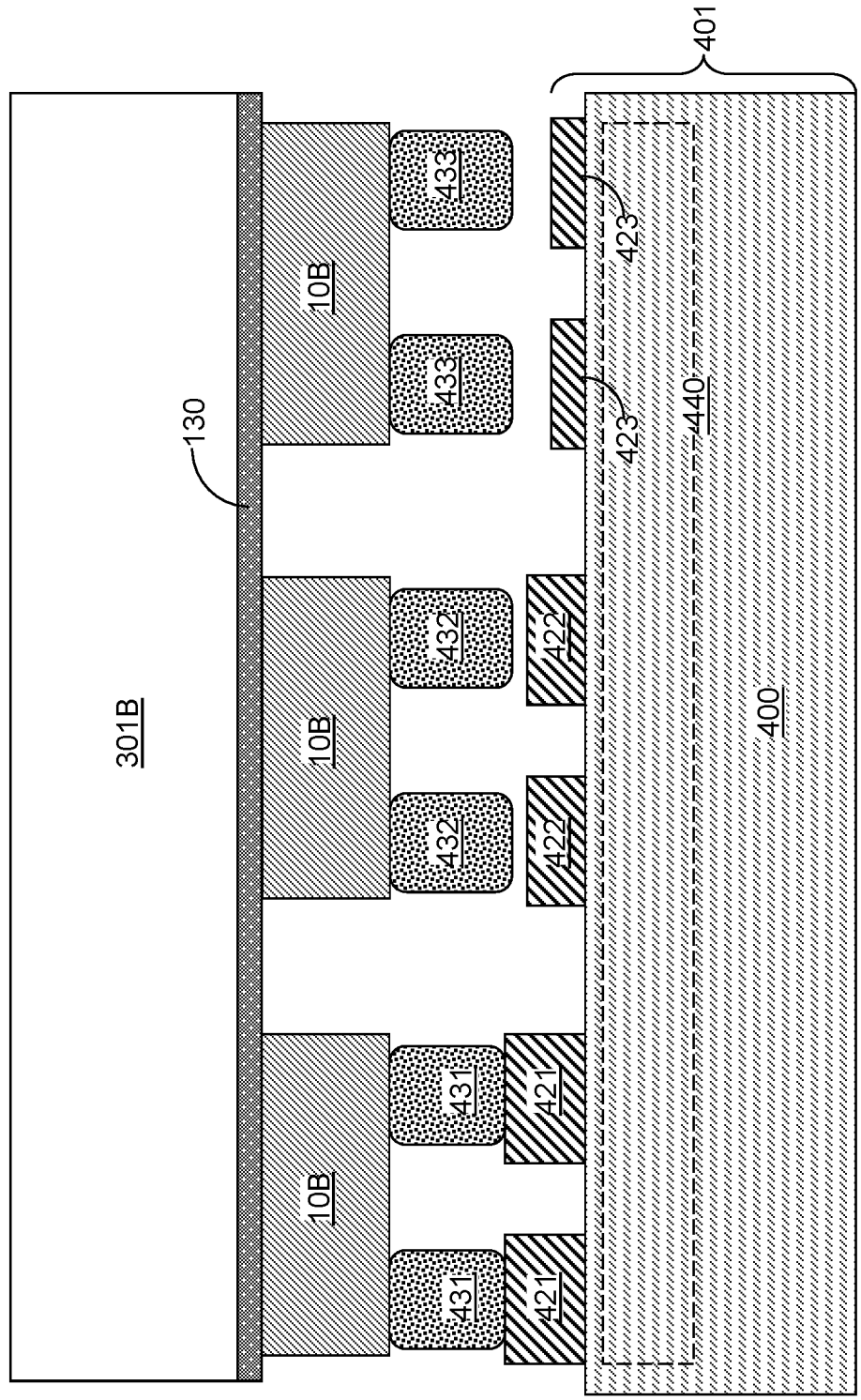

Referring to FIG. 32B, the backplane 401 and the assembly including the first light emitting diodes 10B are positioned such that each first conductive bonding structure 431 is attached to one of a first light emitting device 10B and a first bonding pad 421, and contacts the other of the first light emitting device 10B and the first bonding pad 421. Due to the difference in the thickness of the various types of bonding pads (421, 422, 423), the second conductive bonding structures 432 and the third conductive bonding structures 433 do not contact any underlying bonding pads (422, 423) (in case the second conductive bonding structures 432 and the third conductive bonding structures 433 are attached to the first light emitting devices 10B) or do not contact overlying first light emitting devices 10B (in case the second conductive bonding structures 432 and the third conductive bonding structures 433 are attached to the second bonding pads 422 or the third bonding pads 423).

A reflow process is subsequently performed. The ambient temperature can be raised to a reflow temperature of the material of the conductive bonding structures (431, 432, 432). Only the first conductive bonding structures 431 form additional bonding with the underlying first bonding pads 421 (if the first conductive bonding structures 431 are already bonded to the first light emitting devices 10B) or with the overlying first light emitting devices 10B (if the first conductive bonding structures 431 are already bonded to the first bonding pads 421). Thus, each first conductive bonding structure 431 becomes bonded to the overlying first light emitting device 10B and to the underlying first bonding pad 421, while additional bonding is not formed for the second and third conductive bonding structures (432, 433) during the reflow process. While the present disclosure is described employing an embodiment in which the backplane 401 and the assembly including the first light emitting diodes 10B are brought into contact with each other prior to the reflow process, embodiments are expressly contemplated herein in which the mechanical movement of the backplane 401 and the assembly including the first light emitting diodes 10B is performed simultaneously with the reflow process, e.g., during temperature ramping steps of the reflow process. While the first bonding pads 421 are described above as "underlying" while the first light emitting devices are described as "overlying" for convenience of illustration, it should be understood that the components can be arranged upside down (i.e., where first bonding pads 421 are "underlying" and the first light emitting devices are "underlying") or in any other position during the process.

Figure 32C:
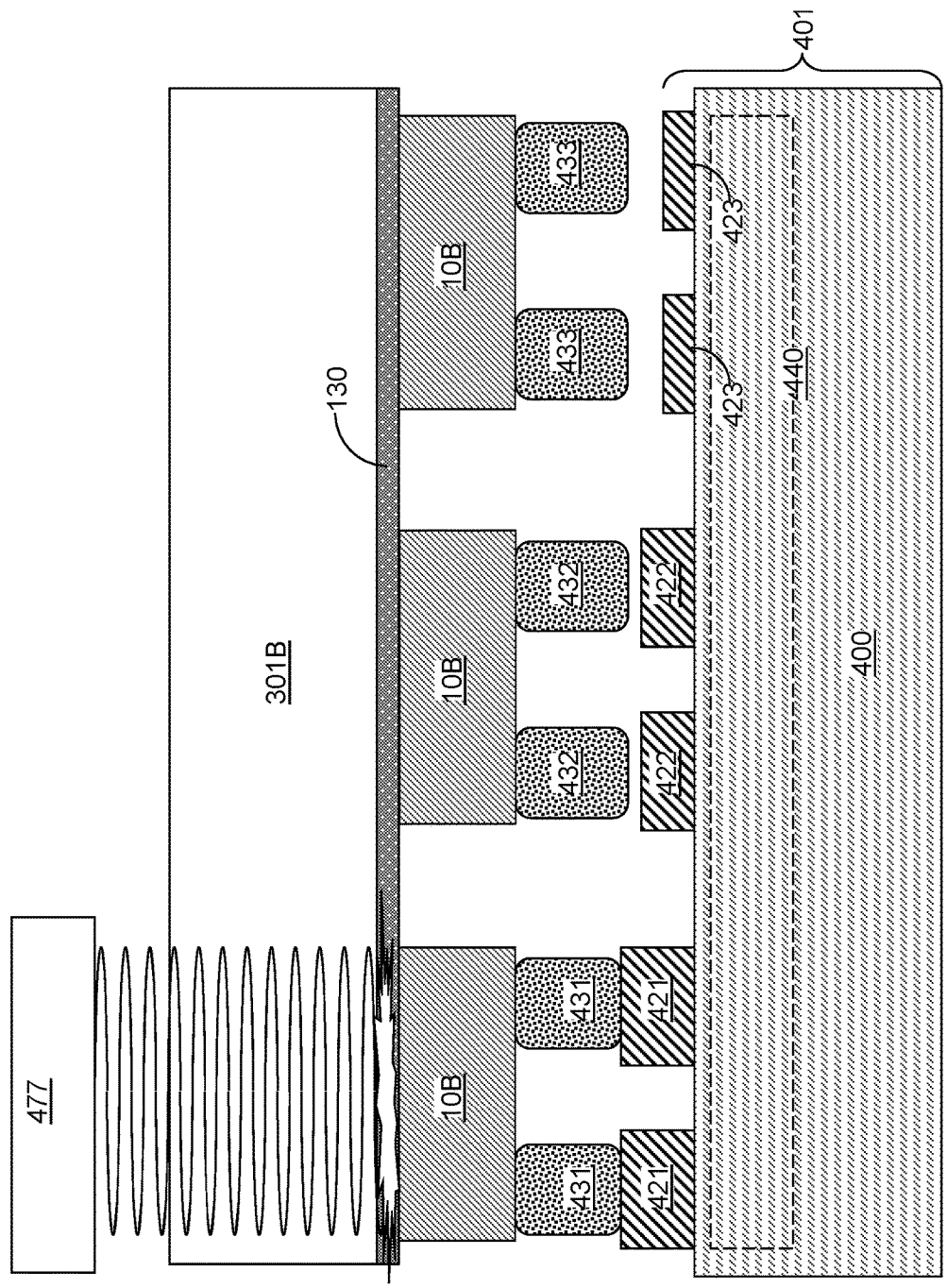

Referring to FIG. 32C, a laser irradiation process is performed to separate each bonded first light emitting device 10B from the first source substrate. The same laser irradiation process can be employed as described above. Portions of the ablation material layer 130 overlying the first subset of the first light emitting diodes 10B (which are bonded to the backplane 401) are irradiated by a laser beam, and are ablated. The laser ablation can be performed sequentially for each first light emitting diode 10B within the first subset.

Figure 32D:
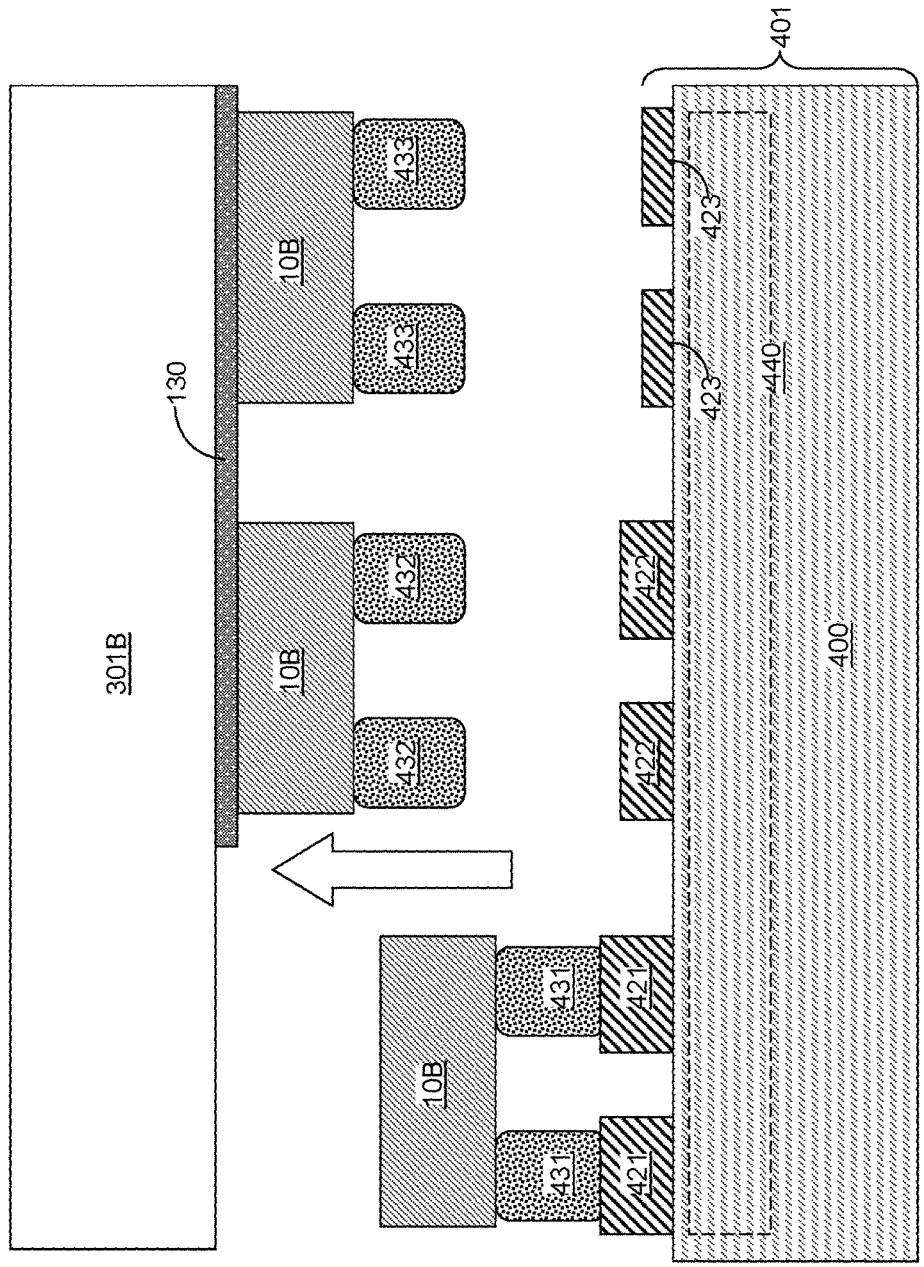

Referring to FIG. 32D, the assembly of the first source substrate 301B and attached first light emitting diodes 10B (i.e., the complement of the first subset of the first light emitting diodes 10B) is separated from the backplane 401 and the first subset of the first light emitting diodes 10B. The first subset of the first light emitting diodes 10B is attached to the backplane 401 through the first conductive bonding structures 431 to form the in-process second exemplary light emitting device assembly.

Figure 32E:
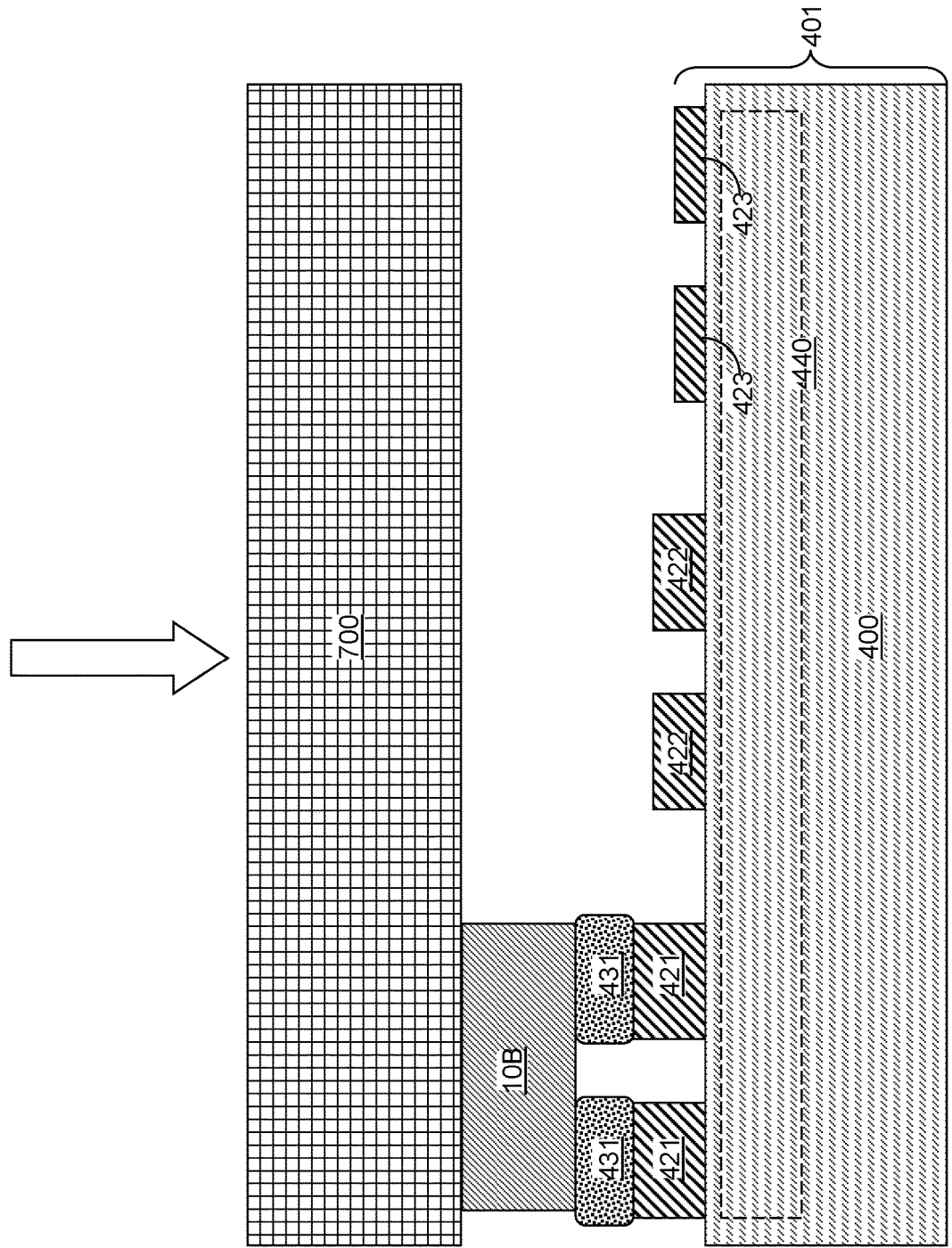

Referring to FIG. 32E, any suitable pressure plate, such as a dummy substrate 700 is employed to push the first light emitting diodes 10B on the first conductive bonding structures 431 toward the backplane 401. The temperature of the in-process second light emitting device assembly is raised to the reflow temperature of the first conductive bonding structures 431 to induce reflow of the first conductive bonding structures 431 as the dummy substrate 700 pushes the first light emitting diodes 10B toward the backplane 401. The push distance is selected such that the vertical distance between the bottom surfaces of the first bonding pads 421 and the top surfaces of the first light emitting diodes 10B is less than the sum of the thicknesses of the thinnest bonding pads (e.g., the third bonding pads 421), the height of the conductive bonding structures (431, 432, 433) (which is the same among the conductive bonding structures), and the least height of the devices (10G, 10R) to be subsequently attached (if the heights are different) or the common height of the devices (10G, 10R) to be subsequently attached (if the heights are the same).

The processing steps of FIGS. 32A-32E can correspond to step 1 illustrated in FIG. 31B, in which the backplane 401 corresponds to the backplane BP1 in FIG. 31B. Equivalent processing steps (corresponding to step 2 illustrated in FIG. 31B) can be performed to transfer a first subset of second light emitting devices 10G from a second source substrate G (which can be a second transfer substrate 300G or a second-type growth substrate 100/500G) to first bonding pads 421 of the second backplane BP2 employing the transfer pattern shown in FIG. 31B (or any other pattern). Such processing steps can provide a second source substrate G from which a first subset of second light emitting devices 10G are removed in a pattern that is congruent to the pattern of the first light emitting diodes 10B on the backplane 401.

Figure 32F:
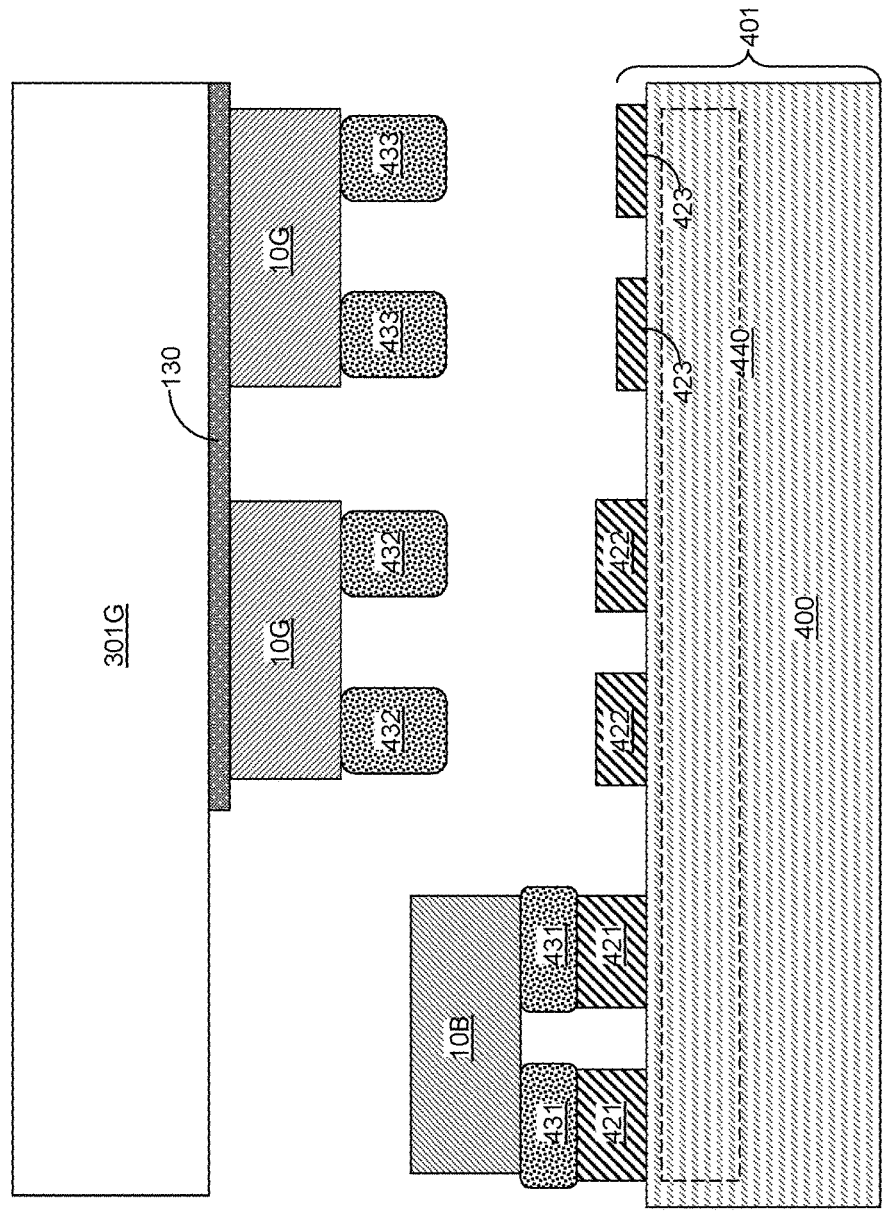

Referring to FIG. 32F, a second source substrate (such as a second transfer substrate 301G) from which a first subset of second light emitting devices 10G are removed is positioned over the in-process second exemplary light emitting device assembly, and is aligned such that a second subset of the second light emitting diodes 10G overlies the second bonding pads 422.

Figure 32G:
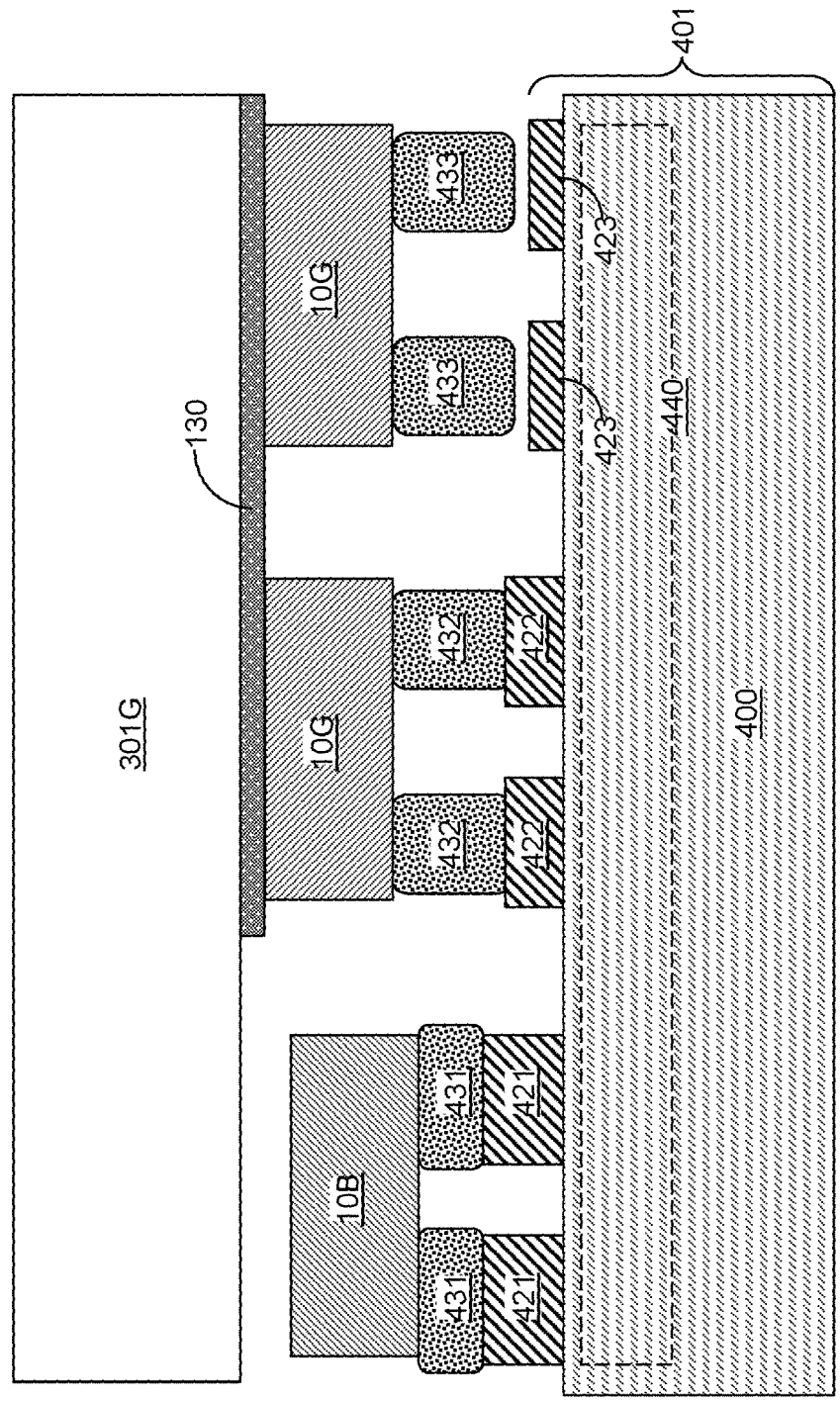

Referring to FIG. 32G, the backplane 401 and the assembly including the second light emitting diodes 10G are positioned such that each second conductive bonding structure 432 is attached to one of a second light emitting device 10G and a second bonding pad 422, and contacts the other of the second light emitting device 10G and the second bonding pad 422. Due to the difference in the thickness of the second and third bonding pads (422, 423), the third conductive bonding structures 433 do not contact any underlying bonding pads 423 (in case the second conductive bonding structures 432 and the third conductive bonding structures 433 are attached to the second light emitting devices 10G) or do not contact overlying second light emitting devices 10G (in case the second conductive bonding structures 432 and the third conductive bonding structures 433 are attached to the second bonding pads 422 or the third bonding pads 423).

A reflow process is subsequently performed. The ambient temperature can be raised to a reflow temperature of the material of the conductive bonding structures (431, 432, 432). The second conductive bonding structures 432 form additional bonding with the underlying second bonding pads 422 (if the second conductive bonding structures 432 are already bonded to the second light emitting devices 10G) or with the overlying second light emitting devices 10G (if the second conductive bonding structures 432 are already bonded to the second bonding pads 422). Thus, each second conductive bonding structure 432 becomes bonded to the overlying second light emitting device 10G, and to the underlying second bonding pad 422, while additional bonding is not formed for the third conductive bonding structures 433 during the reflow process.

Figure 32H:
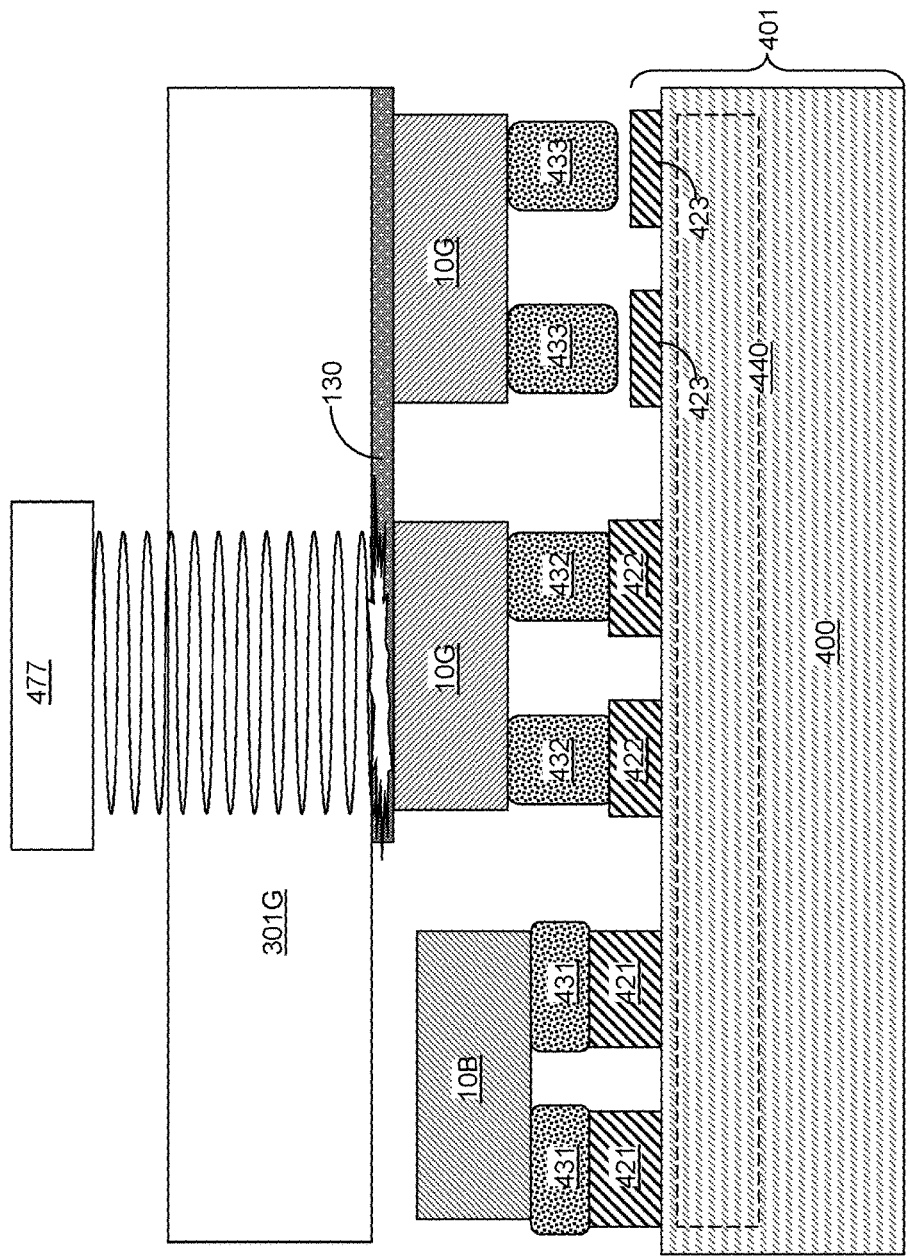

Referring to FIG. 32H, a laser irradiation process is performed to separate each bonded second light emitting device 10G from the second source substrate. Portions of the ablation material layer 130 overlying the bonded subset (i.e., the second subset) of the second light emitting diodes 10G (which are bonded to the backplane 401) are irradiated by a laser beam, and are ablated. The laser ablation can be performed sequentially for each second light emitting diode 10G within the subset of the second light emitting diodes 10G that are bonded to the backplane 401.

Figure 32I:
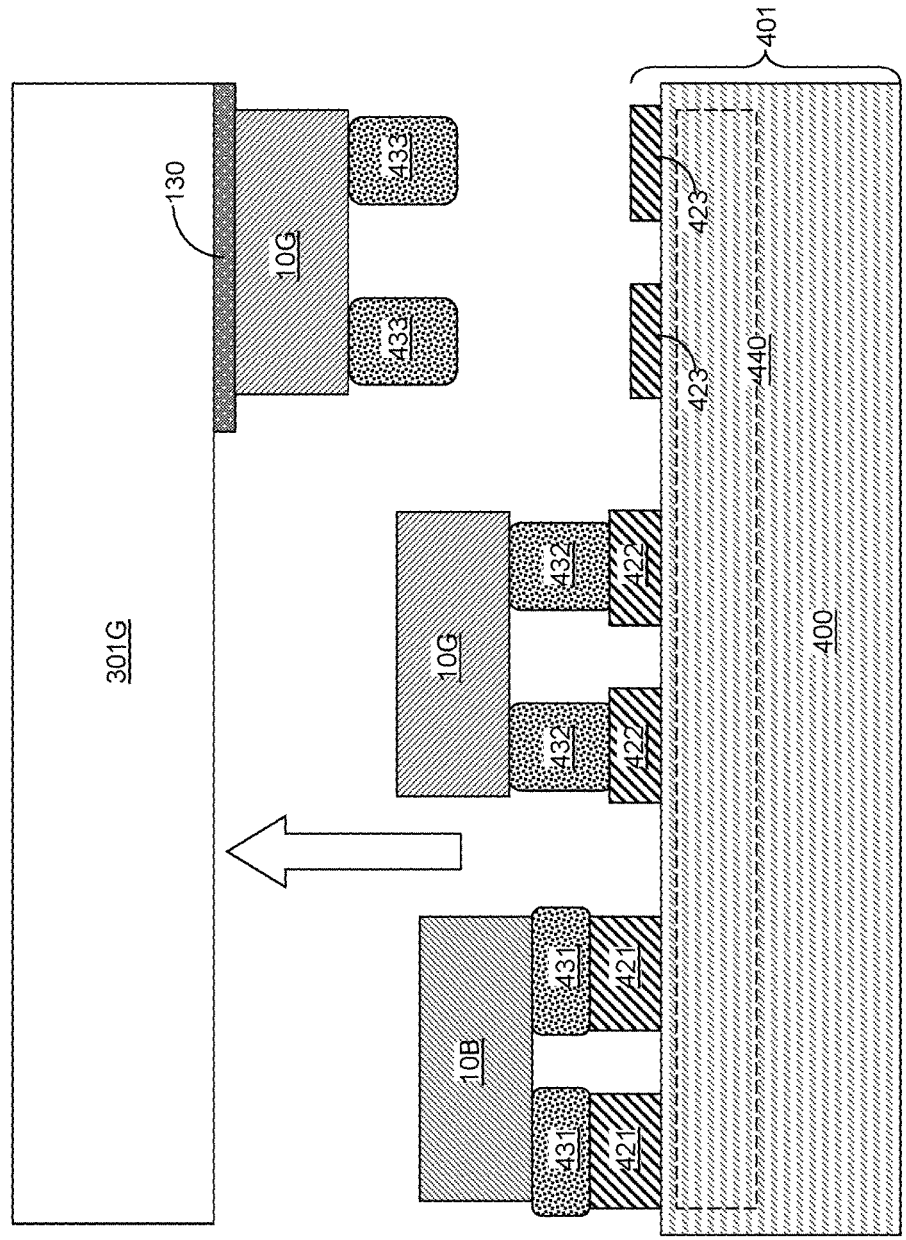

Referring to FIG. 32I, the assembly of the second source substrate 301G and attached second light emitting diodes 10G (a third subset of the second light emitting diodes 10G that remain on the second source substrate) is separated from the backplane 401 and the second subset of the second light emitting diodes 10G that are now attached to the backplane 401. The second subset of the second light emitting diodes 10G is attached to the backplane 401 through the second conductive bonding structures 432 to form the in-process second exemplary light emitting device assembly.

Figure 32J:
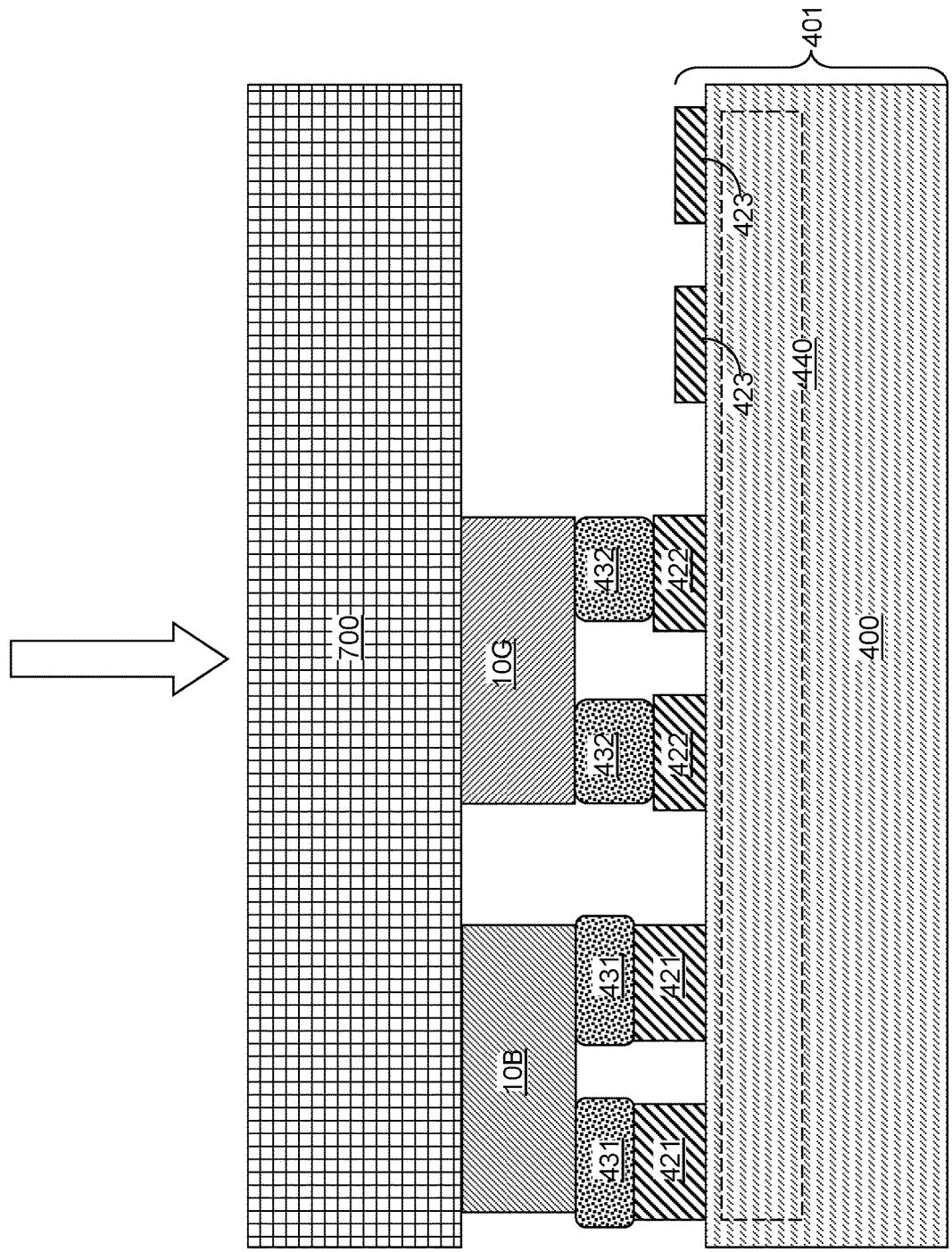

Referring to FIG. 32J, a dummy substrate 700 is employed to push the second light emitting diodes 10G on the second conductive bonding structures 432 toward the backplane 401. The temperature of the in-process second light emitting device assembly is raised to the reflow temperature of the second conductive bonding structures 432 to induce reflow of the second conductive bonding structures 432 as the dummy substrate 700 pushes the second light emitting diodes 10G toward the backplane 401. The push distance is selected such that the vertical distance between the bottom surfaces of the second bonding pads 422 and the top surfaces of the second light emitting diodes 10G is less than the sum of the thicknesses of the thinnest bonding pads (e.g., the third bonding pads 423), the height of the conductive bonding structures (431, 432, 433) as originally provided (which is the same among the conductive bonding structures), and the least height of the devices (10R and optionally 10S) to be subsequently attached (if the heights are different) or the common height of the devices (10R and optionally 10S) to be subsequently attached (if the heights are the same).

The processing steps of FIGS. 32F-32J can correspond to step 6 illustrated in FIG. 31C, in which the backplane 401 corresponds to the backplane BP1 in FIG. 31C. Processing steps corresponding to step 3 in FIG. 31B and step 7 in FIG. 31C can be performed to transfer a first subset and a second subset of third light emitting devices 10R from a third source substrate R (which can be a third transfer substrate 300R or a third-type growth substrate 100/500R) to bonding pads of additional backplanes (e.g., BP3 in FIG. 31B and BP4 in FIG. 31C) employing the transfer pattern shown in FIGS. 31B and 31C (or any other pattern). Such processing steps can provide a third source substrate R from which a first subset and a second subset of third light emitting devices 10R are removed in a pattern that is congruent to the combined pattern of the first light emitting diodes 10B and the second light emitting diodes 10G on the backplane 401.

Figure 32K:
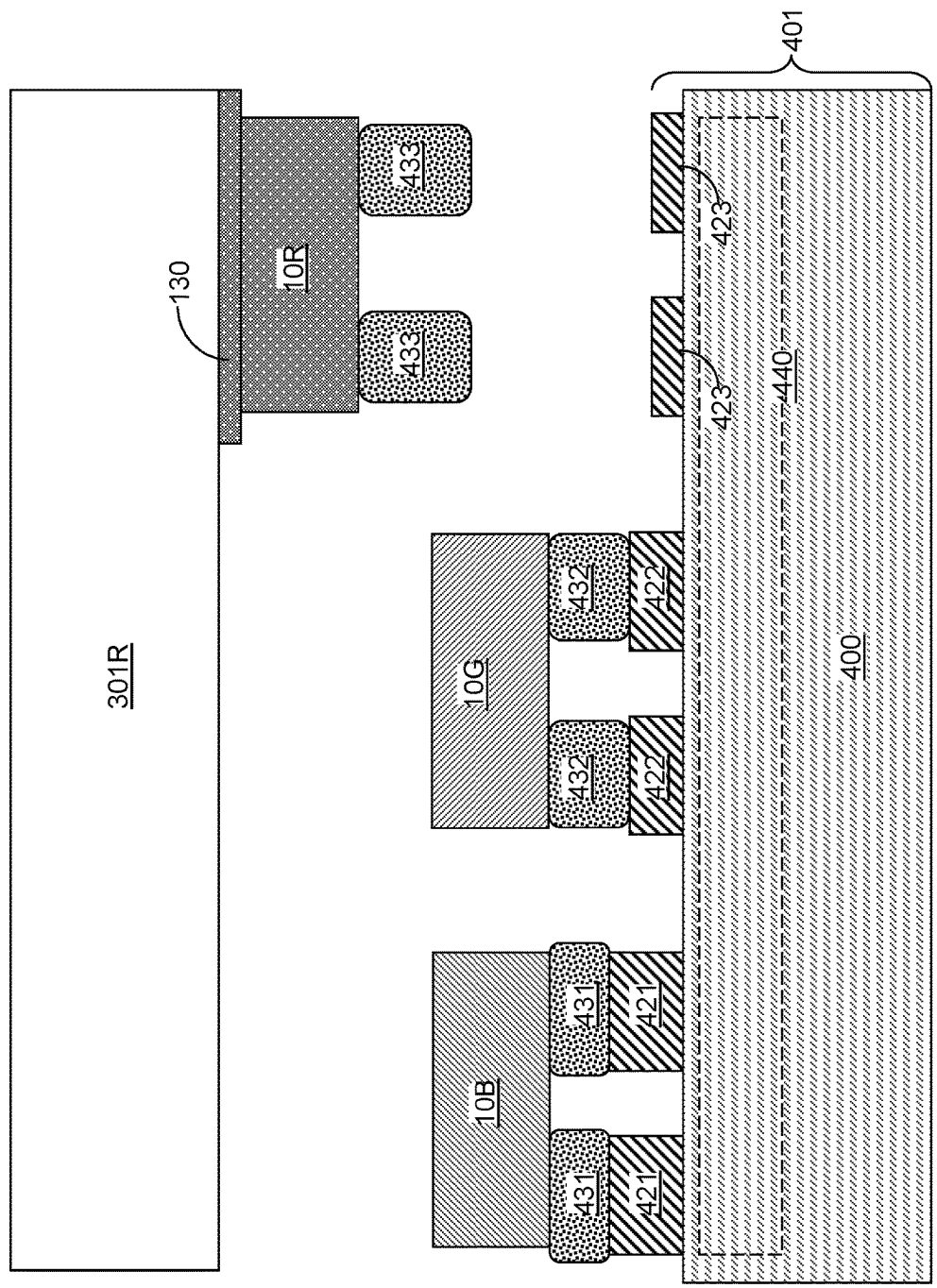

Referring to FIG. 32K, a third source substrate (such as a third transfer substrate 301R), from which a first subset and a second subset of third light emitting devices 10R have been removed in prior processing steps, is positioned over the in-process second exemplary light emitting device assembly, and is aligned such that a third subset of the third light emitting diodes 10R overlies the third bonding pads 423.

Figure 32L:
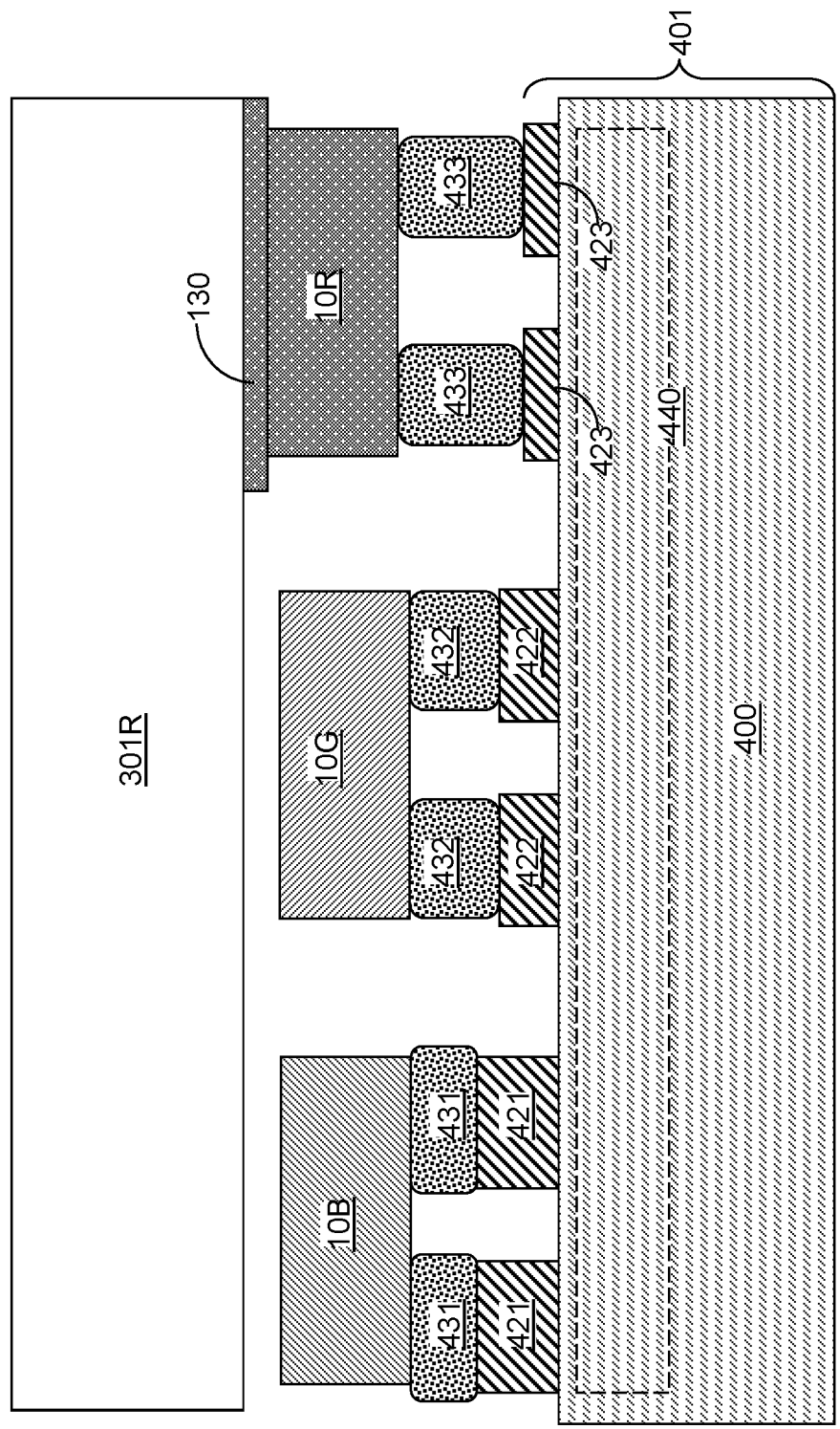

Referring to FIG. 32L, the backplane 401 and the assembly including the third light emitting diodes 10R are positioned such that each third conductive bonding structure 433 is attached to one of a third light emitting device 10R and a third bonding pad 423, and contacts the other of the third light emitting device 10R and the third bonding pad 423. If any addition bonding pads (not shown) having a lesser thickness are present, additional conductive bonding structures (not shown) overlying such additional bonding pads do not contact any underlying additional bonding pads (in case the additional conductive bonding structures are attached to the third source substrate) or do not contact overlying third light emitting devices 10R (in case the additional conductive bonding structures are attached to the additional bonding pads).

A reflow process is subsequently performed. The ambient temperature can be raised to a reflow temperature of the material of the conductive bonding structures (431, 432, 432). The third conductive bonding structures 433 form additional bonding with the underlying third bonding pads 423 (if the third conductive bonding structures 433 are already bonded to the third light emitting devices 10R) or with the overlying third light emitting devices 10R (if the third conductive bonding structures 433 are already bonded to the third bonding pads 423). Thus, each third conductive bonding structure 433 becomes bonded to the overlying third light emitting device 10R, and to the underlying third bonding pad 423, while additional bonding is not formed for the additional conductive bonding structures (if present) during the reflow process.

Figure 32M:
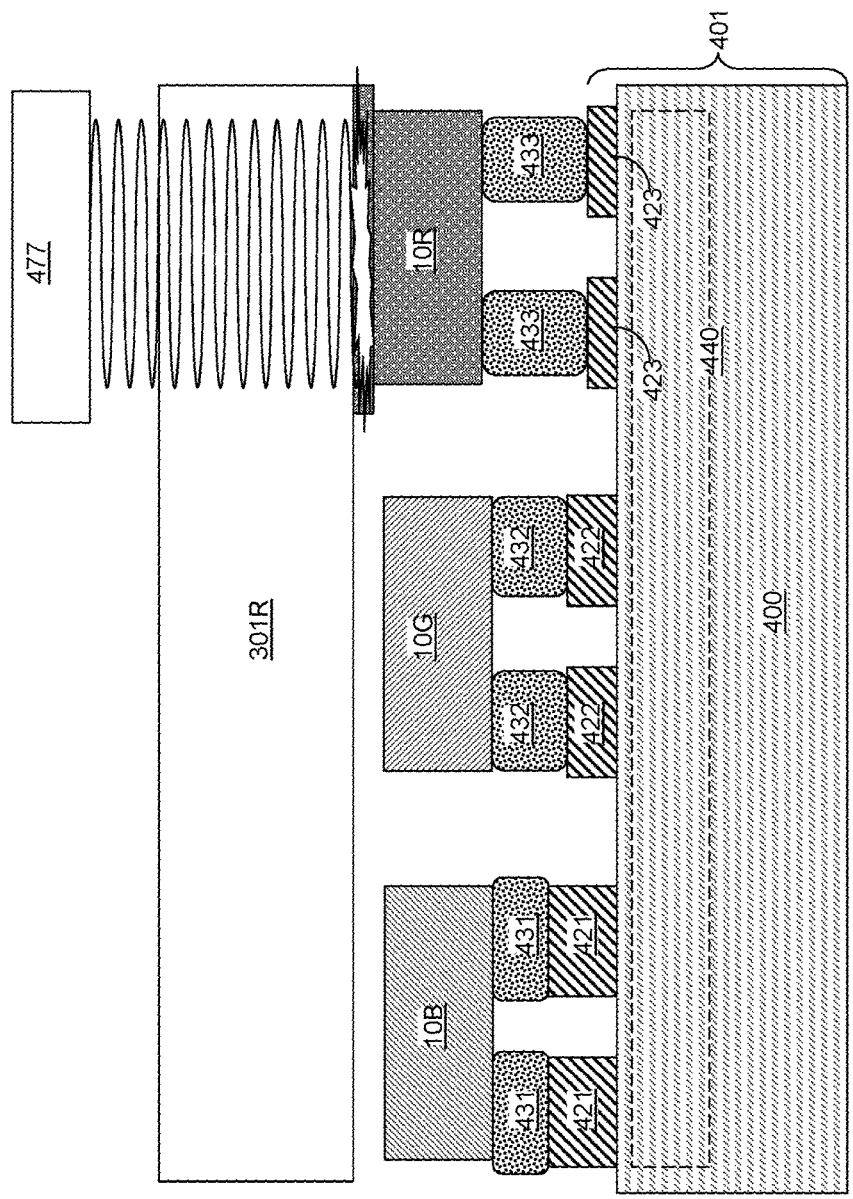

Referring to FIG. 32M, a laser irradiation process is performed to separate each bonded third light emitting device 10R from the third source substrate. Portions of the ablation material layer 130 overlying the bonded subset (i.e., the third subset) of the third light emitting diodes 10R (which are bonded to the backplane 401) are irradiated by a laser beam, and are ablated. The laser ablation can be performed sequentially for each third light emitting diode 10R within the subset of the third light emitting diodes 10R that are bonded to the backplane 401.

Figure 32N:
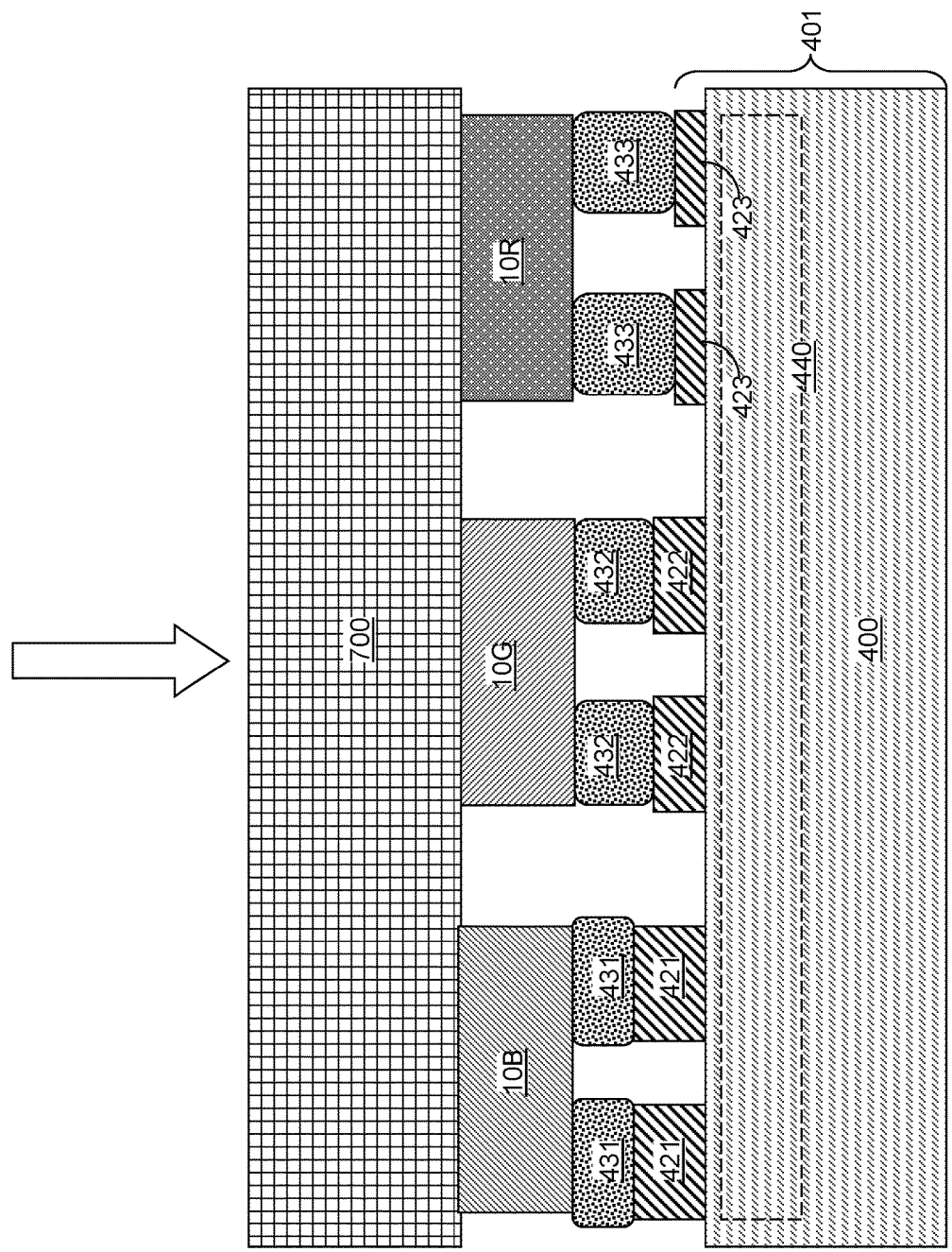

Referring to FIG. 32N, the assembly of the third source substrate 301R and any remaining third light emitting diodes 10R, if any, is separated from the backplane 401 and the third subset of the third light emitting diodes 10R that are now attached to the backplane 401. The third subset of the third light emitting diodes 10R is attached to the backplane 401 through the third conductive bonding structures 433 to form the second exemplary light emitting device assembly.

Optionally, a dummy substrate 700 may be employed to push the third light emitting diodes 10R on the third conductive bonding structures 433 toward the backplane 401. The temperature of the second light emitting device assembly is raised to the reflow temperature of the third conductive bonding structures 433 to induce reflow of the third conductive bonding structures 433 as the dummy substrate 700 pushes the third light emitting diodes 10R toward the backplane 401. If any additional devices (such as sensor devices 10S) are to be subsequently attached to the backplane 401, the push distance can be selected such that the vertical distance between the bottom surfaces of the third bonding pads 423 and the top surfaces of the third light emitting diodes 10R is less than the sum of the thicknesses of the additional bonding pads, the height of the additional conductive bonding structures (which can be the same as the height of the other conductive bonding pads (431, 432, 433) as originally provided), and the least height of the devices (such as sensor devices 10S) to be subsequently.

Figure 33A:
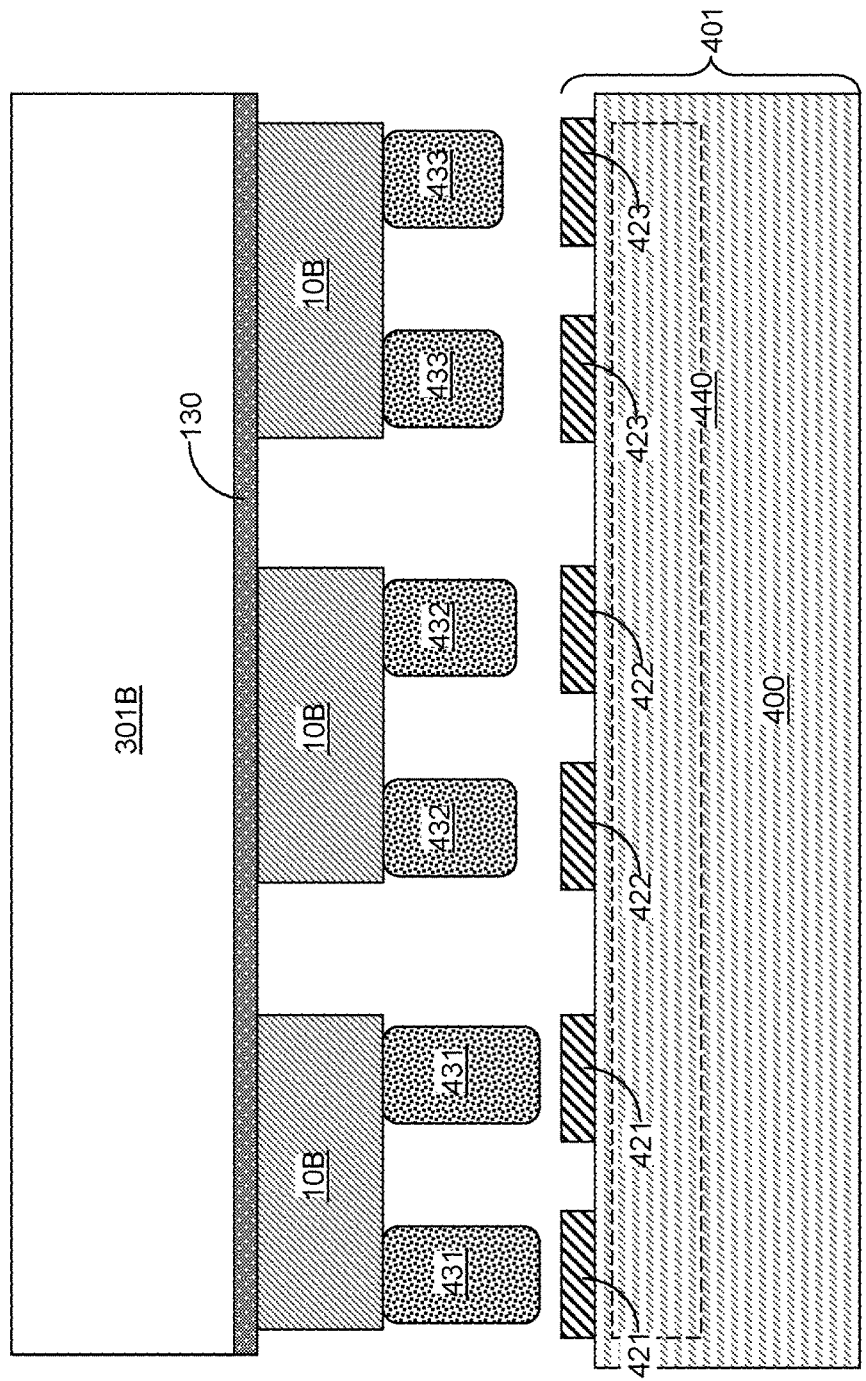
FIGS. 33A-33N are sequential vertical cross-sectional views illustrating a process for formation of a third exemplary light emitting device assembly according to an embodiment of the present disclosure.

Referring to FIG. 33A, an in-process structure is illustrated, which can be employed to form a third exemplary light emitting device assembly according to an embodiment of the present disclosure. The in-process third exemplary light emitting device assembly can be derived from the in-process second exemplary light emitting device assembly of FIG. 32A by employing the same thickness for the bonding pads (421, 422, 423) and different heights for the conductive bonding structures (431, 432, 433). The bond pads (421, 422, 423) can have the same composition as the bond pads 420 described above. In this embodiment, the backplane substrate 400 may have a substantially planar (i.e., not stepped) upper surface or a stepped upper surface as illustrated in FIG. 9, and the bond pads (421, 422, 423) can have the same height or different heights as shown in FIG. 32A.

The conductive bonding structures (431, 432, 433) can include multiple types having different heights. For example, the conductive bonding structures (431, 432, 433) can include first conductive bonding structures 431 having a first height, second conductive bonding structures 432 having a second height, and third conductive bonding structures 433 having a third height. Additional conductive bonding structures (not shown) having different heights can also be employed. In one embodiment, the first height can be greater than the second height, and the second height can be greater than the third height. The difference between the first height and the second height can be in a range from 0.3 micron to 10 microns (for example, from 1 micron to 5 microns), and the difference between the second height and the third height can be in a range from 0.3 micron to 10 microns (for example, from 1 micron to 5 microns). The height of the shortest conductive bonding structures (e.g., 433) can be in a range from 10 micron to 80 microns (for example, from 15 microns to 50 microns), although lesser and greater heights can also be employed.

In one embodiment, the conductive bonding structures (431, 432, 433) can be formed on the devices to be transferred to the backplane 401. For example, first light emitting diodes 10B can be the first devices to be transferred to the backplane substrate 400. The first light emitting diodes 10B can be located on first source substrate B, which can be a first transfer substrate 30B or a first-type growth substrate 100B. The conductive bonding structures (431, 432, 433) can be any of the conductive bonding structures 430 discussed above. The conductive bonding structures 431 are formed on a first subset of the first light emitting diodes 10B to be subsequently transferred to the backplane substrate 400. The second conductive bonding structures 432 are formed on a second subset of the first light emitting diodes 10B to be subsequently transferred to another backplane substrate (not shown). The third conductive bonding structures 433 are formed on a third subset of the first light emitting diodes 10B to be subsequently transferred to yet another backplane substrate. Optionally, additional conductive bonding structures can be formed on another subset of the first light emitting diodes 10B to be subsequently transferred to still another backplane substrate.

Alternatively, conductive bonding structures (431, 432, 433) can be formed on the bond pads (421, 422, 423) of the backplane 401. In this case, the conductive bonding structures (431, 432, 433) can be formed simultaneously on all the bond pads (421, 422, 423).

Yet alternatively, each conductive bonding structure (431, 432, 433) can be formed as two physically disjoined portions such that one portion of each conductive bonding structure (431, 432, or 433) is formed on a first light emitting diode 10B and another portion of the corresponding conductive bonding structure (431, 432, or 433) is formed on a surface of a matching bond pad (421, 422, or 423). In one embodiment, each conductive bonding structure (431, 432, 433) can be formed as two disjoined portions that are divided approximately evenly between an upper portion formed on a first light emitting diode 10B and a lower portion formed on a bond pad (421, 422, or 423).

Different types of conductive bonding structures (431, 432, 433) can be formed sequentially on the first light emitting diodes 10B. The first conductive bonding structures 431 can have a greater volume than the second conductive bonding structures 432, and the second conductive bonding structures 432 can have a greater volume than the third conductive bonding structures 433. In one embodiment, the conductive bonding structures (431, 432, 433) of different types can have substantially the same maximum lateral dimensions (e.g., the diameter of a spherical shape or a cylindrical shape).

In one embodiment, the conductive bonding structures (431, 432, 432) can be substantially ellipsoidal, or substantially cylindrical. The maximum horizontal dimension (such as the diameter of a spherical shape or a cylindrical shape) of each conductive bonding structures (431, 432, 433) can be in a range from 15 microns to 100 microns (such as from 20 microns to 60 microns), although lesser and greater maximum horizontal dimensions can also be employed.

Figure 33B:
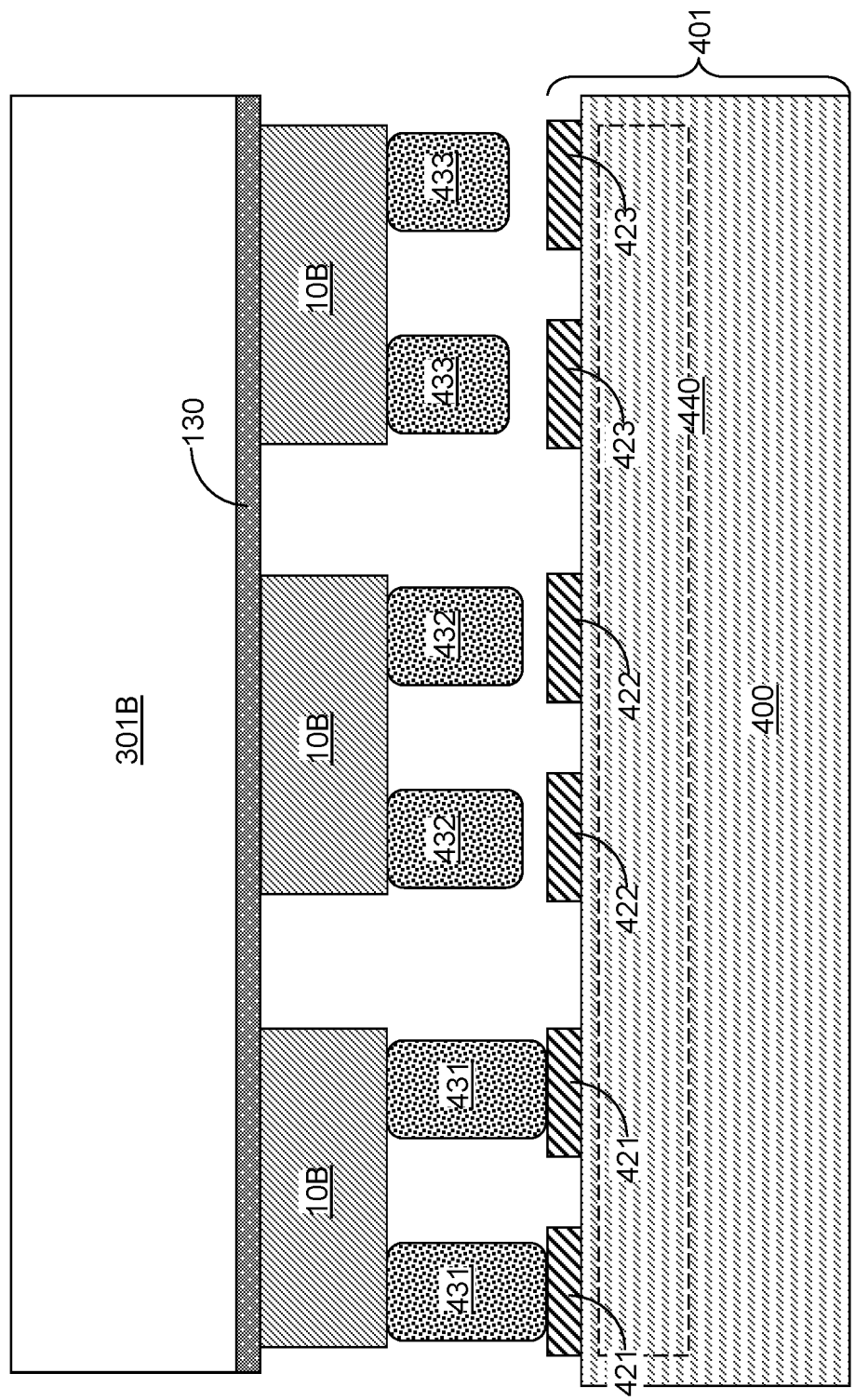

Referring to FIG. 33B, the backplane 401 and the assembly including the first light emitting diodes 10B are positioned such that each first conductive bonding structure 431 is attached to one of a first light emitting device 10B and a first bonding pad 421, and contacts the other of the first light emitting device 10B and the first bonding pad 421. Due to the difference in the heights of the various types of conductive bonding structures (431, 432, 432), the second conductive bonding structures 432 and the third conductive bonding structures 433 do not contact any underlying bonding pads (422, 423) (in case the second conductive bonding structures 432 and the third conductive bonding structures 433 are attached to the first light emitting devices 10B) or do not contact overlying first light emitting devices 10B (in case the second conductive bonding structures 432 and the third conductive bonding structures 433 are attached to the second bonding pads 422 or the third bonding pads 423).

A reflow process is subsequently performed in the same manner as the processing steps of FIG. 32B.

Figure 33C:
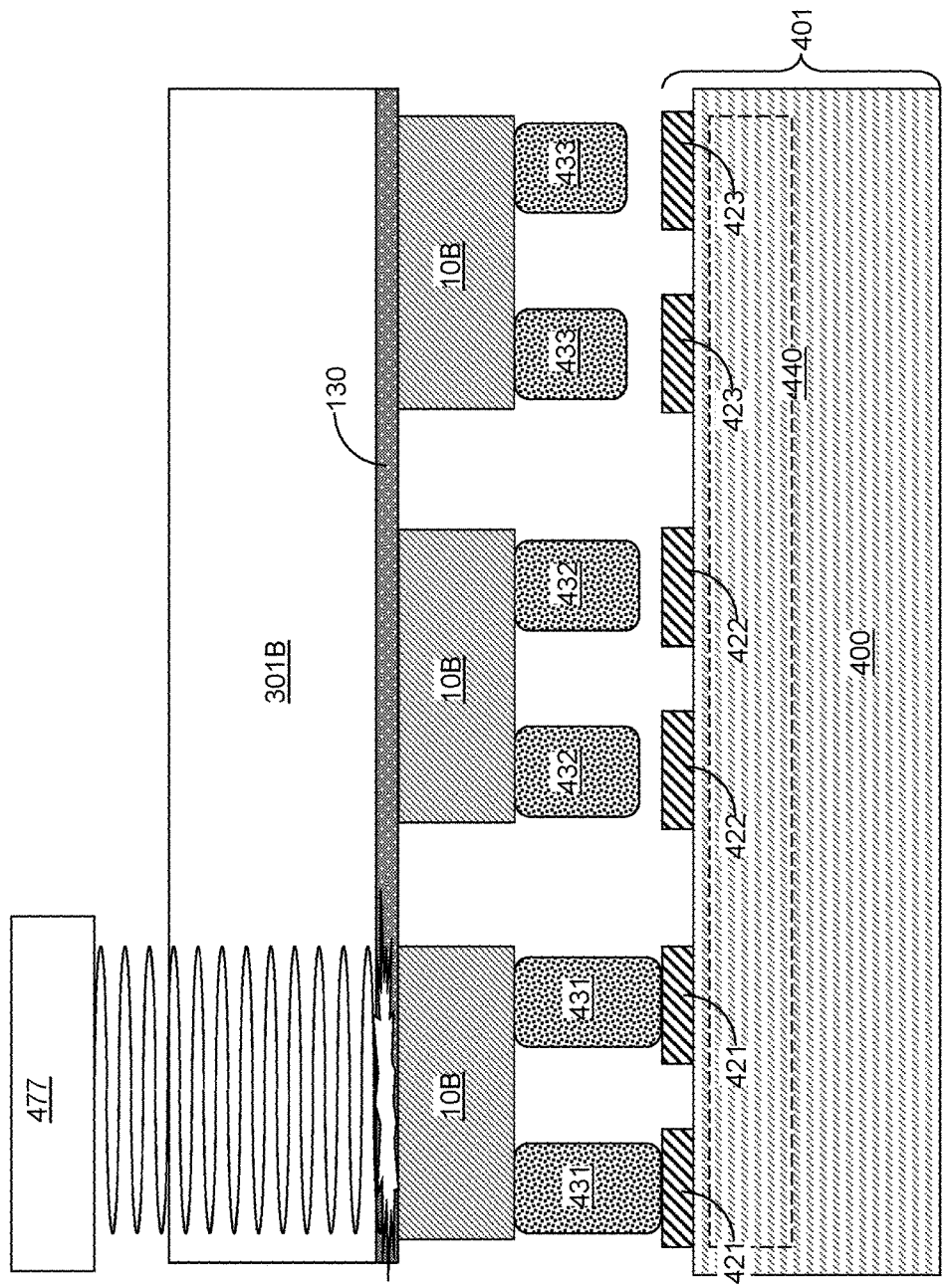

Referring to FIG. 33C, a laser irradiation process is performed to separate each bonded first light emitting device 10B from the first source substrate in the same manner as the processing steps of FIG. 32C.

Figure 33D:
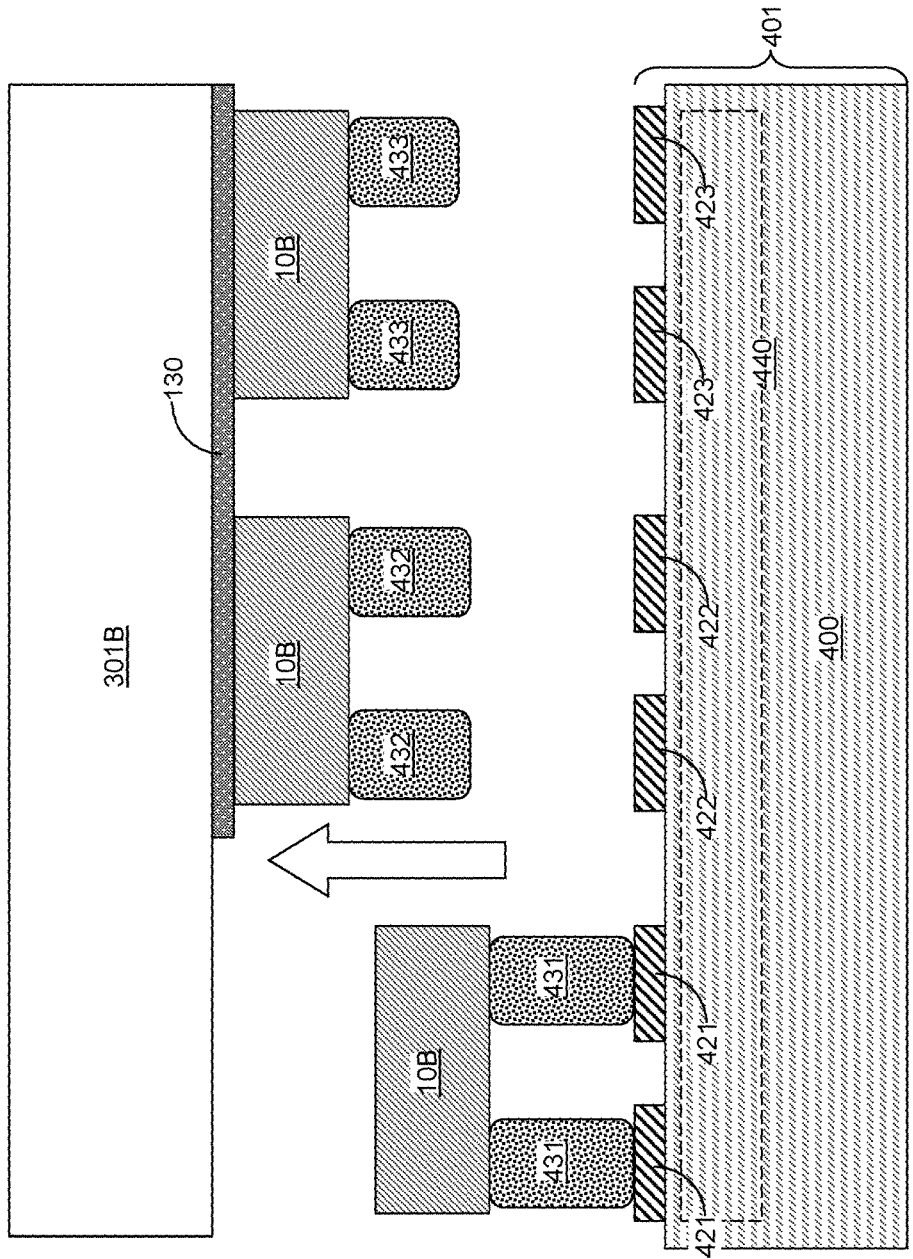

Referring to FIG. 33D, the assembly of the first source substrate 301B and attached first light emitting diodes 10B (i.e., the complement of the first subset of the first light emitting diodes 10B) is separated from the backplane 401 and the first subset of the first light emitting diodes 10B.

Figure 33E:
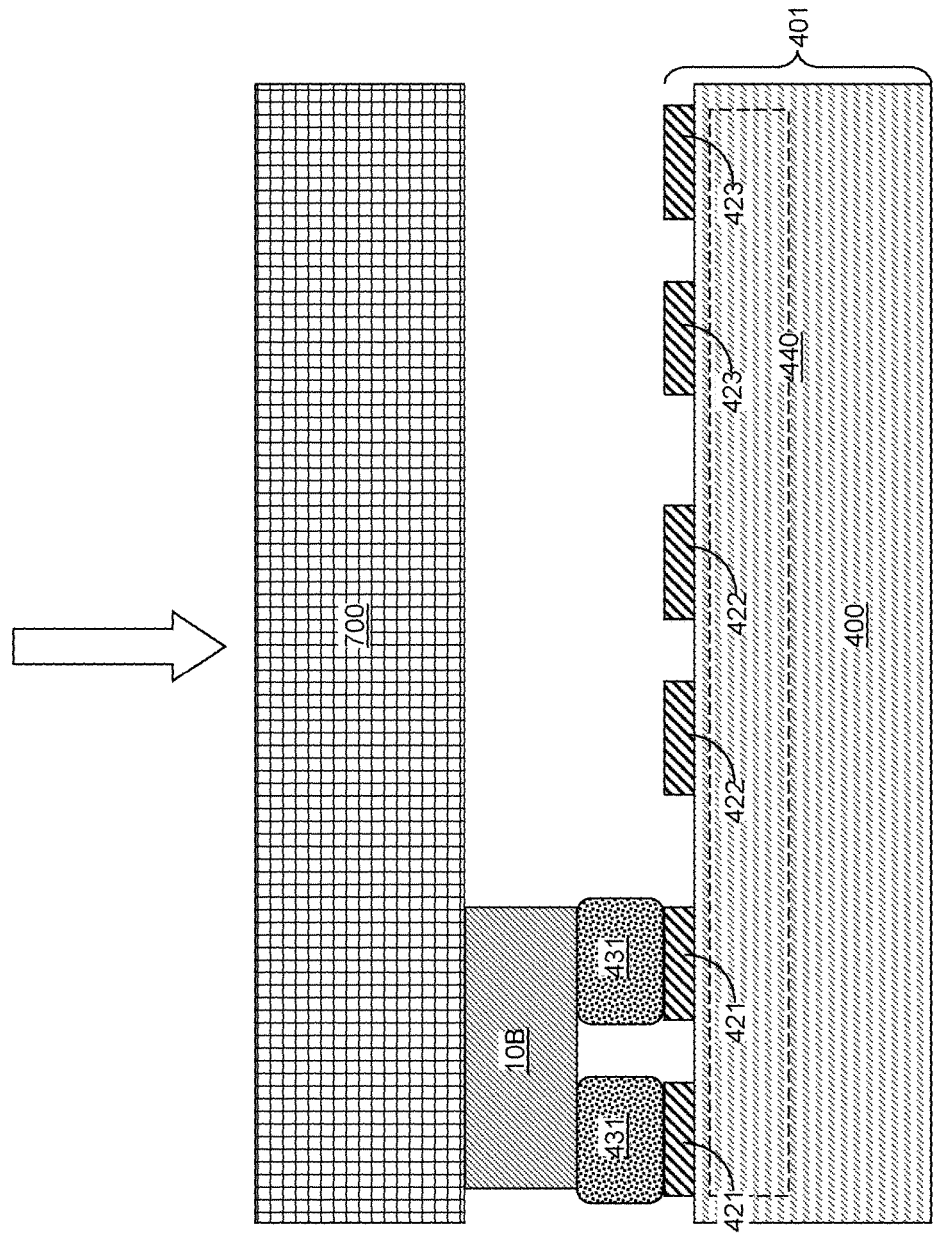

Referring to FIG. 33E, a dummy substrate 700 is employed to push the first light emitting diodes 10B on the first conductive bonding structures 431 toward the backplane 401 while reflowing the first conductive bonding structures 431 in the same manner as the processing steps of FIG. 32E.

The processing steps of FIGS. 33A-33E can correspond to step 1 illustrated in FIG. 31B, in which the backplane 401 corresponds to the backplane BP1 in FIG. 31B. Equivalent processing steps (corresponding to step 2 illustrated in FIG. 31B) can be performed to transfer a first subset of second light emitting devices 10G from a second source substrate G (which can be a second transfer substrate 300G or a second-type growth substrate 100/500G) to first bonding pads 421 of the second backplane BP2 employing the transfer pattern shown in FIG. 31B (or any other pattern). Such processing steps can provide a second source substrate G from which a first subset of second light emitting devices 10G are removed in a pattern that is congruent to the pattern of the first light emitting diodes 10B on the backplane 401.

Figure 33F:
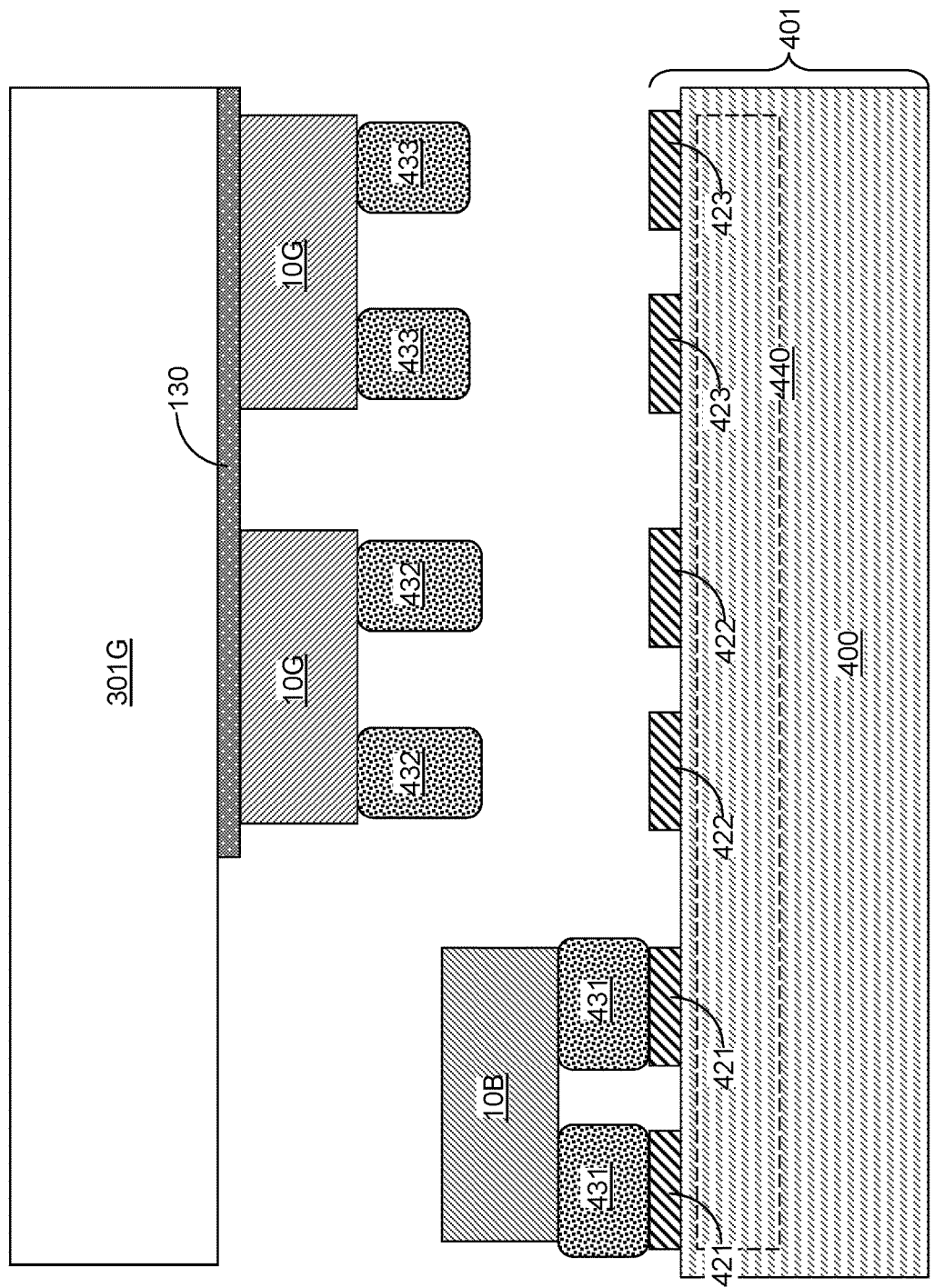

Referring to FIG. 33F, a second source substrate (such as a second transfer substrate 301G) from which a first subset of second light emitting devices 10G are removed is positioned over the in-process fourth exemplary light emitting device assembly, and is aligned such that a second subset of the second light emitting diodes 10G overlies the second bonding pads 422.

Figure 33G:
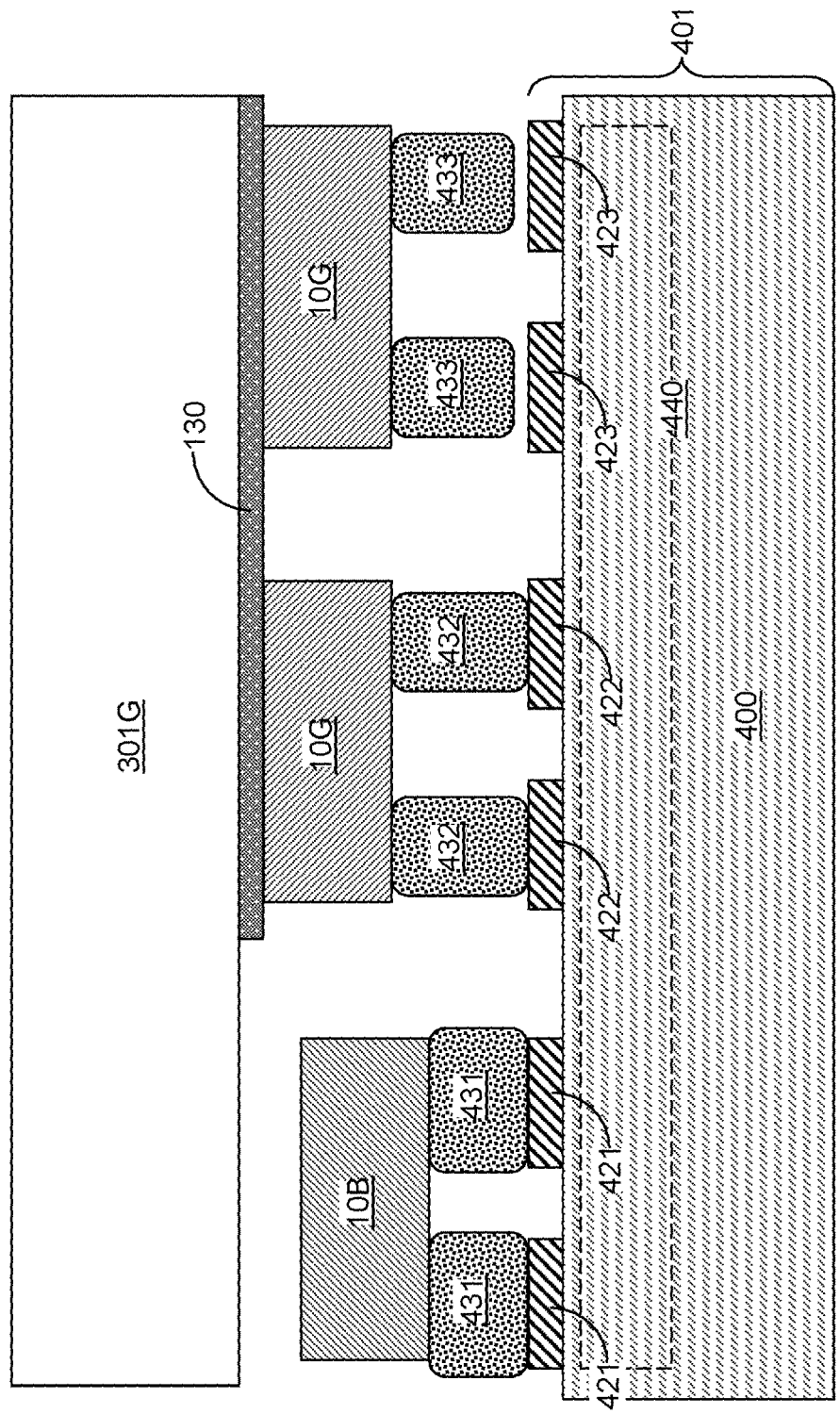

Referring to FIG. 33G, the backplane 401 and the assembly including the second light emitting diodes 10G are positioned such that each second conductive bonding structure 432 is attached to one of a second light emitting device 10G and a second bonding pad 422, and contacts the other of the second light emitting device 10G and the second bonding pad 422. Due to the difference in the heights of the second and third conductive bonding structures (432, 433), the third conductive bonding structures 433 do not contact any underlying bonding pads 423 (in case the second conductive bonding structures 432 and the third conductive bonding structures 433 are attached to the second light emitting devices 10G) or do not contact overlying second light emitting devices 10G (in case the second conductive bonding structures 432 and the third conductive bonding structures 433 are attached to the second bonding pads 422 or the third bonding pads 423).

A reflow process is subsequently performed in the same manner as the processing steps of FIG. 32G. Each second conductive bonding structure 432 becomes bonded to the overlying second light emitting device 10G, and to the underlying second bonding pad 422, while additional bonding is not formed for the third conductive bonding structures 433 during the reflow process.

Figure 33H:
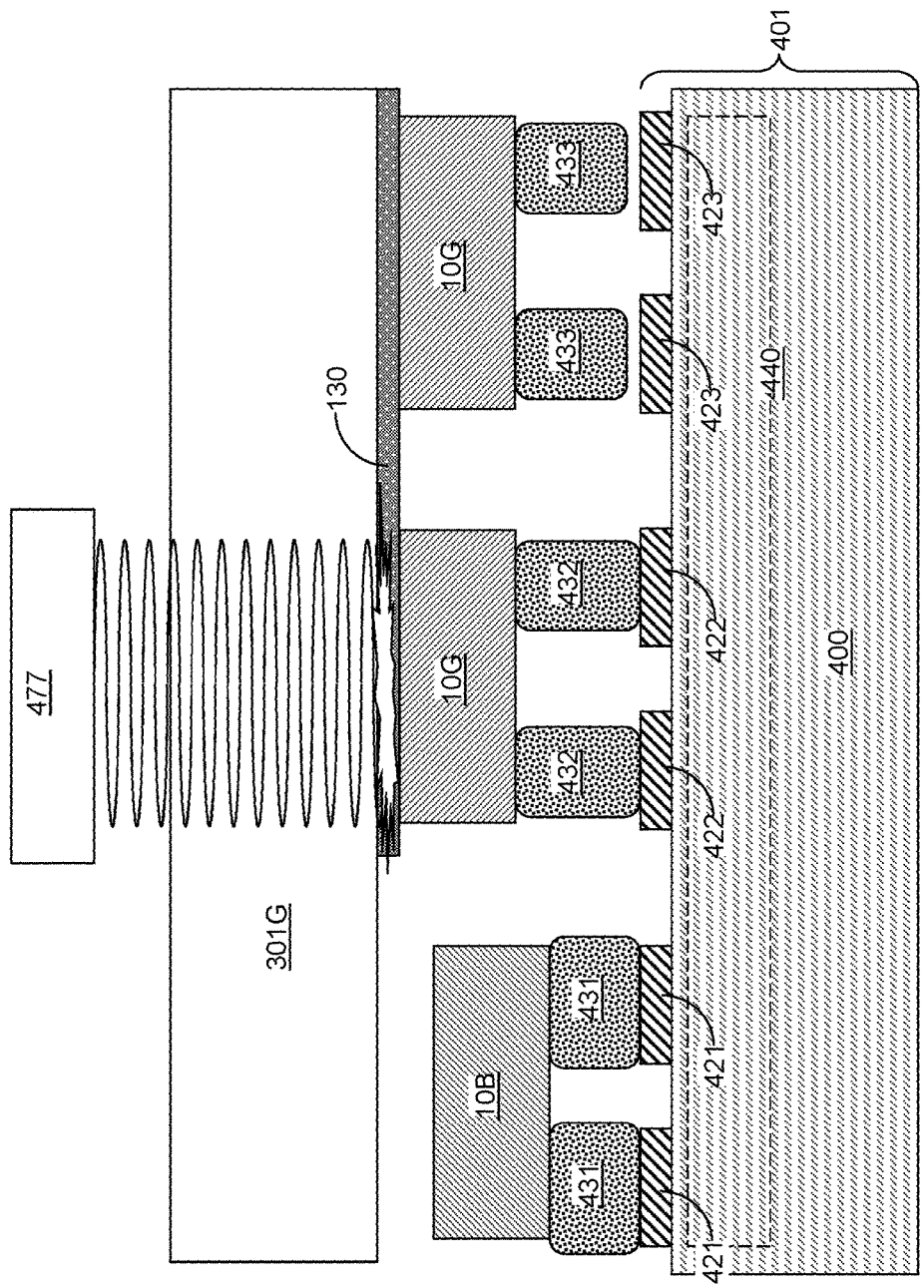

Referring to FIG. 33H, a laser irradiation process is performed to separate each bonded second light emitting device 10G from the second source substrate. The same laser irradiation process can be performed as in the processing steps of FIG. 32H.

Figure 33I:
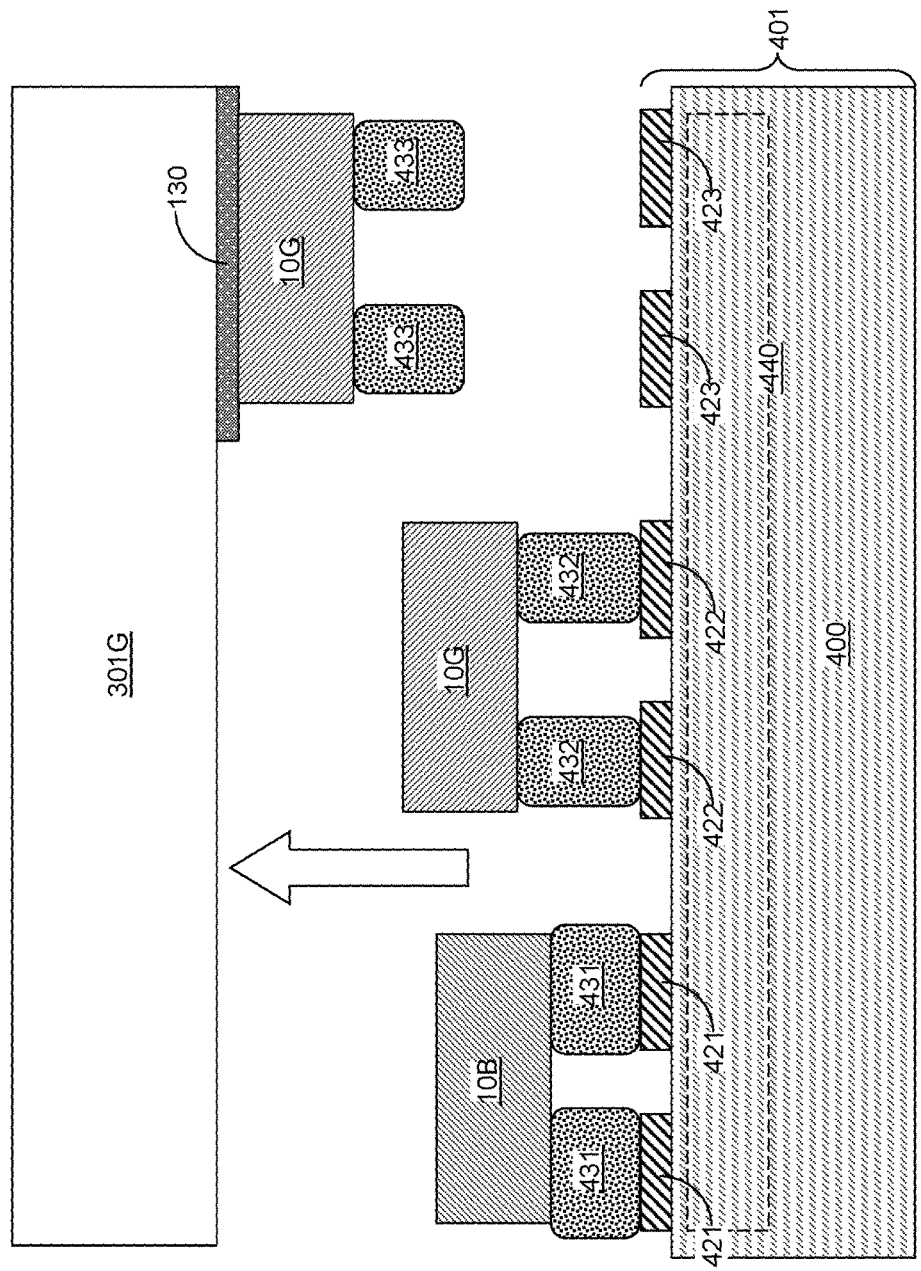

Referring to FIG. 33I, the assembly of the second source substrate 301G and attached second light emitting diodes 10G (a third subset of the second light emitting diodes 10G that remain on the second source substrate) is separated from the backplane 401 and the second subset of the second light emitting diodes 10G that are now attached to the backplane 401.

Figure 33J:
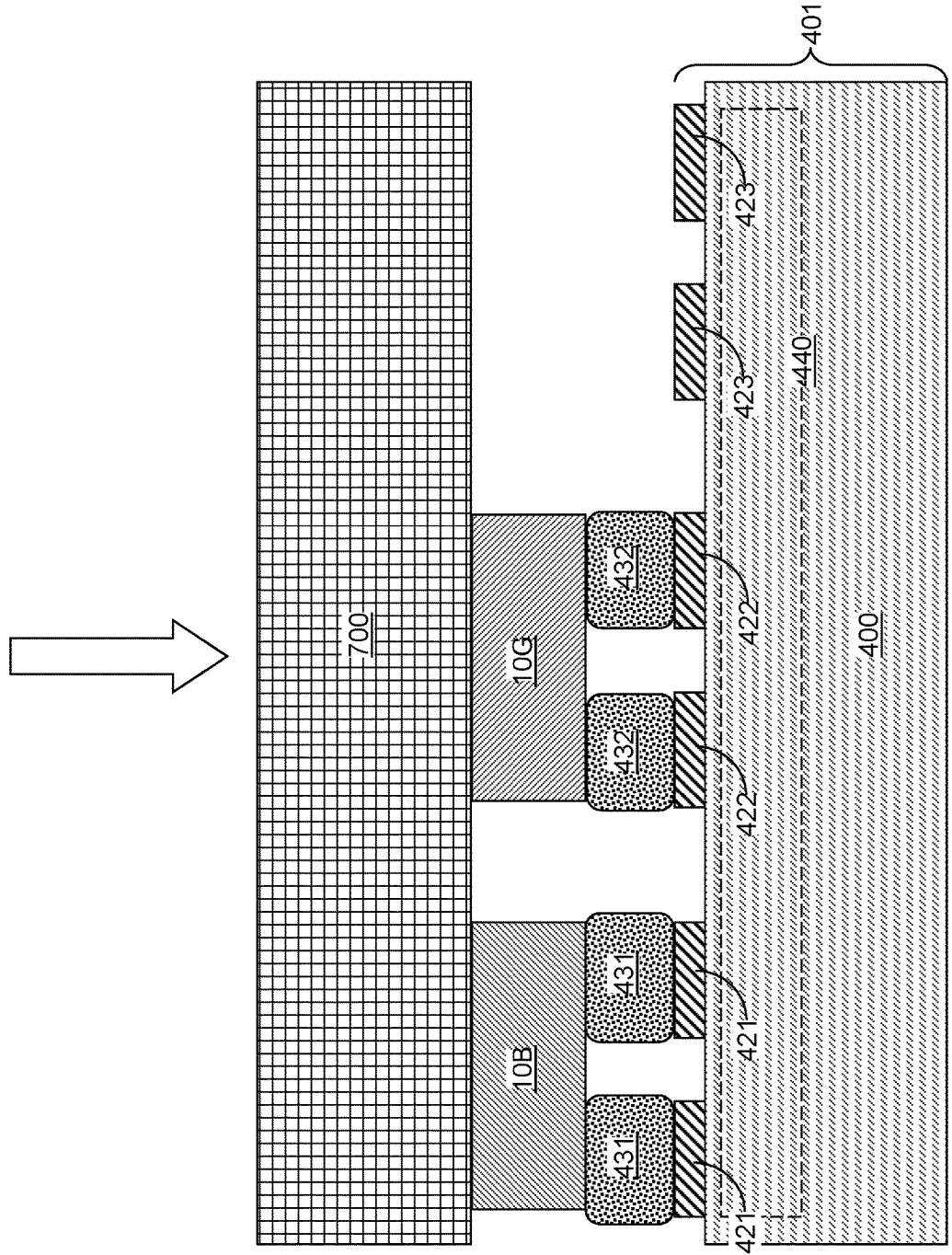

Referring to FIG. 33J, a dummy substrate 700 is employed to push the second light emitting diodes 10G on the second conductive bonding structures 432 toward the backplane 401 in the same manner as in the processing steps of FIG. 32J.

The processing steps of FIGS. 33F-33J can correspond to step 6 illustrated in FIG. 31C, in which the backplane 401 corresponds to the backplane BP1 in FIG. 31C. Processing steps corresponding to step 3 in FIG. 31B and step 7 in FIG. 31C can be performed to transfer a first subset and a second subset of third light emitting devices 10R from a third source substrate R (which can be a third transfer substrate 300R or a third-type growth substrate 100/500R) to bonding pads of additional backplanes (e.g., BP3 in FIG. 31B and BP4 in FIG. 31C) employing the transfer pattern shown in FIGS. 31B and 31C (or any other pattern). Such processing steps can provide a third source substrate R from which a first subset and a second subset of third light emitting devices 10R are removed in a pattern that is congruent to the combined pattern of the first light emitting diodes 10B and the second light emitting diodes 10G on the backplane 401.

Figure 33K:
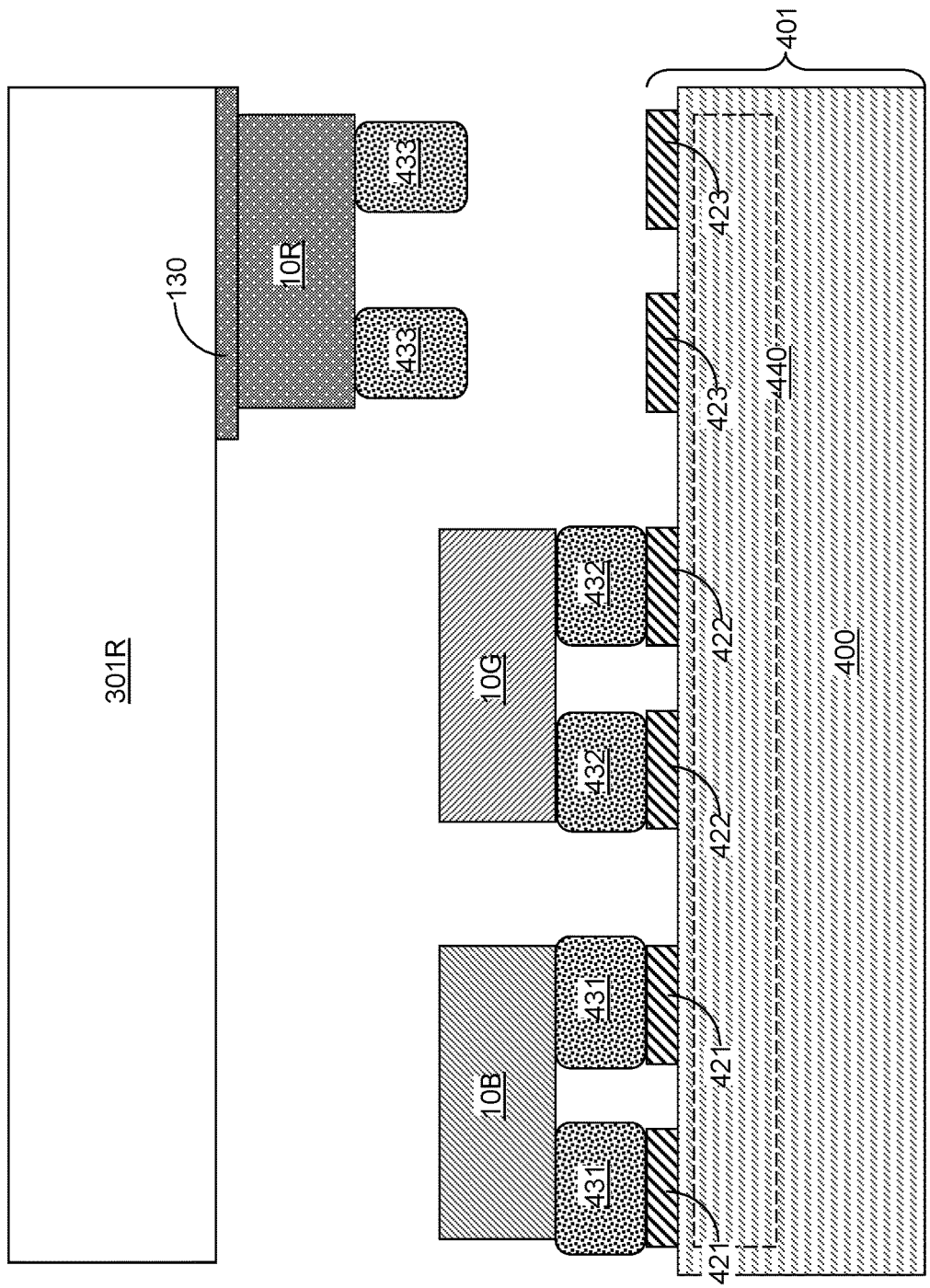

Referring to FIG. 33K, a third source substrate (such as a third transfer substrate 301R), from which a first subset and a second subset of third light emitting devices 10R have been removed in prior processing steps, is positioned over the in-process second exemplary light emitting device assembly, and is aligned such that a third subset of the third light emitting diodes 10R overlies the third bonding pads 423.

Figure 33L:
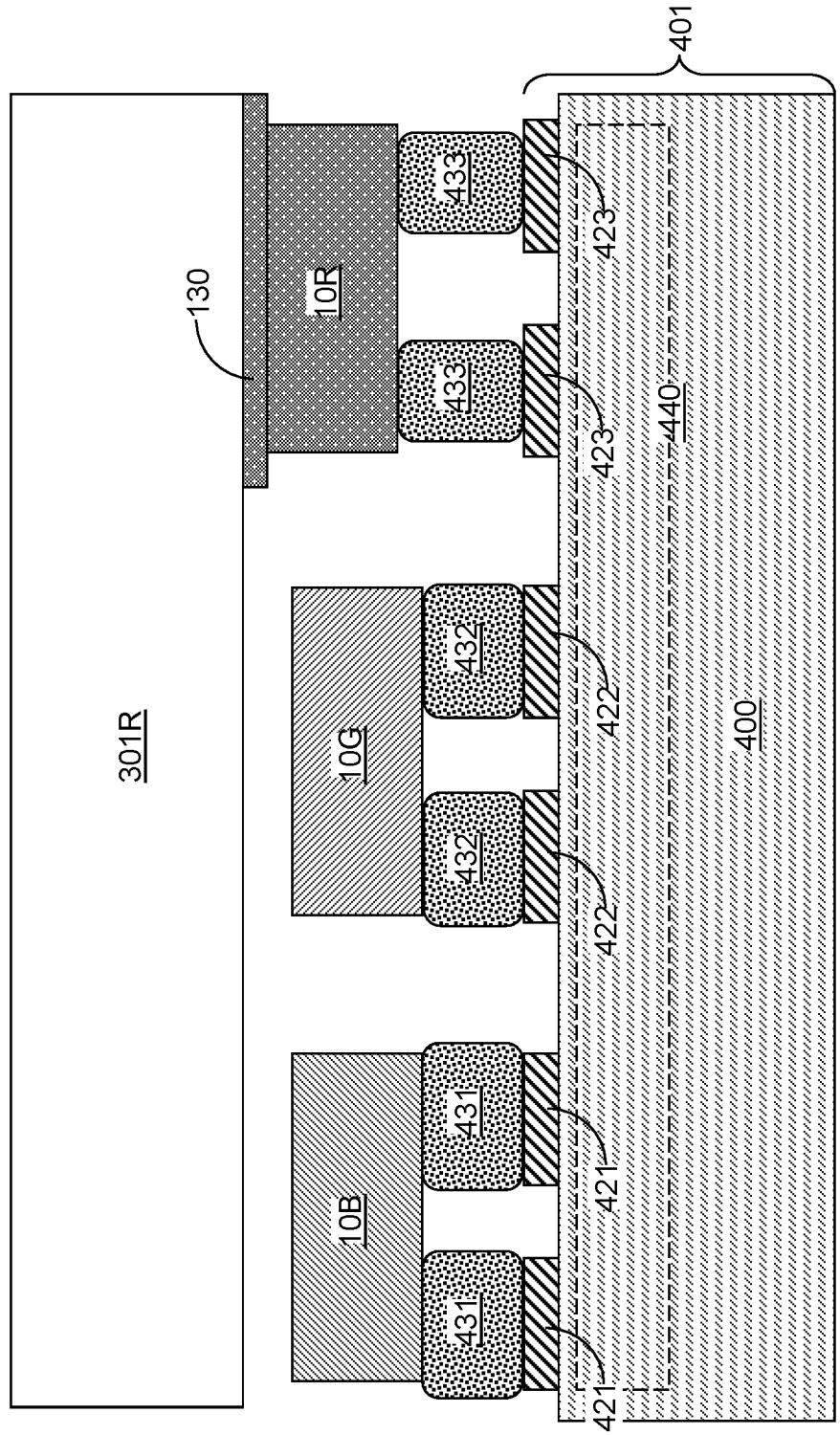

Referring to FIG. 33L, the backplane 401 and the assembly including the third light emitting diodes 10R are positioned such that each third conductive bonding structure 433 is attached to one of a third light emitting device 10R and a third bonding pad 423, and contacts the other of the third light emitting device 10R and the third bonding pad 423. If any addition conductive bonding structures (not shown) having a lesser height are present, additional conductive bonding structures (not shown) overlying such additional bonding pads do not contact any underlying additional bonding pads (in case the additional conductive bonding structures are attached to the third source substrate) or do not contact overlying third light emitting devices 10R (in case the additional conductive bonding structures are attached to the additional bonding pads).

A reflow process is subsequently performed in the same manner as in the processing steps of FIG. 32L.

Figure 33M:
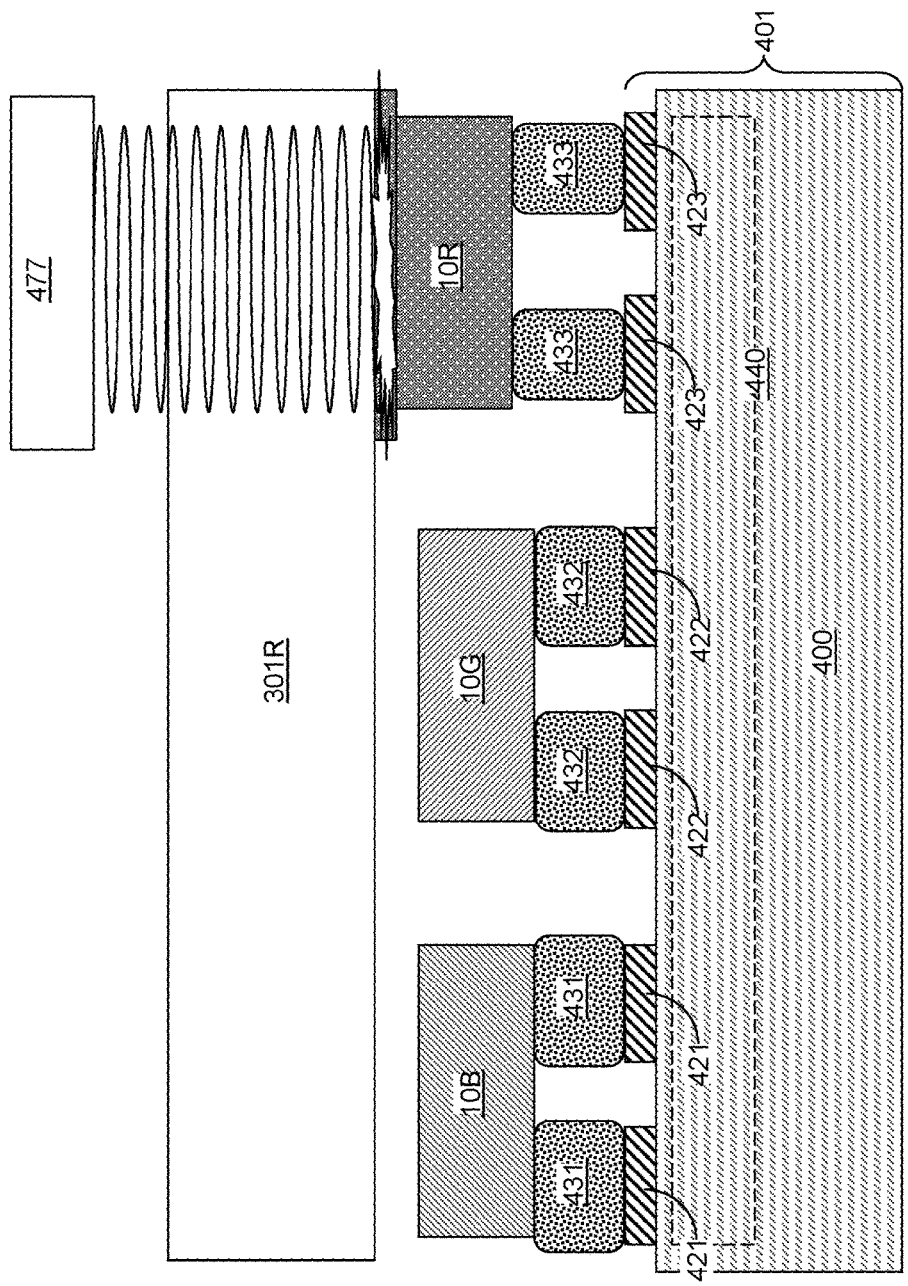

Referring to FIG. 33M, a laser irradiation process is performed to separate each bonded third light emitting device 10R from the third source substrate in the same manner as in the processing steps of FIG. 32M.

Figure 33N:
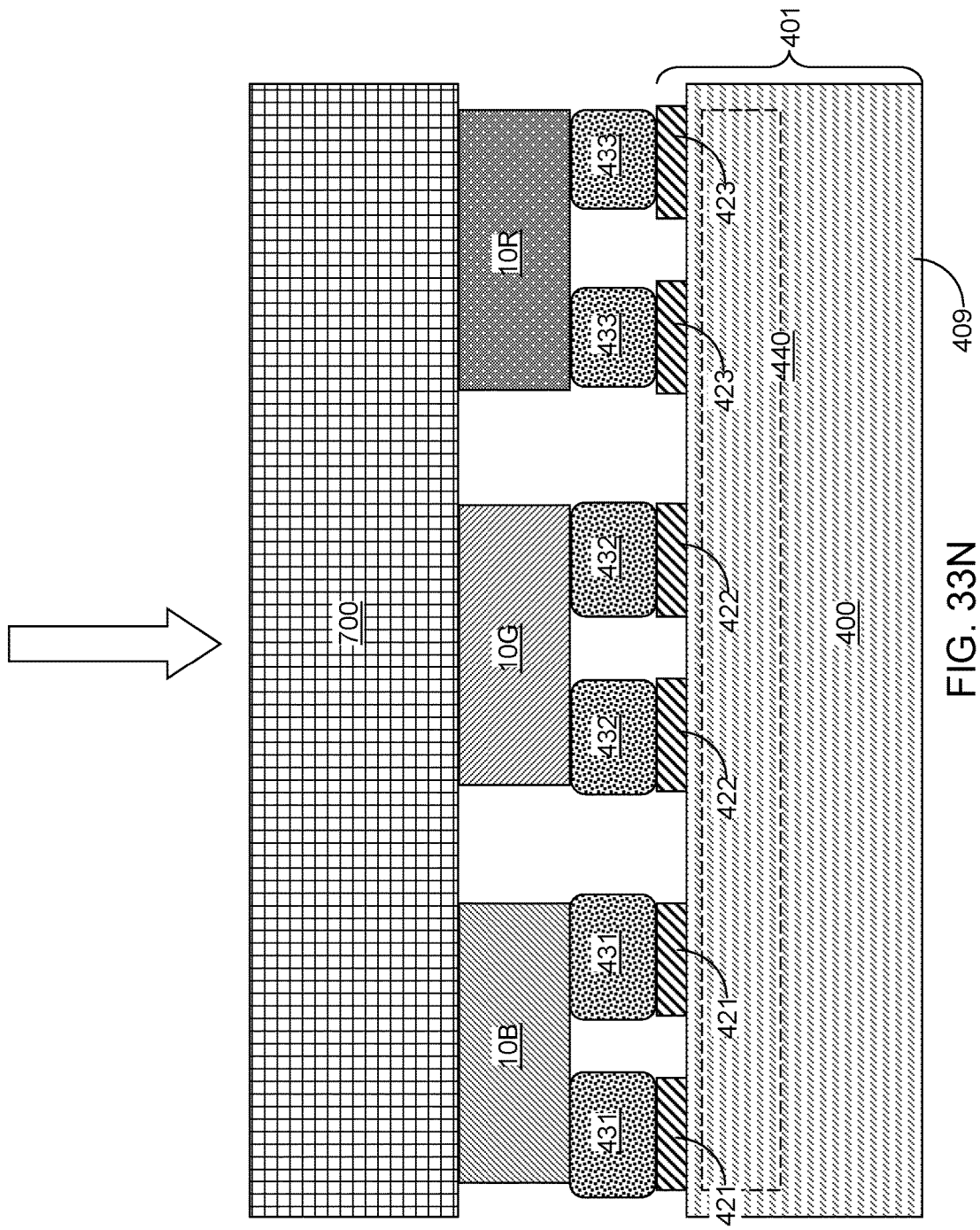

Referring to FIG. 33N, the assembly of the third source substrate 301R and any remaining third light emitting diodes 10R, if any, is separated from the backplane 401 and the third subset of the third light emitting diodes 10R that are now attached to the backplane 401 in the same manner as in the processing steps of FIG. 32N.

Optionally, a dummy substrate 700 may be employed to push the third light emitting diodes 10R on the third conductive bonding structures 433 toward the backplane 401 in the same manner as in the processing steps of FIG. 32N.

Figure 34A:
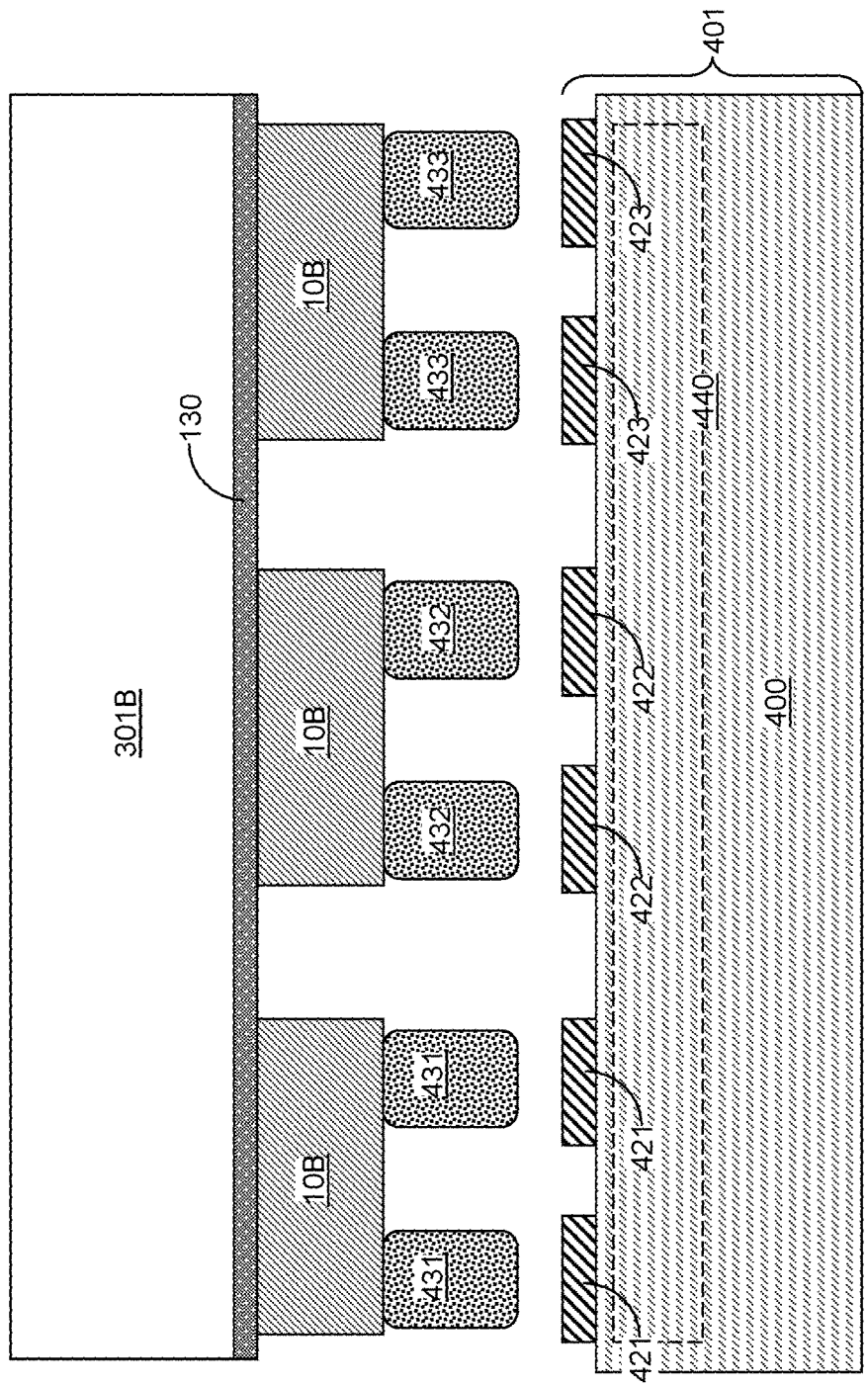
FIGS. 34A-34N are sequential vertical cross-sectional views illustrating a process for formation of a fourth exemplary light emitting device assembly according to an embodiment of the present disclosure.

Referring to FIG. 34A, an in-process structure is illustrated, which can be employed to form a fourth exemplary light emitting device assembly according to an embodiment of the present disclosure in which selective laser soldering is used to bond devices to the backplane. The in-process fourth exemplary light emitting device assembly can be derived from the in-process second exemplary light emitting device assembly of FIG. 32A or the in-process third exemplary light emitting device assembly of FIG. 33A by employing the same thickness for the bonding pads (421, 422, 423) and the same height for the conductive bonding structures (431, 432, 433). The bond pads (421, 422, 423) can have the same composition as the bond pads 420 described above. The conductive bonding structures (431, 432, 433) can have the same composition as the conductive bonding structures 430 described above. In this embodiment, the backplane substrate 400 may have a substantially planar (i.e., not stepped) upper surface or a stepped upper surface as illustrated in FIG. 9. The bond pads (421, 422, 423) can have the same height or different heights as shown in FIG. 32A. The conductive bonding structures (431, 432, 433) can have the same height or different heights as shown in FIG. 33A.

In one embodiment, the conductive bonding structures (431, 432, 433) can be formed on the devices to be transferred to the backplane 401. For example, first light emitting diodes 10B can be the first devices to be transferred to the backplane substrate 400. The first light emitting diodes 10B can be located on first source substrate 301B, which can be a first transfer substrate 300B or a first-type growth substrate 100/500B. The conductive bonding structures (431, 432, 433) can be any of the conductive bonding structures 430 discussed above. The conductive bonding structures 431 are formed on a first subset of the first light emitting diodes 10B to be subsequently transferred to the backplane substrate 400. The second conductive bonding structures 432 are formed on a second subset of the first light emitting diodes 10B to be subsequently transferred to another backplane substrate (not shown). The third conductive bonding structures 433 are formed on a third subset of the first light emitting diodes 10B to be subsequently transferred to yet another backplane substrate. Optionally, additional conductive bonding structures can be formed on another subset of the first light emitting diodes 10B to be subsequently transferred to still another backplane substrate.

Alternatively, conductive bonding structures (431, 432, 433) can be formed on the bond pads (421, 422, 423) of the backplane 401. In this case, the conductive bonding structures (431, 432, 433) can be formed simultaneously on all the bond pads (421, 422, 423).

Yet alternatively, each conductive bonding structure (431, 432, 433) can be formed as two physically disjoined portions such that one portion of each conductive bonding structure (431, 432, or 433) is formed on a first light emitting diode 10B and another portion of the corresponding conductive bonding structure (431, 432, or 433) is formed on a surface of a matching bond pad (421, 422, or 423). In one embodiment, each conductive bonding structure (431, 432, 433) can be formed as two disjoined portions that are divided approximately evenly between an upper portion formed on a first light emitting diode 10B and a lower portion formed on a bond pad (421, 422, or 423).

In one embodiment, the conductive bonding structures (431, 432, 432) can be substantially spherical, substantially ellipsoidal, or substantially cylindrical. The maximum horizontal dimension (such as the diameter of a spherical shape or a cylindrical shape) of each conductive bonding structures (431, 432, 433) can be in a range from 15 microns to 100 microns (such as from 20 microns to 60 microns), although lesser and greater maximum horizontal dimensions can also be employed.

Figure 34B:
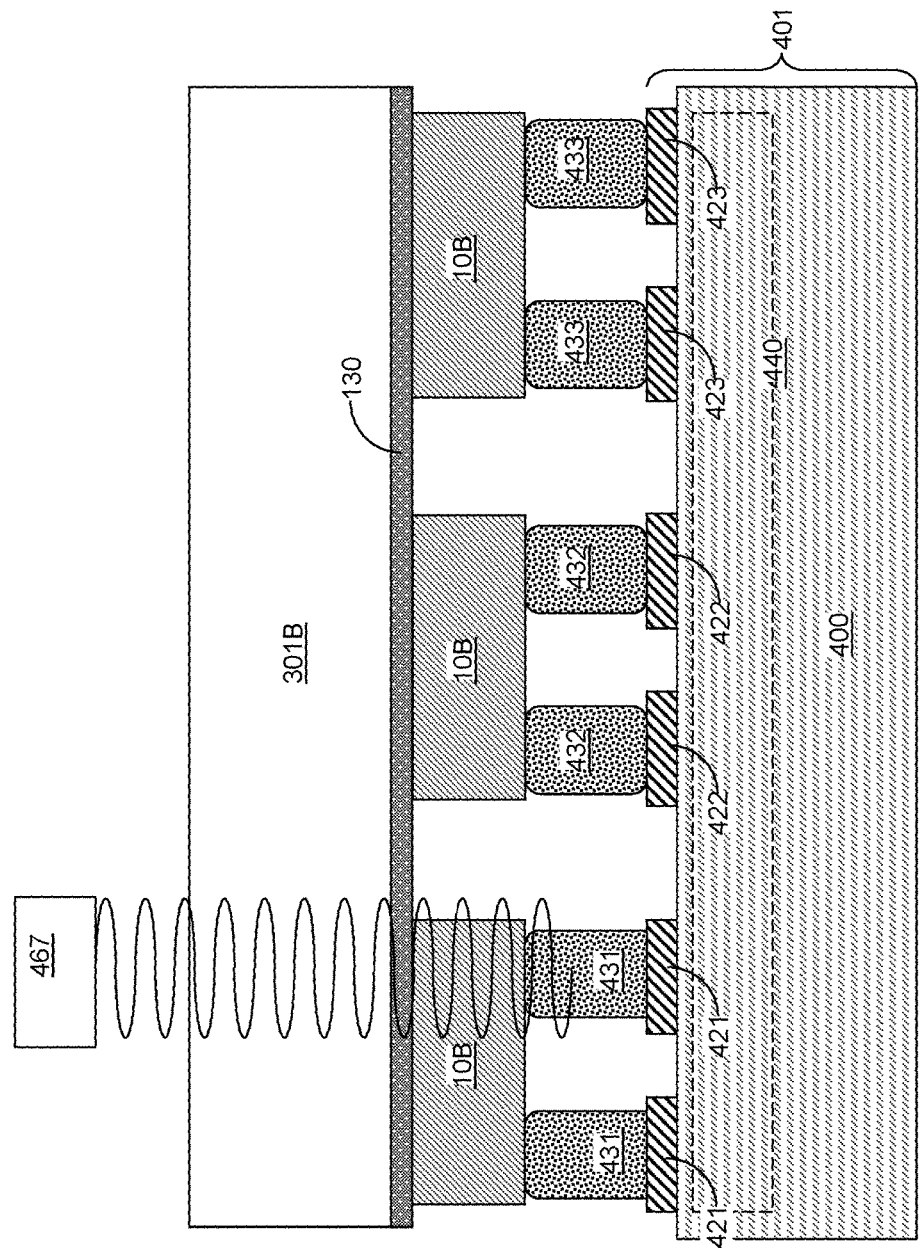

Referring to FIG. 34B, the backplane 401 and the assembly including the first light emitting diodes 10B are positioned such that each conductive bonding structure (431, 432, 433) is attached to one of a first light emitting device 10B and a bonding pad (421, 422, or 423), and contacts the other of the first light emitting device 10B and the bonding pad (421, 422, or 423). In one embodiment, each first conductive bonding structure 431 can be attached to one of an overlying first light emitting device 10B and a first bonding pad 421, and contacts the other of the overlying first light emitting device 10B and the first bonding pad 421; each second conductive bonding structure 432 can be attached to one of an overlying first light emitting device 10B and a second bonding pad 422, and contacts the other of the overlying first light emitting device 10B and the second bonding pad 422; and each third conductive bonding structure 433 can be attached to one of an overlying first light emitting device 10B and a third bonding pad 423, and contacts the other of the overlying first light emitting device 10B and the third bonding pad 423.

A heating laser 467 can be employed to reflow the first conductive bonding structures 431. The heating laser 467 can have a wavelength that induces greater absorption of energy within the material of the conductive bonding structures (431, 432, 433) than within the materials of the source substrate 301B or within the materials of the devices to be transferred (e.g., the first light emitting devices 10B). For example, the heating laser 467 can have a wavelength in a range from 0.8 micron to 20 microns, such as 1 to 2 microns, to provide a differential heating between the material of the conductive bonding structures 431 which are to be reflowed and the material of the conductive bonding structures 432, 433 which are not to be reflowed. Differential heating is also provided between the conductive bonding structures 431 and the materials of the source substrate 301B and the devices to be transferred. The first conductive bonding structures 431 can be selectively heated by sequential irradiation of a laser beam from the heating layer 467 to reflow each first conductive bonding structure 431, and to bond each first conductive bonding structure 431 to an overlying first light emitting device 10B and to an underlying first bonding pad 421. Preferably, the laser beam is provided through the source substrate 301B. The laser beam may be transmitted through the source substrate 301B and through the devices to the conductive bonding structures 431 for selective heating. Alternatively, the laser beam may be absorbed by the source substrate or the device adjacent to the conductive bonding structures 431 to selectively heat and reflow the conductive bonding structures 431 without reflowing the remaining conductive bonding structures (432, 433).

Referring to FIG. 34C, a laser irradiation process is performed to separate each bonded first light emitting device 10B from the first source substrate in the same manner as the processing steps of FIG. 32C. The wavelength of the laser 477 (which is herein referred to an "ablation laser") can be different (e.g., shorter) from the wavelength of the heating laser 467, for example between 0.1 and 0.75 micron, such as 0.25 to 0.5 micron. The laser provides more heating to the material of the ablation material layer 130 than to the materials of the source substrate 301B and the transferred devices (e.g., the first light emitting diodes 10B). Each portion of the ablation material layer 130 overlying the first conductive bonding structures 431 can be sequentially irradiated by a laser beam from the laser 477 to dissociate each underlying first light emitting device 10B.

Figure 34D:
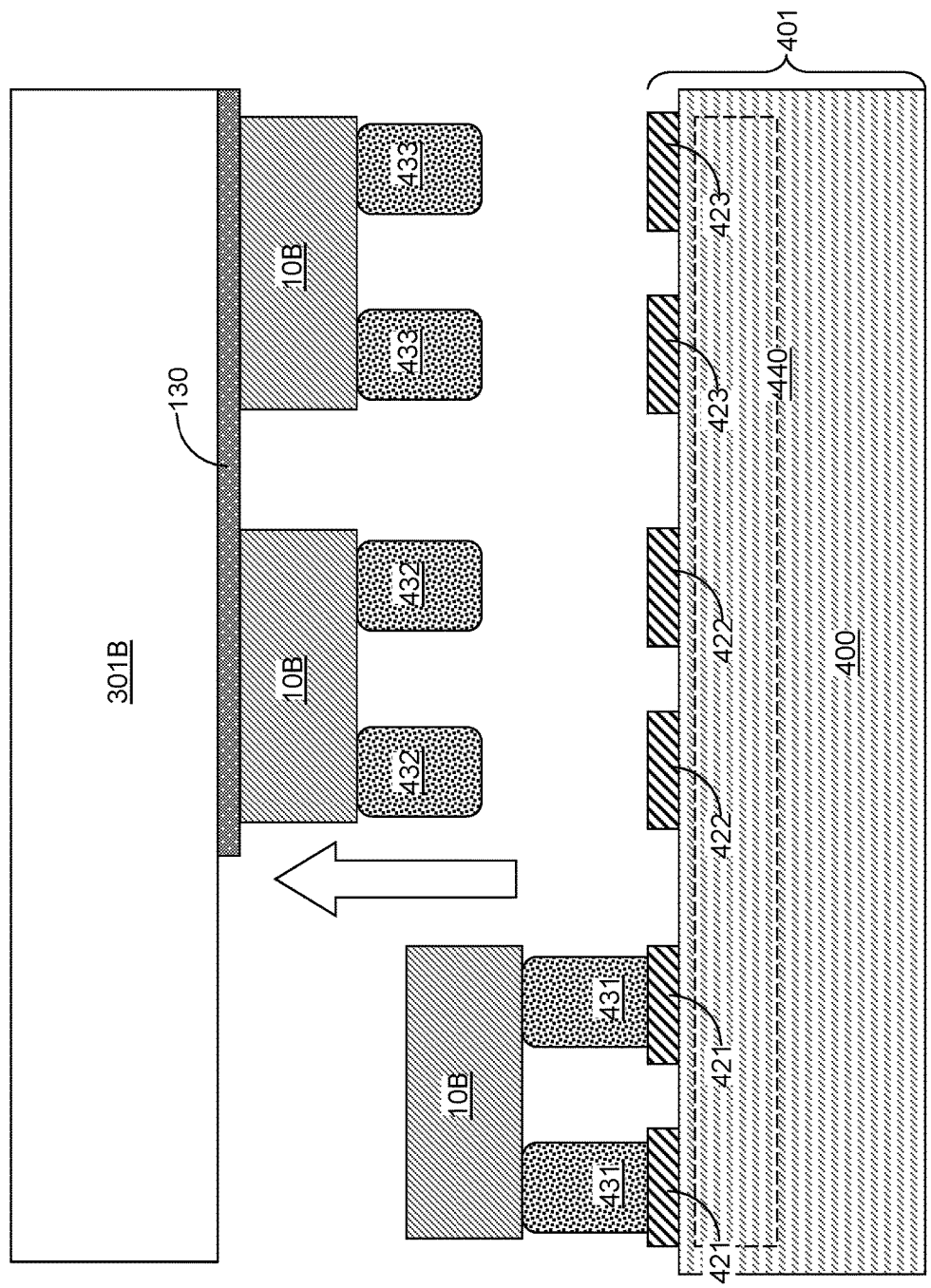

Referring to FIG. 34D, the assembly of the first source substrate 301B and attached first light emitting diodes 10B (i.e., the complement of the first subset of the first light emitting diodes 10B) is separated from the backplane 401 and the first subset of the first light emitting diodes 10B.

Figure 34E:
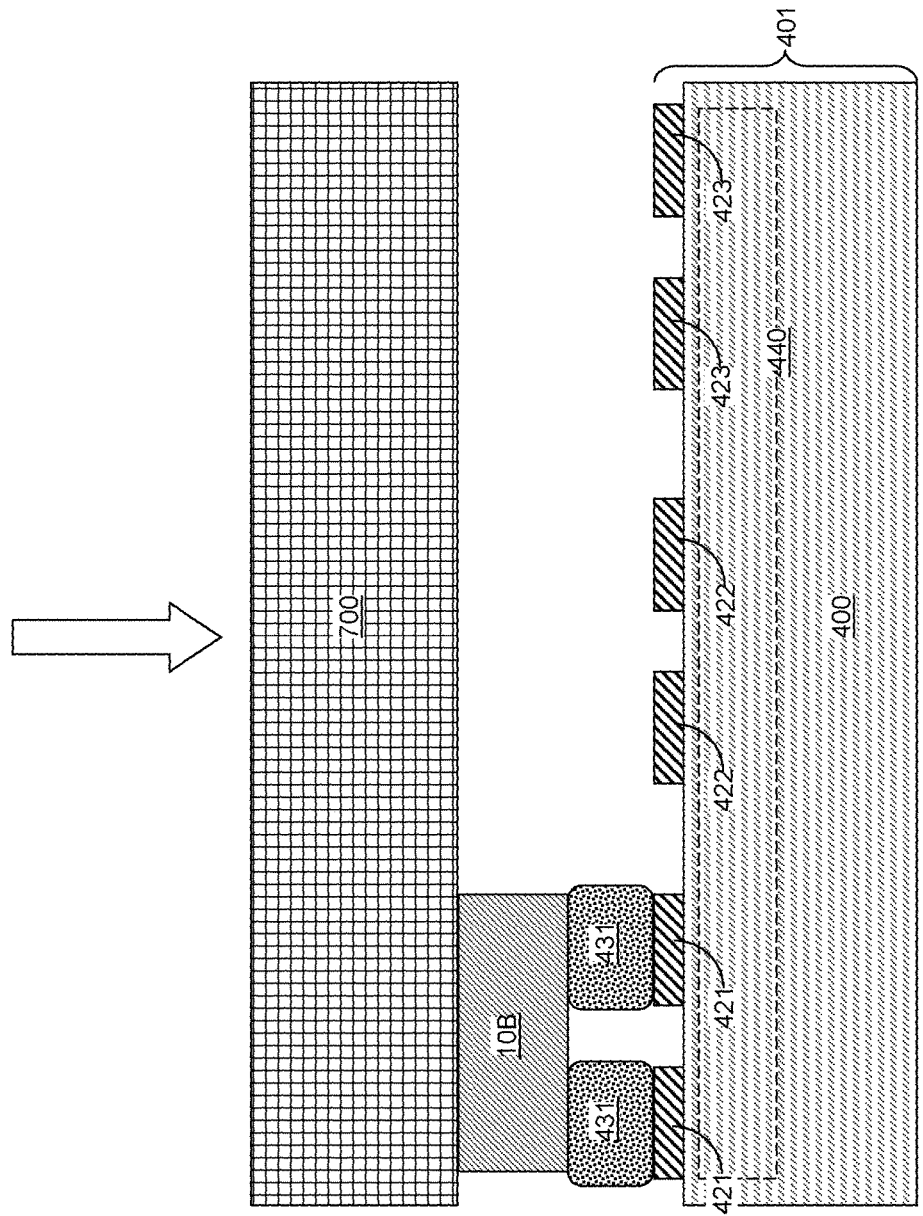

Referring to FIG. 34E, a dummy substrate 700 is employed to push the first light emitting diodes 10B on the first conductive bonding structures 431 toward the backplane 401 while reflowing the first conductive bonding structures 431 in the same manner as the processing steps of FIG. 32E.

The processing steps of FIGS. 34A-34E can correspond to step 1 illustrated in FIG. 31B, in which the backplane 401 corresponds to the backplane BP1 in FIG. 31B. Equivalent processing steps (corresponding to step 2 illustrated in FIG. 31B) can be performed to transfer a first subset of second light emitting devices 10G from a second source substrate G (which can be a second transfer substrate 300G or a second-type growth substrate 100/500G) to first bonding pads 421 of the second backplane BP2 employing the transfer pattern shown in FIG. 31B (or any other pattern). Such processing steps can provide a second source substrate G from which a first subset of second light emitting devices 10G are removed in a pattern that is congruent to the pattern of the first light emitting diodes 10B on the backplane 401.

Figure 34F:
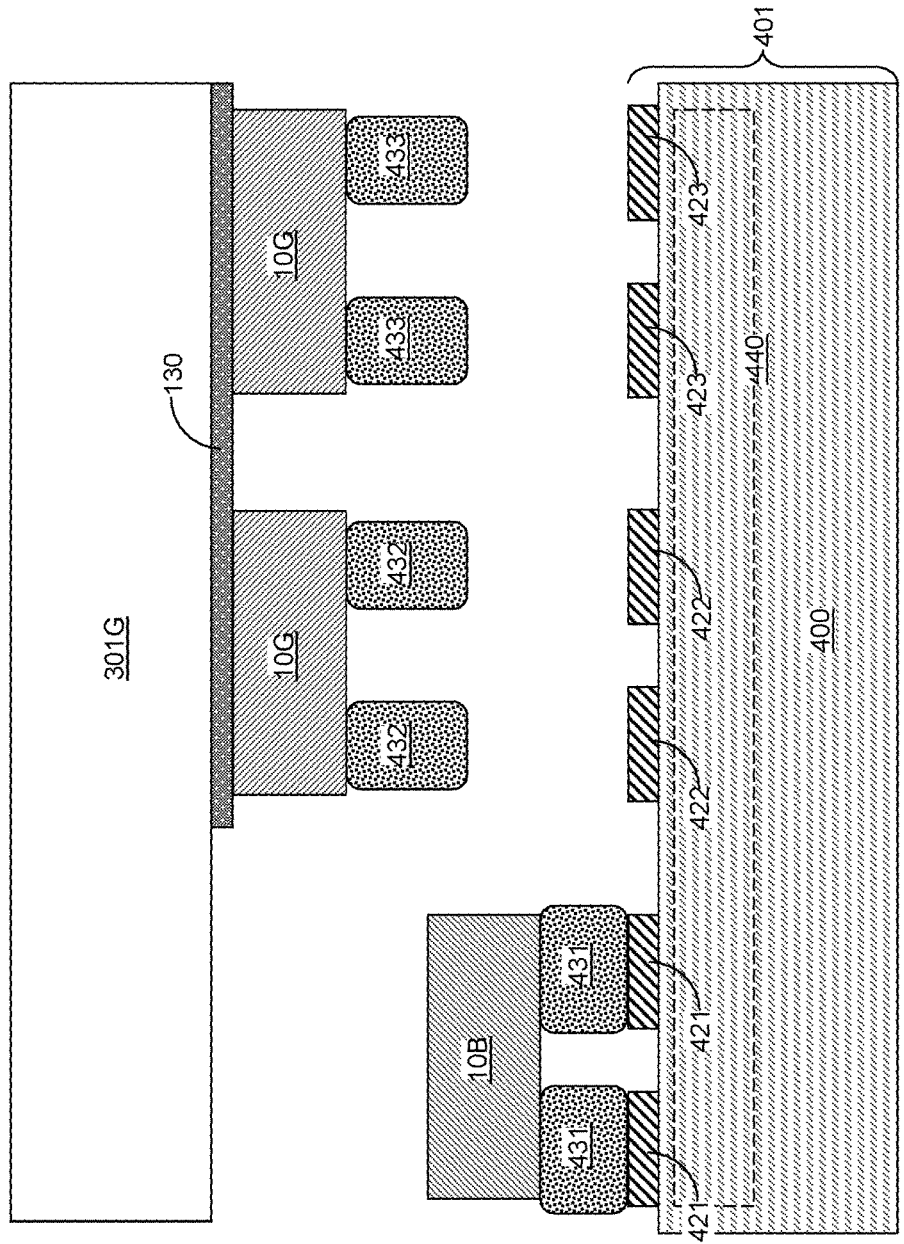

Referring to FIG. 34F, a second source substrate (such as a second transfer substrate 301G) from which a first subset of second light emitting devices 10G are removed is positioned over the in-process fourth exemplary light emitting device assembly, and is aligned such that a second subset of the second light emitting diodes 10G overlies the second bonding pads 422.

Figure 34G:
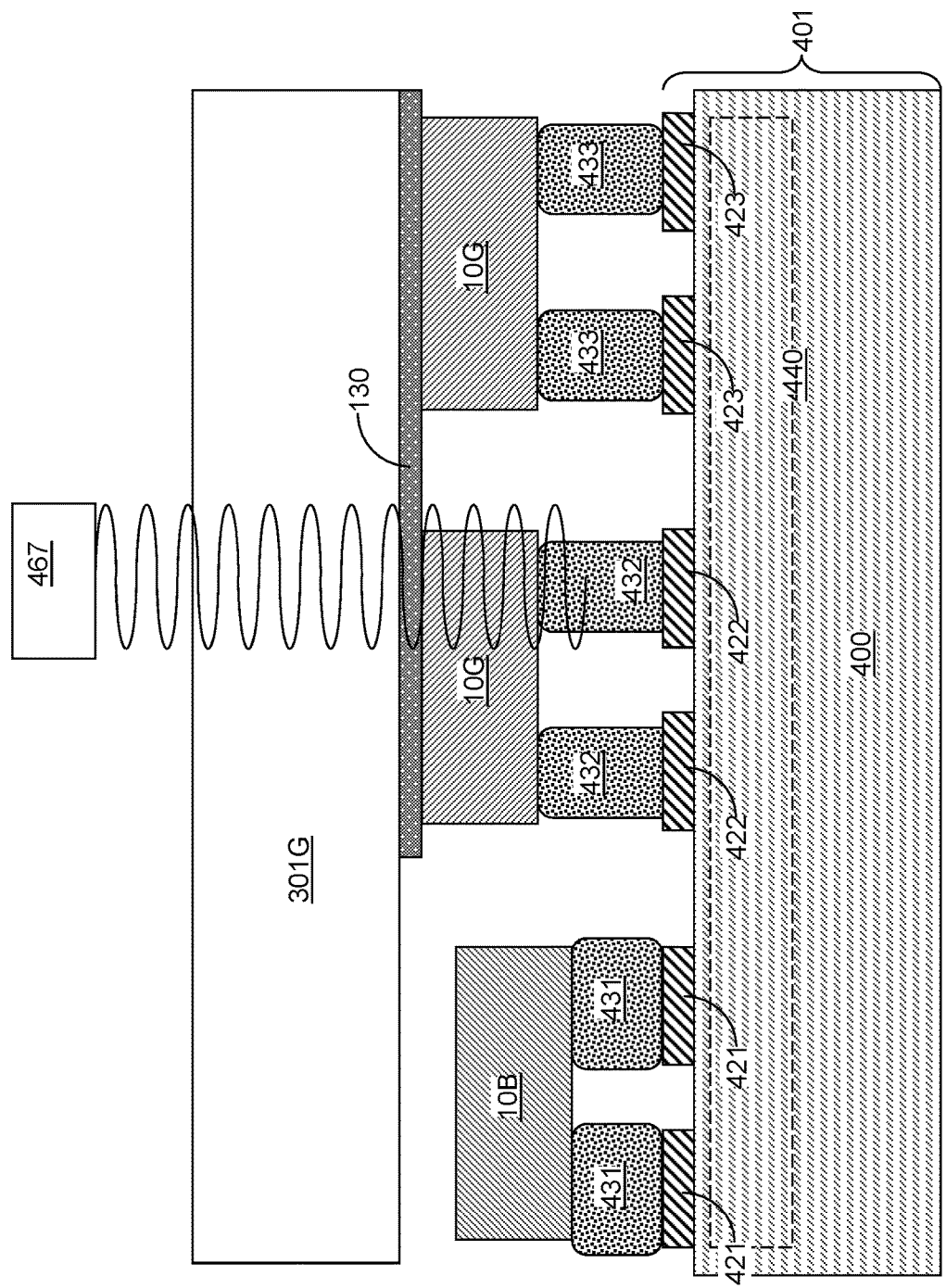

Referring to FIG. 34G, the backplane 401 and the assembly including the second light emitting diodes 10G are positioned such that each second conductive bonding structure 432 is attached to one of a second light emitting device 10G and a second bonding pad 422, and contacts the other of the second light emitting device 10G and the second bonding pad 422.

In one embodiment, each second conductive bonding structure 432 can be attached to one of an overlying second light emitting device 10G and a second bonding pad 422, and contacts the other of the overlying second light emitting device 10G and the second bonding pad 422; and each third conductive bonding structure 433 can be attached to one of an overlying second light emitting device 10G and a third bonding pad 423, and contacts the other of the overlying second light emitting device 10G and the third bonding pad 423.

A heating laser 467 is employed to reflow the second conductive bonding structures 432 without reflowing the remaining conductive bonding structures (431, 433). The heating laser 467 can have a wavelength that induces greater absorption of energy within the material of the conductive bonding structures (431, 432, 433) than within the materials of the source substrate 301G or within the materials of the devices to be transferred (e.g., the second light emitting devices 10G). The same heating laser can be employed as in the processing steps of FIG. 34B. The second conductive bonding structures 432 can be sequentially irradiated by a laser beam from the heating layer 467 to reflow each second conductive bonding structure 432, and to bond each second conductive bonding structure 432 to an overlying second light emitting device 10G and to an underlying second bonding pad 422.

Figure 34H:
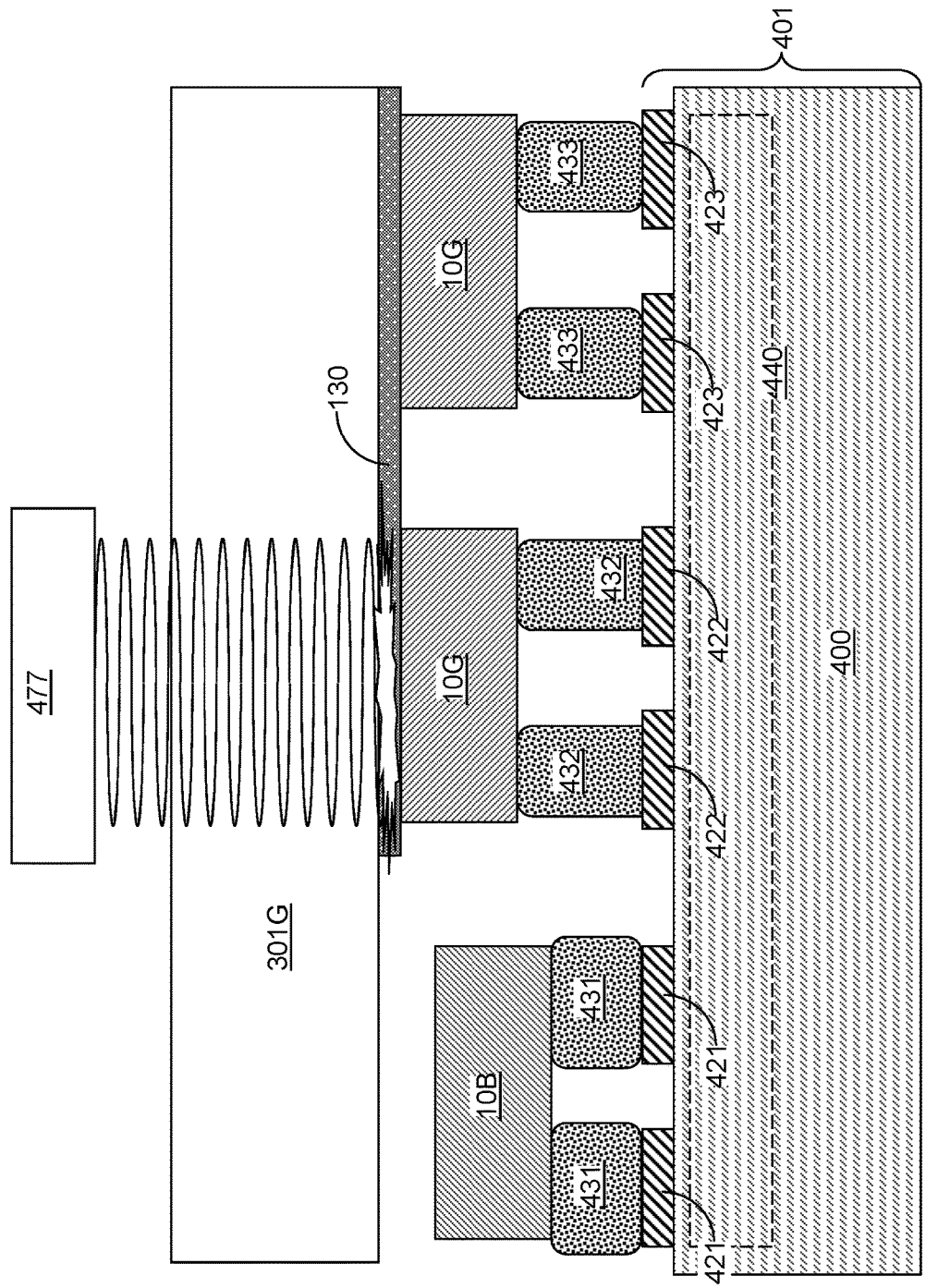

Referring to FIG. 34H, a laser irradiation process is performed to separate each bonded second light emitting device 10G from the second source substrate in the same manner as the processing steps of FIG. 32H. The wavelength of the laser 477 can be different from the wavelength of the heating laser 467, and provides more heating to the material of the ablation material layer 130 than to the materials of the source substrate 301G and the transferred devices (e.g., the second light emitting diodes 10G). Each portion of the ablation material layer 130 overlying the second conductive bonding structures 432 can be sequentially irradiated by a laser beam from the layer 477 to dissociate each underlying second light emitting device 10G.

Figure 34I:
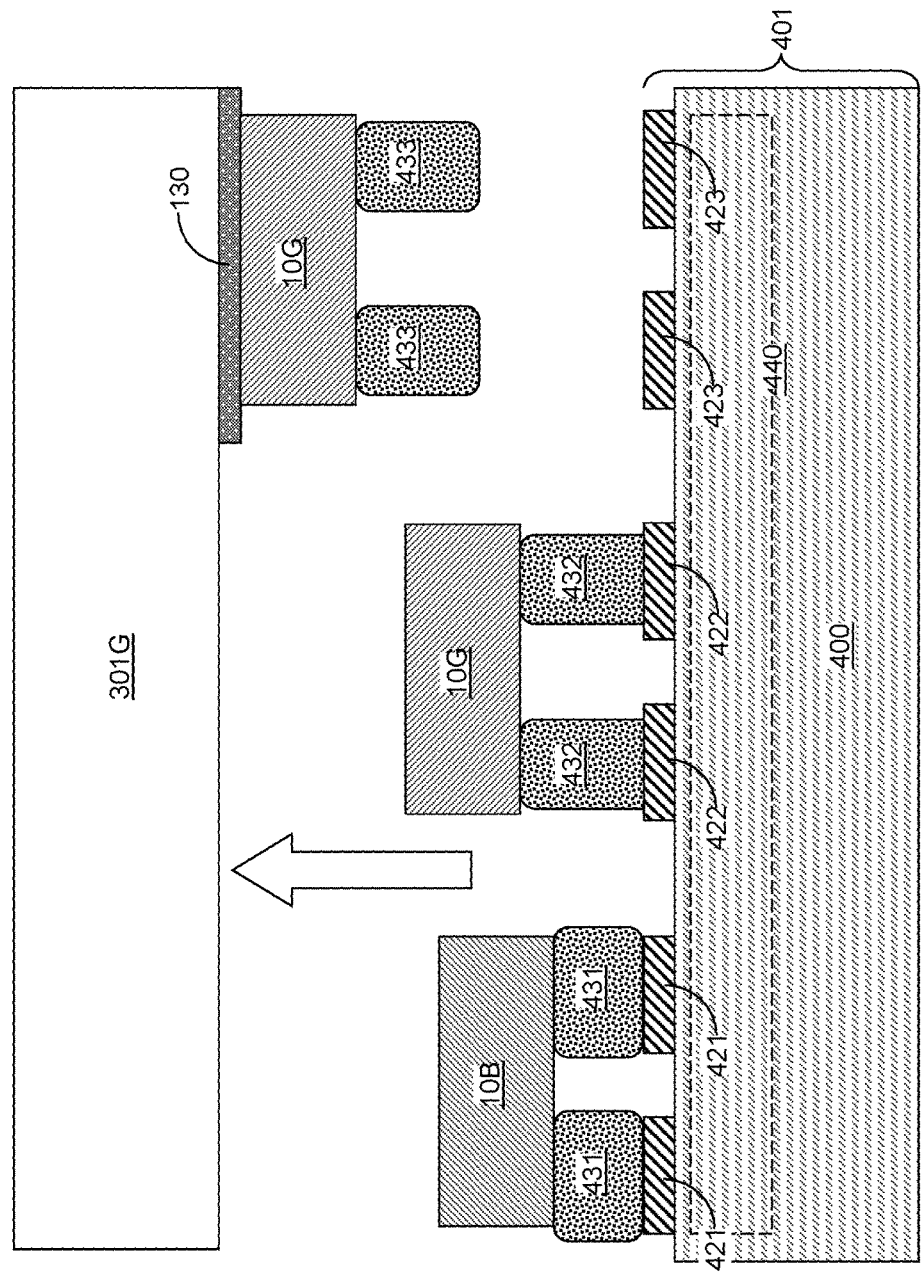

Referring to FIG. 34I, the assembly of the second source substrate 301G and attached second light emitting diodes 10G (a third subset of the second light emitting diodes 10G that remain on the second source substrate) is separated from the backplane 401 and the second subset of the second light emitting diodes 10G that are now attached to the backplane 401.

Figure 34J:
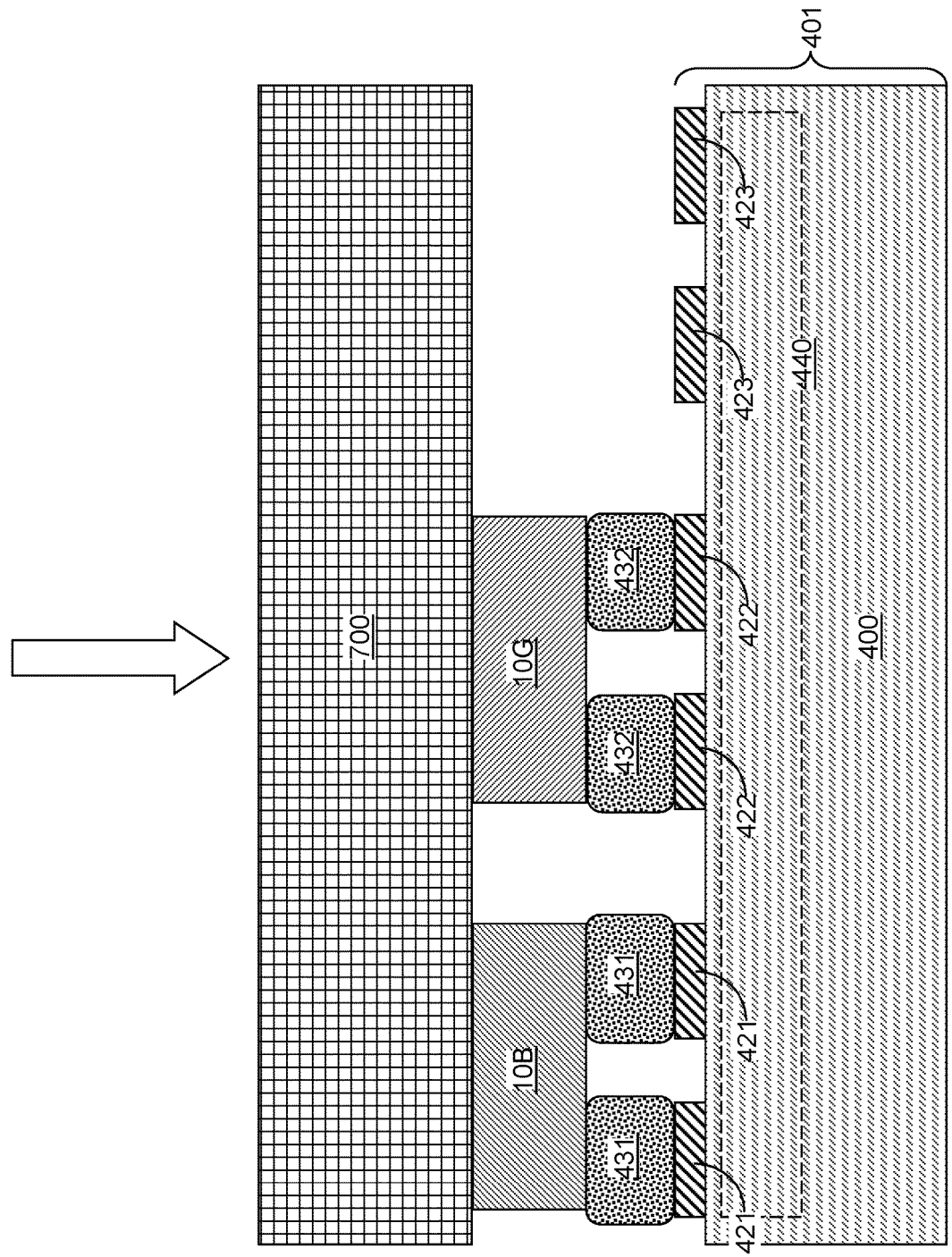

Referring to FIG. 34J, a dummy substrate 700 is employed to push the second light emitting diodes 10G on the second conductive bonding structures 432 toward the backplane 401 in the same manner as in the processing steps of FIG. 32J.

The processing steps of FIGS. 34F-34J can correspond to step 6 illustrated in FIG. 31C, in which the backplane 401 corresponds to the backplane BP1 in FIG. 31C. Processing steps corresponding to step 3 in FIG. 31B and step 7 in FIG. 31C can be performed to transfer a first subset and a second subset of third light emitting devices 10R from a third source substrate R (which can be a third transfer substrate 300R or a third-type growth substrate 100/500R) to bonding pads of additional backplanes (e.g., BP3 in FIG. 31B and BP4 in FIG. 31C) employing the transfer pattern shown in FIGS. 31B and 31C (or any other pattern). Such processing steps can provide a third source substrate R from which a first subset and a second subset of third light emitting devices 10R are removed in a pattern that is congruent to the combined pattern of the first light emitting diodes 10B and the second light emitting diodes 10G on the backplane 401.

Referring to FIG. 34K, a third source substrate (such as a third transfer substrate 301R), from which a first subset and a second subset of third light emitting devices 10R have been removed in prior processing steps, is positioned over the in-process fourth exemplary light emitting device assembly, and is aligned such that a third subset of the third light emitting diodes 10R overlies the third bonding pads 423.

Figure 34L:
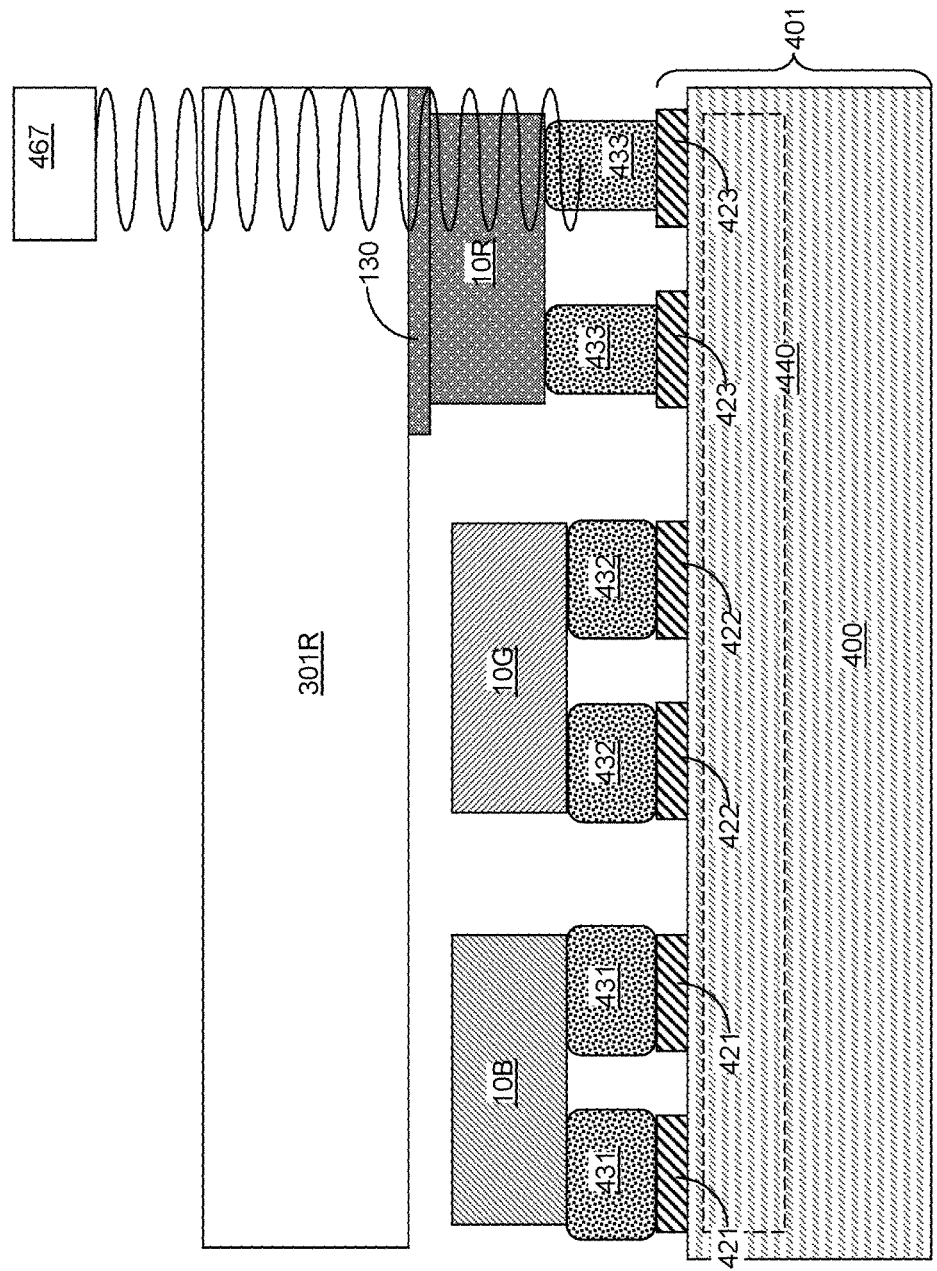

Referring to FIG. 34L, the backplane 401 and the assembly including the third light emitting diodes 10R are positioned such that each third conductive bonding structure 433 is attached to one of a third light emitting device 10R and a third bonding pad 423, and contacts the other of the third light emitting device 10R and the third bonding pad 423. If any addition conductive bonding structures (not shown) are present, additional conductive bonding structures (not shown) overlying such additional bonding pads can contact underlying additional bonding pads and overlying third light emitting devices 10R, and can be attached to the underlying additional bonding pads or to the overlying third light emitting devices 10R.

A heating laser 467 is employed to reflow the third conductive bonding structures 433. The heating laser 467 can have a wavelength that induces greater absorption of energy within the material of the third conductive bonding structures 433 than within the materials of the source substrate 301R or within the materials of the devices to be transferred (e.g., the third light emitting devices 10R). The same heating laser can be employed as in the processing steps of FIG. 34B or FIG. 34G. The third conductive bonding structures 433 can be sequentially irradiated by a laser beam from the heating layer 467 to reflow each third conductive bonding structure 433, and to bond each third conductive bonding structure 433 to an overlying third light emitting device 10R and to an underlying third bonding pad 423.

Figure 34M:
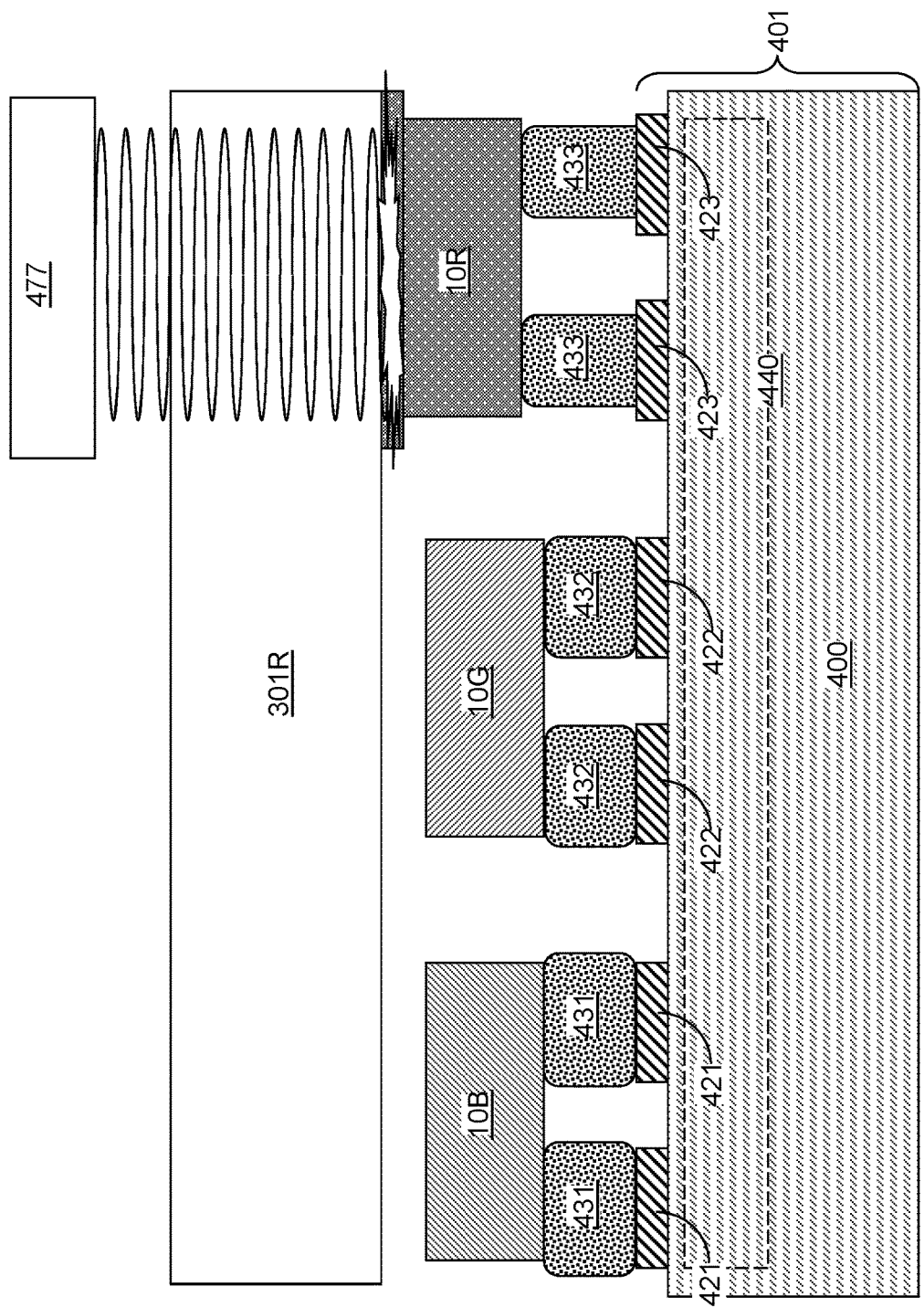

Referring to FIG. 34M, a laser irradiation process is performed to separate each bonded third light emitting device 10R from the third source substrate in the same manner as in the processing steps of FIG. 32M.

Figure 34N:
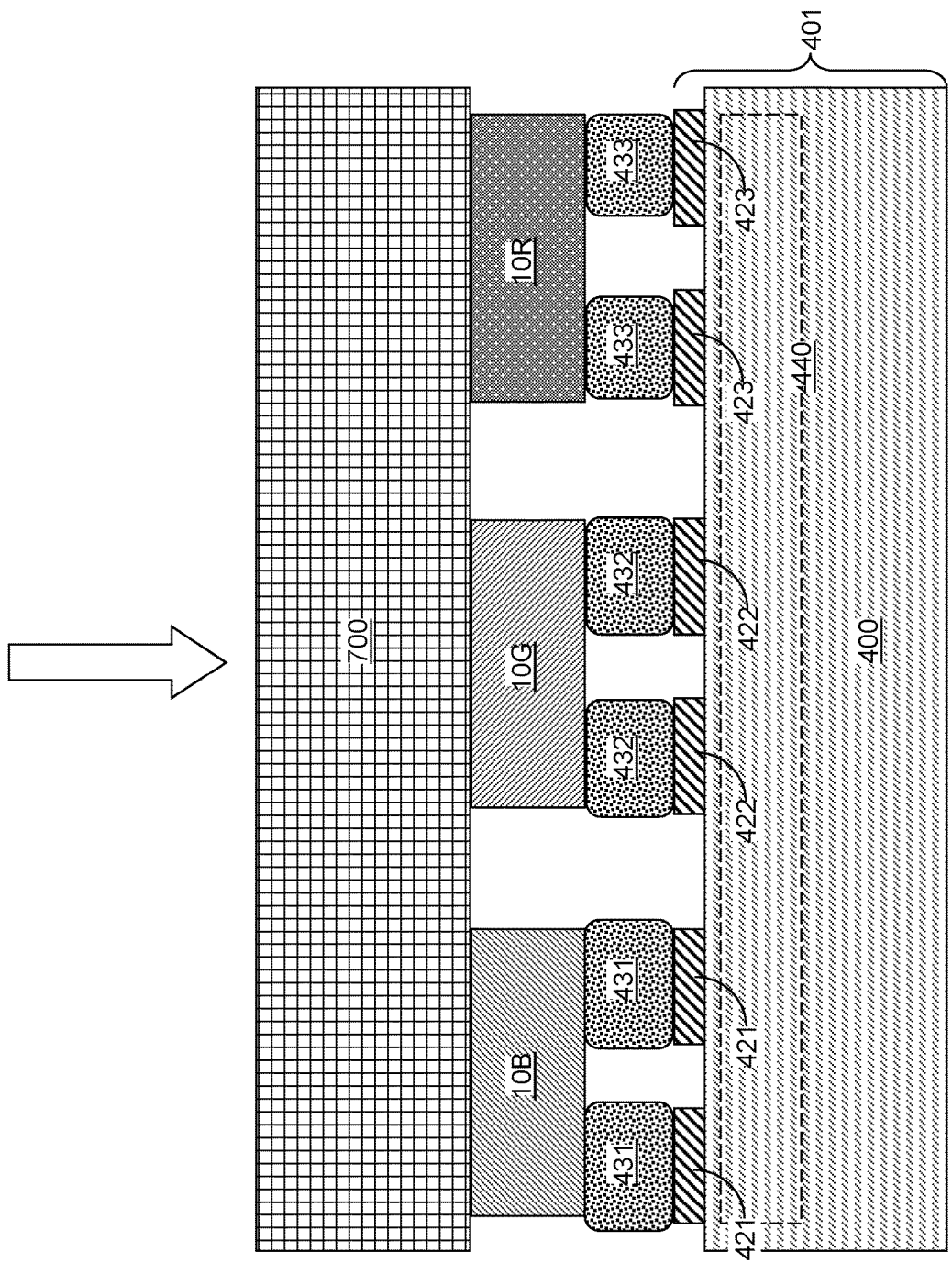

Referring to FIG. 34N, the assembly of the third source substrate 301R and any remaining third light emitting diodes 10R, if any, is separated from the backplane 401 and the third subset of the third light emitting diodes 10R that are now attached to the backplane 401 in the same manner as in the processing steps of FIG. 32N.

Optionally, a dummy substrate 700 may be employed to push the third light emitting diodes 10R on the third conductive bonding structures 433 toward the backplane 401 in the same manner as in the processing steps of FIG. 32N.

Figure 35A:
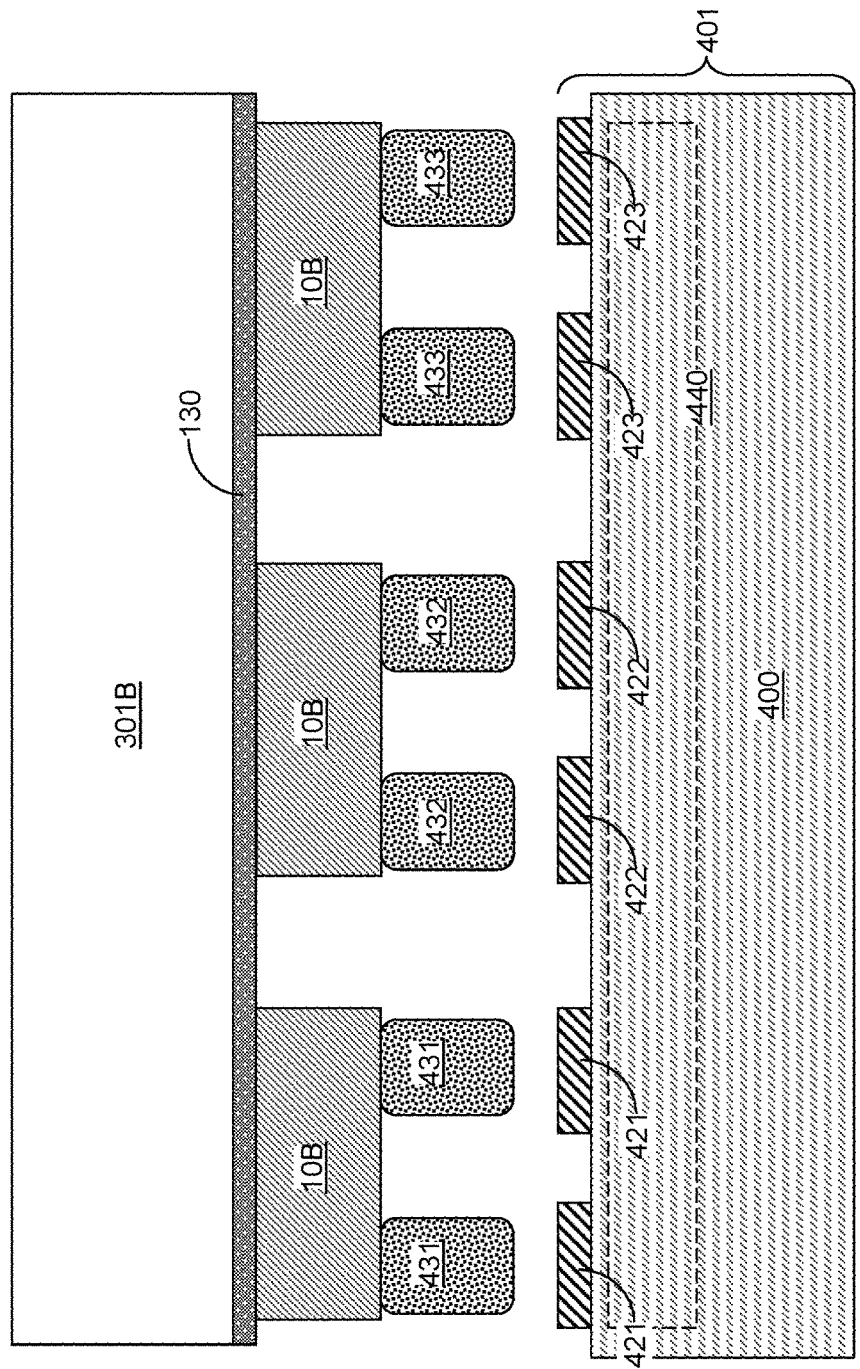
FIGS. 35A-35N are sequential vertical cross-sectional views illustrating a process for formation of a fifth exemplary light emitting device assembly according to an embodiment of the present disclosure.

Referring to FIG. 35A, an in-process structure is illustrated, which can be employed to form a fifth exemplary light emitting device assembly according to an embodiment of the present disclosure in which components are bonded at the same time by non-selective heating rather than by selective laser heating. The in-process fifth exemplary light emitting device assembly can be the same as the in-process fourth exemplary light emitting device assembly of FIG. 34A. In this embodiment, the backplane substrate 400 may have a substantially planar (i.e., not stepped) upper surface or a stepped upper surface as illustrated in FIG. 9. The bond pads (421, 422, 423) can have the same height or different heights as shown in FIG. 32A. The conductive bonding structures (431, 432, 433) can have the same height or different heights as shown in FIG. 33A.

In one embodiment, the conductive bonding structures (431, 432, 433) can be formed on the devices to be transferred to the backplane 401. For example, first light emitting diodes 10B can be the first devices to be transferred to the backplane substrate 400. The first light emitting diodes 10B can be located on first source substrate B, which can be a first transfer substrate 300B or a first-type growth substrate 100/500B. The conductive bonding structures (431, 432, 433) can be any of the conductive bonding structures 430 discussed above.

Alternatively, conductive bonding structures (431, 432, 433) can be formed on the bond pads (421, 422, 423) of the backplane 401. In this case, the conductive bonding structures (431, 432, 433) can be formed simultaneously on all the bond pads (421, 422, 423).

Yet alternatively, each conductive bonding structure (431, 432, 433) can be formed as two physically disjoined portions such that one portion of each conductive bonding structure (431, 432, or 433) is formed on a first light emitting diode 10B and another portion of the corresponding conductive bonding structure (431, 432, or 433) is formed on a surface of a matching bond pad (421, 422, or 423). In one embodiment, each conductive bonding structure (431, 432, 433) can be formed as two disjoined portions that are divided approximately evenly between an upper portion formed on a first light emitting diode 10B and a lower portion formed on a bond pad (421, 422, or 423).

In one embodiment, the conductive bonding structures (431, 432, 432) can be substantially spherical, substantially ellipsoidal, or substantially cylindrical. The maximum horizontal dimension (such as the diameter of a spherical shape or a cylindrical shape) of each conductive bonding structures (431, 432, 433) can be in a range from 15 microns to 100 microns (such as from 20 microns to 60 microns), although lesser and greater maximum horizontal dimensions can also be employed.

Figure 35B:
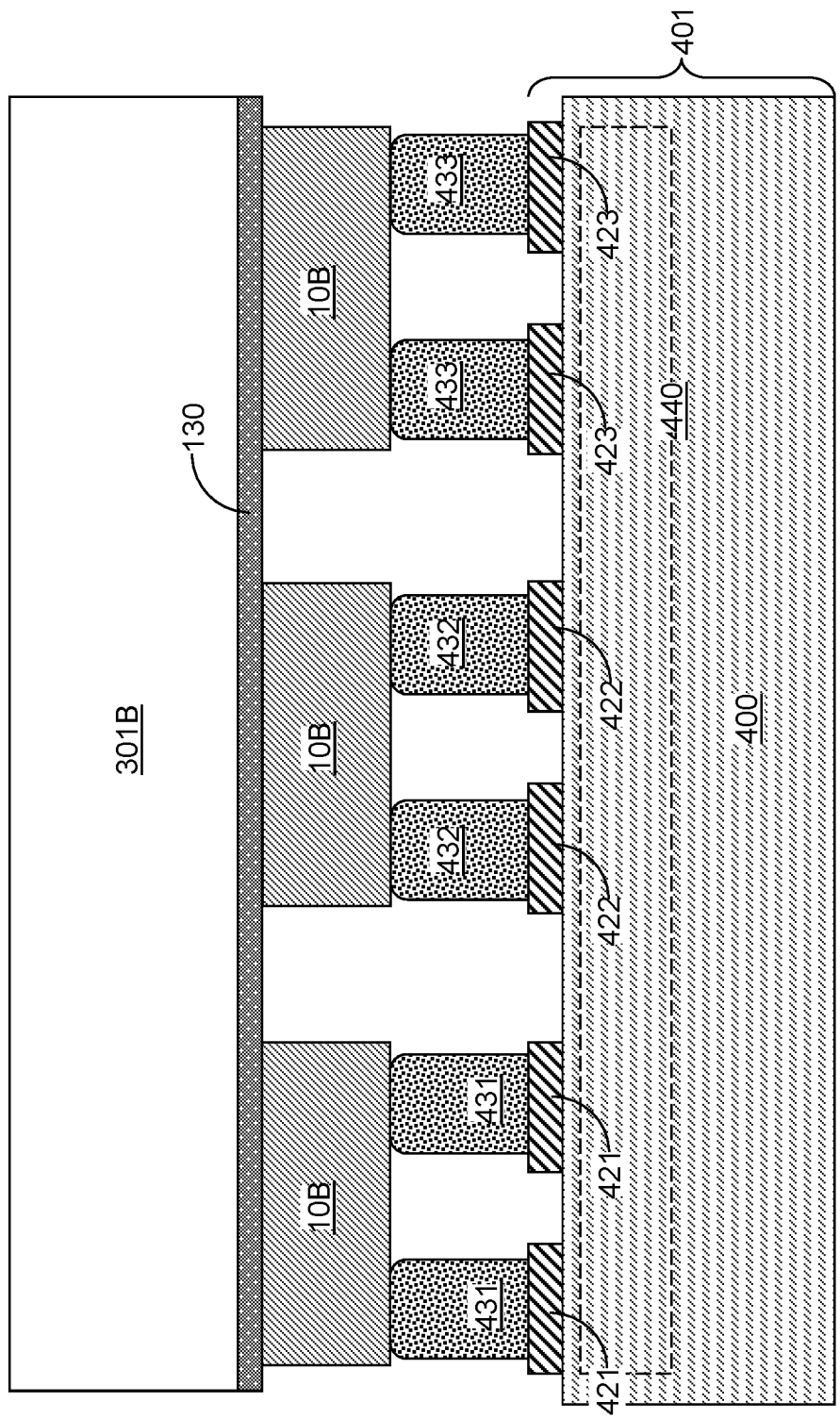

Referring to FIG. 35B, the backplane 401 and the assembly including the first light emitting diodes 10B are positioned such that each conductive bonding structure (431, 432, 433) is attached to one of a first light emitting device 10B and a bonding pad (421, 422, or 423), and contacts the other of the first light emitting device 10B and the bonding pad (421, 422, or 423). In one embodiment, each first conductive bonding structure 431 can be attached to one of an overlying first light emitting device 10B and a first bonding pad 421, and contacts the other of the overlying first light emitting device 10B and the first bonding pad 421; each second conductive bonding structure 432 can be attached to one of an overlying first light emitting device 10B and a second bonding pad 422, and contacts the other of the overlying first light emitting device 10B and the second bonding pad 422; and each third conductive bonding structure 433 can be attached to one of an overlying first light emitting device 10B and a third bonding pad 423, and contacts the other of the overlying first light emitting device 10B and the third bonding pad 423.

A reflow process is performed to reflow the conductive bonding structures (431, 432, 433). The reflow process can be performed by providing uniform heating to the conductive bonding structures (431, 432, 433), for example, by placing the assembly of the backplane 401 and the first source substrate 301B with attached structures thereupon into a furnace or any other temperature controlled environment. Each conductive bonding structure (431, 432, 433) can be bonded to an overlying first light emitting device 10B and an underlying bonding pad (421, 422, 423). The bonding of the conductive bonding structure (431, 432, 433) can occur simultaneously.

Figure 35C:
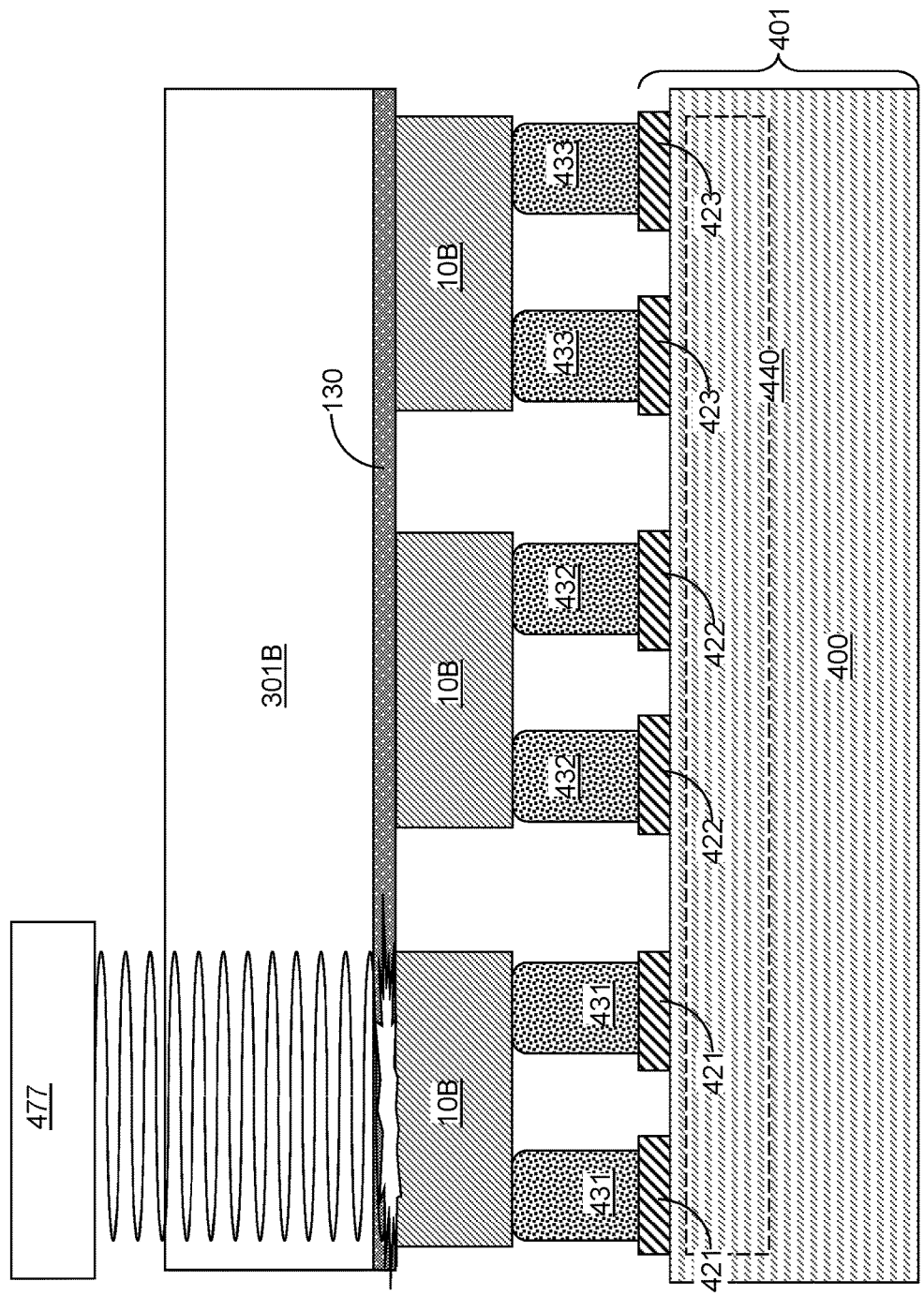

Referring to FIG. 35C, a laser irradiation process is performed to separate each bonded first light emitting device 10B from the first source substrate in the same manner as the processing steps of FIG. 32C. The wavelength of the laser 477 provides more heating to the material of the ablation material layer 130 than to the materials of the source substrate 301B and the transferred devices (e.g., the first light emitting diodes 10B). Each portion of the ablation material layer 130 overlying the first conductive bonding structures 431 can be sequentially irradiated by a laser beam from the layer 477 to dissociate each underlying first light emitting device 10B. In one embodiment, the temperature of the conductive bonding structures (431, 432, 433) can be maintained below the reflow temperature during dissociation process employing laser irradiation. Alternatively, the temperature of the conductive bonding structures (431, 432, 433) can be maintained near the reflow temperature during dissociation process employing laser irradiation Referring to FIG. 35D, the temperature of the conductive bonding structures (431, 432, 433) can be changed to a preset temperature, which is herein referred to as a "separation temperature" by non-selective heating, such as furnace heating. The separation temperature is a temperature at which each of the second and third conductive bonding structures (432, 433) can be split into two portions without causing additional fractures in the second and third bonding structures (432, 433). The separation temperature may be the same as the reflow temperature, may be lower than the reflow temperature (for example, by less than 10 degrees Celsius), or may be higher than the reflow temperature (for example, by less than 20 degrees Celsius). In one embodiment, the temperature of the conductive bonding structures (431, 432, 433) can be at the reflow temperature at the processing steps of FIG. 35B, be lowered to a process temperature that is lower than the reflow temperature at the processing steps of FIG. 35C, and be raised to the separation temperature at the processing steps of FIG. 35D.

The first conductive bonding structures 431 are not attached to the first source substrate 301B after the laser ablation process of FIG. 35C. As the assembly of the first source substrate 301B and attached first light emitting diodes 10B (i.e., the complement of the first subset of the first light emitting diodes 10B) is pulled away from the backplane 401 and the first subset of the first light emitting diodes 10B at the separation temperature, each of the second and third conductive bonding structures (432, 433) can be divided into two portions. For example, each second conductive bonding structure 432 can be divided into an upper second conductive bonding material portion 432U attached to a first light emitting device 10B and a lower second conductive bonding material portion 432L attached to the backplane 401, and each third conductive bonding structure 433 can be divided into an upper third conductive bonding material portion 433U attached to a first light emitting device 10B and a lower third conductive bonding material portion 433L attached to the backplane 401. The ratio of the amount of the conductive bonding material in an upper conductive bonding material portion (432U or 433U) to the amount of the conductive bonding material in an underlying lower conductive bonding material portion (432L or 433L) can be about 1 or less than 1 depending on the selection of the separation temperature.

Figure 35D:
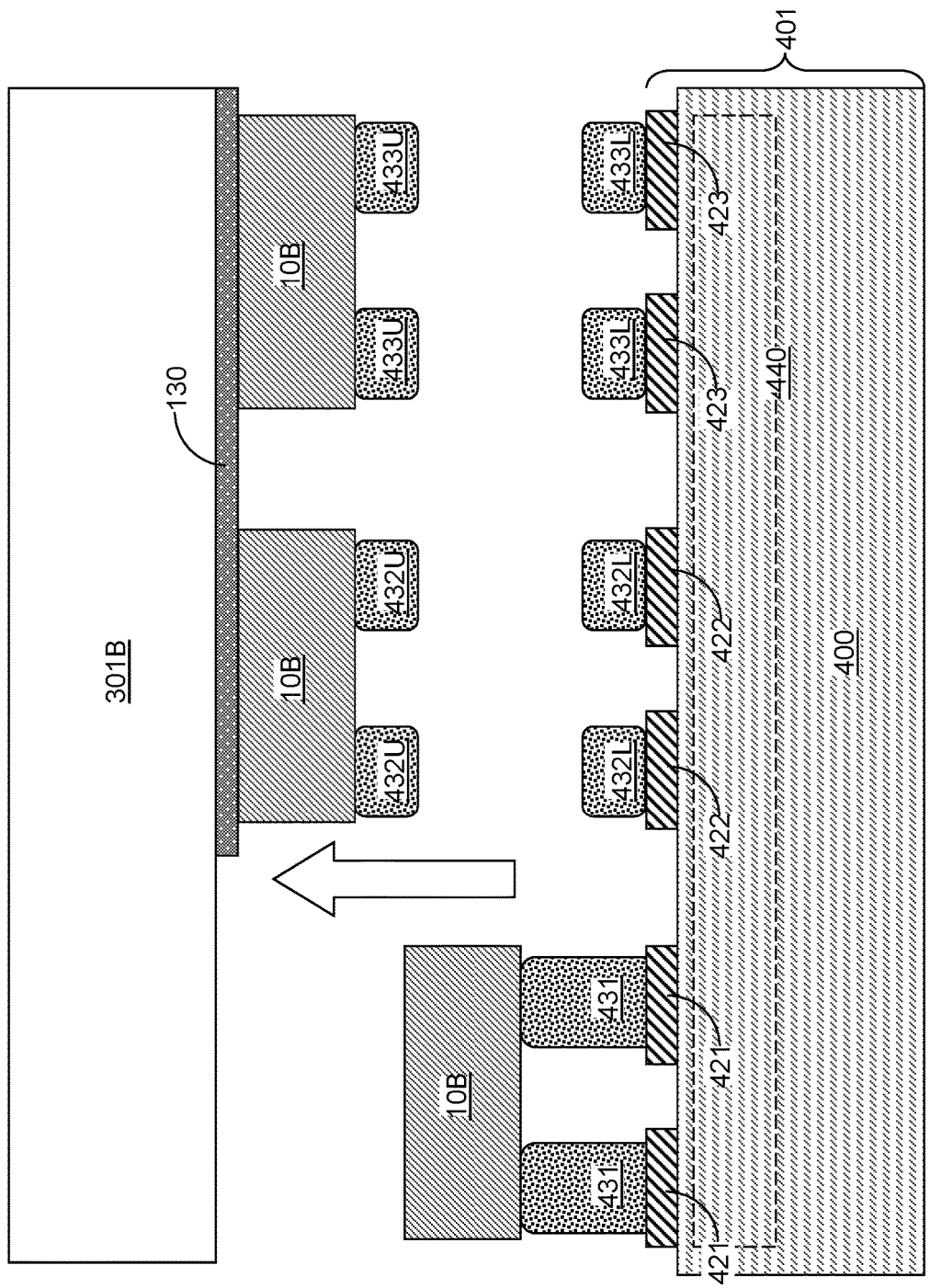
Figure 35E:
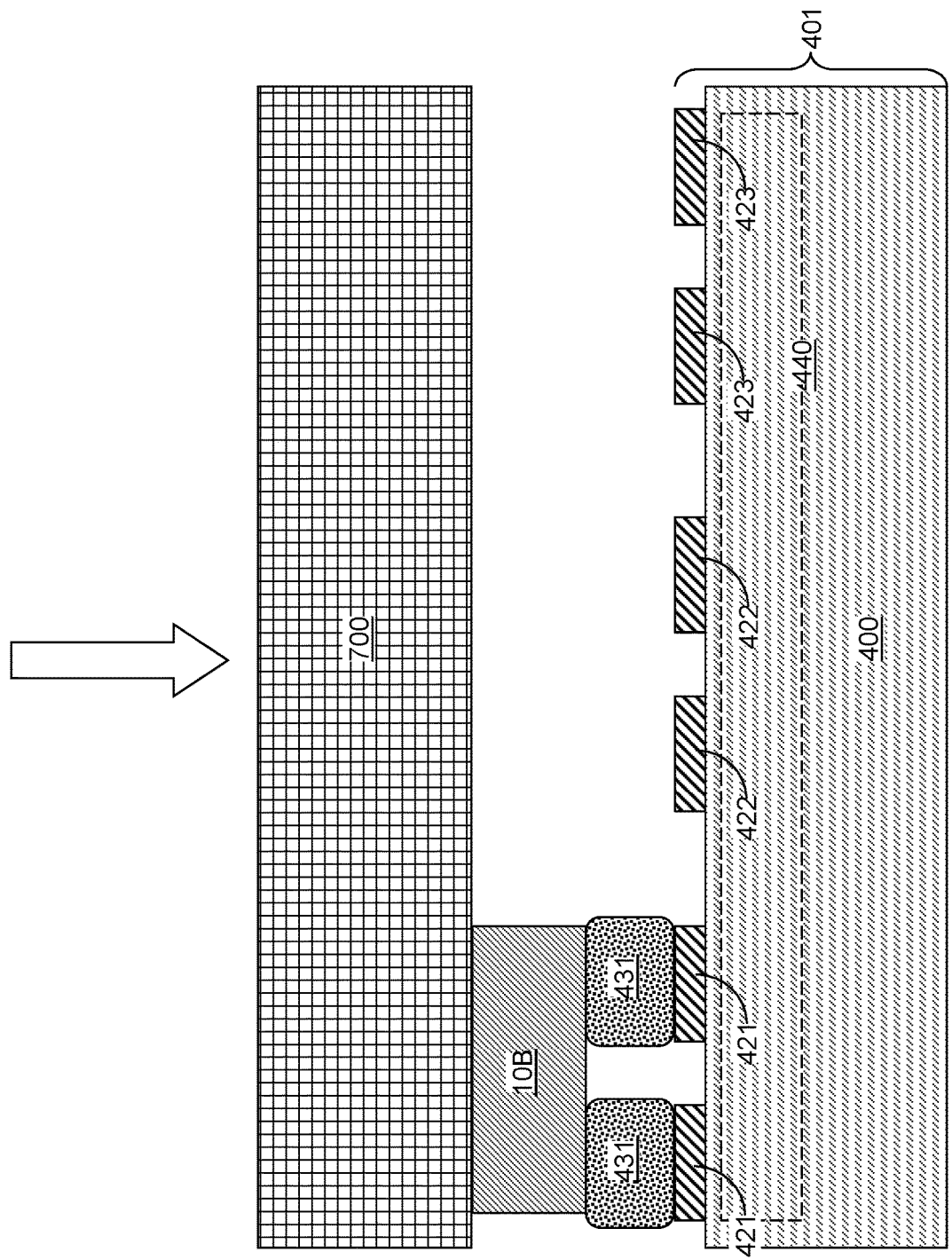

Referring to FIG. 35E, a dummy substrate 700 is employed to push the first light emitting diodes 10B on the first conductive bonding structures 431 toward the backplane 401 while reflowing the first conductive bonding structures 431 in the same manner as the processing steps of FIG. 32E.

The processing steps of FIGS. 35A-35E can correspond to step 1 illustrated in FIG. 31B, in which the backplane 401 corresponds to the backplane BP1 in FIG. 31B. Equivalent processing steps (corresponding to step 2 illustrated in FIG. 31B) can be performed to transfer a first subset of second light emitting devices 10G from a second source substrate G (which can be a second transfer substrate 300G or a second-type growth substrate 100/500G) to first bonding pads 421 of the second backplane BP2 employing the transfer pattern shown in FIG. 31B (or any other pattern). Such processing steps can provide a second source substrate G from which a first subset of second light emitting devices 10G are removed in a pattern that is congruent to the pattern of the first light emitting diodes 10B on the backplane 401.

Figure 35F:
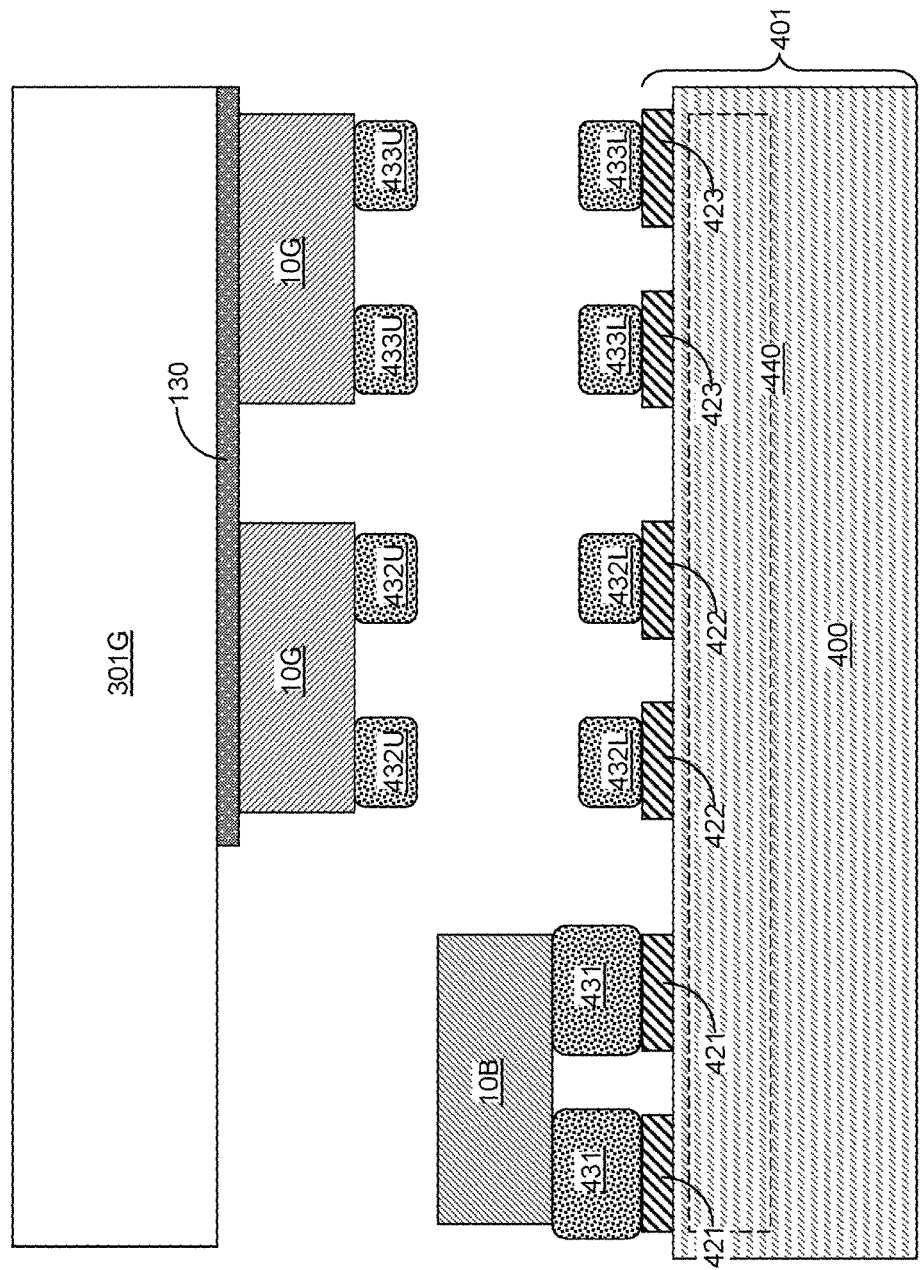

Referring to FIG. 35F, a second source substrate (such as a second transfer substrate 301G) from which a first subset of second light emitting devices 10G are removed is positioned over the in-process fifth exemplary light emitting device assembly, and is aligned such that a second subset of the second light emitting diodes 10G overlies the second bonding pads 422. Each upper conductive bonding material portion (432U or 433U) can be aligned to an underlying lower conductive bonding material portion (432L or 433L) after the alignment process.

Figure 35G:
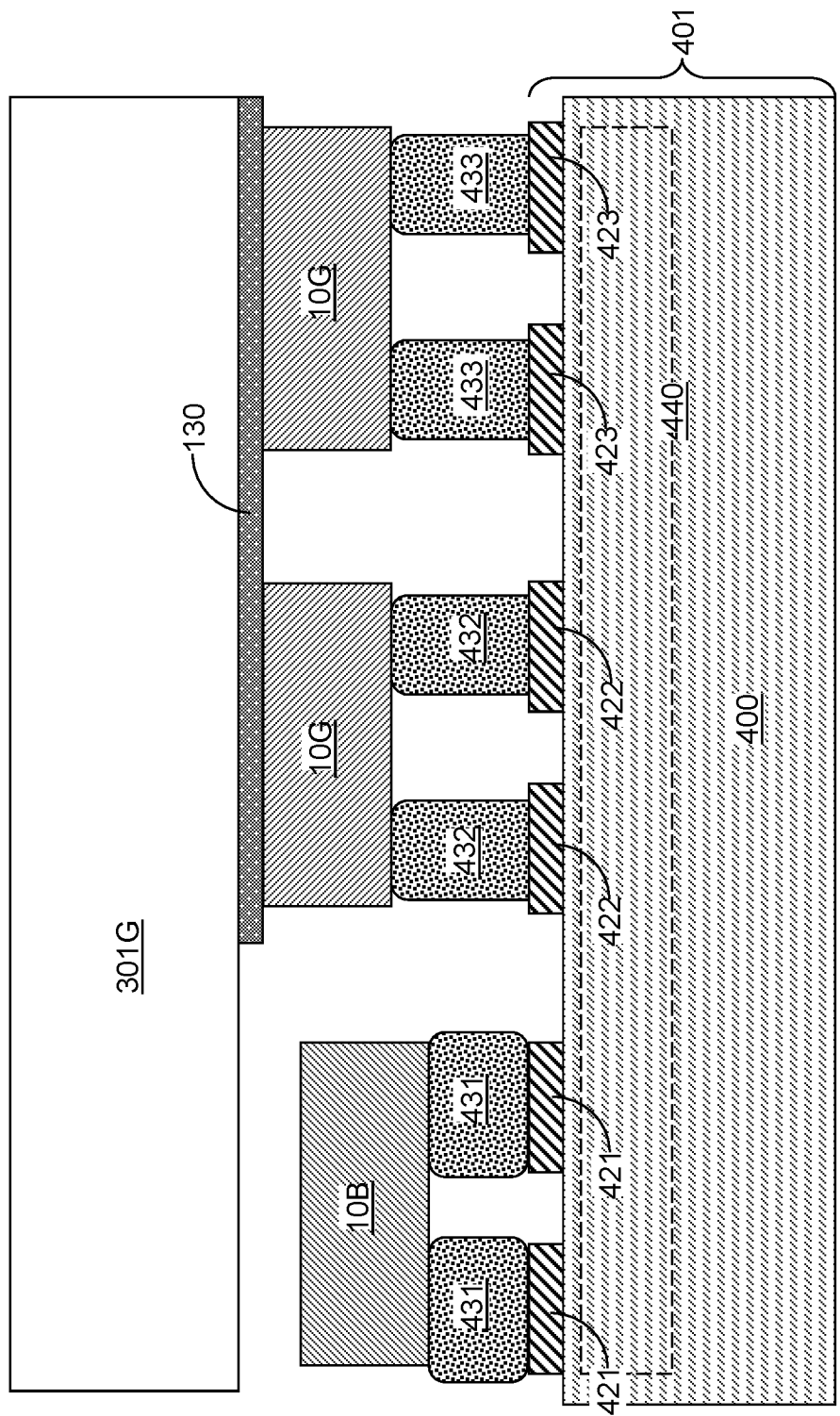

Referring to FIG. 35G, the backplane 401 and the assembly including the second light emitting diodes 10G are brought into contact with each other while the temperature is raised to the reflow temperature of the material of the upper conductive bonding material portions (432U, 433U) and the lower conductive bonding material portions (432L, 433L). The simultaneous ramping up of the temperature and reduction of the separation distance between the upper conductive bonding material portions (432U, 433U) and the lower conductive bonding material portions (432L, 433L) can avoid breakage of, and/or misalignment between, the upper conductive bonding material portions (432U, 433U) and the lower conductive bonding material portions (432L, 433L) due to irregularity in the shapes thereof.

Each vertically adjoined pair of an upper second conductive bonding material portion 432U and a lower second conductive bonding material portion 432L merges to form a second conductive bonding structure 432. Each vertically adjoined pair of an upper third conductive bonding material portion 433U and a lower third conductive bonding material portion 433L merges to form a second conductive bonding structure 433. Each second conductive bonding structure 432 is bonded to an overlying second light emitting device 10G and an underlying second bonding pad 422. Each third conductive bonding structure 433 is bonded to an overlying second light emitting device 10G and an underlying third bonding pad 423.

Figure 35H:
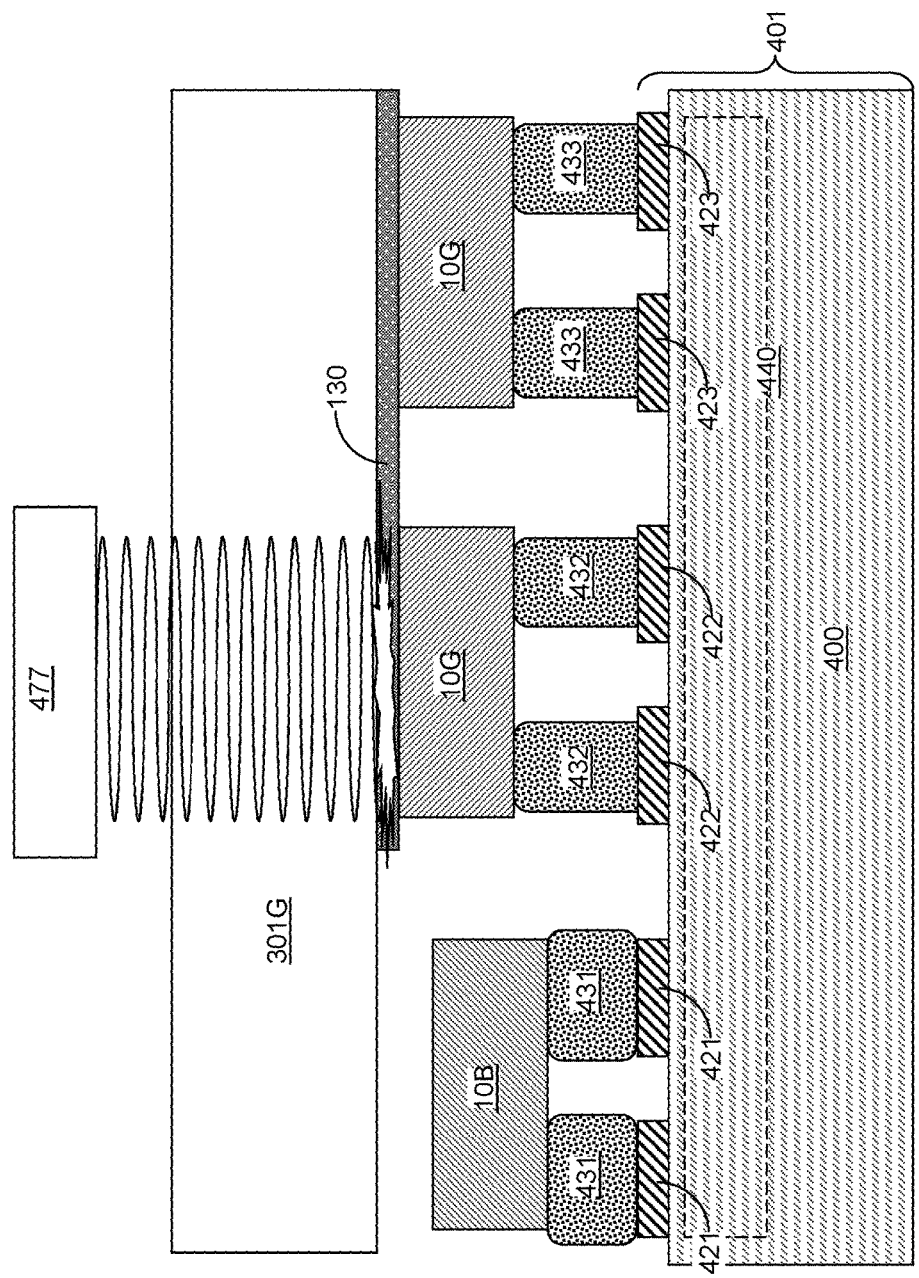

Referring to FIG. 35H, a laser irradiation process is performed to separate each bonded second light emitting device 10G from the second source substrate in the same manner as the processing steps of FIG. 32H. The wavelength of the laser 477 provides more heating to the material of the ablation material layer 130 than to the materials of the source substrate 301G and the transferred devices (e.g., the second light emitting diodes 10G). Each portion of the ablation material layer 130 overlying the second conductive bonding structures 432 can be sequentially irradiated by a laser beam from the layer 477 to dissociate each underlying second light emitting device 10G.

Figure 35I:
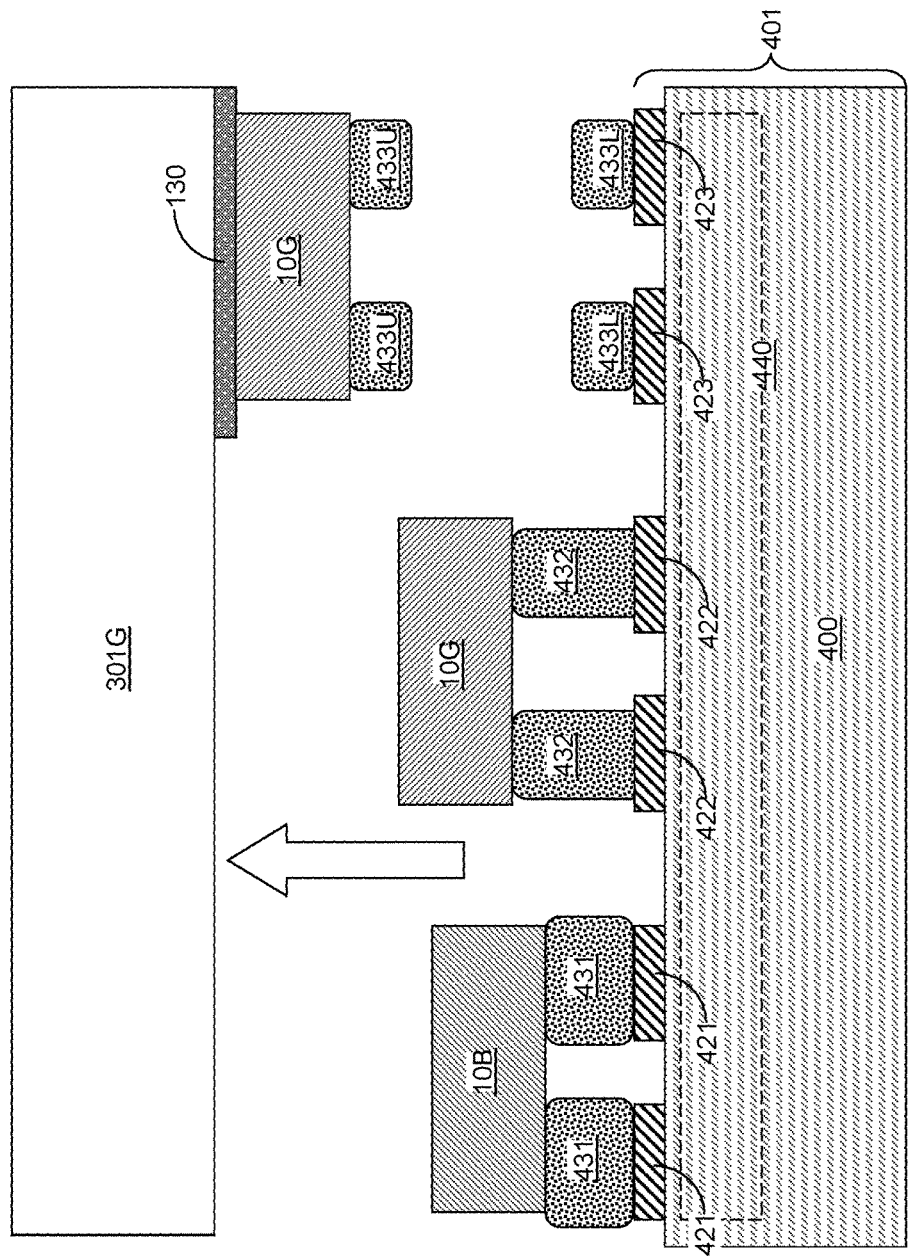

Referring to FIG. 35I, the second conductive bonding structures 432 are not attached to the second source substrate 301B after the laser ablation process of FIG. 35C. The temperature of the conductive bonding structures (431, 432, 433) can be changed to the separation temperature, and the assembly of the second source substrate 301G and attached second light emitting diodes 10G is pulled away from the backplane 401 and the first subset of the first light emitting diodes 10B at the separation temperature. Each of the third conductive bonding structures 433 can be divided into two portions. Specifically, each third conductive bonding structure 433 can be divided into an upper third conductive bonding material portion 433U attached to a first light emitting device 10B and a lower third conductive bonding material portion 433L attached to the backplane 401. The ratio of the amount of the conductive bonding material in an upper third conductive bonding material portion 433U to the amount of the conductive bonding material in an underlying lower third conductive bonding material portion 433L can be about 1 or less than 1 depending on the selection of the separation temperature.

Figure 35J:
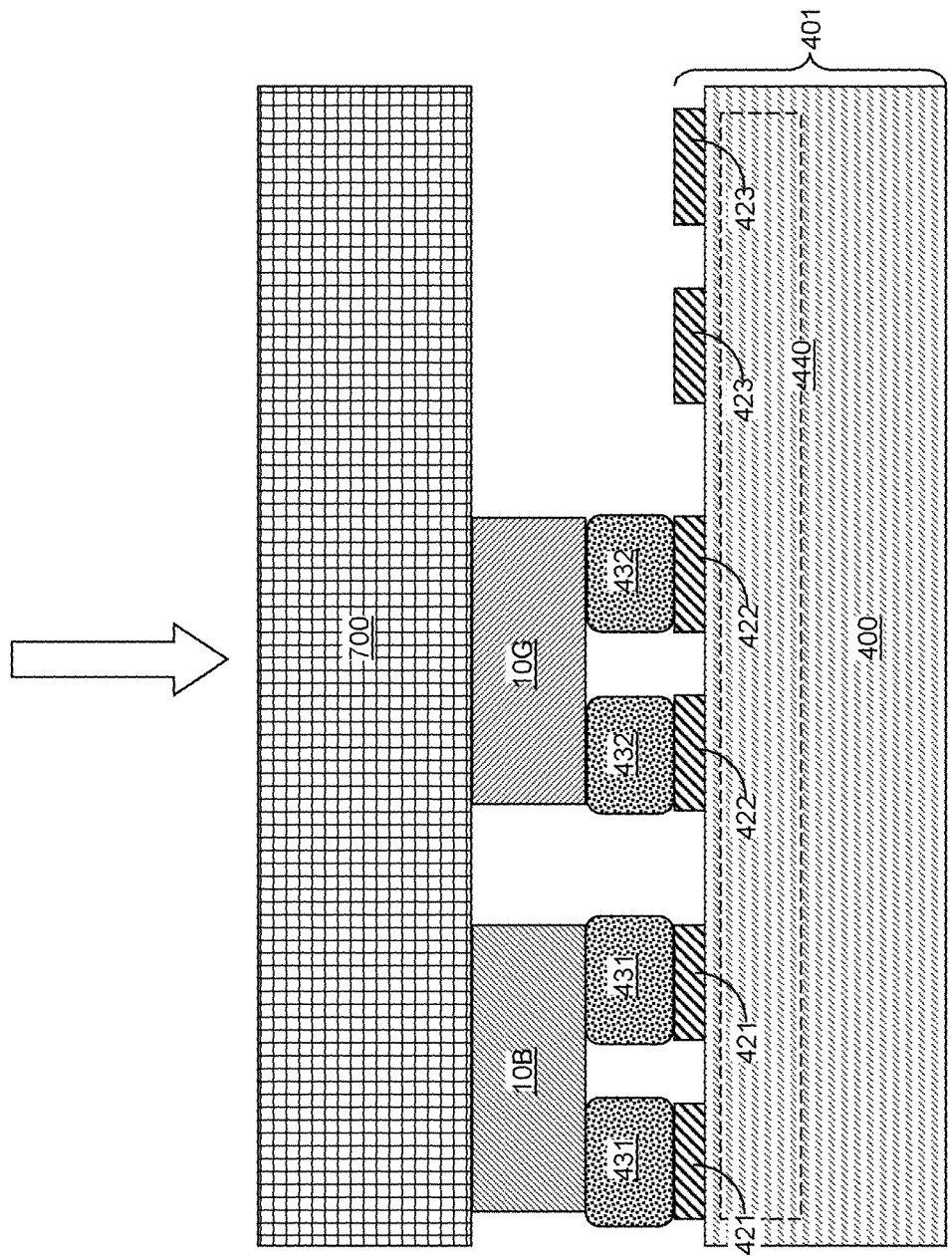

Referring to FIG. 35J, a dummy substrate 700 is employed to push the second light emitting diodes 10G on the second conductive bonding structures 432 toward the backplane 401 in the same manner as in the processing steps of FIG. 32J.

The processing steps of FIGS. 35F-35J can correspond to step 6 illustrated in FIG. 31C, in which the backplane 401 corresponds to the backplane BP1 in FIG. 31C. Processing steps corresponding to step 3 in FIG. 31B and step 7 in FIG. 31C can be performed to transfer a first subset and a second subset of third light emitting devices 10R from a third source substrate R (which can be a third transfer substrate 300R or a third-type growth substrate 100/500R) to bonding pads of additional backplanes (e.g., BP3 in FIG. 31B and BP4 in FIG. 31C) employing the transfer pattern shown in FIGS. 31B and 31C (or any other pattern). Such processing steps can provide a third source substrate R from which a first subset and a second subset of third light emitting devices 10R are removed in a pattern that is congruent to the combined pattern of the first light emitting diodes 10B and the second light emitting diodes 10G on the backplane 401.

Referring to FIG. 35K, a third source substrate (such as a third transfer substrate 301R), from which a first subset and a second subset of third light emitting devices 10R have been removed in prior processing steps, is positioned over the in-process fifth exemplary light emitting device assembly, and is aligned such that a third subset of the third light emitting diodes 10R overlies the third bonding pads 423. Each upper third conductive bonding material portion 433U can be aligned to an underlying lower third conductive bonding material portion 433L after the alignment process.

Figure 35L:
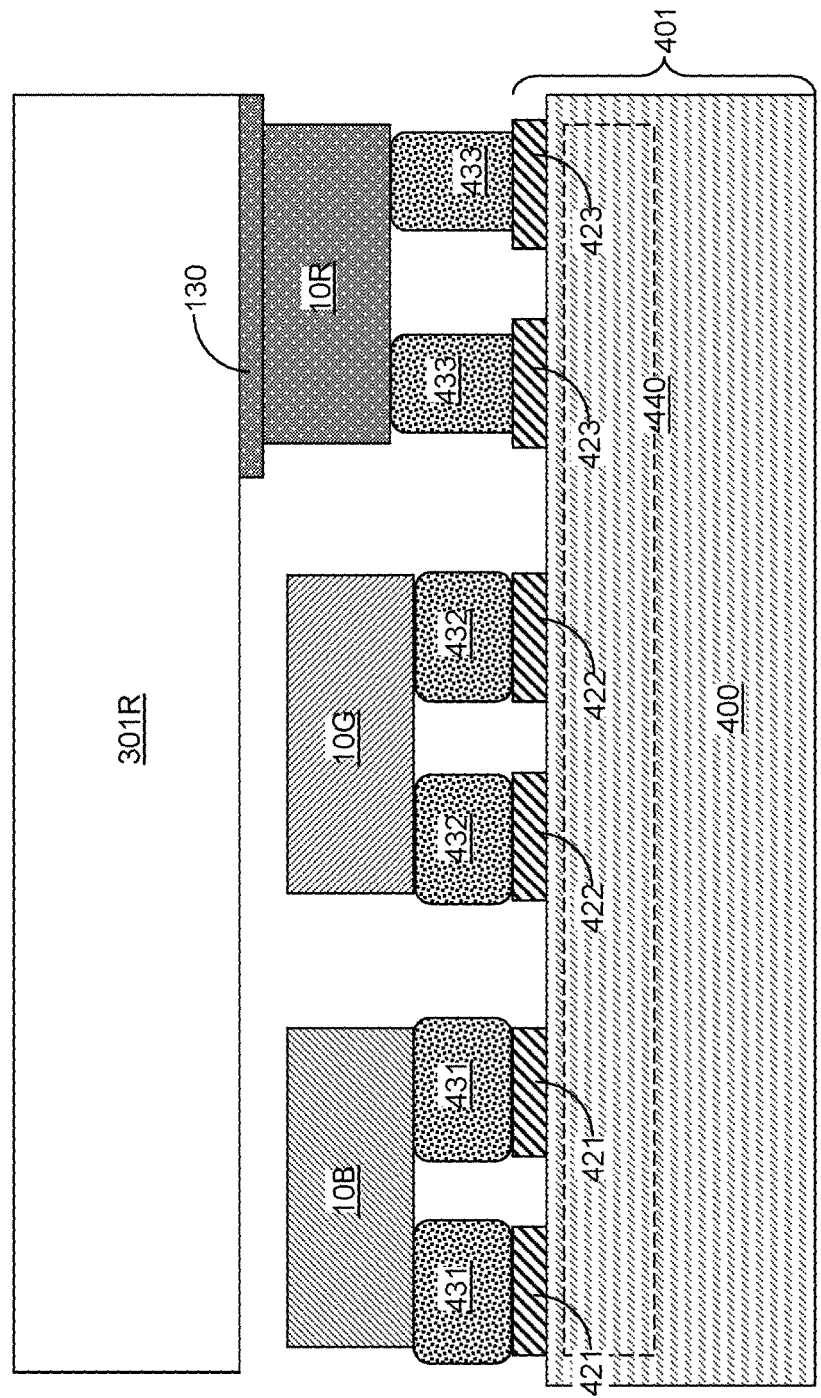

Referring to FIG. 35L, the backplane 401 and the assembly including the second light emitting diodes 10G are brought into contact with each other while the temperature is raised to the reflow temperature of the material of the upper third conductive bonding material portions 433U and the lower third conductive bonding material portions 433L. The simultaneous ramping up of the temperature and reduction of the separation distance between the upper third conductive bonding material portions 433U and the lower third conductive bonding material portions 433L can avoid breakage of, and/or misalignment between, the upper third conductive bonding material portions 433U and the lower third conductive bonding material portions 433L due to irregularity in the shapes thereof.

Each vertically adjoined pair of an upper third conductive bonding material portion 433U and a lower third conductive bonding material portion 433L merges to form a second conductive bonding structure 433. Each third conductive bonding structure 433 is bonded to an overlying second light emitting device 10G and an underlying third bonding pad 423.

Figure 35M:
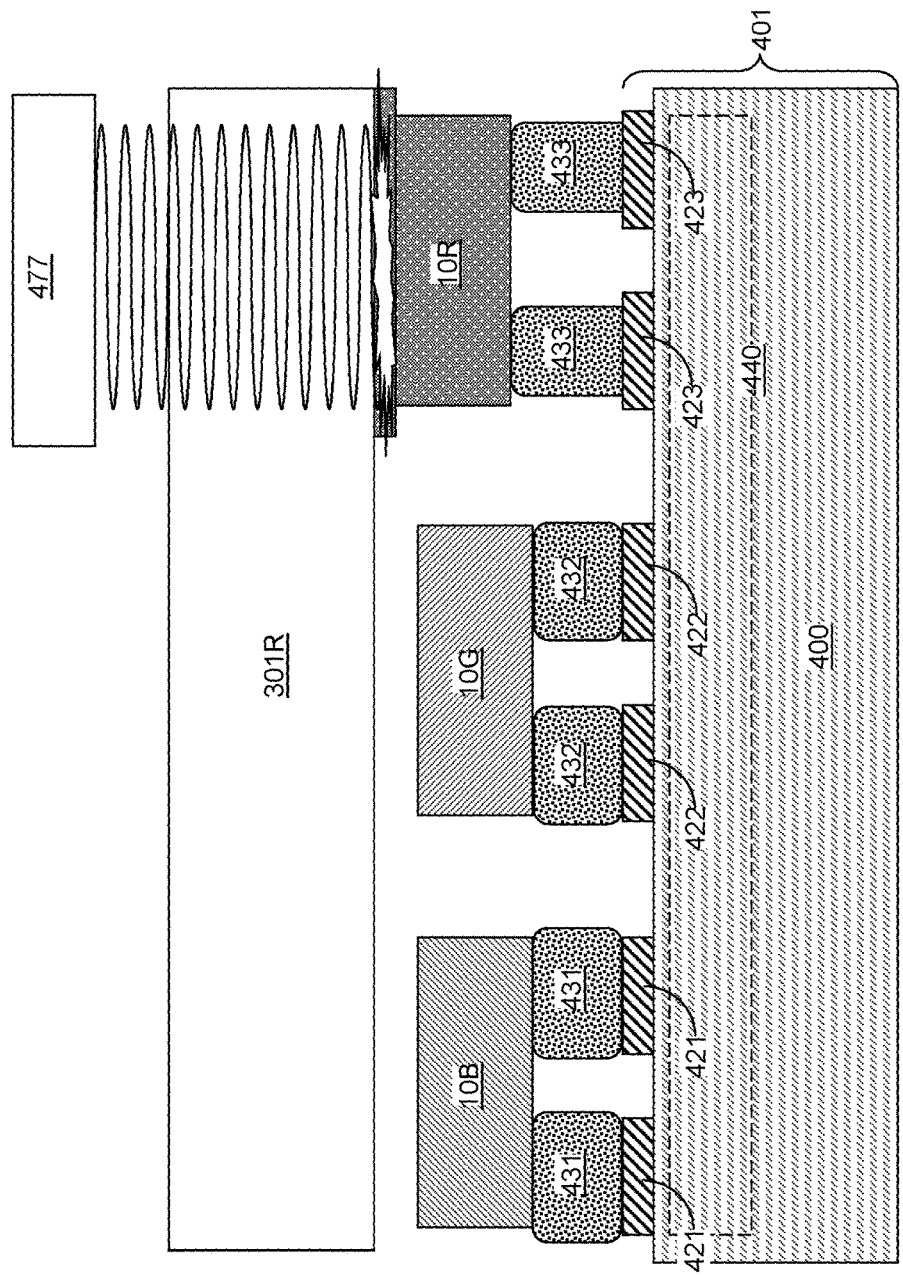

Referring to FIG. 35M, a laser irradiation process is performed to separate each bonded third light emitting device 10R from the third source substrate in the same manner as in the processing steps of FIG. 32M.

Referring to FIG. 35N, the assembly of the third source substrate 301R and any remaining third light emitting diodes 10R, if any, is separated from the backplane 401 and the third subset of the third light emitting diodes 10R that are now attached to the backplane 401 in the same manner as in the processing steps of FIG. 32N.

Optionally, a dummy substrate 700 may be employed to push the third light emitting diodes 10R on the third conductive bonding structures 433 toward the backplane 401 in the same manner as in the processing steps of FIG. 32N.

According to various embodiments of the present disclosure, a method of forming at least one integrated light emitting device assembly is provided. A first assembly comprising a first source substrate 301B and first light emitting devices 10B that emits light of a first wavelength is disposed over a backplane 401. First conductive bonding structures (430B or 431) are disposed between the backplane 401 and the first assembly. A first subset of the first light emitting devices 10B is bonded to the backplane 401 through the first conductive bonding structures (430B or 431). The first subset of the first light emitting devices 10B is detached from the first source substrate 301B by laser ablation of material portions 130 overlying the first subset of the first light emitting devices 10B. An assembly comprising the first source substrate 301B and a second subset of the first light emitting devices 10B is separated from the backplane 401 while the first subset of the first light emitting devices 10B remains bonded to the backplane 401 as illustrated in FIGS. 14, 32D, 33D, 34D, and 35D.

In one embodiment, a second assembly comprising a second source substrate 301G and second light emitting devices 10G is provided. The second light emitting devices 10G emit light of a second wavelength that is different from the first wavelength. The second light emitting devices 10G are not present in vacancy positions that form a first pattern (such as the pattern or vacancy in the second source substrate G in FIG. 31B). The second assembly comprising the second source substrate 301G and the second light emitting devices 10G is disposed over the backplane 401. Second conductive bonding structures 432 are disposed between the backplane 401 and the second assembly. The vacancy positions of the first pattern overlie all areas of the first light emitting devices 10B that are bonded to the backplane 402 when the second assembly is disposed over the backplane 401, as illustrated in FIGS. 15, 16, 32F, 32G, 33F, 33G, 34F, 34G, 35F, and 35G.

In one embodiment, a first subset of the second light emitting devices 10G is bonded to the backplane 401 through the second conductive bonding structures (430G or 432). The first subset of the second light emitting devices 10G is detached from the second source substrate 301G by laser ablation of material portions 130 overlying the first subset of the second light emitting devices; and 10G. An assembly comprising the second source substrate 301G and a second subset of the second light emitting devices 10G is separated from the backplane 401 while the first subset of the second light emitting devices 10G remains bonded to the backplane 401, as illustrated in FIGS. 17, 32I, 33I, 34I, and 35I.

In one embodiment, a third assembly comprising a third source substrate 301R and third light emitting devices 10R is provided. The third light emitting devices 10R emit light of a third wavelength that is different from the first wavelength and from the second wavelength. The third light emitting devices 10R are not present in vacancy positions that form a second pattern such as the pattern of vacancy positions over the third source substrate R in FIG. 31C. The third assembly comprising the third source substrate 301R and the third light emitting devices 10R is disposed over the backplane 401. Third conductive bonding structures (430R or 433) are disposed between the backplane 401 and the third assembly. The vacancy positions in the second pattern overlie all areas of the first and second light emitting devices (10B, 10G) that are bonded to the backplane 401 when the third assembly is disposed over the backplane 401, as illustrated in FIGS. 18, 32K, 32L, 33K, 33L, 34K, 34L, 35K, and 35L.

In one embodiment, a first subset of the third light emitting devices 10R is bonded to the backplane 401 through the third conductive bonding structures (430R or 433). The first subset of the third light emitting devices 10R is detached from the third source substrate 301R by laser ablation of material portions 130 overlying the first subset of the third light emitting devices 10R. An assembly comprising the third source substrate 301R and a second subset of the third light emitting devices 10R is separated from the backplane 401 while the first subset of the third light emitting devices 10R remains bonded to the backplane 401 as illustrated in FIG. 19 or in processing steps immediately following the processing steps of FIG. 32M, 33M, 34M, or 35M.

First bonding pads (420 or 421) and second bonding pads (420 or 421) are provided on the backplane 401. The first conductive bonding structures (430B or 431) overlie the first bonding pads (420 or 421) and the second conductive bonding structures (430G or 432) overlie the second bonding pads (420 or 422) when the first assembly is disposed over the backplane 401. The first conductive bonding structures (430B or 431) are bonded to the first subset of the first light emitting devices 10B and to the first bonding pads (420 or 421) when the first subset of the first light emitting devices 10B are bonded to the backplane 401 as illustrated in FIGS. 12, 32B, 33B, 34B, and 35B.

In some embodiments, one set of structures {(420 or 422) or 10B} selected from the second bonding pads (420 or 422) and the second subset of the first light emitting devices 10B does not physically contact the second conductive bonding structures (430G or 432) when the first subset of the first light emitting devices 10B are bonded to the backplane 401 as illustrated in FIGS. 13, 32B, and 33B. In some embodiments, the first conductive bonding structures (430B or 431) are bonded to the first bonding pads (420 or 421) and the second conductive bonding structures (430G or 432) are bonded to the second bonding pads (420 or 422) before, and while, the first subset of the first light emitting devices 10B are bonded to the backplane 401 as illustrated in FIGS. 11 and 12 and as explained above for the second through fifth exemplary integrated light emitting device assemblies. In some embodiments, each of the first and conductive bonding structures (430B or 431) is bonded to a respective first light emitting device 10B before, and while, the first subset of the first light emitting devices 10B are bonded to the backplane 401 as explained above for the first exemplary integrated light emitting device assembly and as illustrated in FIGS. 32A, 32B, 33A, 33B, 34A, 34B, 35A, and 35B.

In some embodiments, proximal surfaces of the first light emitting diodes 10B (i.e., surfaces that are closest to the backplane 401 such as the bottom surfaces of the first light emitting diodes 10B) are within a horizontal plane when the first assembly is disposed over the backplane as illustrated in FIGS. 12, 32A, 32B, 33A, 33B, 34A, 34B, 35A, and 35B. The first bonding pads (420 or 421) are more proximal to the horizontal plane than the second bonding pads (420 or 422) are to the horizontal plane when the first assembly is disposed over the backplane 401 as illustrated in FIGS. 12, 32A, and 32B. In some embodiments, the first bonding pads (421 have a greater thickness than the second bonding pads 422 as illustrated in FIGS. 32A-32N. In some embodiments, backside surfaces of the first bonding pads 420 are vertically spaced from the horizontal plane by a lesser separation distance than backside surfaces of the second bonding pads 420 are from the horizontal plane when the first assembly is disposed over the backplane 401 as illustrated in FIG. 12. In some embodiments, the backplane 401 has stepped surfaces having a different separation distance from a planar backside surface 409 of the backplane 401, and the first bonding pads 420 are located on a different stepped surface than the second bonding pads 420 as illustrated in FIGS. 9-12.

In some embodiments, the first bonding pads 421 and second bonding pads 422 have a same thickness, and the first conductive bonding structures 431 have a greater height than the second conductive bonding structures 432 upon formation thereof, as illustrated in FIG. 33A.

In some embodiments, the second bonding pads 422 and the second subset of the first light emitting devices 10B are in physically contact with the second conductive bonding structures 432 when the first subset of the first light emitting devices 10B are bonded to the backplane 401, as illustrated in FIGS. 34B and 35B.

In some embodiments, the first conductive bonding structures 431 are bonded to an underlying first bonding pad 421 and an overlying first light emitting device 10B by irradiation by a laser beam that selectively heats each first conductive bonding structure 10B as illustrated in FIG. 34B. In some embodiments, one set of structures (422 or 10B) selected from the second bonding pads 422 and the second subset of the first light emitting devices 10B is not bonded to the second conductive bonding structures 432 when the first subset of the first light emitting devices 10B are bonded to the backplane 401.

In some embodiments, the first conductive bonding structures (430B or 431) are bonded to an underlying first bonding pad (420 or 421) and an overlying first light emitting device 10B by uniformly heating the first conductive bonding structures (430B or 431) as illustrated in FIGS. 12, 32B, 33B, and 35B.

In some embodiments, the second conductive bonding structures 432 are bonded to the second bonding pads 422 and to the second subset of the first light emitting devices 10B when the first subset of the first light emitting devices 10B are bonded to the backplane 401 as illustrated in FIG. 35B. In this case, each of the second conductive bonding structures 432 can be separated into two portions (432U, 432L) while separating the assembly comprising the first source substrate 301B and a second subset of the first light emitting devices 10B from the backplane 401 as illustrated in FIG. 35D. The two portions (432U, 432L) can comprise an upper portion 432U bonded to a respective first light emitting device 10B within the second set, and a lower portion 432L bonded to a respective second bonding pad 421.

In some embodiments, the first subset of the first light emitting devices 10B are bonded to the first bonding pad 421 and the second subset of the first light emitting devices 10B are bonded to the second bonding pad 422 simultaneously at a reflow temperature at the processing step of FIG. 35B. The laser ablation can be performed at a temperature lower than the reflow temperature at the processing step of FIG. 35C. At the processing step of FIG. 35D, the assembly comprising the first source substrate 301B and the second subset of the first light emitting devices 10B is separated from the backplane 401 at a separation temperature, which can be selected to be not less than the reflow temperature in some cases.

In some embodiments, the first subset of the first light emitting devices 10B is pushed closer to the backplane while reflowing the first conductive bonding structures after the assembly comprising the first source substrate 301B and the second subset of the first light emitting devices 10B is separated from the backplane 401 as illustrated in FIGS. 27, 28, 32E, 33E, 34E, and 35E. In some embodiments, a vertical pushing distance during the pushing of the first subset of the first light emitting devices 10B can be greater than a maximum height among gaps between the second conductive bonding structures (430G or 432) and structures selected from overlying first light emitting diodes 10B and underlying second bonding pads (420 or 422). The gaps can be present between the second conductive bonding structures (430G or 432) and overlying first light emitting diodes 10B as illustrated in FIGS. 12 and 13, or can be present between the second conductive bonding structures (430G or 432) and underlying second bonding pads (420 or 422) as illustrated in FIGS. 32B and 33B.

In some embodiments, an additional assembly comprising another source substrate (401S or 101S) and sensor devices 10S can be provided. The sensor devices 10S are not present in vacancy positions that form another pattern, which can be, for example, the pattern of the vacancy positions in the fourth source substrate S in FIG. 31D. The additional assembly comprising the additional source substrate (401S or 101S) and the sensor devices 10S can be disposed over the backplane 401. Additional conductive bonding structures 420 can be disposed between the backplane 401 and the additional assembly, and the vacancy positions in the additional pattern overlie all areas of the first light emitting devices 10B (and second and third light emitting devices (10G, 10R), if present) that are bonded to the backplane 401 when the additional assembly is disposed over the backplane 401 as illustrated in FIG. 19. While transfer of the sensor devices 10S to the backplane 401 is not expressly described for the second through fifth integrated light emitting device assemblies, it is understood that the same device transfer methods can be iteratively employed to transfer any number of different types of discrete devices in an array configuration having the same pitches as the transferred discrete devices on the backplane 401.

In one embodiment, a first subset of the sensor devices 10S can be bonded to the backplane 401 through the additional conductive bonding structures 420. The first subset of the sensor devices 20S can be detached from the additional source substrate (401S or 101S) by laser ablation of material portions 20 overlying the first subset of the sensor devices 10S as illustrated in FIG. 20. An assembly comprising the additional source substrate (401S or 101S) and a second subset of the sensor devices 10S can be separated from the backplane 401 while the first subset of the sensor devices 10 remains bonded to the backplane 401 as illustrated in FIG. 21.

In some embodiments, the first subset of the first light emitting devices 10B is detached from the first source substrate (401B or 101B) one at a time by sequential irradiation of a laser beam to each first light emitting device 10B in the first subset as illustrated in FIGS. 13, 32C, 33C, 34C, and 35C.

The first bonding pads (420, 421) are provided on the backplane 401, and each of the first conductive bonding structures (430B or 431) is bonded to a respective first bonding pad (420, 421) and a respective first light emitting device 10B in the first subset when the first subset of the first light emitting devices 10B are bonded to the backplane 401. In some embodiment, second conductive bonding structures (430G or 432) are disposed between the second subset of the first light emitting devices 10B and second bonding pads (420, 422) located on the backplane 401 at a time of bonding the first subset of the first light emitting diodes to the backplane 401, and each second conductive bonding structure (430G or 432) is bonded to one of an overlying first light emitting device 10B within the second subset and an underlying second bonding pad (420, 422), and does not physically contact another of the overlying first light emitting device 10B within the second subset and the underlying second bonding pad (420, 422), as illustrated in FIGS. 13, 32B, and 33B.

In some embodiment, the backplane 401 is provided with stepped horizontal surfaces at a top side as illustrated in FIGS. 9-23 and 25-29. The stepped horizontal surfaces can comprise a first subset of the stepped horizontal surfaces located within a first horizontal surface plane HSP1, and a second subset of the stepped horizontal surfaces located within a second horizontal surface plane HSP2 that is more proximal to a planar backside surface 409 of the backplane 401 than the first subset of stepped horizontal surfaces is to the planar backside surface 409 of the backplane 401 as illustrated in FIG. 9. In this case, the first conductive bonding structures 420 can be formed at the first subset of the stepped horizontal surfaces, and the second conductive bonding structures 420 can be formed at the second subset of the stepped horizontal surfaces. The stepped horizontal surfaces can comprise a third subset of the stepped horizontal surfaces is located within a third horizontal surface plane HSP3 that is more proximal to the backside surface 409 of the backplane 401 than the second subset of stepped horizontal surfaces is to the backside surface 409 of the backplane 401, and the third conductive bonding structures 420 can be formed at the third subset of the stepped horizontal surfaces.

In one embodiment, the first assembly comprising the first source substrate (401B, 101B) and the first light emitting devices 10B can further comprise a release layer 20 contacting the first source substrate and comprising a material that absorbs light at a wavelength selected from ultraviolet range, visible range, and infrared range. A bonding material layer 30 can contact the release layer 20 and the first light emitting devices 10B.

First portions of the release layer 20 (which is an ablation material layer 130) that overlies the first subset of the first light emitting devices 10B can be removed selectively, while second portions of the release layer 20 that overlie the second subset of the first light emitting devices 10B are not removed. In some embodiments, the release layer 20 comprises silicon nitride, the laser wavelength is a ultraviolet wavelength, and irradiating the first portions of the release layer 20 with the laser beam ablates the first portions of the release layer 20.

In some embodiments, the first source substrate can be an upper portion 530 of a growth substrate 500B on which the first light emitting devices 10B are fabricated. The first source substrate 101B can be provided by separating the upper portion 530 of the growth substrate 500B from a lower portion of the growth substrate 500B. In one embodiment, the growth substrate 500B can comprise a compound semiconductor material, and can be a III-V compound semiconductor substrate.

According to some embodiments of the present disclosure, an integrated light emitting device assembly is provided, which comprises a backplane 401 having stepped horizontal surfaces at a top side. The stepped horizontal surfaces comprises a first subset of the stepped horizontal surfaces located within a first horizontal surface plane HSP1, and a second subset of the stepped horizontal surfaces located within a second horizontal surface plane HSP2 that is more proximal to a backside surface 409 of the backplane 401 than the first subset of stepped horizontal surfaces is to the backside surface 409 of the backplane 401 as illustrated in FIG. 9. The integrated light emitting device assembly can comprise conductive bonding structures 430 overlying the stepped horizontal surfaces of the backplane 401. The conductive bonding structures 430 comprise first conductive bonding structures 430B overlying the first subset of the stepped horizontal surfaces and second conductive bonding structures 430G overlying the second subset of the stepped horizontal surfaces. The integrated light emitting device assembly can comprise light emitting devices (10B, 10G, 10R) bonded to the conductive bonding structures 430. The light emitting devices (10B, 10G, 10R) can comprise first light emitting devices 10B that emit light of a first wavelength and overlie the first subset of the stepped horizontal surfaces and second light emitting devices 10G that emit light of a second wavelength and overlie the second subset of stepped horizontal surfaces.

In some embodiments, a first horizontal interfacial plane including interfaces between the first light emitting devices 10B and the first conductive bonding structures 430B is more distal from the second horizontal surface plane than a second horizontal interface plane between the second light emitting devices 10G and the second conductive bonding structures 430G as illustrated in FIGS. 22, 23, 24, 25, and 29. In some embodiments, the stepped horizontal surfaces further comprise a third subset of the stepped horizontal surfaces located within a third horizontal surface plane HSP3 that is more proximal to the backside surface 409 of the backplane 401 than the second subset of stepped horizontal surfaces as illustrated in FIG. 9. The conductive bonding structures 430 can further comprise third conductive bonding structures 430R overlying the third subset of the stepped horizontal surfaces.

In some embodiments, the light emitting devices (10B, 10G, 10R) further comprise third light emitting devices 10R that emit light of a third wavelength and overlie the third subset of the stepped horizontal surfaces. A third horizontal interfacial plane including interfaces between the third light emitting devices 10R and the third conductive bonding structures 430R can be more proximal to the second horizontal surface plane HSP2 than the second horizontal interface plane is to the second horizontal surface plane HSP2 as illustrated in FIGS. 22, 23, 24, 25, and 29.

In some embodiments, the second conductive bonding structures 430G have a greater height than the first conductive bonding structures 430B as illustrated in FIGS. 22, 23, 24, 25, and 29. In some embodiments, the third conductive bonding structures 430R have a greater height than the second conductive bonding structures 430G as illustrated in 22, 23, 24, 25, and 29. In some embodiments, the integrated light emitting device assembly can comprise sensor devices 10S bonded to the backplane 401 through fourth conductive bonding structures 430S.

In some embodiment, a first horizontal top plane including top surfaces of the first light emitting devices 10B can be more proximal to the second horizontal surface plane HSP2 than a second horizontal top plane including top surfaces of the second light emitting devices 10G is to the second horizontal surfaces plane HSP2 as illustrated in FIGS. 22, 23, 24, 25, and 29.

In some embodiments, the light emitting devices (10B, 10G, 10R) further comprise third light emitting devices 10R that emit light of a third wavelength and overlie the third subset of the stepped horizontal surfaces. A third horizontal top plane including top surfaces of the third light emitting devices 10R can be more distal from the second horizontal surface plane than the second horizontal top plane is from the second horizontal surfaces plane as illustrated in FIGS. 22, 23, 24, 25, and 29.

In some embodiments, the second light emitting devices 10G can have a greater height than the first light emitting devices 10G as illustrated in FIGS. 22, 23, 24, 25, and 29. In some embodiments, the third light emitting devices 10R can have a greater height than the second light emitting devices 10G.

In some embodiments, the light emitting devices (10B, 10G, 10R) can be arranged in a periodic array in which center-to-center distances of neighboring light emitting devices along a horizontal direction are integer multiples of a unit distance.

According to some embodiments of the present disclosure, an integrated light emitting device assembly comprising first light emitting devices 10B and second light emitting devices 10G bonded to a backplane 401 is provided. Each first light emitting device 10B emits light at a first wavelength, and each second light emitting device 10G emits light at a second wavelength that is different from the first wavelength. Each first light emitting device 10B is bonded to the backplane 401 through a first stack including a first bonding pad (420 or 421) and a first conductive bonding structure (430B or 431). Each second light emitting device 10G is bonded to the backplane 401 through a second stack including a second bonding pad (420 or 422) and a second conductive bonding structure (430G or 432). A first plane including first interfaces between the first bonding pads (420 or 421) and the first conductive bonding structures (430B or 431) is vertically offset from a second plane including second interfaces between the second bonding pads (420 or 422) and the second conductive bonding structures (430G or 432) as illustrated in FIGS. 22, 23, 24, 25, 29, and 32.

In some embodiments, distal surfaces (i.e., top surfaces) of the first light emitting devices 10B and the second light emitting devices 10G can be within a same plane that is spaced from, and is parallel to, the first and second planes as illustrated in FIG. 32N. In some embodiments, the first bonding pads 421 can have a first thickness, and the second bonding pads 422 can have a second thickness that is less than the first thickness as illustrated in FIG. 32N.

In some embodiments, the first bonding pads 420 and the second bonding pads 420 can have a same thickness, and are located on stepped surfaces. Bottom surfaces of the first bonding pads 420 are located on a first subset of the stepped surfaces, and bottom surfaces of the second bonding pads 420 are located on a second subset of the stepped surfaces that are vertically offset from the first subset of the stepped surfaces as illustrated in FIGS. 22, 23, 24, 25, and 29.

In some embodiment, the first conductive bonding structures 432 have a first height, and the second conductive bonding structures 432 have a second height that is less than the first height as illustrated in FIG. 32N. Each of the conductive bonding structures (431, 432, 433) can be formed with a same volume upon formation (for example, at the processing step of FIG. 32A), and each of the first conductive bonding structures 431 and the second conductive bonding structures 432 can have the same volume. The first conductive bonding structures 431 and the second conductive bonding structures 432 can have the same material composition. In some embodiments, the first bonding pads 421 can have a first thickness, the second bonding pads 422 can have a second thickness, and the sum of the first thickness and the first height of the first conductive bonding structures 431 can be the same as the sum of the second thickness and the second height of the second conductive bonding structures 432 as illustrated in FIG. 32N.

In some embodiments, third light emitting devices 10R can be bonded to the backplane 401. Each third light emitting device 10R emits light at a third wavelength that is different from the first wavelength and from the second wavelength. Each third light emitting device 10R can be bonded to the backplane 401 through a third stack including a third bonding pad 423 and a third conductive bonding structure 433. A third plane including third interfaces between the third bonding pads 423 and the third conductive bonding structures 433 can be vertically offset from the first plane and from the second plane.

According to some embodiments of the present disclosure, an integrated light emitting device assembly comprising first light emitting devices 10B and second light emitting devices 10G bonded to a backplane 401 is provided. Each first light emitting device 10B emits light at a first wavelength, and each second light emitting device 10G emits light at a second wavelength that is different from the first wavelength. Each first light emitting device 10B can be bonded to the backplane 401 through a first stack including a first bonding pad 421 and a first conductive bonding structure 431, and each second light emitting device 10G can be bonded to the backplane 401 through a second stack including a second bonding pad 422 and a second conductive bonding structure 432. The first conductive bonding structures 431 and the second conductive bonding structures 432 can have a same height. Each of the first conductive bonding structures 431 can have a first volume, and each of the second conductive bonding structures 432 can have a second volume that is less than the first volume as illustrated in FIG. 33N. The first conductive bonding structures 431, the second conductive bonding structures 432, and the third conductive bonding structures 433 can have different volumes as formed at the processing step of FIG. 33A. For example, the volume of the first conductive bonding structures 431 can be greater than the volume of the second conductive bonding structures 432, and the volume of the second conductive bonding structures 432 can be greater than the volume of the third conductive bonding structures 433. The conductive bonding structures (431, 432, 433) can have approximately the same lateral extent and different vertical extents as formed at the processing step of FIG. 33A.

In some embodiments, distal surfaces (i.e., top surfaces) of the first light emitting devices 10B and the second light emitting devices 10G can be within a same horizontal plane that is spaced from, and is parallel to, a top surface of the backplane 401, and a backside surface 409 of the backplane 401.

In some embodiments, the first bonding pads 421 and the second bonding pads 422 can have the same thickness as illustrated in FIG. 33N. In some embodiments, bottom surfaces of the first bonding pads 421 and the second bonding pads 422 can be located within a same plane including a top surface of the backplane 401. In some embodiments, the first conductive bonding structures 421 and the second conductive bonding structures 422 can have a same material composition.

In some embodiments, third light emitting devices 10R can be bonded to the backplane 401. Each third light emitting device 10R emits light at a third wavelength that is different from the first wavelength and from the second wavelength. Each third light emitting device 10R can be bonded to the backplane 401 through a third stack including a third bonding pad 423 and a third conductive bonding structure 433. The first conductive bonding structures 431, the second conductive bonding structures 432, and the third conductive bonding structures 433 can have the same height, and each of the third conductive bonding structures 433 can have a third volume that is less than the second volume.

According to an aspect of the present disclosure, ultra low temperature bonding for thermally sensitive processes can be designed around low melting point metals, eutectics and rapid diffusion reactions. Combining separate bond pad combinations leads to a process called selective die bonding. While the present disclosure is described employing a combination of three materials including indium (In), tin (Sn), and tellurium (Te), a combination of any plurality of materials selected from Table 1 below and having different melting temperatures can be employed as a set of solder materials in conjunction with corresponding bond pad metallurgy to enable sequential bonding of dies (devices) in multiple stages.

Further, various types of bond materials can be employed to implement the features of the present disclosure. Three embodiments include: fully reversible pure metal bonds; partially reversible eutectic reactions; and nearly irreversible low temperature diffusion reactions.

Fully reversible pure metal bonds with In (melting point 156° C.), Sn (melting point 232° C.) and Te (melting point 449° C.) are deposited on one or both sides of the devices to be bonded. The bond interface can be remelted and reworked several times. Each metal must be deposited on top of appropriate diffusion barriers and adhesion layers consistent with the underlying device or substrate. For example, Sn can be employed on Pt/Ti/Cr. The thickness of the layer may range from 10 nm to several microns. Lateral flow of the molten solder is controlled by bonding conditions, bond pad geometry, wetting layer design and thermal compression bonding parameters.

Partially reversible eutectic reactions are bonds in which the alloy system includes a series of cascading eutectic reactions in the phase diagram (e.g. the Cu—Sn) system or has an extended two phase liquid plus solid phase region adjoining the eutectic point. These bonds are partially reversible when the composition of the bond interface is engineered such that the mixing (diffusion) of the two alloying components increases in temperature of the alloy but still contains pure components and solid solutions with a low melting point. The reaction is partially reversible since the reacted alloy will form intermetallic compounds that do not remelt at low temperature. This type of die bonding method can also result in permanent bond when the thicknesses of the metal layers is engineered to result in full consumption of the lower melting point material into higher stability intermetallic compounds. These system will generally allow at least one remelt and rebond sequence and as many as four or more (Au—Sn). The first bond will be done slightly above the melting point of the lowest melting component. Rework temperature will be approximately 10° C.-15° C. higher than the first bond temperature. As more and more of the higher temperature component is consumed in the alloy formation the rebond/rework temperatures will rise. Each metal must be deposited on top of appropriate diffusion barriers and adhesion layers consistent with the underlying device or substrate. For example, Sn can be employed on Pt/Ti/Cr. The thickness of the layer may range from 10 nm to several microns. Lateral flow of the molten solder is controlled by bonding conditions, bond pad geometry, wetting layer design and thermal compression bonding parameters.

Nearly irreversible low temperature diffusion reactions are systems where it may be possible to rework the bond joint only once owing to the rapid diffusion process and formation of stable high temperature compounds. The reactions are rapid but can be used with rapid thermal processes to arrest the compound formation and allow for melting of remaining lower temperature solid solution. Each metal must be deposited on top of appropriate diffusion barriers and adhesion layers consistent with the underlying device or substrate. For example, Sn can be employed on Pt/Ti/Cr. The thickness of the layer may range from 10 nm to several microns. Lateral flow of the molten solder is controlled by bonding conditions, bond pad geometry, wetting layer design and thermal compression bonding parameters.

The exemplary systems include, but are not limited to, those with reaction temperatures below 450° C. that have been shown to be partially or fully reversible. The pure metal, fully reversible systems are In—In, Sn—Sn, and Te—Te. The fully and partially reversible bonds include one or more of In, Sn or Te. For tin based joints the most notable examples are In—Sn, Cu—Sn, Au—Sn, Ag—Sn, Al—Sn, Pd—Sn, Ge—Sn, Ni—Sn. For indium based joints the most significant systems are In—Sn, Ag—In, Au—In, Cu—In, In—Pt, In—Pd. The tellurium systems of interest are In—Te, Sn—Te, Ag, Te, Cu—Te, and Ge—Te.

Combing these basic low temperature reactions in selective areas of a bonded system allows selective transfer of mixed technologies or die types. The substrate can be provided with solder materials of different types. In one embodiment, the solder materials can be embodied as the conductive bonding structures (430, 431, 432, 433) described above. Alternatively, if a bonding scheme employs direct bondpad-to-bondpad bonding, the bondpads (420, 421, 422, 423) described above can include the solder materials.

For example if a support substrate is composed of bond pads of In, Sn and Te and the mating part(s) have bond pads of copper the following sequence could be used to selectively bond parts only at In, Sn, or Te locations.

First, starting with the first material (e.g., In) having a first eutectic point with Cu (which is the lowest eutectic point among the three eutectic points), the substrate can be heated to just over the first eutectic point (e.g., 156° C. for the case of the In—Cu system) and contacted by a first Cu-pad containing die, i.e., a first device 10B including copper bonding pads. This will form a eutectic alloy, and depending upon the length of time and temperature, the first Cu-pad containing die is held in contact the joint will form a stable intermetallic that will not remelt until above 310° C. during subsequent reheating processes. No other location with the Sn or Te will appreciably react with the Cu material at such a low temperature.

Second, a second Cu-pad containing die, i.e., a second device 10G including copper bonding pads, can be bonded to the substrate by placing the second Cu-pad containing die and raising the temperature of the contacted parts to just above the second eutectic point of the second material (e.g., Sn) with Cu. The second eutectic point is higher than the first eutectic point, and is lower than the third eutectic point of the third material with Cu. In case Sn is the second material, the second eutectic temperature is 186° C. The substrate can be heated to just over the second eutectic point and contacted by the second Cu-pad containing die, i.e., the copper bonding pad(s) of the second device 10G. This will form a eutectic alloy, and depending upon the length of time and temperature, the second Cu-pad containing die is held in contact the joint will form a stable intermetallic that will not remelt until above 340° C. during subsequent reheating processes. The intermetallics stabilize the joint.

Last, a third Cu-pad containing die, i.e., a third device 10R including copper bonding pads, can be bonded to the substrate by placing the third Cu-pad containing die and raising the temperature of the contacted parts to just above the third eutectic point of the third material (e.g., Te) with Cu. If the third material is Te, the third eutectic temperature is about 340° C.

Additional bonding schemes are provided, in which a substrate (such as a backplane 401) and a die (which can be any of the devices) have multiple combined metallurgies of staggered reaction temperatures. For example, the substrate can contain sites with In, Sn and Te bonding pads. A first die (such as a first light emitting device 10B) with at least one Au bonding pad can be joined to the In sites at 144° C., a second die (such as a second light emitting device 10G) with at least one Cu bonding pad can be joined to the Sn sites at 186° C.-227° C., and a third die (such as third light emitting device 10R) with at least one Ag bonding pad can be joined to the Te sites at 295° C.-353° C. Many combinations are possible and the thickness of the layers of the various types of bonding pads can be adjusted such that at each selective die attach stage there is enough remaining In, Sn, or Te to enable remelting and rework of the individual bonds.

The various methods of employing multiple types of solder materials having different eutectic temperatures with a common bonding pad material (such as Cu, Au, Ag, Sn, or In) can be employed in conjunction with any of the die (device) transfer methods described above.

Table 1 lists the metallurgical systems of interest and the lowest bond temperature for initial selective die attach.

TABLE 1

Exemplary eutectic systems and respective eutectic temperatures that can be employed to provide a set of eutectic systems having different eutectic temperatures for various bonding schemes of the present disclosure.

| Binary Alloy System | Lowest Bond Temp (° C.) |
| --- | --- |
| Au—Pd | 100 |
| In—Sn | 120 |
| Ag—In | 144 |
| Au—In | 153 |
| Cu—In | 153 |
| In—Pt | 154 |
| In—Pd | 156 |
| In—Te | 156 |

TABLE 1-continued

Exemplary eutectic systems and respective eutectic temperatures that can be employed to provide a set of eutectic systems having different eutectic temperatures for various bonding schemes of the present disclosure.

| Binary Alloy System | Lowest Bond Temp (° C.) |
| --- | --- |
| Cu—Sn | 186 |
| Sn—Zn | 199 |
| Au—Sn | 217 |
| Ag—Sn | 221 |
| Al—Sn | 228 |
| Sn—Te | 228 |
| Pd—Sn | 230 |
| Ge—Sn | 231 |
| Ni—Sn | 231 |
| Sn—Ti | 231 |
| Cr—Sn | 232 |
| Nb—Sn | 232 |
| Sn—Sn | 232 |
| Au—Cu | 240 |
| Cu—Ni | 250 |
| Ag—Te | 295 |
| Cu—Te | 340 |
| Al—Cr | 350 |
| Au—Ge | 360 |
| Au—Si | 363 |
| Ge—Te | 365 |
| Cu—Pd | 400 |
| Cu—Pt | 418 |

According to an aspect of the present disclosure, a backplane optionally having stepped horizontal surfaces and optionally embedding metal interconnect structures is provided. First conductive bonding structures are formed on first stepped horizontal surfaces. First light emitting devices on a first transfer substrate are disposed on the first conductive bonding structures, and a first subset of the first light emitting devices is bonded to the first conductive bonding structures. Laser irradiation can be employed to selectively disconnect the first subset of the first light emitting devices from the first transfer substrate while a second subset of the first light emitting devices remains attached to the first transfer substrate. Additional devices on each additional transfer substrate can be bonded to additional conductive bonding structures on the backplane employing the same method provided that the additional devices are not present in positions that would overlap with pre-existing first light emitting devices or devices on the backplane at a bonding position.

According to another aspect of the present disclosure, different types of discrete devices can be transferred from multiple growth substrates either directly, or through transfer substrates, to multiple backplanes. A multi-step transfer sequence can be employed to prevent collision of discrete devices. A subset of devices can be transferred from a selected source substrate to a selected backplane at each transfer step. A combination of a bonding process and a laser ablation process can be employed to transfer the discrete devices. Collision between a source substrate and previously attached devices on the backplanes can be avoided by employing a scheme that provides differential heights between previously attached devices and devices to be transferred. Stepped horizontal surfaces on the backplanes, bonding pads with different thicknesses, and/or conductive bonding structures having different heights can be employed to provide differential heights. A dummy substrate may also be employed to push previously bonded devices closer to the backplanes.

According to yet another aspect of the present disclosure, a backplane optionally having stepped horizontal surfaces and optionally embedding metal interconnect structures is provided. First conductive bonding structures are formed on first stepped horizontal surfaces. First light emitting devices on a first transfer substrate are disposed on the first conductive bonding structures, and a first subset of the first light emitting devices is bonded to the first conductive bonding structures. Laser irradiation can be employed to selectively disconnect the first subset of the first light emitting devices from the first transfer substrate while a second subset of the first light emitting devices remains attached to the first transfer substrate. Additional devices on each additional transfer substrate can be bonded to additional conductive bonding structures on the backplane employing the same method provided that the additional devices are not present in positions that would overlap with pre-existing first light emitting devices or devices on the backplane at a bonding position.

According to still another aspect of the present disclosure, different types of discrete devices can be transferred from multiple growth substrates either directly, or through transfer substrates, to multiple backplanes. A multi-step transfer sequence can be employed to prevent collision of discrete devices. A subset of devices can be transferred from a selected source substrate to a selected backplane at each transfer step. A combination of a bonding process and a laser ablation process can be employed to transfer the discrete devices. Collision between a source substrate and previously attached devices on the backplanes can be avoided by employing a scheme that provides differential heights between previously attached devices and devices to be transferred. Stepped horizontal surfaces on the backplanes, bonding pads with different thicknesses, and/or conductive bonding structures having different heights can be employed to provide differential heights. A dummy substrate may also be employed to push previously bonded devices closer to the backplanes.

According to even another aspect of the present disclosure, different types of discrete devices can be transferred from multiple growth substrates either directly, or through transfer substrates, to multiple backplanes. A multi-step transfer sequence can be employed to prevent collision of discrete devices. A subset of devices can be transferred from a selected source substrate to a selected backplane at each transfer step. A combination of a bonding process and a laser ablation process can be employed to transfer the discrete devices. Multiple types of solder materials having different eutectic temperatures can be employed to enable sequential bonding of discrete devices of different types without inducing collapse of previously bonded devices.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. Where an embodiment employing a particular structure and/or configuration is illustrated in the present disclosure, it is understood that the present invention may be practiced with any other compatible structures and/or configurations that are functionally equivalent provided that such substitutions are not explicitly forbidden or otherwise known to be impossible to one of ordinary skill in the art.

What is claimed is:

1. A method of forming an integrated light emitting device assembly, comprising:
   forming first conductive bonding structures on a top side of a backplane;
   disposing an assembly comprising a first transfer substrate and first light emitting devices that emit light of a first wavelength on the backplane, wherein a first subset of the first light emitting devices contacts the first conductive bonding structures and a second subset of the first light emitting devices does not contact any conductive bonding structure;
   bonding the first subset of the first light emitting devices to the first conductive bonding structures; and
   separating an assembly comprising the first transfer substrate and the second subset of the first light emitting devices from the backplane while the first subset of the first light emitting devices remains bonded to the first conductive bonding structures.

2. The method of claim 1, further comprising:
   forming second conductive bonding structures on the top side of the backplane after separating the assembly of the first transfer substrate and the second subset of the first light emitting devices from the backplane;
   providing an assembly comprising a second transfer substrate and second light emitting devices, wherein the second light emitting devices emit light of a second wavelength that is different from the first wavelength, and the second light emitting devices are not present in positions that correspond to positions over the backplane at which the first subset of the first light emitting devices is present in a configuration in which the second light emitting devices face the top side of the backplane; and
   disposing the assembly comprising the second transfer substrate and the second light emitting devices on the backplane, wherein a first subset of the second light emitting devices contacts the second conductive bonding structures and a second subset of the second light emitting devices does not overlie the second conductive bonding structures.

3. The method of claim 2, wherein the backplane is provided with stepped horizontal surfaces at a top side, the stepped horizontal surfaces comprising:
   a first subset of the stepped horizontal surfaces located within a first horizontal surface plane; and
   a second subset of the stepped horizontal surfaces located within a second horizontal surface plane that is more proximal to a backside surface of the backplane than the first subset of stepped horizontal surfaces,
   wherein:
   the first conductive bonding structures are formed on the first subset of the stepped horizontal surfaces; and
   the second conductive bonding structures are formed on the second subset of the stepped horizontal surfaces.

4. The method of claim 2, further comprising:
   bonding the first subset of the second light emitting devices to the second conductive bonding structures while the second subset of the second light emitting devices is not bonded to any structure on the backplane; and
   separating an assembly comprising the second transfer substrate and the second subset of the second light emitting devices from the backplane while the first subset of the second light emitting devices remains bonded to the second conductive bonding structures.

5. The method of claim 4, further comprising:
   forming third conductive bonding structures on the top side of the backplane after separating the assembly of the second transfer substrate and the second subset of the second light emitting devices from the backplane;

providing an assembly comprising a third transfer substrate and third light emitting devices, wherein the third light emitting devices emit light of a third wavelength that is different from the first and second wavelengths, and the third light emitting devices are not present in positions that correspond to positions over the backplane at which the first subset of the first light emitting devices and the first subset of the second light emitting devices are present in a configuration in which the third light emitting devices face the top side of the backplane; and disposing the assembly comprising the third transfer substrate and the third light emitting devices on the backplane, wherein a first subset of the third light emitting devices contacts the third conductive bonding structures and a second subset of the third light emitting devices does not overlie the third conductive bonding structures.

6. The method of claim 5, wherein the backplane is provided with stepped horizontal surfaces at a top side, the stepped horizontal surfaces comprising:

a first subset of the stepped horizontal surfaces located within a first horizontal surface plane;

a second subset of the stepped horizontal surfaces located within a second horizontal surface plane that is more proximal to a backside surface of the backplane than the first subset of stepped horizontal surfaces is to the backside surface of the backplane; and a third subset of the stepped horizontal surfaces located within a third horizontal surface plane that is more proximal to the backside surface of the backplane than the second subset of stepped horizontal surfaces is to the backside surface of the backplane, wherein:

the first conductive bonding structures are formed on the first subset of the stepped horizontal surfaces; and the second conductive bonding structures are formed on the second subset of the stepped horizontal surfaces; and the third conductive bonding structures are formed on the third subset of the stepped horizontal surfaces.

7. The method of claim 5, further comprising:

bonding the first subset of the third light emitting devices to the third conductive bonding structures while the second subset of the third light emitting devices is not bonded to any structure on the backplane; and separating an assembly comprising the third transfer substrate and the second subset of the third light emitting devices from the backplane while the first subset of the third light emitting devices remains bonded to the third conductive bonding structures.

8. The method of claim 4, wherein a first horizontal interfacial plane including interfaces between the first subset of the first light emitting devices and the first conductive bonding structures is more distal from the second horizontal surface plane than a second horizontal interface plane between the first subset of the second light emitting devices and the second conductive bonding structures.

9. The method of claim 1, further comprising:

forming additional conductive bonding structures on the top side of the backplane after separating the assembly of the first transfer substrate and the second subset of the first light emitting devices from the backplane;

providing an assembly comprising an additional transfer substrate and sensor devices, wherein the sensor devices are not present in positions that correspond to positions over the backplane at which the first subset of the first light emitting devices is present in a configuration in which the sensor devices face the top side of the backplane; and disposing the assembly comprising the additional transfer substrate and the sensor devices on the backplane, wherein a first subset of the sensor devices contacts the additional conductive bonding structures and a second subset of the sensor devices does not overlie any of the additional conductive bonding structures.

10. The method of claim 9, further comprising:

bonding the first subset of the sensor devices to the additional conductive bonding structures while the second subset of the sensor devices is not bonded to any structure on the backplane; and separating an assembly comprising the additional transfer substrate and the second subset of the sensor devices from the backplane while the first subset of the sensor devices remains bonded to the additional conductive bonding structures.

11. The method of claim 1, wherein the assembly comprising the first transfer substrate and the first light emitting devices further comprises:

a release layer contacting the first transfer substrate and comprising a material that absorbs light at a wavelength selected from ultraviolet range, visible range, and infrared range; and a bonding material layer contacting the release layer and the first light emitting devices.

12. The method of claim 11, further comprising removing first portions of the release layer that overlies the first subset of the first light emitting devices selectively, while second portions of the release layer that overlies the second subset of the first light emitting devices are not removed.

13. The method of claim 11, wherein the first transfer substrate comprises a material that is optically transparent at a laser wavelength, and the method further comprises irradiating the first portions of the release layer with a laser beam having the laser wavelength.

14. The method of claim 13, wherein:

the release layer comprises silicon nitride;

the laser wavelength is a ultraviolet wavelength; and irradiating the first portions of the release layer with the laser beam ablates the first portions of the release layer.

15. The method of claim 13, wherein a remnant portion of the bonding material layer is formed on at least one of the first subset of the first light emitting devices after the first portions of the release layer are irradiated with the laser beam.

16. The method of claim 11, further comprising:

providing a carrier substrate on which the first light emitting devices are attached;

depositing a first bonding material layer on the carrier substrate;

providing a stacked structure including a stack of the first transparent substrate, the release layer, and a second bonding material layer; and bonding the second bonding material layer with the first bonding material layer to form the bonding material layer, wherein the assembly comprising the first transfer substrate, the release layer, the bonding material layer, and the first light emitting devices is formed.

17. The method of claim 1, wherein the first conductive bonding structures have a lesser height than the second conductive bonding structures.

18. The method of claim 1, wherein:
the backplane comprises metal interconnect structures embedded within a dielectric material matrix; and
the conductive bonding structures are electrically connected to a respective metal interconnect structure within the backplane upon forming of the conductive bonding structures.

19. The method of claim 1, further comprising encapsulating the first subset of the first light emitting devices with a transparent encapsulation dielectric layer by depositing the transparent encapsulation dielectric layer over the backplane after separating the assembly comprising the first transfer substrate and the second subset of the first light emitting devices.

20. The method of claim 19, further comprising forming conductive interconnect structures within the transparent encapsulation dielectric layer, wherein the conductive interconnect structures electrically contact a respective light emitting device among the first subset of the first light emitting devices.

21. A method of forming at least one integrated light emitting device assembly, comprising:
disposing a first assembly comprising a first source substrate and first light emitting devices that emit light of a first wavelength over a backplane, wherein first conductive bonding structures are disposed between the backplane and the first assembly;
bonding a first subset of the first light emitting devices to the backplane through the first conductive bonding structures;
detaching the first subset of the first light emitting devices from the first source substrate by laser ablation of material portions overlying the first subset of the first light emitting devices; and
separating an assembly comprising the first source substrate and a second subset of the first light emitting devices from the backplane while the first subset of the first light emitting devices remains bonded to the backplane.

22. The method of claim 21, further comprising:
providing a second assembly comprising a second source substrate and second light emitting devices, wherein the second light emitting devices emit light of a second wavelength that is different from the first wavelength, and the second light emitting devices are not present in vacancy positions that form a first pattern; and
disposing the second assembly comprising the second source substrate and the second light emitting devices over the backplane, wherein:
second conductive bonding structures are disposed between the backplane and the second assembly; and
the vacancy positions of the first pattern overlie all areas of the first light emitting devices that are bonded to the backplane when the second assembly is disposed over the backplane.

23. The method of claim 22, further comprising:
bonding a first subset of the second light emitting devices to the backplane through the second conductive bonding structures;
detaching the first subset of the second light emitting devices from the second source substrate by laser ablation of material portions overlying the first subset of the second light emitting devices; and
separating an assembly comprising the second source substrate and a second subset of the second light emitting devices from the backplane while the first subset of the second light emitting devices remains bonded to the backplane.

24. The method of claim 23, further comprising:
providing a third assembly comprising a third source substrate and third light emitting devices, wherein the third light emitting devices emit light of a third wavelength that is different from the first wavelength and from the second wavelength, and the third light emitting devices are not present in vacancy positions that form a second pattern; and
disposing the third assembly comprising the third source substrate and the third light emitting devices over the backplane, wherein:
third conductive bonding structures are disposed between the backplane and the third assembly; and
the vacancy positions in the second pattern overlie all areas of the first and second light emitting devices that are bonded to the backplane when the third assembly is disposed over the backplane.

25. The method of claim 24, further comprising:
bonding a first subset of the third light emitting devices to the backplane through the third conductive bonding structures;
detaching the first subset of the third light emitting devices from the third source substrate by laser ablation of material portions overlying the first subset of the third light emitting devices; and
separating an assembly comprising the third source substrate and a second subset of the third light emitting devices from the backplane while the first subset of the third light emitting devices remains bonded to the backplane.

26. The method of claim 22, wherein:
first bonding pads and second bonding pads are provided on the backplane;
the first conductive bonding structures overlie the first bonding pads and the second conductive bonding structures overlie the second bonding pads when the first assembly is disposed over the backplane; and
the first conductive bonding structures are bonded to the first subset of the first light emitting devices and to the first bonding pads when the first subset of the first light emitting devices are bonded to the backplane.

27. The method of claim 26, wherein one set of structures selected from the second bonding pads and the second subset of the first light emitting devices does not physically contact the second conductive bonding structures when the first subset of the first light emitting devices are bonded to the backplane.

28. The method of claim 26, wherein the first conductive bonding structures are bonded to the first bonding pads and the second conductive bonding structures are bonded to the second bonding pads before the first subset of the first light emitting devices are bonded to the backplane.

29. The method of claim 26, wherein each of the first conductive bonding structures is bonded to a respective first light emitting device before the first subset of the first light emitting devices are bonded to the backplane.

30. The method of claim 26, wherein:
proximal surfaces of the first light emitting diodes are within a horizontal plane when the first assembly is disposed over the backplane; and
the first bonding pads are more proximal to the horizontal plane than the second bonding pads are to the horizontal plane when the first assembly is disposed over the backplane.

31. The method of claim 30, wherein the first bonding pads have a greater thickness than the second bonding pads.

32. The method of claim 30, wherein backside surfaces of the first bonding pads are vertically spaced from the horizontal plane by a lesser separation distance than backside surfaces of the second bonding pads are from the horizontal plane when the first assembly is disposed over the backplane.

33. The method of claim 30, wherein the backplane has stepped surfaces having a different separation distance from a planar backside surface of the backplane, and the first bonding pads are located on a different stepped surface than the second bonding pads.

34. The method of claim 21, wherein the first subset of the first light emitting devices is detached from the first source substrate one at a time by sequential irradiation of a laser beam to each first light emitting devices in the first subset.

35. The method of claim 26, wherein:
the first bonding pads and second bonding pads have a same thickness; and
the first conductive bonding structures have a greater height than the second conductive bonding structures upon formation thereof.

36. The method of claim 26, wherein the second bonding pads and the second subset of the first light emitting devices are in physically contact with the second conductive bonding structures when the first subset of the first light emitting devices are bonded to the backplane.

37. The method of claim 26, wherein the first conductive bonding structures are bonded to an underlying first bonding pad and an overlying first light emitting device by irradiation by a laser beam that selectively heats each first conductive bonding structure.

38. The method of claim 37, wherein one set of structures selected from the second bonding pads and the second subset of the first light emitting devices is not bonded to the second conductive bonding structures when the first subset of the first light emitting devices are bonded to the backplane.

39. The method of claim 36, wherein the first conductive bonding structures are bonded to an underlying first bonding pad and an overlying first light emitting device by uniformly heating the first conductive bonding structures.

40. The method of claim 39, wherein the second conductive bonding structures are bonded to the second bonding pads and to the second subset of the first light emitting devices when the first subset of the first light emitting devices are bonded to the backplane.

41. The method of claim 40, further comprising separating each of the second conductive bonding structures into two portions while separating the assembly comprising the first source substrate and a second subset of the first light emitting devices from the backplane, wherein the two portions comprise:
an upper portion bonded to a respective first light emitting device within the second set; and
a lower portion bonded to a respective second bonding pad.

42. The method of claim 41, wherein:
the first subset of the first light emitting devices are bonded to the first bonding pad and the second subset of the first light emitting devices are bonded to the second bonding pad simultaneously at a reflow temperature;
the laser ablation is performed at a temperature lower than the reflow temperature; and the assembly comprising the first source substrate and the second subset of the first light emitting devices is separated from the backplane at a separation temperature.

43. The method of claim 26, further comprising pushing the first subset of the first light emitting devices closer to the backplane while reflowing the first conductive bonding structures after the assembly comprising the first source substrate and the second subset of the first light emitting devices is separated from the backplane.

44. The method of claim 43, wherein a vertical pushing distance during the pushing of the first subset of the first light emitting devices is greater than a maximum height among gaps between the second conductive bonding structures and structures selected from overlying first light emitting diodes and underlying second bonding pads.

45. The method of claim 21, further comprising:
providing an additional assembly comprising another source substrate and sensor devices, wherein the sensor devices are not present in vacancy positions that form another pattern; and
disposing the additional assembly comprising the additional source substrate and the sensor devices over the backplane, wherein:
additional conductive bonding structures are disposed between the backplane and the additional assembly; and
the vacancy positions in the additional pattern overlie all areas of the first light emitting devices that are bonded to the backplane when the additional assembly is disposed over the backplane.

46. The method of claim 45, further comprising:
bonding a first subset of the sensor devices to the backplane through the additional conductive bonding structures;
detaching the first subset of the sensor devices from the additional source substrate by laser ablation of material portions overlying the first subset of the sensor devices; and
separating an assembly comprising the additional source substrate and a second subset of the sensor devices from the backplane while the first subset of the sensor devices remains bonded to the backplane.

47. The method of claim 21, wherein:
first bonding pads are provided on the backplane; and
each of the first conductive bonding structures is bonded to a respective first bonding pad and a respective first light emitting device in the first subset when the first subset of the first light emitting devices are bonded to the backplane.

48. The method of claim 47, wherein:
second conductive bonding structures are disposed between the second subset of the first light emitting devices and second bonding pads located on the backplane at a time of bonding the first subset of the first light emitting diodes to the backplane; and
each second bonding structure is bonded to one of an overlying first light emitting device within the second subset and an underlying second bonding pad, and does not physically contact another of the overlying first light emitting device within the second subset and the underlying second bonding pad.

49. The method of claim 21, wherein the backplane is provided with stepped horizontal surfaces at a top side, the stepped horizontal surfaces comprising:
a first subset of the stepped horizontal surfaces located within a first horizontal surface plane; and a second subset of the stepped horizontal surfaces located within a second horizontal surface plane that is more proximal to a planar backside surface of the backplane than the first subset of stepped horizontal surfaces is to the planar backside surface of the backplane, wherein:
the first conductive bonding structures are formed at the first subset of the stepped horizontal surfaces; and
the second conductive bonding structures are formed at the second subset of the stepped horizontal surfaces.

50. The method of claim 49, wherein:
the stepped horizontal surfaces comprise a third subset of the stepped horizontal surfaces is located within a third horizontal surface plane that is more proximal to the backside surface of the backplane than the second subset of stepped horizontal surfaces is to the backside surface of the backplane; and
third conductive bonding structures are formed at the third subset of the stepped horizontal surfaces.

51. The method of claim 21, wherein the first assembly comprising the first source substrate and the first light emitting devices further comprises:
a release layer contacting the first source substrate and comprising a material that absorbs light at a wavelength selected from ultraviolet range, visible range, and infrared range; and
a bonding material layer contacting the release layer and the first light emitting devices.

52. The method of claim 51, further comprising removing first portions of the release layer that overlie the first subset of the first light emitting devices selectively, while second portions of the release layer that overlie the second subset of the first light emitting devices are not removed.

53. The method of claim 52, wherein:
the release layer comprises silicon nitride;
the laser wavelength is a ultraviolet wavelength; and
irradiating the first portions of the release layer with the laser beam ablates the first portions of the release layer.

54. The method of claim 21, wherein:
the first source substrate is an upper portion of a growth substrate on which the first light emitting devices are fabricated; and
the first source substrate is provided by separating the upper portion of the growth substrate from a lower portion of the growth substrate.

55. The method of claim 54, wherein the growth substrate comprises a III-V compound semiconductor material.

56. The method of claim 21, wherein the integrated light emitting device assembly comprises an emissive display panel containing light emitting diodes that emit three or more different colors.

57. The method of claim 56, wherein the emissive display panel comprises a direct view display panel containing red, green and blue wavelength light emitting diodes and sensors bonded to the backplane.

* * * * *